US010269987B2

(12) United States Patent
Yamamoto

(10) Patent No.: US 10,269,987 B2
(45) Date of Patent: Apr. 23, 2019

(54) BIDIRECTIONAL ZENER DIODE

(71) Applicant: ROHM CO., LTD., Kyoto (JP)

(72) Inventor: Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/783,686

(22) Filed: Oct. 13, 2017

(65) Prior Publication Data

US 2018/0047854 A1 Feb. 15, 2018

Related U.S. Application Data

(63) Continuation of application No. 15/041,019, filed on Feb. 10, 2016, now Pat. No. 9,825,187, which is a (Continued)

(30) Foreign Application Priority Data

| Mar. 5, 2014 | (JP) | 2014-43187 |
| Mar. 5, 2014 | (JP) | 2014-43188 |
| Mar. 5, 2014 | (JP) | 2014-43189 |
| Mar. 5, 2014 | (JP) | 2014-43190 |
| Mar. 5, 2014 | (JP) | 2014-43191 |
| Nov. 5, 2014 | (JP) | 2014-225236 |

(51) Int. Cl.
*H01L 29/866* (2006.01)
*H01L 29/417* (2006.01)
(Continued)

(52) U.S. Cl.
CPC ........ *H01L 29/866* (2013.01); *H01L 27/0255* (2013.01); *H01L 29/0619* (2013.01); *H01L 29/0623* (2013.01); *H01L 29/0634* (2013.01); *H01L 29/0692* (2013.01); *H01L 29/417* (2013.01); *H01L 29/66106* (2013.01); *H01L 29/747* (2013.01)

(58) Field of Classification Search
None
See application file for complete search history.

(56) References Cited

U.S. PATENT DOCUMENTS

| 9,054,072 B2 * | 6/2015 | Yamamoto | H01L 23/49551 |
| 9,293,605 B2 * | 3/2016 | Yamamoto | H01L 27/0255 |

(Continued)

FOREIGN PATENT DOCUMENTS

| JP | 2001-326354 A | 11/2001 |
| JP | 2005-277042 A | 10/2005 |
| JP | 2009-239049 A | 10/2009 |

*Primary Examiner* — Minh Loan Tran
(74) *Attorney, Agent, or Firm* — Rabin & Berdo, P.C.

(57) ABSTRACT

A bidirectional Zener diode of the present invention includes a semiconductor substrate of a first conductivity type, a first electrode and a second electrode which are defined on the semiconductor substrate, and a plurality of diffusion regions of a second conductivity type, which are defined at intervals from one another on a surface portion of the semiconductor substrate, to define p-n junctions with the semiconductor substrate, and the plurality of diffusion regions include diode regions which are electrically connected to the first electrode and the second electrode, and pseudo-diode regions which are electrically isolated from the first electrode and the second electrode.

15 Claims, 89 Drawing Sheets

Related U.S. Application Data continuation of application No. 14/635,627, filed on Mar. 2, 2015, now Pat. No. 9,293,605.

(51) Int. Cl.
  *H01L 27/02* (2006.01)
  *H01L 29/747* (2006.01)
  *H01L 29/06* (2006.01)
  *H01L 29/66* (2006.01)

(56) References Cited

U.S. PATENT DOCUMENTS

| | | |
|---|---|---|
| 9,825,187 B2 * | 11/2017 | Yamamoto .......... H01L 27/0255 |
| 2002/0050602 A1 | 5/2002 | Narazaki |
| 2003/0057497 A1 | 3/2003 | Higashida et al. |
| 2009/0039432 A1 | 2/2009 | Nishimura et al. |
| 2011/0084335 A1 | 4/2011 | Lin et al. |
| 2012/0049187 A1 | 3/2012 | Haruyama et al. |
| 2014/0284754 A1 | 9/2014 | Yamamoto |
| 2015/0216044 A1 | 7/2015 | Tamagawa et al. |
| 2015/0243612 A1 | 8/2015 | Yamamoto |

\* cited by examiner

FIG. 7A Arrangement Example 1
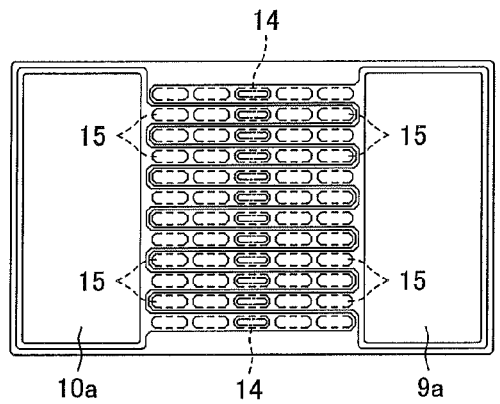
FIG. 7D Arrangement Example 4
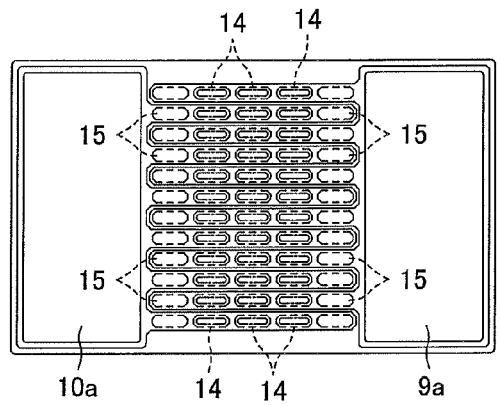
FIG. 7B Arrangement Example 2
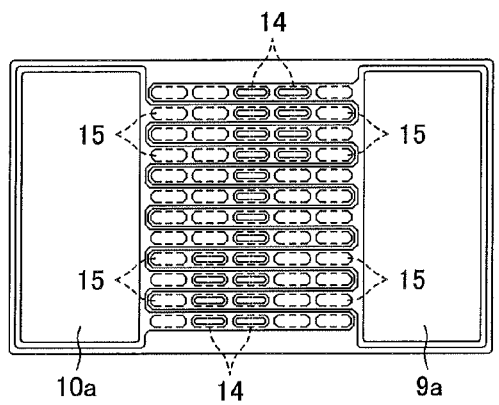
FIG. 7E Arrangement Example 5
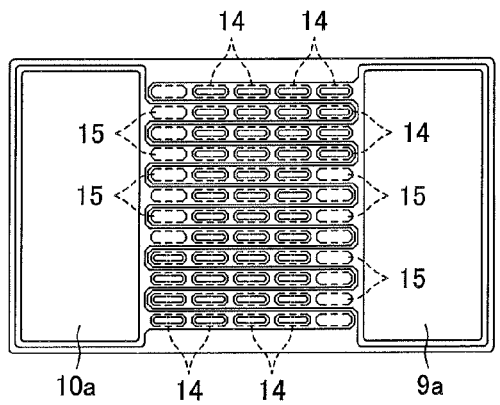
FIG. 7C Arrangement Example 3
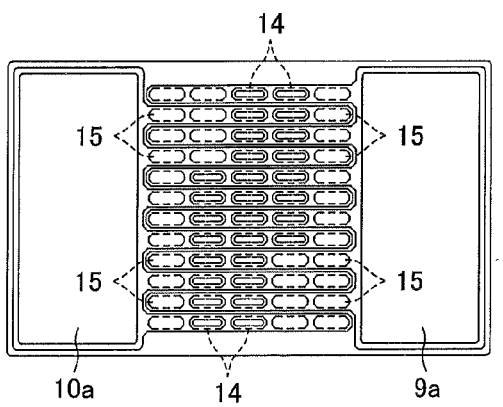
FIG. 7F Arrangement Example 6
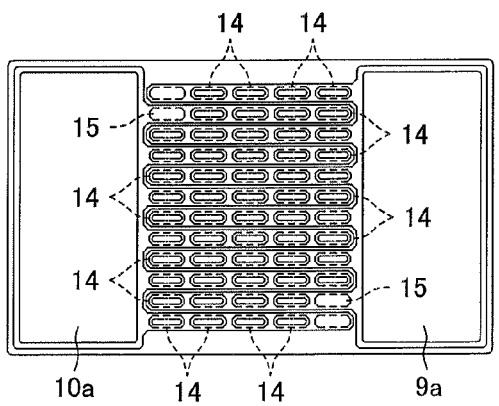

|  | Area of diffusion region ($\mu m^2$) | Capacitance between terminals Ct Theoretical value(pF) | Capacitance between terminals Ct Measured value(pF) |
|---|---|---|---|
| — | 0 | 0 | 1.71 |
| Arrangement Example 1 | 6319 | 3 | 4.69 |
| Arrangement Example 2 | 11585 | 5.3 | 6.98 |
| Arrangement Example 3 | 14744 | 7 | 8.83 |
| Arrangement Example 4 | 18957 | 9 | 10.22 |
| Arrangement Example 5 | 23170 | 11 | 12.6 |
| Arrangement Example 6 | 29489 | 14 | 15.4 |

FIG. 22A Arrangement Example 101
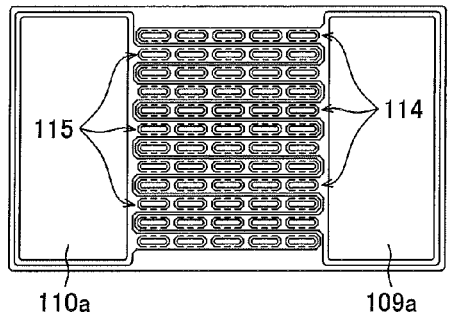
FIG. 22D Arrangement Example 104
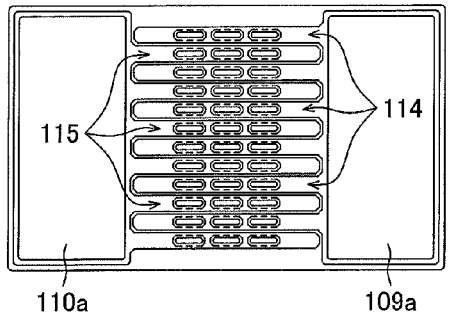
FIG. 22B Arrangement Example 102
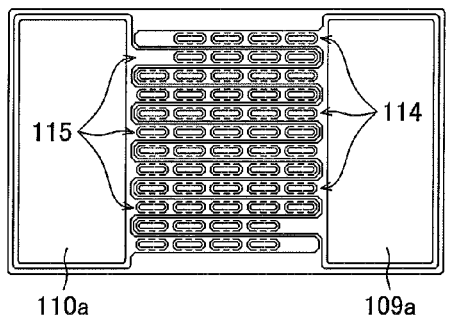
FIG. 22E Arrangement Example 105
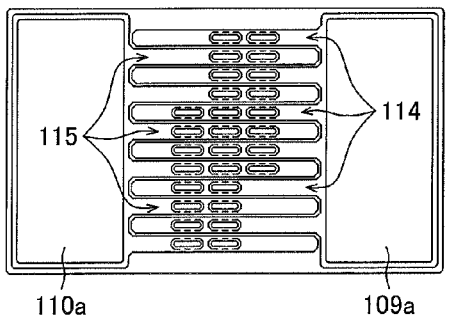
FIG. 22C Arrangement Example 103
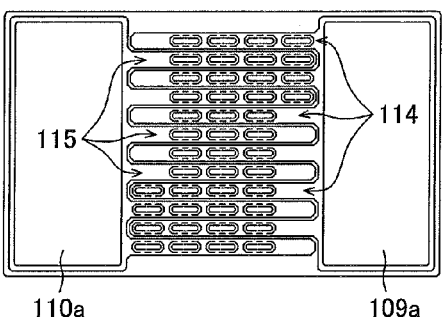
FIG. 22F Arrangement Example 106
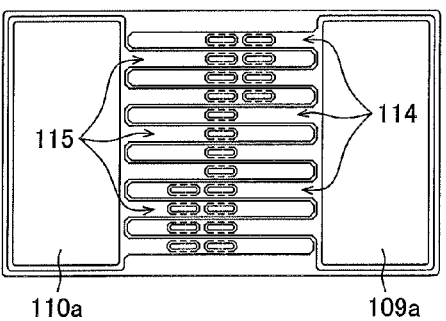
FIG. 22G Arrangement Example 107
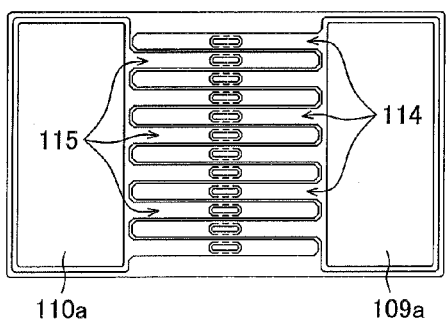

FIG. 23

| | Boundary length of diffusion region ($\mu$m) | Area of diffusion region ($\mu$m$^2$) | Capacitance between terminals Ct Theoretical value(pF) | Capacitance between terminals Ct Measured value(pF) | Peak pulse power $P_{pk}$(W) |
|---|---|---|---|---|---|
| Reference Example | 586 | 43923 | 31.0 | 20.42 | 27.1 |
| Arrangement Example 101 | 2379 | 31595 | 15.0 | 16.58 | 77.5 |
| Arrangement Example 102 | 2220 | 29489 | 14.0 | 15.25 | 75.8 |
| Arrangement Example 103 | 1744 | 23170 | 11.0 | 12.38 | 65.7 |
| Arrangement Example 104 | 1427 | 18957 | 9.0 | 10.76 | 57.0 |
| Arrangement Example 105 | 1110 | 14744 | 7.0 | 8.58 | 37.3 |
| Arrangement Example 106 | 872 | 11585 | 5.3 | 6.93 | 34.2 |
| Arrangement Example 107 | 476 | 6319 | 3.0 | 4.46 | 21.5 |

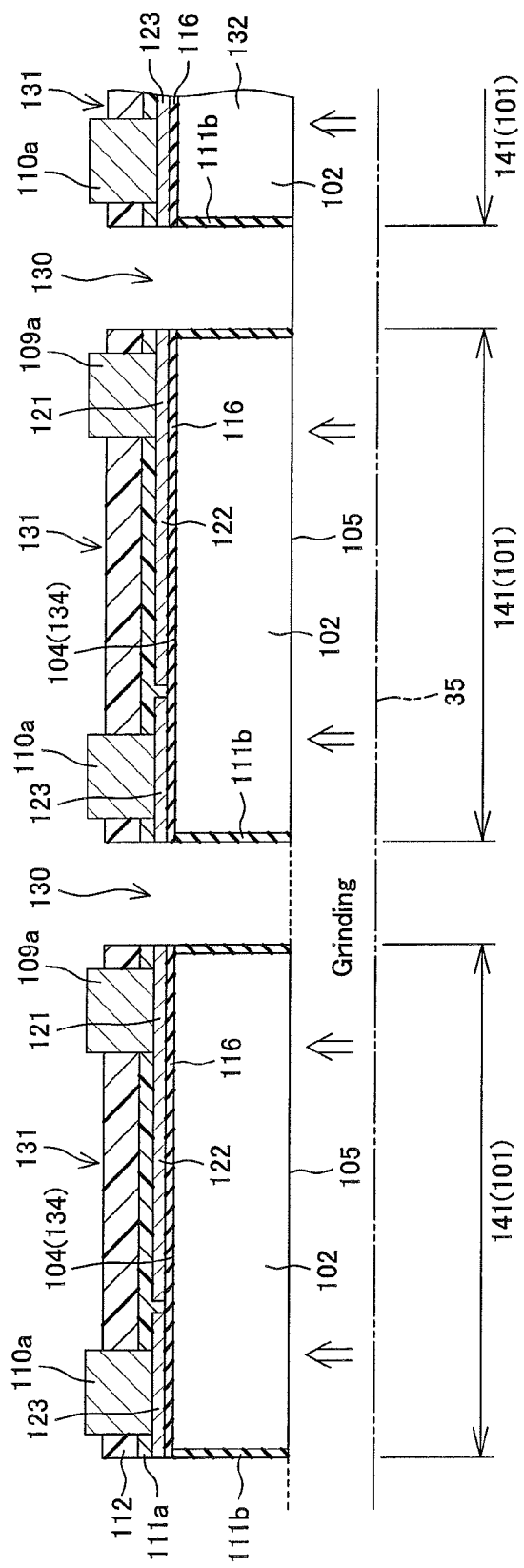

FIG. 38A  Arrangement Example 201
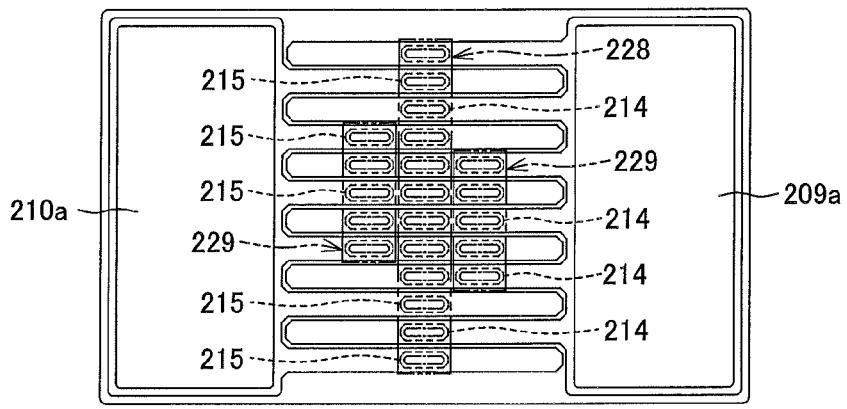
FIG. 38B  Arrangement Example 202
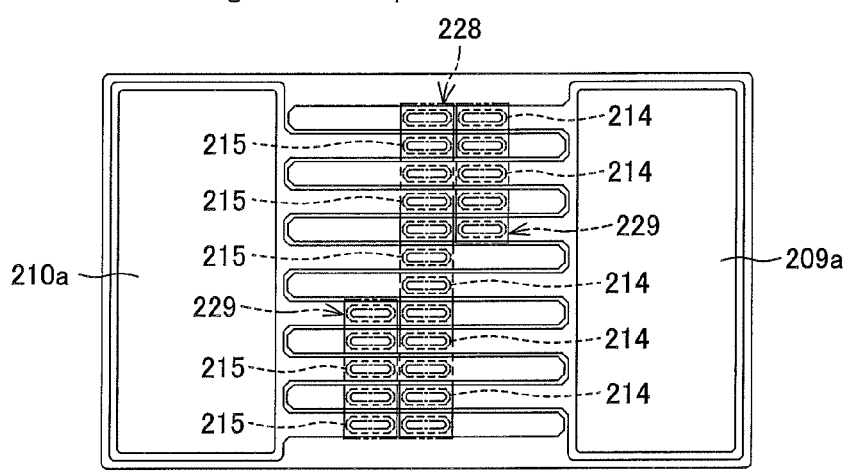
FIG. 38C  Arrangement Example 203
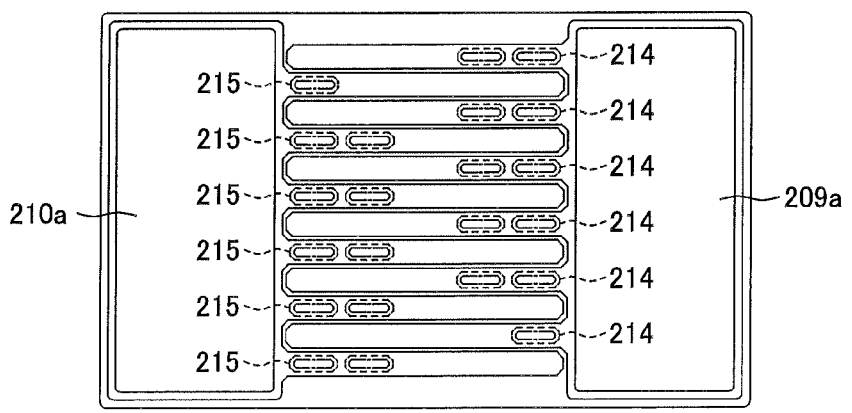

FIG. 39

| | Respective areas of first and second diffusion regions ($\mu m^2$) | Respective boundary lengths of first and second diffusion regions ($\mu m$) | ESD resistance (kV) | Capacitance between terminals $C_t$ (pF) | Reverse breakdown voltage $V_{br}$ (V) | Peak pulse power $P_{pk}$ (W) |
|---|---|---|---|---|---|---|
| Arrangement Example 201 | 11585 | 872 | 18.0 | 6.93 | 7.700 | 34.2 |
| Arrangement Example 202 | 11585 | 872 | 16.0 | 6.82 | 7.693 | 32.1 |
| Arrangement Example 203 | 11585 | 872 | 10.5 | 7.01 | 8.085 | 37.6 |

FIG. 48

FIG. 50A Arrangement Example 204
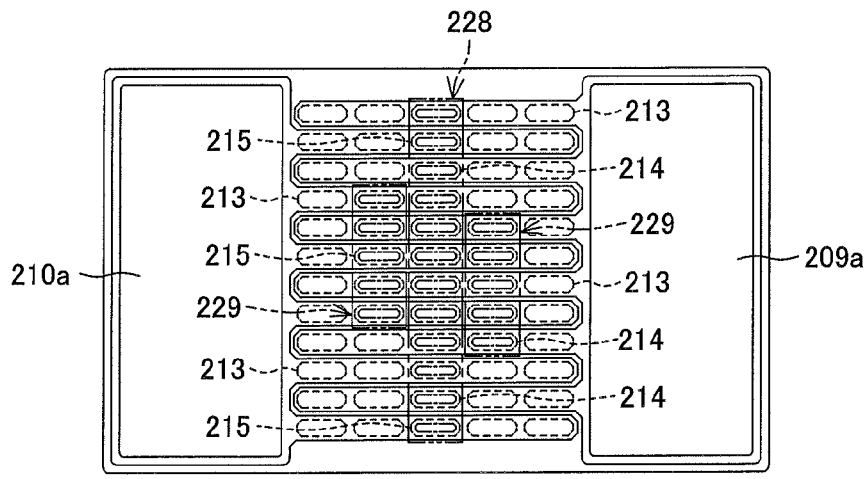
FIG. 50B Arrangement Example 205
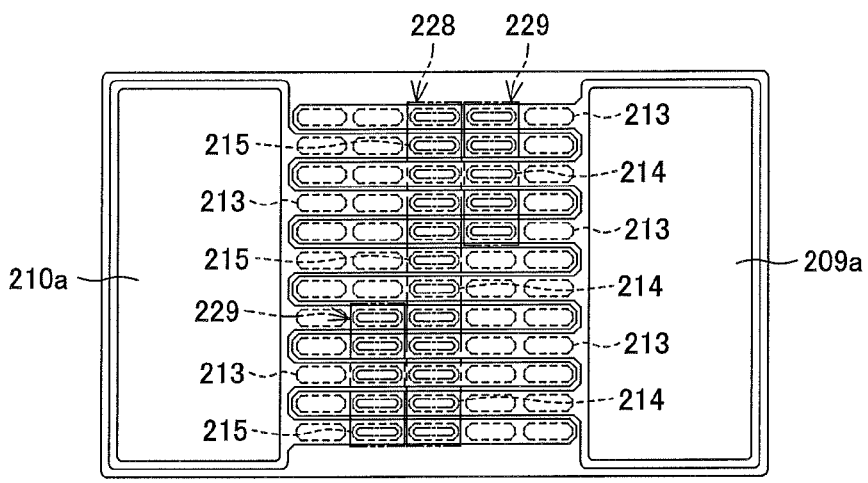
FIG. 50C Arrangement Example 206
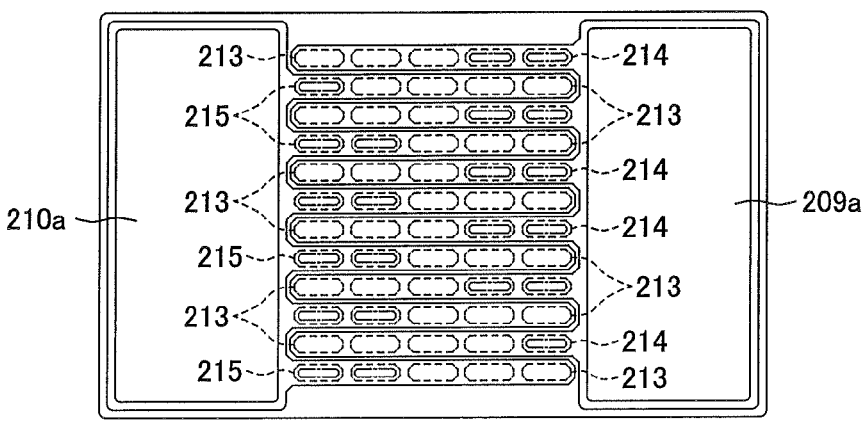

FIG. 51

| | Respective areas of first and second diffusion regions ($\mu m^2$) | Respective boundary lengths of first and second diffusion regions ($\mu m$) | ESD resistance (kV) | Capacitance between terminals $C_t$ (pF) | Reverse breakdown voltage $V_{br}$ (V) | Peak pulse power $P_{pk}$ (W) |
|---|---|---|---|---|---|---|
| Arrangement Example 204 | 11585 | 872 | 18.5 | 6.98 | 7.740 | 32.1 |
| Arrangement Example 205 | 11585 | 872 | 16.5 | 7.07 | 7.740 | 32.4 |
| Arrangement Example 206 | 11585 | 872 | 7.0 | 6.95 | 8.118 | 33.5 |

FIG. 62

| | Width between first and second diffusion regions W303(μm) | Respective boundary lengths of first and second diffusion regions (μm) | Respective areas of first and second diffusion regions (μm²) | ESD resistance (kV) | Capacitance between terminals $C_t$ (pF) | Reverse breakdown voltage $V_{br}$ (V) | Peak pulse power $P_{pk}$ (W) |
|---|---|---|---|---|---|---|---|
| Arrangement Example 301 | 12.5 | 476 | 6319 | 11.5 | 4.46 | 7.686 | 21.5 |
| Arrangement Example 302 | 11.0 | 476 | 6319 | 11.5 | 4.44 | 7.552 | 21.0 |
| Arrangement Example 303 | 10.0 | 476 | 6319 | 11.5 | 4.47 | 7.444 | 19.0 |
| Arrangement Example 304 | 9.0 | 476 | 6319 | 12.0 | 4.37 | 7.257 | 18.0 |
| Arrangement Example 305 | 8.0 | 476 | 6319 | 12.0 | 4.34 | 7.052 | 17.0 |
| Arrangement Example 306 | 7.0 | 476 | 6319 | 11.5 | 4.41 | 6.713 | 16.0 |

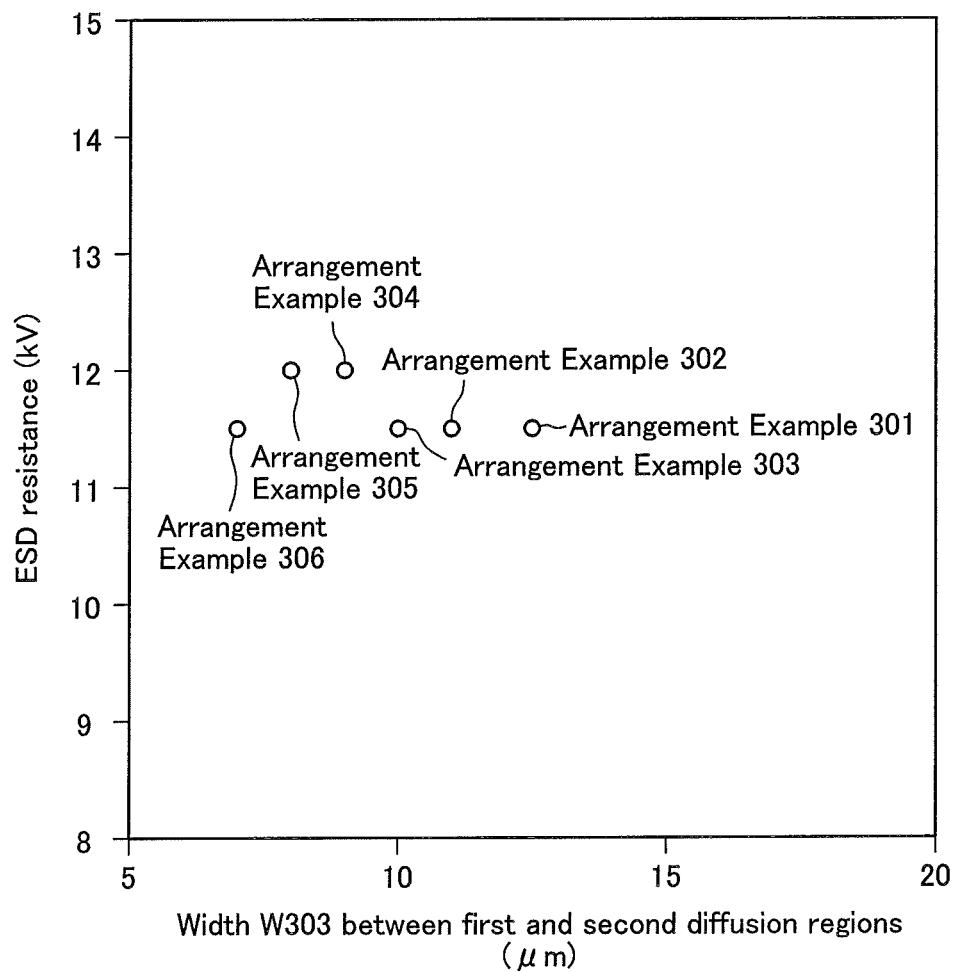

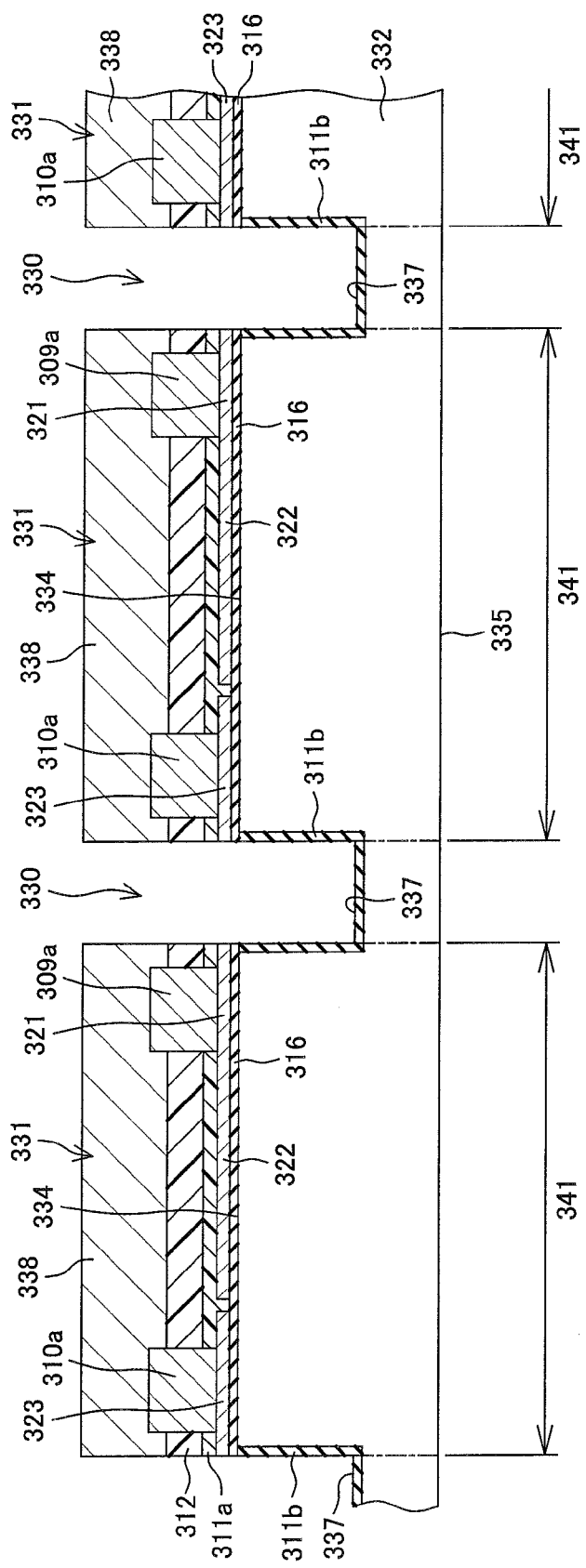

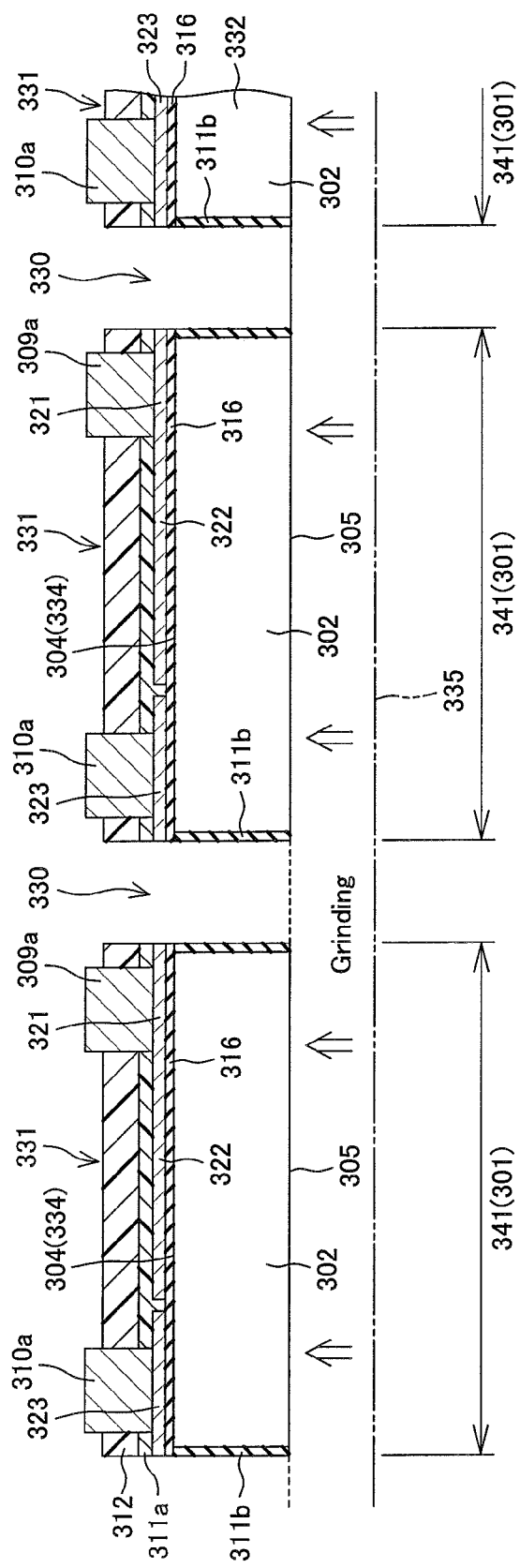

| Zener voltage Vz(V) | Capacitance between terminals Ct (pF) | Peak pulse power Ppk (W) | ESD resistance (kV) |
|---|---|---|---|
| 6.2 | 11.8 | 33.6 | 14.5 |
| 6.8 | 11.4 | 37.5 | 22.0 |
| 7.5 | 10.9 | 40.6 | 24.0 |
| 8.2 | 9.5 | 43.1 | 16.0 |

| Reverse breakdown voltage Vbr (V) | Capacitance between terminals Ct (pF) | Peak pulse power Ppk (W) | ESD resistance (kV) |
|---|---|---|---|
| 6.8 | 5.5 | 22.1 | 15.0 |
| 7.5 | 5.3 | 24.7 | 22.0 |
| 8.2 | 5.1 | 26.7 | 24.0 |
| 8.9 | 4.6 | 28.4 | 16.0 |

BIDIRECTIONAL ZENER DIODE

CROSS-REFERENCE TO RELATED APPLICATIONS

This is a continuation of U.S. application Ser. No. 15/041,019, filed on Feb. 10, 2016, and allowed on Jul. 14, 2017, which is a continuation of U.S. application Ser. No. 14/635,627, filed on Mar. 2, 2015 (issued on Mar. 22, 2016 as U.S. Pat. No. 9,293,605), and claims the benefit of priority of Japanese Patent Application No. 2014-43187 filed in the Japan Patent Office on Mar. 5, 2014, Japanese Patent Application No. 2014-43188 filed in the Japan Patent Office on Mar. 5, 2014, Japanese Patent Application No. 2014-43189 filed in the Japan Patent Office on Mar. 5, 2014, Japanese Patent Application No. 2014-43190 filed in the Japan Patent Office on Mar. 5, 2014, Japanese Patent Application No. 2014-43191 filed in the Japan Patent Office on Mar. 5, 2014, and Japanese Patent Application No. 2014-225236 filed in the Japan Patent Office on Nov. 5, 2014, and all the disclosures of these prior applications are incorporated herein by citation.

FIELD OF THE INVENTION

The present invention relates to a bidirectional Zener diode.

BACKGROUND ART

In Patent Literature 1 (Japanese Patent Application Publication No. 2001-326354), a vertical MOSFET in which a protection diode composed of a bidirectional Zener diode is connected between a gate and a source is disclosed. A bidirectional Zener diode is used as a protection element that releases positive and negative surge currents, to protect other devices.

BRIEF SUMMARY OF THE INVENTION

As the characteristics of the bidirectional Zener diode, there are a reverse breakdown voltage ($V_{br}$: Reverse Breakdown Voltage), peak pulse power ($P_{pk}$: Peak Pulse Power), capacitance between terminals ($C_t$), ESD (Electrostatic Discharge) resistance, and the like.

Among these characteristics, as the capacitance between terminals ($C_t$), a variety of values are selected on the intended use of usage application. However, this capacitance between terminals ($C_t$) is strongly dependent on a shape, a size, and the like of a diffusion region composing a bidirectional Zener diode. Therefore, in order to obtain on-target capacitance between terminals ($C_t$) on the intended use of application, a great design change of the bidirectional Zener diode may be mandatory in many cases.

Therefore, an object of the present invention is to provide a bidirectional Zener diode which is capable of easily achieving a variety of capacitances between terminals by devising the layout.

BRIEF DESCRIPTION OF THE DRAWINGS

FIGS. 7A to 7F are schematic plan views for explanation of arrangement examples of diode regions and pseudo-diode regions.

FIGS. 22A to 22G are schematic plan views for explanation of arrangement examples of diffusion regions of the bidirectional Zener diode shown in FIG. 14.

FIG. 23 is a table showing the specifications and the electrical characteristics of the bidirectional Zener diode according to Reference Example shown in FIG. 21 and respective Arrangement Examples of the bidirectional Zener diode according to Reference Example 1 shown in FIG. 22.

FIGS. 30A and 30B are schematic cross-sectional views for explanation of a backside polishing and dicing process shown in FIG. 28.

FIGS. 38A to 38C are schematic plan views for explanation of arrangement examples of the diffusion regions in Arrangement Example 1.

FIG. 39 is a table showing the specifications and the electrical characteristics in respective Arrangement Examples shown in FIG. 38.

FIG. 48 is a cross-sectional view taken along the cross-section line XLVIII-XLVIII shown in FIG. 46.

FIGS. 50A to 50C are schematic plan views for explanation of arrangement examples of the diffusion regions in Arrangement Example 2.

FIG. 51 is a table showing the specifications and the electrical characteristics in respective Arrangement Examples shown in FIG. 50.

FIG. 62 is a table showing the specifications of the bidirectional Zener diode shown in FIG. 55.

FIG. 63 is a graph on which the ESD resistances shown in FIG. 62 are reflected.

FIGS. 68A and 68B are schematic cross-sectional views for explanation of a backside polishing and dicing process shown in FIG. 66.

DETAILED DESCRIPTION OF THE INVENTION

Figure 1:
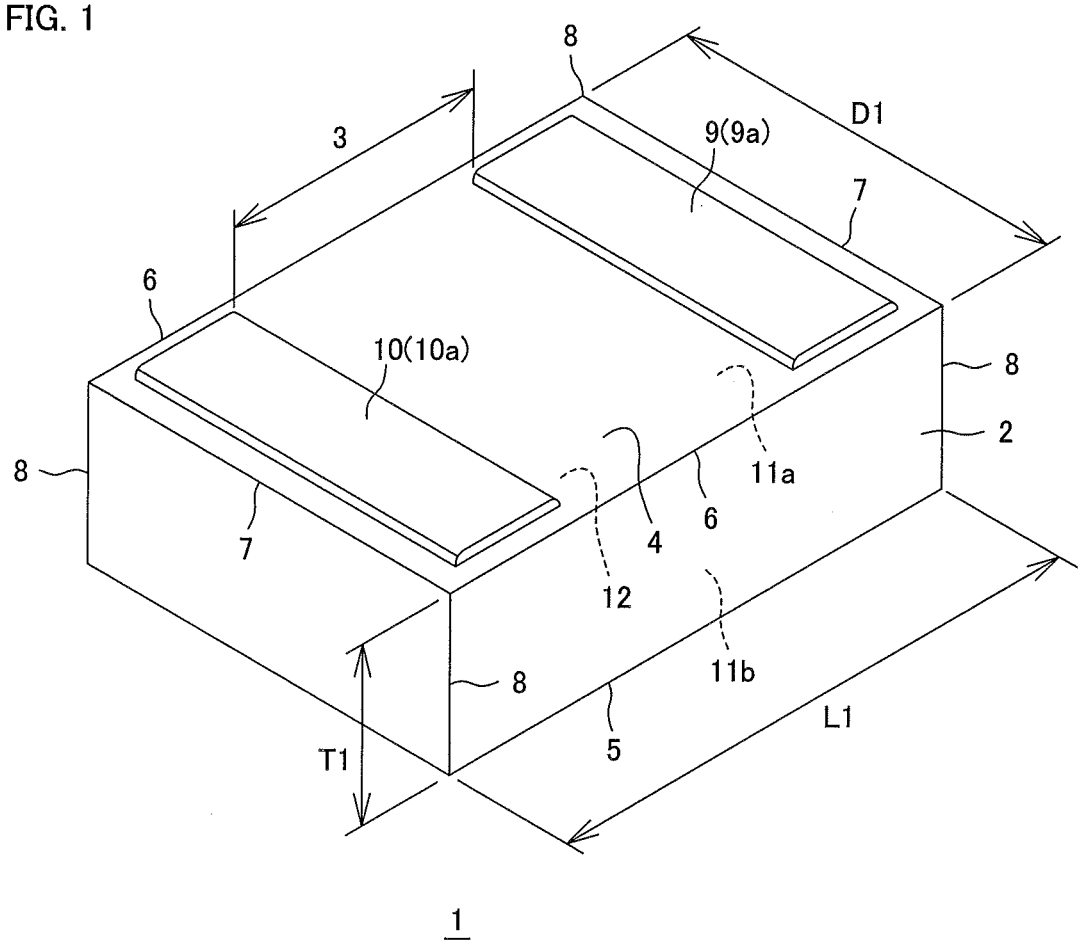
FIG. 1 is a schematic perspective view of a bidirectional Zener diode according to a preferred embodiment of the present invention.

A bidirectional Zener diode according to a preferred embodiment of the present invention includes a semiconductor substrate of a first conductivity type, a first electrode and a second electrode which are defined on the semiconductor substrate, and a plurality of diffusion regions of a second conductivity type, which are defined at intervals from one another on a surface portion of the semiconductor substrate, to define p-n junctions with the semiconductor substrate, and the plurality of diffusion regions include diode regions which are electrically connected to the first electrode and the second electrode, and pseudo-diode regions which are electrically isolated from the first electrode and the second electrode.

In accordance with this configuration, first Zener diodes whose cathodes are connected to the first electrode are defined in the diode regions electrically connected to the first electrode. Further, second Zener diodes whose cathodes are connected to the second electrode are defined in the diffusion regions electrically connected to the second electrode. The respective anodes of the first and second Zener diodes are connected in common to the semiconductor substrate. In this manner, because the first Zener diodes and the second Zener diodes are anti-series connected via the semiconductor substrate, the bidirectional Zener diode is configured between the first electrode and the second electrode.

On the other hand, in the pseudo-diode regions which are electrically isolated from the first electrode and the second electrode, pseudo-Zener diodes which are in the open state, and are therefore incapable of electrically operating are defined. That is, in accordance with this configuration, although parasitic capacitances in the first and second Zener diodes contribute to an increase in capacitance between terminals (the total capacitance between the first electrode and the second electrode), parasitic capacitances in the pseudo-diode regions hardly contribute to an increase in capacitance between terminals.

Accordingly, a component ratio of the diode regions which contribute to capacitance between terminals and the pseudo-diode regions which do not contribute to the capacitance between terminals is adjusted, thereby it is possible to adjust a value of capacitance between terminals within a predetermined range of a plurality of the diffusion regions. In addition, it is possible to adjust the respective numbers of diode regions and pseudo-diode regions in accordance with the connection or disconnection of the first electrode and the second electrode with respect to the plurality of diffusion regions without changing the array pattern of the respective diffusion regions. Therefore, even without application of great design change, it is possible to provide a bidirectional Zener diode which is capable of easily achieving a variety of capacitances between terminals for different purposes.

In the bidirectional Zener diode, the plurality of diffusion regions are preferably defined so as to respectively have the same area and the same depth.

In accordance with this configuration, it is possible to equalize all the parasitic capacitances in the respective diffusion regions. Therefore, it is possible to more precisely adjust the capacitance between terminals.

In the bidirectional Zener diode, the plurality of diffusion regions are preferably defined in a matrix shape.

In the bidirectional Zener diode, the plurality of diffusion regions are preferably defined so as to regularly align along the row direction or the column direction.

In the bidirectional Zener diode, the plurality of diffusion regions may be defined in a rectangular shape extending in the row direction.

It is preferable that the bidirectional Zener diode further includes an insulating film which covers the surface of the semiconductor substrate, and contact holes for selectively exposing the diode regions are defined in the insulating film.

In accordance with this configuration, the first electrode and the second electrode are defined so as to enter the contact holes in the diode regions. The first electrode and the second electrode define ohmic contacts with the diode regions. Thereby, the first Zener diodes and the second Zener diodes are defined. On the other hand, the first electrode and the second electrode face the pseudo-diode regions across the insulating film in the pseudo-diode regions. It is possible to adjust the presence or absence of contact holes by a layout of a mask in the manufacturing process. Therefore, at the same time of defining contact holes with one mask, to define the diode regions, it is possible to define pseudo-diode regions at portions where the contact holes are not defined. Thereby, it is possible to easily define the diode regions and the pseudo-diode regions.

In the bidirectional Zener diode, each of the contact holes is preferably defined so as to have a width narrower than a width of each of the diode regions.

In accordance with this configuration, because it is possible to connect the first electrode and the second electrode only to the diffusion regions (the diode regions) in the contact holes, it is possible to obtain a good contact.

In the bidirectional Zener diode, the first electrode includes a plurality of first extraction electrodes which cover the plurality of first diffusion regions, the second electrode includes a plurality of second extraction electrodes which cover the plurality of diffusion regions, and the first extraction electrodes and the second extraction electrodes may be defined in comb-teeth shapes engaging with each other.

In accordance with this configuration, because the plurality of first extraction electrodes and the plurality of second extraction electrodes are defined in comb-teeth shapes engaging with each other, it is possible to efficiently array the plurality of diffusion regions (the diode regions and the pseudo-diode regions.

In the bidirectional Zener diode, each of the first extraction electrodes and each of the second extraction electrodes are preferably defined so as to have a width wider than the width of each of the diffusion regions.

In accordance with this configuration, it is possible to favorably connect the first electrode and the second electrode to the diode regions.

In the bidirectional Zener diode, the diode regions and the pseudo-diode regions are preferably arrayed so as to be symmetrical.

In accordance with this configuration, it is possible to substantially equalize the electrical characteristics of the first Zener diodes, and the electrical characteristics of the second Zener diodes. Thereby, it is possible to substantially equalize the characteristics of a current flowing from the first electrode toward the second electrode, and the characteristics of a current flowing from the second electrode toward the first electrode. Symmetry includes point symmetry and line symmetry. Further, symmetry also includes a mode, which is not an exact symmetrical figure, but considered as being substantially symmetrical as long as the electrical characteristics are symmetrical.

In the bidirectional Zener diode, the semiconductor substrate has a rectangular shape including one end and the other end, and the first electrode and the second electrode may be respectively defined on the surfaces of the one end and the other end of the semiconductor substrate.

In the bidirectional Zener diode, the semiconductor substrate may have a rectangular shape whose corner portions are rounded.

In accordance with this configuration, because it is possible to reduce or prevent chipping of the corner portions of the bidirectional Zener diode, it is possible to provide a bidirectional Zener diode with less possibility of poor appearance.

In the bidirectional Zener diode, the semiconductor substrate may be a p-type semiconductor substrate, and the diffusion regions may be n-type diffusion regions.

In accordance with this configuration, because the semiconductor substrate is a p-type semiconductor substrate, it is possible to achieve stable characteristics even without defining an epitaxial layer on the semiconductor substrate. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because a p-type semiconductor substrate has a small in-plane resistivity variation, it is possible to cut a bidirectional Zener diode with stable characteristics out of any place of the p-type semiconductor substrate without defining an epitaxial layer. Therefore, by use of the p-type semiconductor substrate, it is possible to simplify the manufacturing process, and reduce the manufacturing cost.

Hereinafter, modes according to a preferred embodiment and Reference Examples (Reference Examples 1 to 4) of the present invention will be described concretely with reference to the accompanying drawings.

<Preferred Embodiment>

FIG. 1 is a schematic perspective view of a bidirectional Zener diode 1 according to a preferred embodiment of the present invention.

As shown in FIG. 1, the bidirectional Zener diode 1 is a micro chip component, and includes a semiconductor substrate 2 constituting a main body portion.

The semiconductor substrate 2 is defined in a substantially rectangular shape having one end portion and the other end portion, and a rectangular element region 3 in which a plurality of diodes are defined, is set in an interior portion of a surface thereof. Hereinafter, the plane on which the element region 3 is set is called an element forming surface 4, and the plane on the opposite side thereof is called a back surface 5.

With respect to a planar shape of the semiconductor substrate 2, a length L1 of a long side 6 along the longitudinal direction is 0.3 mm to 0.6 mm, and a length D1 of a short side 7 along the short direction is 0.15 mm to 0.3 mm. Further, a thickness Ti of the semiconductor substrate 2 is, for example, 0.1 mm. That is, as the semiconductor substrate 2, so-called a 0603 chip, a 0402 chip, a 03015 chip, or the like is applied.

Respective corner portions 8 of the semiconductor substrate 2 may be round shapes, which are chamfered in planar view. With the round shapes, the semiconductor substrate is structured to be able to reduce chipping in the manufacturing process or at the time of mounting. A first connection electrode 9a of a first electrode 9 and a second connection electrode 10a of a second electrode 10 are defined on one end portion side and the other end portion side of the element forming surface 4 of the semiconductor substrate 2.

The first connection electrode 9a and the second connection electrode 10a are defined at an interval from one another so as to sandwich the element region 3 from the one end portion side and the other end portion side of the element forming surface 4. The first connection electrode 9a and the second connection electrode 10a are defined in substantially rectangular shapes in planar view along the short side 7 of the semiconductor substrate 2.

In addition, in the semiconductor substrate 2, the respective entire areas of the element forming surface 4 and the side surfaces are covered with passivation films 11a, 11b. Further, a resin film 12 is defined so as to cover the entire area of the passivation film 11a on the element forming surface 4. Therefore, in the strict sense, in FIG. 1, the respective entire areas of the element forming surface 4 and the side surfaces are located on the insides (rear sides) of the passivation films 11a, 11b and the resin film 12, and are therefore not exposed to the outside. The passivation films 11a, 11b, and the resin film 12 will be hereinafter described in detail.

Figure 2:
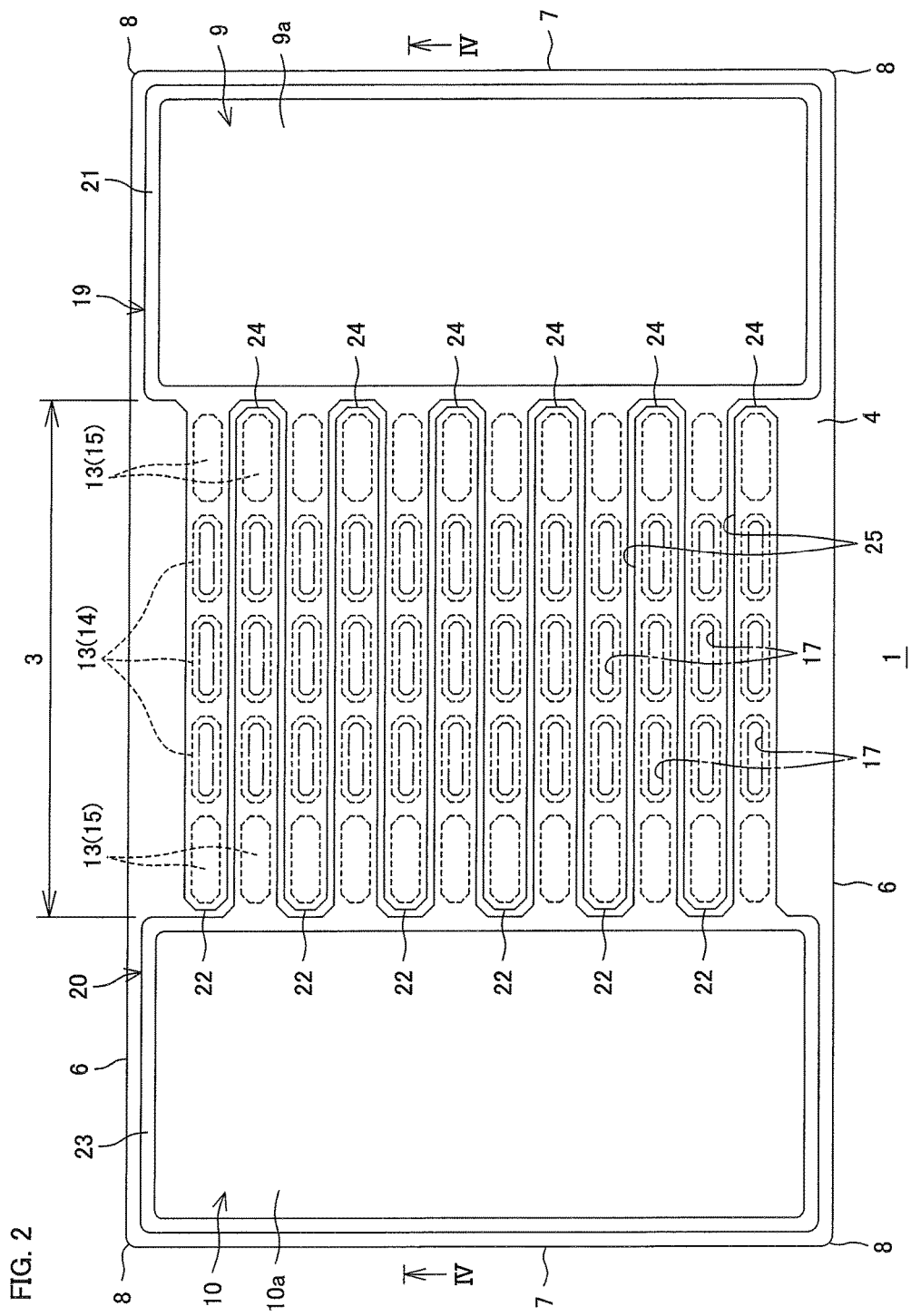
FIG. 2 is a schematic plan view of the bidirectional Zener diode shown in FIG. 1.
Figure 3:
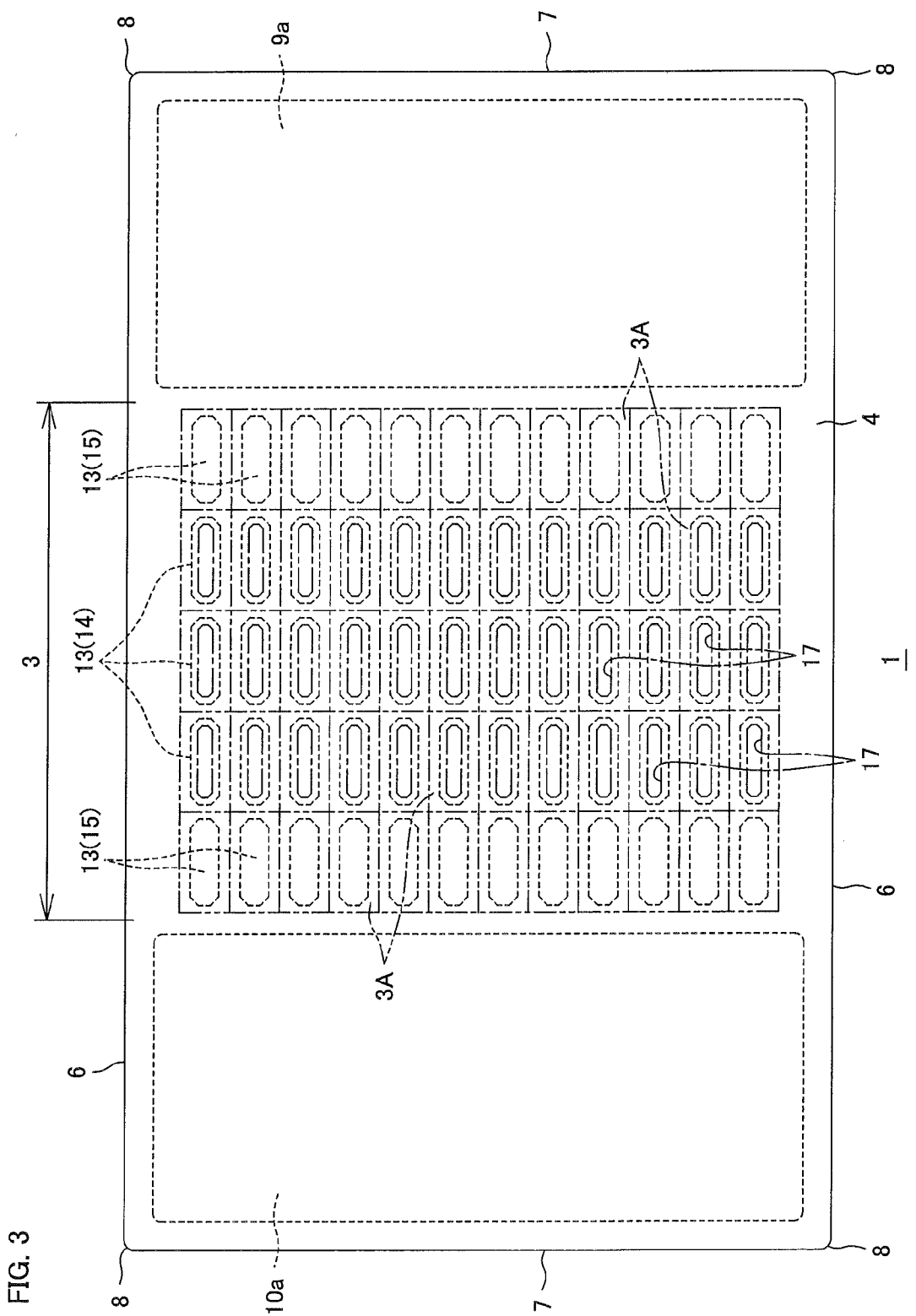
FIG. 3 is a plan view showing an arrangement of the diffusion regions shown in FIG. 2.
Figure 4:
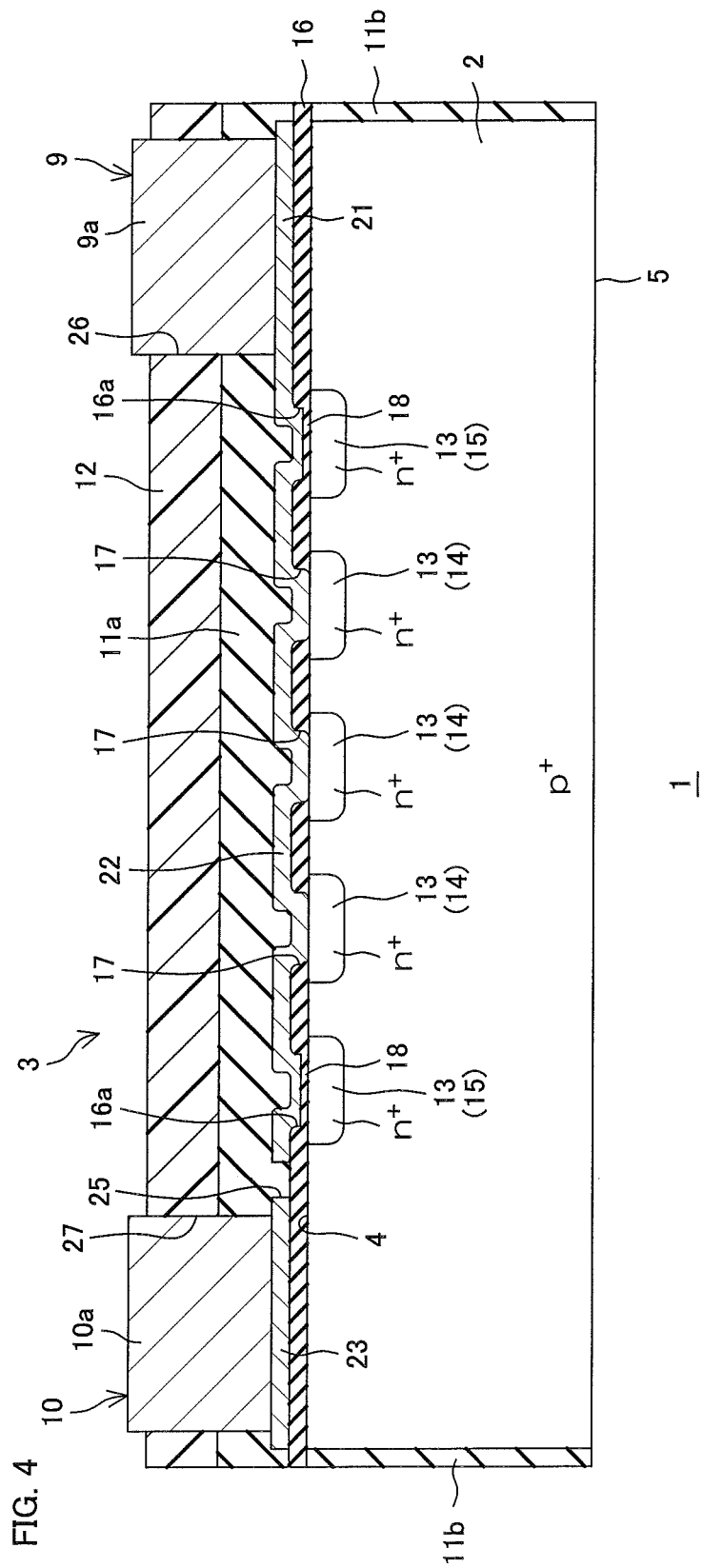
FIG. 4 is a cross-sectional view taken along the cross-section line IV-IV shown in FIG. 2.

FIG. 2 is a schematic plan view of the bidirectional Zener diode 1 shown in FIG. 1. FIG. 3 is a plan view showing an arrangement of $n^+$-type diffusion regions 13 (diode regions 14 and pseudo-diode regions 15) shown in FIG. 2. FIG. 4 is a cross-sectional view taken along the cross-section line IV-IV shown in FIG. 2. In addition, FIGS. 2 to 4 illustrate an arrangement example of the $n^+$-type diffusion regions 13 (the diode regions 14 and the pseudo-diode regions 15) as the representative example.

The semiconductor substrate 2 is the $p^+$-type semiconductor substrate 2 (silicon substrate). A plurality of the $n^+$-type diffusion regions 13 are defined on the surface portion (the element forming surface 4) of the semiconductor substrate 2 in the element region 3. The plurality of $n^+$-type diffusion regions 13 are defined so as to have the same depth and the same impurity concentration, and define p-n junctions with the semiconductor substrate 2. As shown in FIG. 3, the plurality of $n^+$-type diffusion regions 13 are defined so as to regularly align in the element region 3.

More specifically, in the element region 3, a plurality of cells 3A which are partitioned in a matrix shape along the row direction and the column direction (the cells 3A composed of 12 rows×5 columns=60 measures in the preferred embodiment) are set in the element region 3.

The respective cells 3A are partitioned into substantially rectangular shapes in planar view, and the $n^+$-type diffusion regions 13 are defined one by one in the interior portions thereof. That is, the respective $n^+$-type diffusion regions 13 are arrayed at intervals from one another along the row direction and the column direction. The respective $n^+$-type diffusion regions 13 which are adjacent to one another in the row direction and the column direction are defined parallel to one another along the row direction and the column direction.

The $n^+$-type diffusion regions 13 are defined in substantially rectangular shapes in planar view so as to extend along the row direction in the respective cells 3A. More specifically, each of the $n^+$-type diffusion regions 13 is defined in substantially rectangular shapes having the same area, whose four corners are cut off. In addition, the cells 3A are virtual regions which are determined in order to regularly arrange the plurality of $n^+$-type diffusion regions 13, and as a matter of course, a plurality of the cells 3A composed of 12 rows×5 columns or more may be set in the element region 3.

In the element region 3, the plurality of $n^+$-type diffusion regions 13 include diode regions 14 which are electrically connected to the first and second connection electrodes 9a, 10a, and pseudo-diode regions 15 which are electrically isolated from the first and second connection electrodes 9a, 10a. Based on the definition of the first column, the second column, . . . and the fifth column as being from the second connection electrode 10a side toward the first connection electrode 9a side, in this arrangement example, the diode regions 14 are set on the second column to the fourth column, and the pseudo-diode regions 15 are set on the first column and the fifth column.

As shown in FIG. 4, an insulating film 16 (not shown in FIGS. 1 to 3) is defined on the element forming surface 4 of the semiconductor substrate 2. The insulating film 16 is, for example, a silicon oxide film. Contact holes 17 for selectively exposing the diode regions 14 are defined in the insulating film 16 (refer to the dashed-dotted lines in FIGS. 2 and 3 as well). Each of the contact holes 17 is defined so as to have a width narrower than the width of each of the $n^+$-type diffusion regions 13. More specifically, the contact hole 17 is defined at a position at a regular interval from the peripheral edge portion of the $n^+$-type diffusion region 13 on the interior region side of the $n^+$-type diffusion region 13.

On the other hand, thin-film portions 18 that the insulating film 16 is selectively thinned are defined on the portions on the pseudo-diode regions 15 in the insulating film 16. The thin-film portions 18 define concave portions 16a in the insulating film 16. The first electrode 9 and the second electrode 10 are defined on the insulating film 16.

The first electrode 9 includes the first connection electrode 9a, and a first electrode film 19 electrically connected to the first connection electrode 9a. The first electrode film 19 further has a first pad 21, and first extraction electrodes 22 which are defined integrally with the first pad 21.

The first pad 21 is defined in a substantially rectangular shape in planar view on the one end portion side of the element forming surface 4. The first connection electrode 9a is connected to the first pad 21. This allows the first extraction electrodes 22 to be electrically connected to the first connection electrode 9a via the first pad 21.

The first extraction electrodes 22 are defined linearly along the row direction from the first pad 21. More specifically, the first extraction electrodes 22 are defined linearly from the first pad 21 toward the odd rows in the element region 3. That is, the first extraction electrodes 22 are defined in a comb-teeth shape. The first extraction electrodes 22 are defined so as to have a width wider than the width of the $n^+$-type diffusion regions 13 (the diode regions 14 and the pseudo-diode regions 15), and are defined so as to cover the $n^+$-type diffusion regions 13 arrayed in the row direction. The first extraction electrodes 22 have a uniform width throughout from the $n^+$-type diffusion regions 13 up to the first pad 21. The leading end portions of the first extraction electrodes 22 are defined in substantially rectangular shapes whose corner portions are cut off, and are arranged at positions close to the second electrode 10 at an interval therefrom, across the first column in the element region 3.

The first extraction electrodes 22 covering the diode regions 14 enter the contact holes 17, to define ohmic contacts with the diode regions 14. That is, the diode regions 14 are electrically connected to the first connection electrode 9a via the first extraction electrodes 22. On the other hand, the first extraction electrodes 22 covering the pseudo-diode regions 15 enter the concave portions 16a of the insulating film 16, and face the pseudo-diode regions 15 across the thin-film portions 18. That is, the pseudo-diode regions 15 are in a state in which the surfaces thereof are covered with the insulating film 16 (the thin-film portions 18), and therefore electrically isolated from the first connection electrode 9a.

The second electrode 10 includes the second connection electrode 10a, and a second electrode film 20 electrically connected to the second connection electrode 10a. The second electrode film 20 further has a second pad 23, and second extraction electrodes 24 which are defined integrally with the second pad 23.

The second pad 23 is defined in a substantially rectangular shape in planar view on the other end portion side (the end portion opposite to the first pad 21) of the element forming surface 4. The second connection electrode 10a is connected to the second pad 23. This allows the second extraction electrodes 24 to be electrically connected to the second connection electrode 10a via the second pad 23.

The second extraction electrodes 24 are defined linearly along the row direction from the second pad 23. More specifically, the second extraction electrodes 24 are defined linearly from the second pad 23 toward the even rows in the element region 3. That is, the second extraction electrodes 24 are defined in a comb-teeth shape along the longitudinal direction of the first extraction electrodes 22. Accordingly, the first and second electrode films 19, 20 are defined in the comb-teeth shapes such that the first and second extraction electrodes 22, 24 engage with each other.

Further, the second extraction electrodes 24 are defined so as to have a width wider than the width of the $n^+$-type diffusion regions 13 (the diode regions 14 and the pseudo-diode regions 15), and are defined so as to cover the $n^+$-type diffusion regions 13 arrayed in the row direction. The second extraction electrodes 24 have a uniform width throughout from the $n^+$-type diffusion regions 13 up to the second pad 23. The leading end portions of the second extraction electrodes 24 are defined in substantially rectangular shapes whose corner portions are cut off, and are arranged at positions close to the first electrode 9 at an interval therefrom, across the fifth column in the element region 3.

The second extraction electrodes 24 covering the diode regions 14 enter the contact holes 17, to define ohmic contacts with the diode regions 14. That is, the diode regions 14 are electrically connected to the second connection electrode 10a via the second extraction electrodes 24. On the other hand, the second extraction electrodes 24 covering the pseudo-diode regions 15 enter the concave portions 16a of the insulating film 16, and face the pseudo-diode regions 15 across the thin-film portions 18. That is, the pseudo-diode regions 15 are in a state in which the surfaces thereof are covered with the insulating film 16 (the thin-film portions 18), and therefore electrically isolated from the second connection electrode 10*a*.

The first and second electrode films 19, 20 are composed of the same conductive material, and for example, Al, AlCu, AlSiCu, or the like may be exemplified. The first and second electrodes 9, 10 are electrically isolated by slits 25 rimming the respective peripheral edge portions of the first and second extraction electrodes 22, 24 on the insulating film 16.

The passivation film 11*a* and the resin film 12 are defined in this order so as to cover the first and second electrode films 19, 20 on the insulating film 16. Further, the passivation film 11*b* is defined on the side surfaces of the semiconductor substrate 2. The passivation films 11*a*, 11*b* are composed of, for example, silicon nitride, and the resin film 12 is composed of, for example, polyimide.

The passivation films 11*a*, 11*b* and the resin film 12 constitute a protective film, that reduces or prevents moisture intrusion into the first and second extraction electrodes 22, 24 and the element forming surface 4, and absorbs impact and the like from the outside, which contributes to improvement in durability of the bidirectional Zener diode.

Pad openings 26, 27 for selectively exposing the first and second pads 21, 23 are defined in the passivation film 11*a* and the resin film 12. The first and second connection electrodes 9*a*, 10*a* are defined so as to backfill the pad openings 26, 27. The first and second connection electrodes 9*a*, 10*a* are composed of a single-layer conductive material (for example, an Ni layer). The first and second connection electrodes 9*a*, 10*a* are defined so as to protrude from the surface of the resin film 12.

Next, the sizes of the diode region 14 and the pseudo-diode region 15 will be described concretely with reference to FIG. 5.

Figure 5:
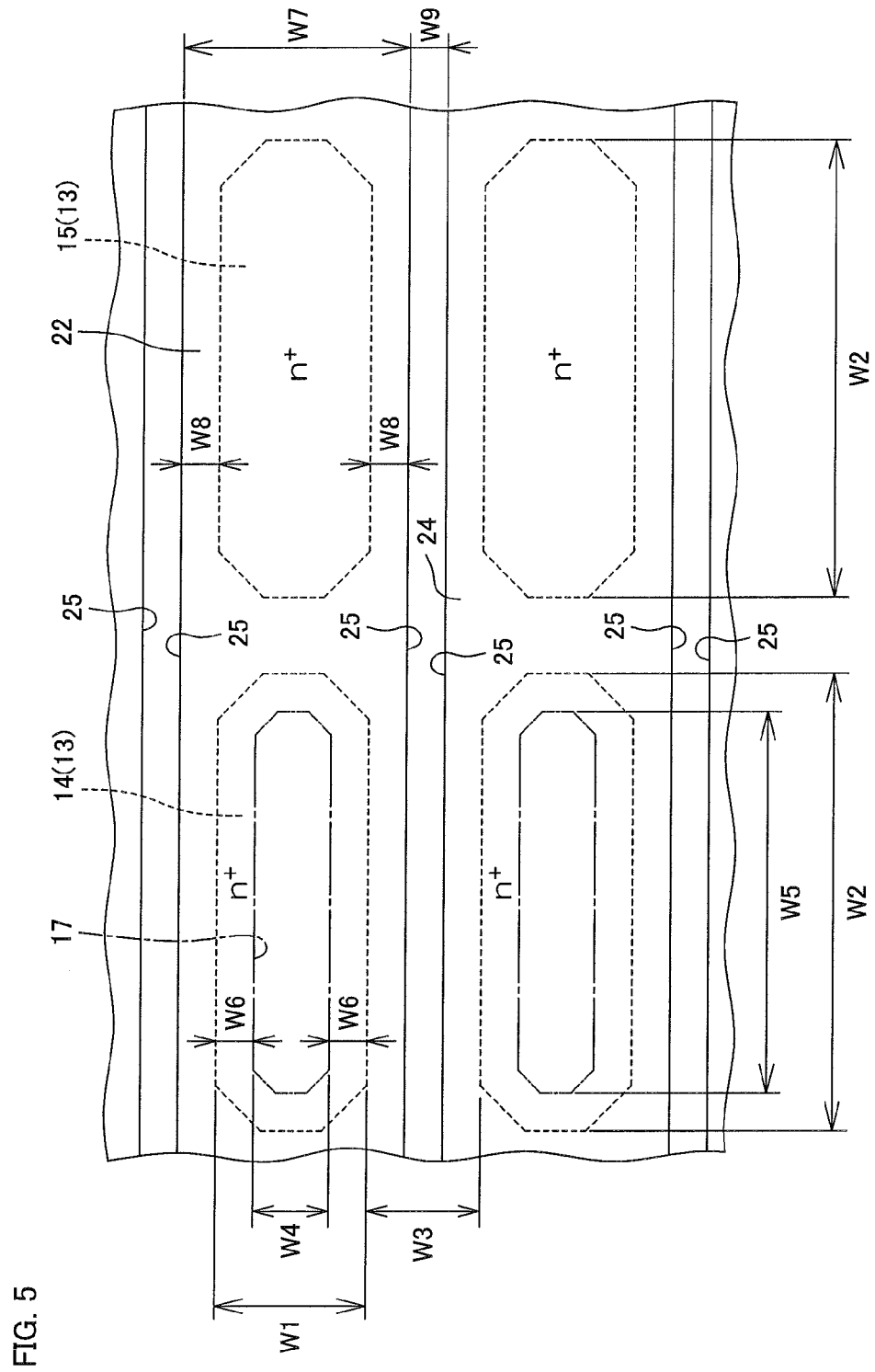
FIG. 5 is an enlarged plan view of a region including the diffusion regions shown in FIG. 3.

FIG. 5 is an enlarged plan view of a region including the $n^+$-type diffusion regions 13 (the diode regions 14 and the pseudo-diode regions 15) shown in FIG. 3.

As shown in FIG. 5, a width W1 in the column direction of the diode region 14 and the pseudo-diode region 15 is 5 µm to 15 µm (9 µm in the preferred embodiment), and a width W2 in the row direction is 20 µm to 40 µm (28.8 µm in the preferred embodiment). Further, a width W3 between the respective diode regions 14 and a width W3 between the respective pseudo-diode regions 15 may be 5 µm to 25 µm.

Further, a width W4 in the column direction of the contact hole 17 is 1 µm to 10 µm (4 µm in the preferred embodiment), and a width W5 in the row direction is 10 µm to 30 µm (23.8 µm in the preferred embodiment). In the planar view, a width W6 from the peripheral edge portion of the $n^+$-type diffusion region 13 to the peripheral edge portion of the contact hole 17 may be approximately 2.5 µm.

Further, each width W7 in the column direction of the first and second extraction electrodes 22, 24 is 10 µm to 20 µm (14 µm in the preferred embodiment). In this planar view, a width W8 from the respective peripheral edge portions of the diode regions 14 and the pseudo-diode regions 15 to the slits 25 of the first and second extraction electrodes 22, 24 may be approximately 2.5 µm. Further, a width W9 between the slits 25 may be 3 µm to 10 µm.

Next, the electrical structure of the bidirectional Zener diode 1 will be described with reference to FIGS. 6A and 6B.

Figure 6A:
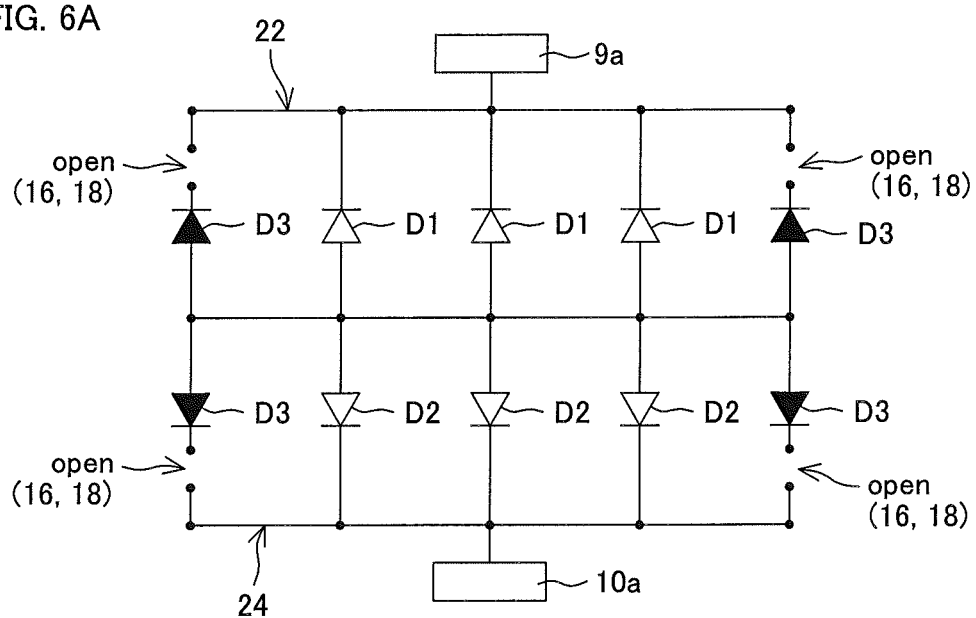
FIG. 6A is an electrical circuit diagram for explanation of the electrical structure of the bidirectional Zener diode shown in FIG. 2.
Figure 6B:
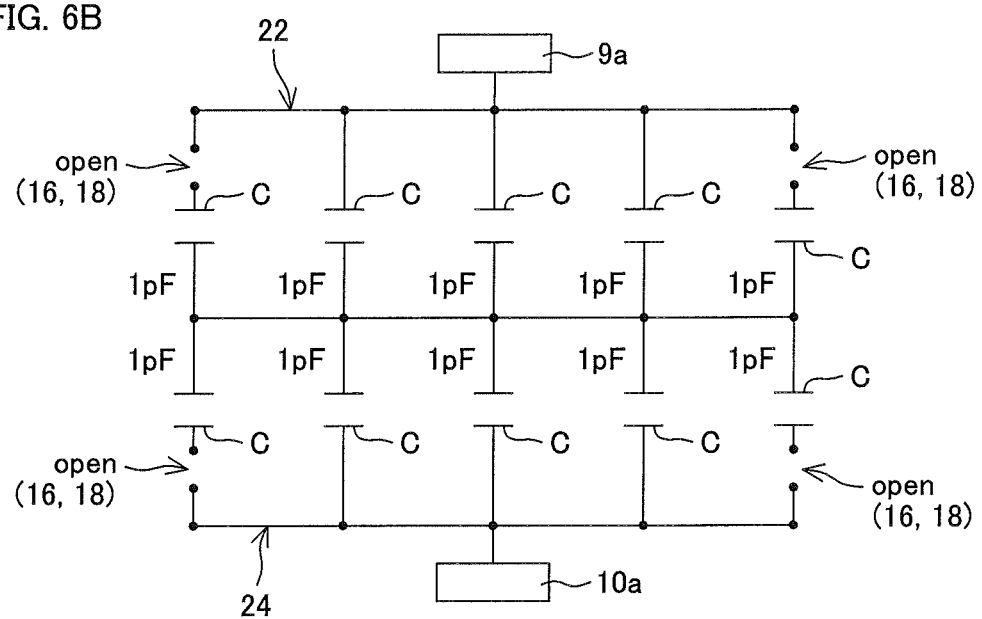
FIG. 6B is a diagram for explanation of the capacitance between terminals of the bidirectional Zener diode shown in FIG. 2.

FIG. 6A is an electrical circuit diagram for explanation of the electrical structure of the bidirectional Zener diode 1 shown in FIG. 2, and FIG. 6B is a diagram for explanation of the capacitance between terminals $C_t$ (the total capacitance between the first electrode 9 and the second electrode 10) shown in FIG. 2. In addition, FIGS. 6A and 6B are diagrams that a pair of the first and second extraction electrodes 22, 24 adjacent to one another is extracted, to be remade into electrical circuit diagrams.

As shown in FIG. 6A, first Zener diodes D1 are defined in the diode regions 14 electrically connected to the first connection electrode 9*a*. The cathodes of the respective first Zener diodes D1 are connected in common to the first connection electrode 9*a* (cathode common). Further, second Zener diodes D2 are defined in the diode regions 14 electrically connected to the second connection electrode 10*a*. The cathodes of the respective second Zener diodes D2 are connected in common to the second connection electrode 10*a* (cathode common).

The respective anodes of the first and second Zener diodes D1, D2 are connected in common to the semiconductor substrate 2 (anode common). In this manner, the first Zener diodes D1 and the second Zener diodes D2 are anti-series connected via the semiconductor substrate 2.

On the other hand, pseudo-Zener diodes D3 are defined in the pseudo-diode regions 15 which are electrically isolated from the first and second connection electrodes 9*a*, 10*a* by the insulating film 16 (the thin-film portions 18) (refer to FIG. 4). The anode sides of the pseudo-Zener diodes D3 are connected in common to the first and second Zener diodes D1, D2 at the semiconductor substrate 2 (anode common). On the other hand, the cathode sides of the pseudo-Zener diodes D3 are electrically open-circuited by the insulating film 16 (the thin-film portions 18). That is, the pseudo-Zener diodes D3 are incapable of electrically operating.

In this manner, the single bidirectional Zener diode 1 is composed of the first and second Zener diodes D1, D2, and the pseudo-Zener diodes D3.

As shown in FIG. 6B, respectively, five capacitors C serving as parasitic capacitances are connected in parallel to the first and second extraction electrodes 22, 24. In the preferred embodiment, all the $n^+$-type diffusion regions 13 (the diode regions 14 and the pseudo-diode regions 15) have capacitance components equal to one another (1 pF in the preferred embodiment).

Because the parasitic capacitances of the pseudo-diode regions 15 are electrically open-circuited, those can be discarded. Accordingly, the first and second extraction electrodes 22, 24 respectively have the parasitic capacitances of 3 pF. Further, a pair of the first and second extraction electrodes 22, 24 is connected in series to one another. Accordingly, the pair of first and second extraction electrodes 22, 24 has parasitic capacitance of 1.5 pF.

In the preferred embodiment, as shown in FIG. 2, six pairs of the first and second extraction electrodes 22, 24 are connected in parallel. Accordingly, in the case of the representative example shown in FIG. 2, the capacitance between terminals $C_t$, which is 1.5 pF×6 pairs=9.0 pF is obtained as a theoretical value.

In this manner, in theory, although the parasitic capacitances in the first and second Zener diodes D1, D2 contribute to an increase in capacitance between terminals $C_t$, the parasitic capacitances in the pseudo-Zener diodes D3 do not contribute to an increase in capacitance between terminals $C_t$. Accordingly, it is clear that a component ratio of the diode regions 14 and the pseudo-diode regions 15 is adjusted, thereby it is possible to adjust a value of capacitance between terminals $C_t$ within a predetermined range of a plurality of the $n^+$-type diffusion regions 13.

The preferred embodiment adjusts the capacitance between terminals $C_t$ by increasing and decreasing the number of the pseudo-diode regions 15 (the pseudo-Zener diodes D3) with respect to all the $n^+$-type diffusion regions 13. FIG. 7 show Arrangement Examples of the diode regions 14 and the pseudo-diode regions 15 in the case where the number of the pseudo-diode regions 15 (the pseudo-Zener diodes D3) is increased and decreased.

FIG. 7 are schematic plan views for explanation of arrangement examples of the diode regions 14 and the pseudo-diode regions 15.

FIGS. 7A to 7F are plan views sequentially showing Arrangement Example 1, Arrangement Example 2, . . . and Arrangement Example 6. In addition, Arrangement Example 4 shown in FIG. 7D is the above-described representative example.

In Arrangement Example 1 shown in FIG. 7A, the diode regions 14 are set only on the third column, that is, only in the central portion of the element region 3, and the pseudo-diode regions 15 are set on the other columns. A theoretical value of the capacitance between terminals $C_t$ in Arrangement Example 1 is 3 pF.

In Arrangement Examples 2, 3 shown in FIGS. 7B and 7C, the diode regions 14 are set on the second column and the fourth column of the element region 3 as well. The larger number of the diode regions 14 is set in the order of Arrangement Examples 2, 3. A theoretical value of the capacitance between terminals $C_t$ in Arrangement Example 2 is 5.3 pF, and a theoretical value of the capacitance between terminals $C_t$ in Arrangement example 3 is 7 pF.

In the arrangement examples shown in Arrangement Examples 5, 6 shown in FIGS. 7E and 7F, the diode regions 14 are set on the first column and the fifth column of the element region 3 as well. The larger number of the diode regions 14 is set in the order of Arrangement Examples 5, 6. A theoretical value of the capacitance between terminals $C_t$ in Arrangement Example 5 is 11 pF, and a theoretical value of the capacitance between terminals $C_t$ in Arrangement Example 6 is 14 pF.

Further, as shown in FIGS. 7A to 7F, the diode regions 14 and the pseudo-diode regions 15 in respective Arrangement Examples 1 to 6 are all defined so as to regularly align along the row direction or the column direction.

Further, with reference to respective Arrangement Examples 1 to 6, the respective $n^+$-type diffusion regions 13 are configured so as to be symmetrical to one another in planar view. More specifically, the diode regions 14 and the pseudo-diode regions 15 are configured so as to be point-symmetrical with respect to the central portion (for example, the center of gravity) of the element forming surface 4 in planar view. That is, in the case where the semiconductor substrate 2 is rotated by 180 degrees around a predetermined vertical axis line perpendicular to the element forming surface 4, the positions of the diode regions 14 and the pseudo-diode regions 15 correspond to the positions of the diode regions 14 and the pseudo-diode regions 15 before the rotation. Further, with reference to Arrangement Examples 1, 4, the diode regions 14 and the pseudo-diode regions 15 are defined so as to be line-symmetrical to one another with respect to a straight line passing through the third row in planar view.

In accordance with these symmetrical structures, it is possible to make the electrical characteristics between the first electrode 9 and the second electrode 10 symmetrical. That is, it is possible to substantially equalize the voltage-current characteristics in the case where a voltage is applied with the first connection electrode 9a serving as a positive electrode and the second connection electrode 10a serving as a negative electrode, and the voltage-current characteristics in the case where a voltage is applied with the second connection electrode 10a serving as a positive electrode and the first connection electrode 9a serving as a negative electrode.

Figures 8, 9:
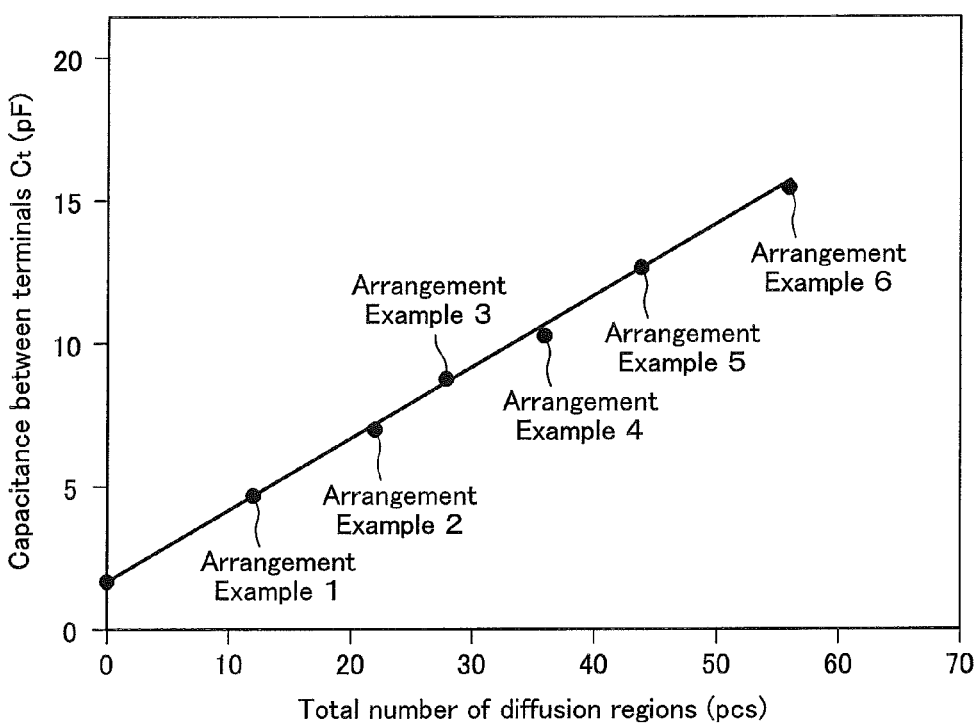
FIG. 8 is a table showing the areas of diffusion regions, and the capacitances between terminals of respective Arrangement Examples shown in FIG. 7.
FIG. 9 is a graph on which the results of FIG. 8 are reflected.

Checking the respective capacitances between terminals $C_t$ of Arrangement Examples 1 to 6 shown in FIGS. 7A to 7F leads to the results shown in FIGS. 8 and 9.

FIG. 8 is a table showing the areas of the $n^+$-type diffusion regions 13, and the capacitances between terminals $C_t$ in respective Arrangement Examples 1 to 6 shown in FIG. 7. FIG. 9 is a graph on which the results of FIG. 8 are reflected.

As shown in FIGS. 8 and 9, the capacitance between terminals $C_t$ increases according to the larger number of the diode regions 14 being set. Further, the capacitance between terminals $C_t$ in the case where the $n^+$-type diffusion regions 13 are not defined at all is 1.71 pF. When this capacitance between terminals $C_t$ (=1.71 pF) is added to the respective theoretical values, the results substantially corresponding to the measured values were obtained (for example, in the case of Arrangement Example 1, 1.71 pF+3.0 pF=4.71 pF-4.69 pF).

As described above, in accordance with the preferred embodiment, the single bidirectional Zener diode 1 is defined from the plurality of first and second Zener diodes D1, D2 which electrically operate, and the plurality of pseudo-Zener diodes D3 which are incapable of electrically operating.

Although the respective parasitic capacitances of the first and second Zener diodes D1, D2 contribute to an increase in capacitance between terminals $C_t$, the parasitic capacitances of the pseudo-diode regions 15 hardly contribute to an increase in capacitance between terminals $C_t$. Accordingly, a component ratio of the diode regions 14 contributing to the capacitance between terminals $C_t$, and the pseudo-diode regions 15 which do not contribute to the capacitance between terminals $C_t$ is adjusted, thereby it is possible to adjust a value of the capacitance between terminals $C_t$ within a predetermined range of a plurality of the $n^+$-type diffusion regions 13.

In addition, it is possible to adjust the respective numbers of the diode regions 14 and the pseudo-diode regions 15 in accordance with the connection or disconnection of the first electrode 9 and the second electrode 10 with respect to the respective $n^+$-type diffusion regions 13 without changing the array pattern of the respective $n^+$-type diffusion regions 13. Therefore, even without application of great design change, it is possible to provide the bidirectional Zener diode 1 which is capable of easily achieving a variety of capacitances between terminals $C_t$ for different purposes.

Further, in accordance with this configuration, because the respective capacitance components (the parasitic capacitances) of the $n^+$-type diffusion regions 13 are set to 1 pF, it is possible to adjust the capacitance between terminals $C_t$ of the bidirectional Zener diode 1 in units of [pF]. Therefore, it is possible to precisely adjust the capacitance between terminals ($C_t$) in accordance with the specifications of application and the purposes for which the bidirectional Zener diode 1 is used.

Further, because the semiconductor substrate 2 is a p-type semiconductor substrate, it is possible to achieve stable characteristics even without defining an epitaxial layer on the semiconductor substrate 2. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because the p-type semiconductor substrate 2 has a small in-plane resistivity variation, it is possible to cut a bidirectional Zener diode with stable characteristics out of any place of the p-type semiconductor substrate 2 without defining an epitaxial layer. Therefore, by use of the p-type semiconductor substrate 2, it is possible to simplify the manufacturing process, and reduce the manufacturing cost.

Next, an example of the manufacturing process of the bidirectional Zener diode 1 will be described with reference to FIGS. 10 to 13.

Figure 10:
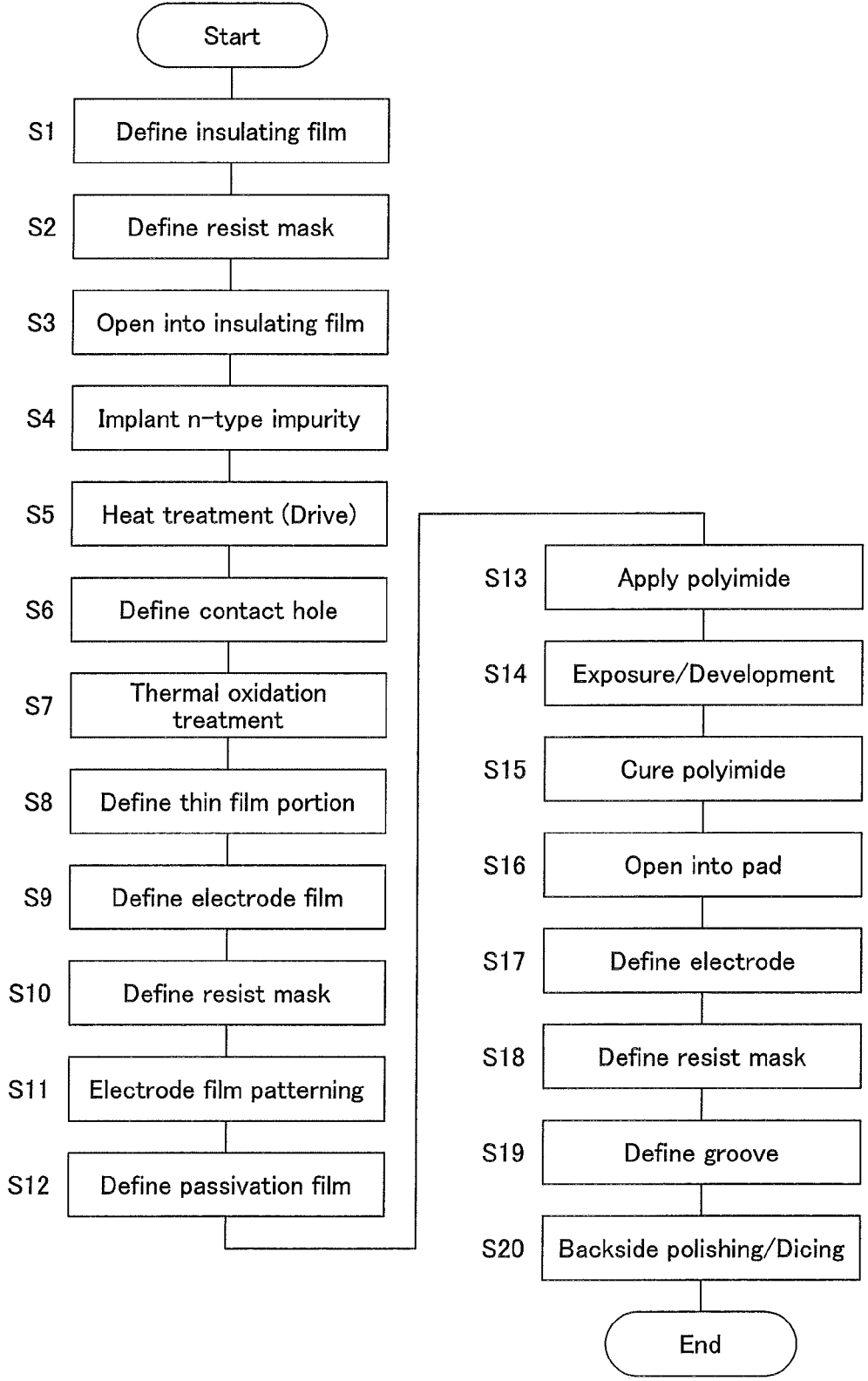
FIG. 10 is a flowchart for explanation of an example of the manufacturing process of the bidirectional Zener diode shown in FIG. 1.

FIG. 10 is a flowchart for explanation of an example of the manufacturing process of the bidirectional Zener diode 1 shown in FIG. 1.

Figure 11:
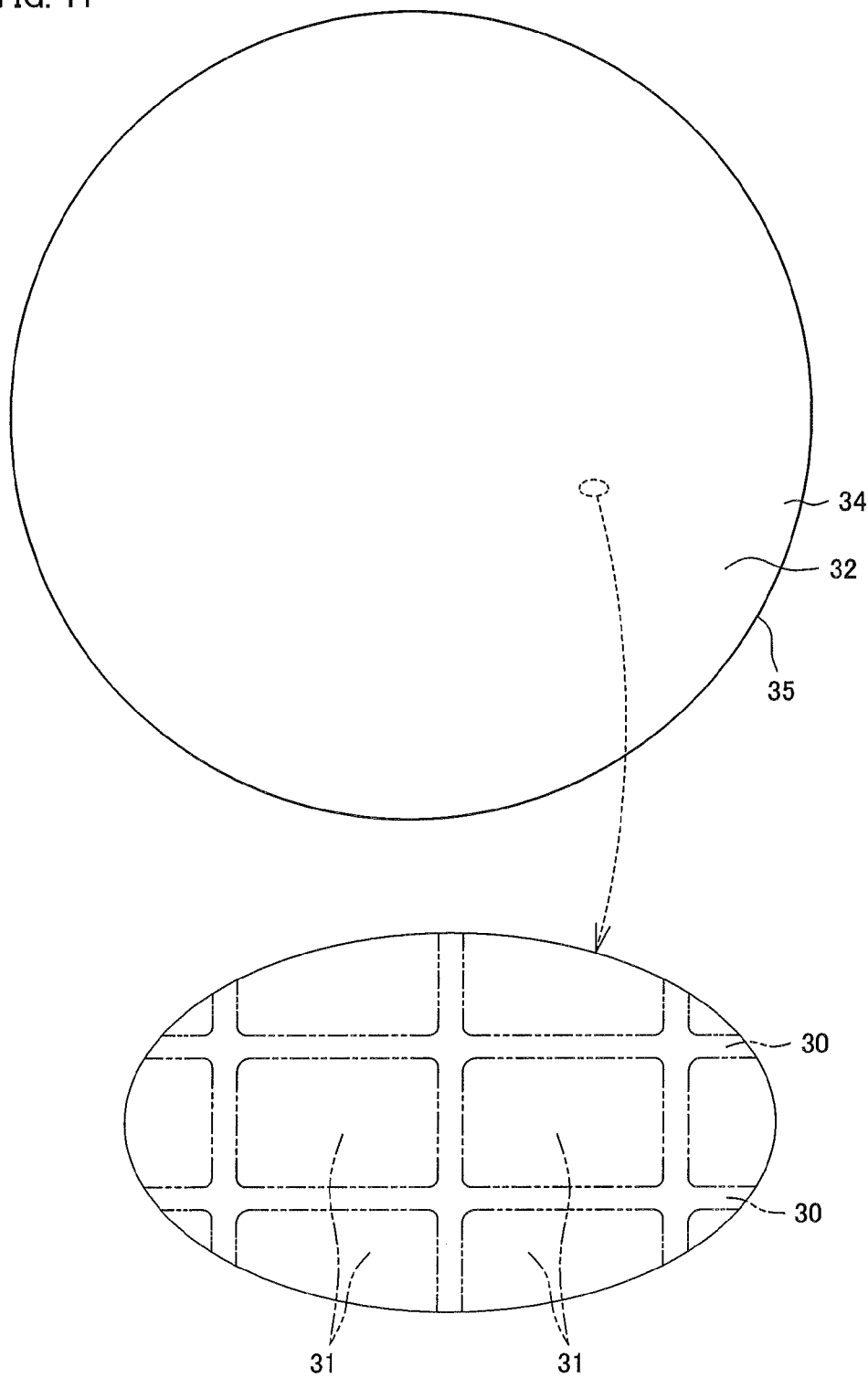
FIG. 11 is a schematic plan view of a semiconductor wafer which is applied to the manufacturing process of FIG. 10.

FIG. 11 is a schematic plan view of a semiconductor wafer 32, which is applied to the manufacturing process of FIG. 10. FIGS. 12A to 12D are schematic cross-sectional views for explanation of one process in the manufacturing process shown in FIG. 10. FIGS. 13A and 13B are schematic cross-sectional views for explanation of a backside polishing and dicing process shown in FIG. 10. In addition, in FIGS. 12A to 12D, the regions in which the diode region 14 and the pseudo-diode region 15 are defined are partially enlarged to be shown. Further, in FIGS. 13A and 13B, the illustrations of the n$^+$-type diffusion regions 13 are omitted.

First, as shown in FIG. 11, the p$^+$-type semiconductor wafer 32 as a base substrate of the semiconductor substrate 2 is prepared. A surface 34 of the semiconductor wafer 32 corresponds to the element forming surface 4 of the semiconductor substrate 2, and a back surface 35 of the semiconductor wafer 32 corresponds to the back surface 5 of the semiconductor substrate 2.

Chip regions 31 in which a plurality of the bidirectional Zener diodes 1 are defined, are set so as to align in a matrix shape on the surface of the semiconductor wafer 32. A boundary region 30 is provided between the chip regions 31 adjacent to one another. The boundary region 30 is a band-shaped region having a substantially constant width, and extends in two directions perpendicular to one another, to be defined in a lattice shape.

Figure 12A:
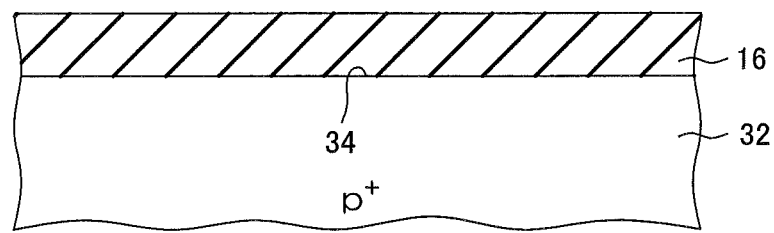
FIGS. 12A to 12D are schematic cross-sectional views for explanation of one process in the manufacturing process shown in FIG. 10.
Figure 13A:
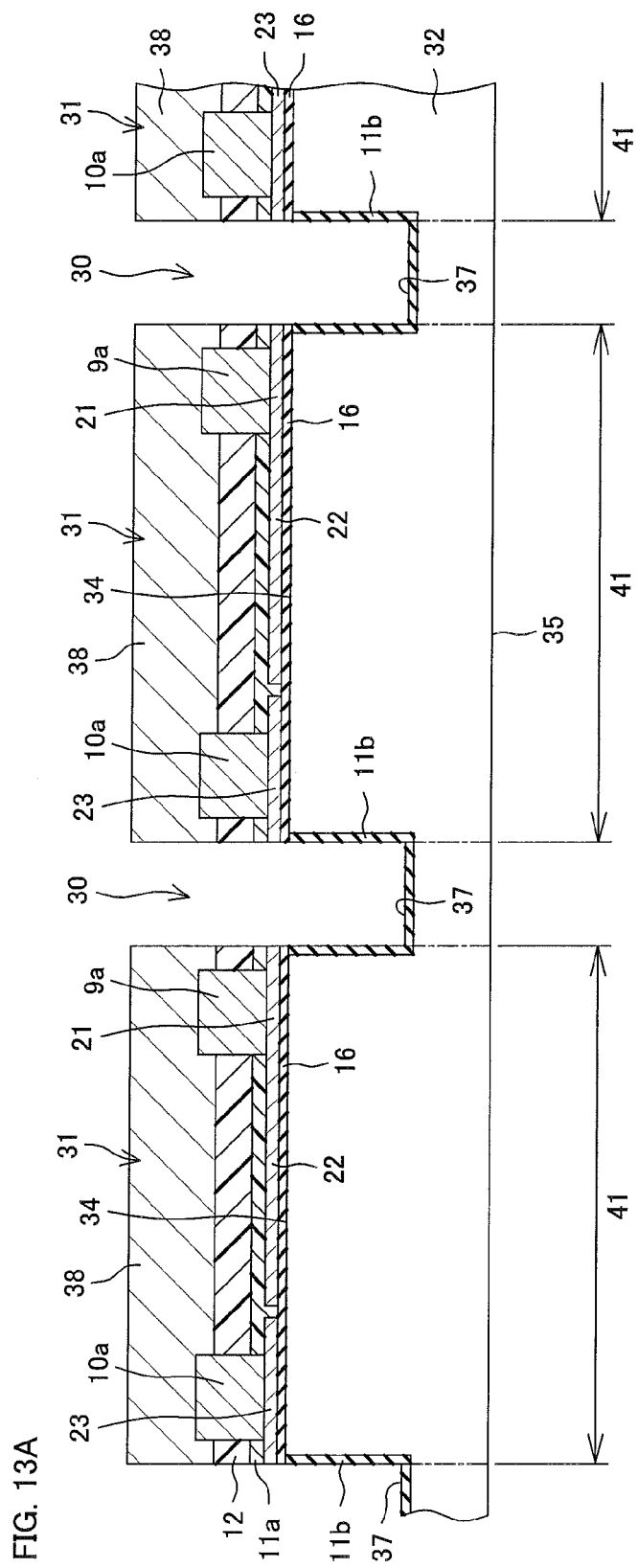
FIGS. 13A and 13B are schematic cross-sectional views for explanation of a backside polishing and dicing process shown in FIG. 10.
Figure 13B:
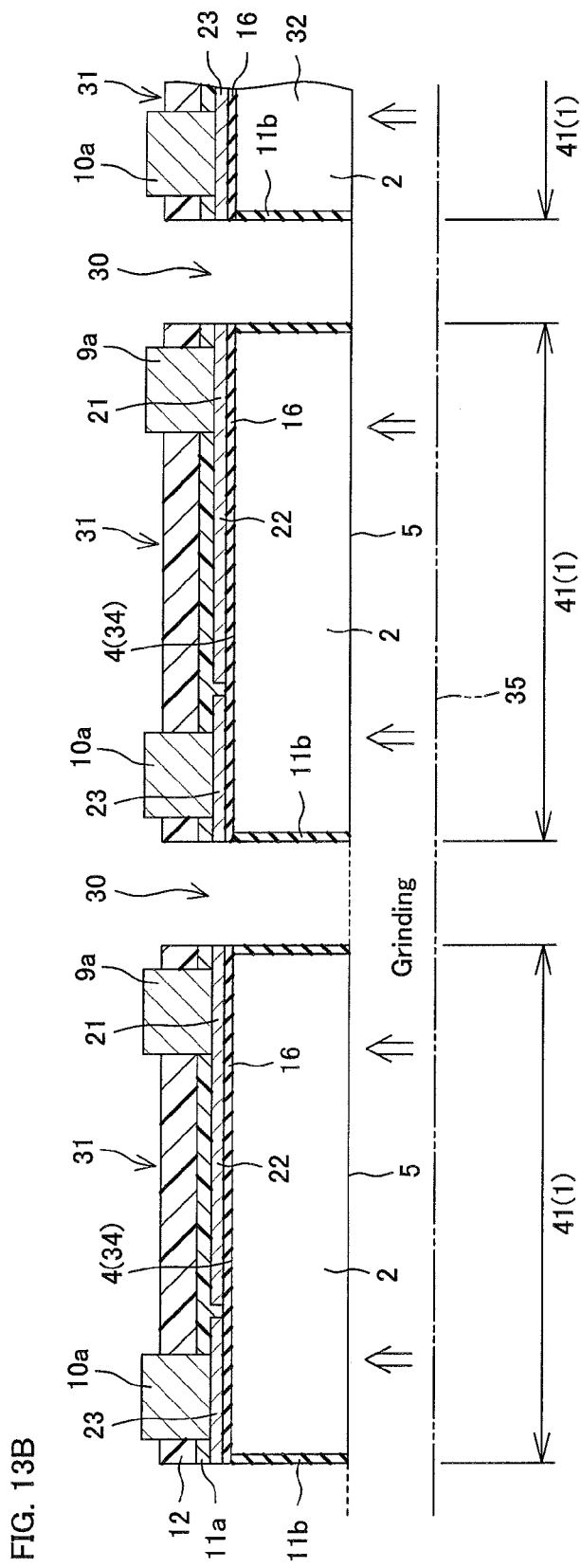

Next, as shown in FIG. 12A, the insulating film 16 is defined on the surface 34 of the semiconductor wafer 32 (Step S1: Define insulating film). Next, a resist mask is defined on the insulating film 16 (Step S2: Define resist mask). Openings 33 corresponding to the plurality of n$^+$-type diffusion regions 13 are defined in the insulating film 16 by etching by use of this resist mask (Step S3: Open insulating film).

Figure 12B:
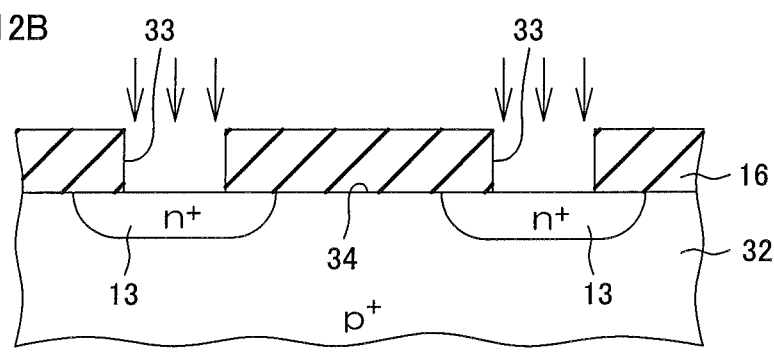

Next, as shown in FIG. 12B, after the resist mask is peeled off, an n-type impurity is implanted into the surface 34 of the semiconductor wafer 32 which is exposed from the openings 33 defined in the insulating film 16 (Step S4: Implant n-type impurity). Implantation of the n-type impurity may be performed by the process of depositing phosphorus as the n-type impurity on the surface (so-called phosphorus deposition), or may be performed by implantation of n-type impurity ions (for example, phosphorus ions).

Next, after the insulating film 16 is made into a thick film by a CVD method as needed, a heat treatment (drive) for activation of the impurity ions implanted into the semiconductor wafer 32 is performed (Step S5: Heat treatment (drive)). Thereby, the plurality of n$^+$-type diffusion regions 13 on the surface portion of the semiconductor wafer 32 are defined.

Next, a resist mask having openings corresponding to the contact holes 17 are defined on the insulating film 16 (Step S6: Define contact hole). The contact holes 17 are defined in the insulating film 16 by etching via the resist mask. Thereafter, the resist mask is peeled off.

Figure 12C:
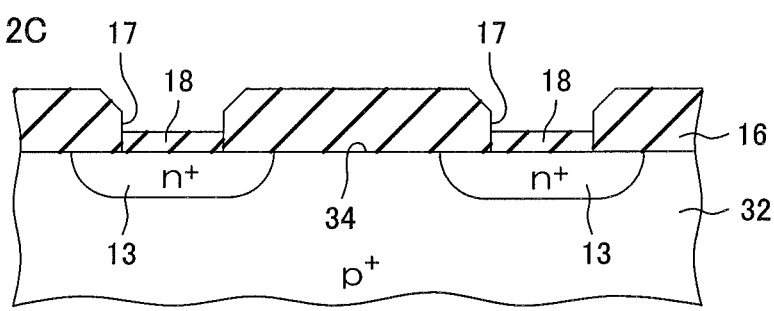

Next, as shown in FIG. 12C, a thermal oxidation treatment is applied to the surface of the semiconductor wafer 32 (Step S7: Thermal oxidation treatment). Thereby, the thin-film portions 18 integrally continuing to the insulating film 16 in the surfaces of the respective n$^+$-type diffusion regions 13 exposed from the contact holes 17 are defined.

Figure 12D:
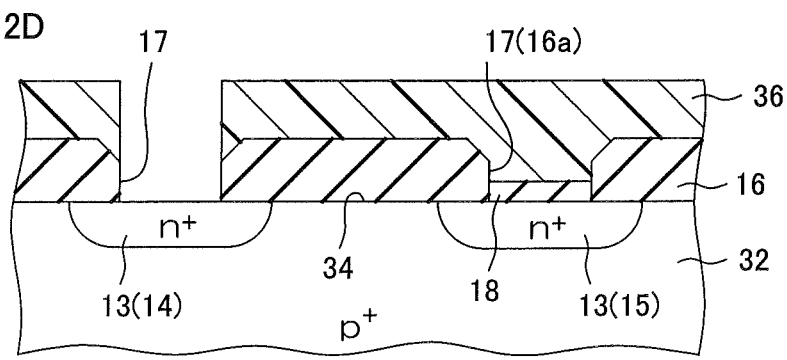

Next, as shown in FIG. 12D, a resist mask 36 selectively covering regions to be the pseudo-diode regions 15 among the plurality of n$^+$-type diffusion regions 13 is defined on the insulating film 16. Next, by etching via the resist mask 36 (Step S8: Define thin-film portion), the thin-film portions 18 covering the respective n$^+$-type diffusion regions 13 (the diode regions 14) is removed. Thereby, the concave portions 16a and the contact holes 17 in the insulating film 16 are defined. Further, simultaneously, the diode regions 14 electrically connected to the first and second electrodes 9, 10, and the pseudo-diode regions 15 electrically isolated from the first and second electrodes 9, 10 are defined in the following process.

Next, an electrode film constituting the first and second electrode films 19, 20 is defined on the insulating film 16 by, for example, sputtering (Step S9: Define electrode film). In the preferred embodiment, an electrode film composed of Al is defined. Then, a resist mask having an opening pattern corresponding to the slits 25 is defined on the electrode film (Step S10: Define resist mask). The slits 25 are defined in the electrode film by etching (for example, reactive ion etching) via the resist mask (Step S11: Electrode film patterning). This separates the electrode film into the first and second electrode films 19, 20.

Next, after the resist mask is peeled off, the passivation film 11a such as a nitride film is defined by, for example, a CVD method (Step S12: Define passivation film). Next, the resin film 12 is defined by application of photosensitive polyimide or the like (Step S13: Apply polyimide). Next, the resin film 12 is exposed through a pattern corresponding to the pad openings 26, 27. Thereafter, the resin film 12 is developed (Step S14: Exposure/development process).

Next, as needed, a heat treatment for curing the resin film 12 is performed (Step S15: Cure polyimide). Then, the passivation film 11a is removed by dry etching (for example, reactive ion etching) with the resin film 12 serving as a mask (Step S16: Open pad). Thereby, the pad openings 26, 27 are defined.

Next, for example, a conductive material (for example, an Ni layer) is plated to form a film so as to backfill the pad openings 26, 27 (Step S17: Define electrode). Thereby, the first and second connection electrodes 9a, 10a are defined.

Next, as shown in FIG. 13A, a resist pattern 38 for a groove for cutting 37 is defined in the boundary region 30 (refer to FIG. 11 as well) (Step S18: Define resist mask). The resist pattern 38 has a grid-shaped opening corresponding to the boundary region 30. Plasma etching is performed via the resist pattern 38 (Step S19: Define groove). Accordingly, the semiconductor wafer 32 is etched from the surface up to a predetermined depth, to define the groove for cutting 37 along the boundary region 30.

Half-finished products 41 are located one by one in the chip regions 31 surrounded by the groove for cutting 37, and these half-finished products 41 are arranged so as to align in a matrix shape. By defining the groove for cutting 37 in this manner, it is possible to separate the semiconductor wafer 32 into the plurality of chip regions 31. After the groove for cutting 37 is defined, the resist pattern is peeled off.

Next, the passivation film 11b composed of silicon nitride is defined on the surface of the semiconductor wafer 32 by a CVD method. At this time, the passivation film 11b is defined on the entire area of the inner circumferential surface (the bottom surface and the side surfaces) of the groove for cutting 37.

Next, as shown in FIG. 13B, the semiconductor wafer 32 is polished from the back surface 35 side, so as to reach the bottom surface of the groove for cutting 37 (Step S20: Backside polishing/Dicing). Thereby, it is possible to obtain the bidirectional Zener diodes 1 that the plurality of chip regions 31 are diced into pieces. In this manner, provided that the semiconductor wafer 32 is polished from the back surface 35 side after the groove for cutting 37 is defined, it is possible to simultaneously dice the plurality of chip regions 31 defined on the semiconductor wafer 32 into pieces. Therefore, it is possible to achieve the improvement in productivity of the bidirectional Zener diodes 1 due to shortening of the manufacturing time. In addition, the back surface 5 of the completed semiconductor substrate 2 may be mirrored by polishing or etching, so as to clear the back surface 5.

As described above, in accordance with this manufacturing process, by merely changing the layout of the resist mask 36 (refer to FIG. 12D) used at the time of removing the thin-film portions 18, it is possible to set the diode regions 14 and the pseudo-diode regions 15. Further, by such a change of the layout, it is possible to define the pseudo-diode regions 15 at the portions on which the contact holes 17 are not defined at the same time of defining the diode regions 14. Thereby, it is possible to easily define the diode regions 14 and the pseudo-diode regions 15.

Therefore, because it is possible to easily adjust a component ratio of the diode regions 14 contributing to the capacitance between terminals $C_t$, and the pseudo-diode regions 15 which do not contribute to the capacitance between terminals $C_t$, it is possible to easily adjust a value of the capacitance between terminals $C_t$ within a predetermined range of a plurality of the n$^+$-type diffusion regions 13.

In addition, in the above-mentioned manufacturing process, in the contact hole defining process in Step S6, the method of defining the contact holes 17 for exposing all the n$^+$-type diffusion regions 13 has been described. However, the contact holes 17 for selectively exposing only the diode regions 14 may be defined. In accordance with this manufacturing process, the thermal oxidation treatment process in Step S7 and the thin-film portion defining process in Step S8 may be omitted.

REFERENCE EXAMPLE 1

Figure 14:
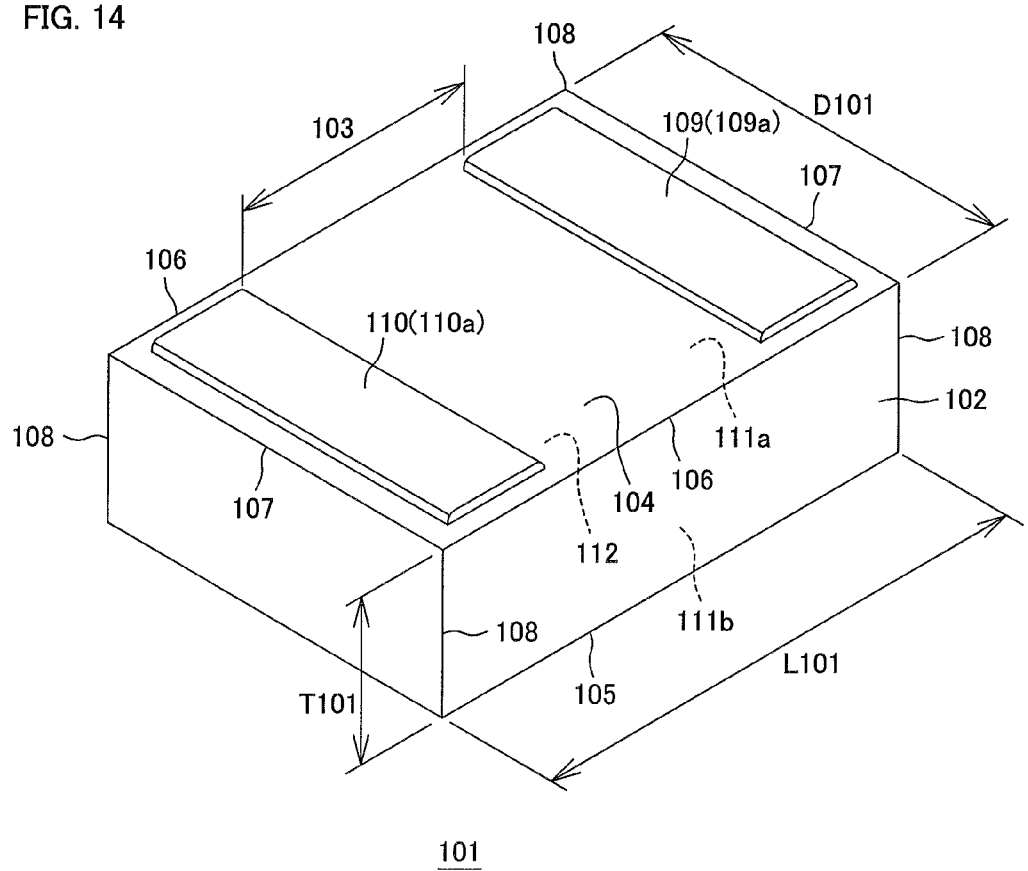
FIG. 14 is a schematic perspective view of a bidirectional Zener diode according to Reference Example 1.

FIG. 14 is a schematic perspective view of a bidirectional Zener diode 101 according to Reference Example 1.

As shown in FIG. 14, the bidirectional Zener diode 101 is a minute chip part, and includes a semiconductor substrate 102 constituting a main body portion.

The semiconductor substrate 102 is defined in a substantially rectangular shape having one end portion and the other end portion, and a rectangular element region 103 in which a plurality of diodes are defined, is set in an interior portion of a surface thereof. Hereinafter, the plane on which the element region 103 is set is called an element forming surface 104, and the plane on the opposite side thereof is called a back surface 105.

With respect to a planar shape of the semiconductor substrate 102, a length L101 of a long side 106 along the longitudinal direction is 0.3 mm to 0.6 mm, and a length D101 of a short side 107 along the short direction is 0.15 mm to 0.3 mm. Further, a thickness T101 of the semiconductor substrate 102 is, for example, 0.1 mm. That is, as the semiconductor substrate 102, so-called a 0603 chip, a 0402 chip, a 03015 chip, or the like is applied.

Respective corner portions 108 of the semiconductor substrate 102 may be round shapes, which are chamfered in planar view. The round shapes are capable of reducing chipping in the manufacturing process or at the time of mounting. A first connection electrode 109a of a first electrode 109 and a second connection electrode 110a of a second electrode 110 are defined on one end portion side and the other end portion side of the element forming surface 104 of the semiconductor substrate 102.

The first connection electrode 109a and the second connection electrode 110a are defined at an interval from one another so as to sandwich the element region 103 from the one end portion side and the other end portion side of the element forming surface 104. The first connection electrode 109a and the second connection electrode 110a are defined in substantially rectangular shapes in planar view along the short side 107 of the semiconductor substrate 102.

In addition, in the semiconductor substrate 102, the respective entire areas of the element forming surface 104 and the side surfaces are covered with passivation films 111a and 111b. Further, a resin film 112 is defined so as to cover the entire area of the passivation film 111a on the element forming surface 104. Therefore, in the strict sense, in FIG. 14, the respective entire areas of the element forming surface 104 and the side surfaces are located on the insides (the rear sides) of the passivation films 11a and 111b and the resin film 112, and are therefore not exposed to the outside. The passivation films 111a and 111b, and the resin film 112 will be hereinafter described in detail.

Figure 15:
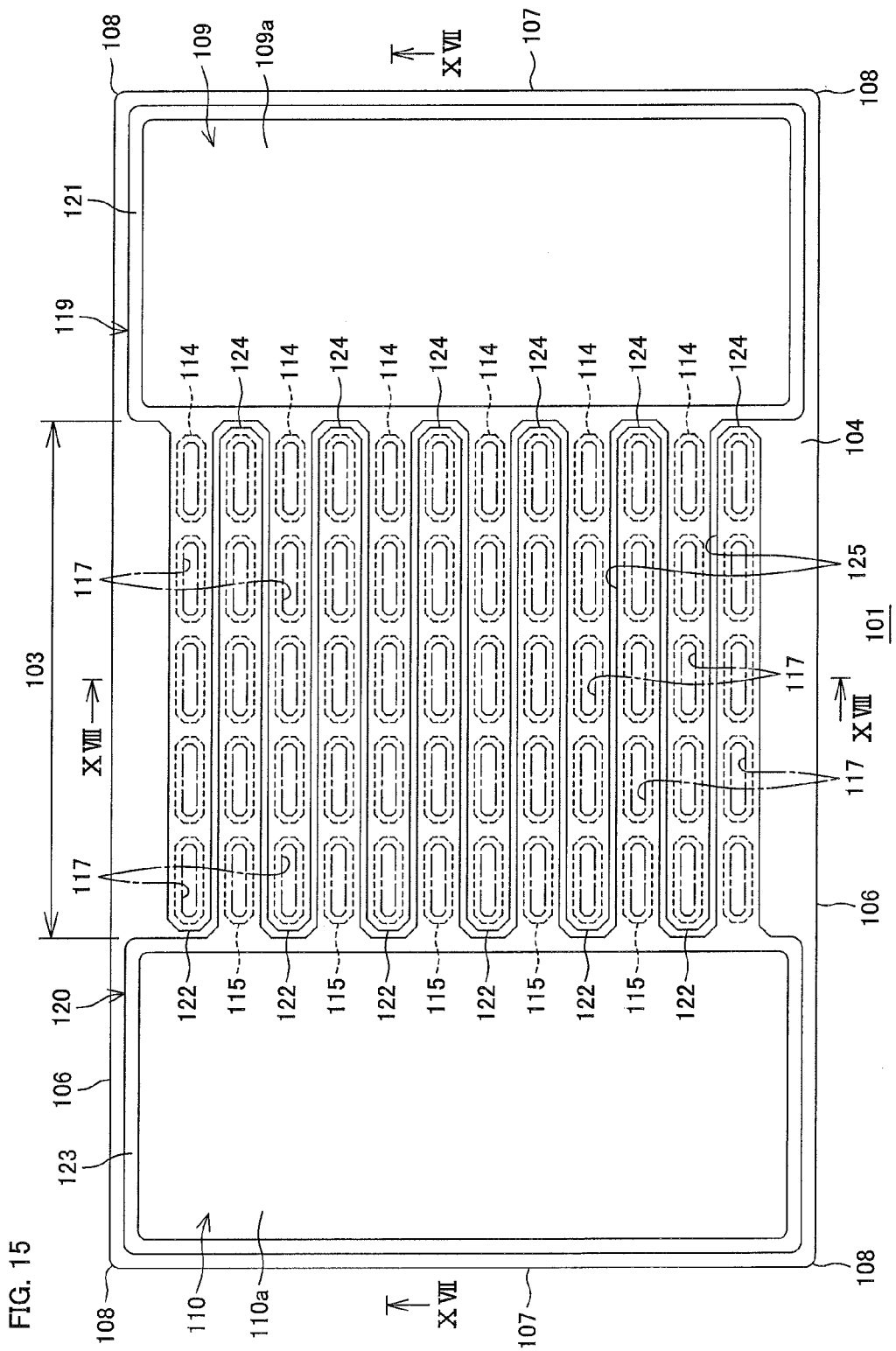
FIG. 15 is a schematic plan view of the bidirectional Zener diode shown in FIG. 14.
Figure 16:
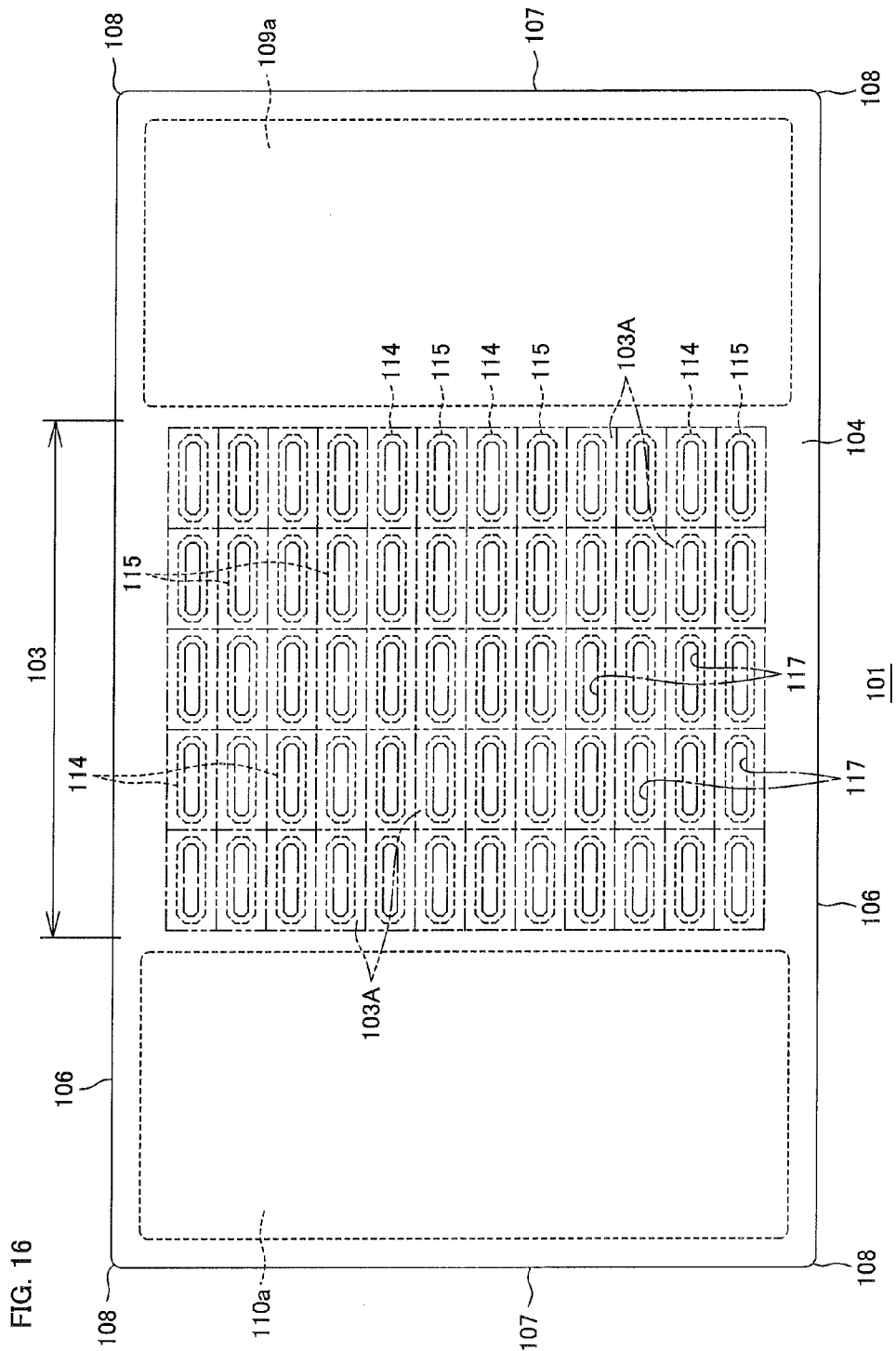
FIG. 16 is a plan view showing an arrangement of the diffusion regions shown in FIG. 15.
Figure 17:
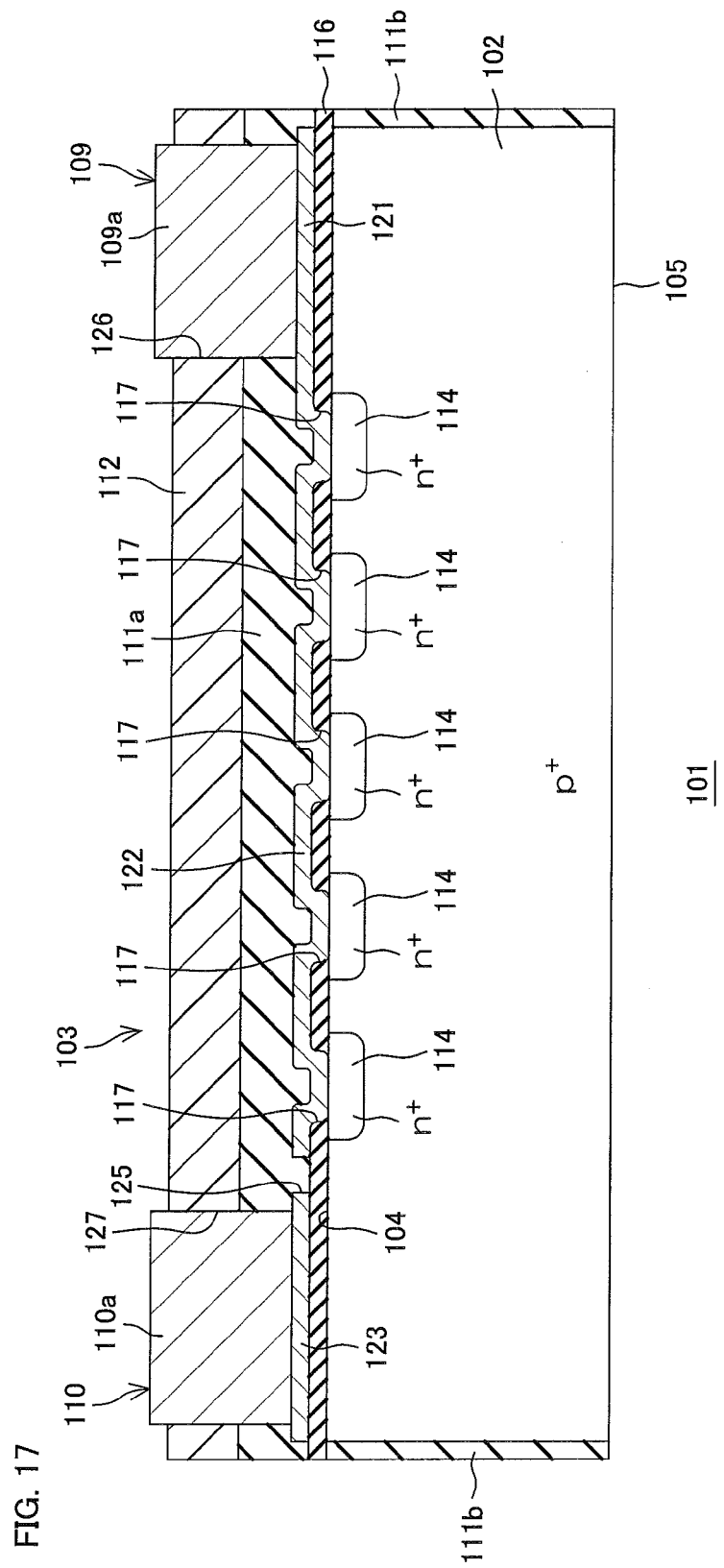
FIG. 17 is a cross-sectional view taken along the cross-section line XVII-XVII shown in FIG. 15.
Figure 18:
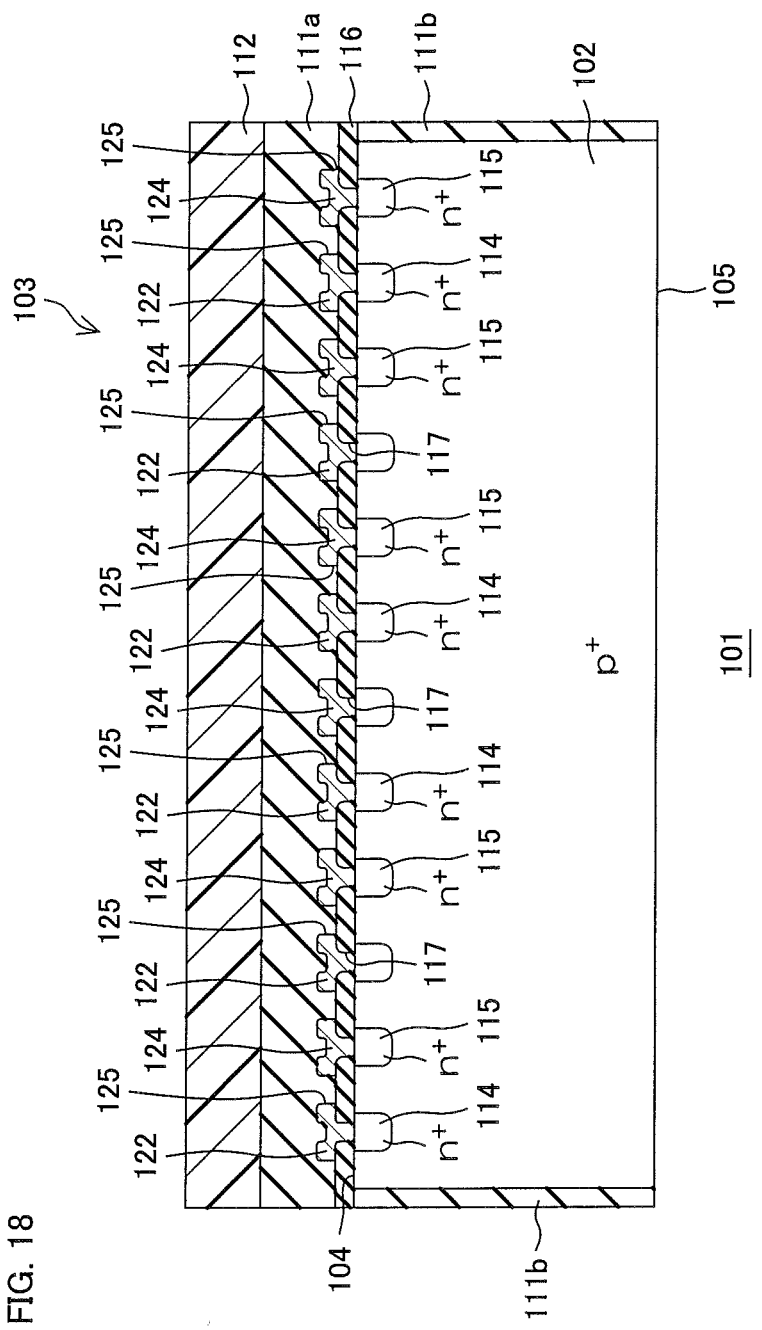
FIG. 18 is a cross-sectional view taken along the cross-section line XVIII-XVIII shown in FIG. 15.

FIG. 15 is a schematic plan view of the bidirectional Zener diode 101 shown in FIG. 14. FIG. 16 is a plan view showing an arrangement of first diffusion regions 114 and second diffusion regions 115 shown in FIG. 15. FIG. 17 is a cross-sectional view taken along the cross-section line XVII-XVII shown in FIG. 15. FIG. 18 is a cross-sectional view taken along the cross-section line XVIII-XVIII shown in FIG. 15. In addition, FIGS. 15 to 18 illustrate an arrangement example of the first diffusion regions 114 and the second diffusion regions 115 as the representative example.

The semiconductor substrate 102 is the p$^+$-type semiconductor substrate 102 (silicon substrate). A plurality of the n$^+$-type first diffusion regions 114 and a plurality of the n$^+$-type second diffusion regions 115 are defined on the surface portion (the element forming surface 104) of the semiconductor substrate 102 in the element region 103. The first and second diffusion regions 114, 115 are defined so as to have the same depth and the same impurity concentration, and define p-n junctions with the semiconductor substrate 102. As shown in FIG. 16, the plurality of first and second diffusion regions 114, 115 are defined so as to regularly align in the element region 103.

More specifically, as shown in FIG. 16, a plurality of cells 103A which are partitioned in a matrix shape along the row direction and the column direction (the cells 103A composed of 12 rows×5 columns=60 measures in Reference Example 1) are set in the element region 103.

The respective cells 103A are partitioned into substantially rectangular shapes in planar view, and the first diffusion regions 114 or the second diffusion regions 115 are defined one by one in the interior portions thereof. The first and second diffusion regions 114, 115 are defined in substantially rectangular shapes in planar view so as to extend along the row direction in the respective cells 103A. More specifically, each of the first and second diffusion regions 114, 115 is defined in substantially rectangular shapes having the same area, whose four corners are cut off. In addition, the cells 103A are virtual regions which are determined in order to regularly arrange the first and second diffusion regions 114, 115, and as a matter of course, a plurality of the cells 103A composed of 12 rows×5 columns or more may be set in the element region 103.

A plurality (5 in Reference Example 1) of the first diffusion regions 114 are defined at intervals from one another along the row direction of the odd rows. On the other hand, a plurality (5 in Reference Example 1) of the second diffusion regions 115 are defined at intervals from one another along the row direction of the even rows. The first and second diffusion regions 114, 115 are respectively defined parallel to one another along the row direction and the column direction.

Based on the definition of the first column, the second column, . . . and the fifth column as being from the second connection electrode 110a side toward the first connection electrode 109a side, the first and second diffusion regions 114, 115 are defined so as to be adjacent to one another in the respective column directions of the first to fifth columns.

As shown in FIGS. 17 and 18, an insulating film 116 (not shown in FIGS. 14 to 16) is defined on the element forming surface 104 of the semiconductor substrate 102. The insulating film 116 is, for example, a silicon oxide film. Contact holes 117 for selectively exposing the first and second diffusion regions 114, 115 are defined in the insulating film 116 (refer to the dashed-dotted lines in FIGS. 15 and 16 as well).

The contact hole 117 is defined so as to have a width narrower than the width of the first and second diffusion regions 114, 115. More specifically, the contact hole 117 is defined at a position at a regular interval from the peripheral edge portion of the first and second diffusion regions 114, 115 on the interior region side of the first and second diffusion regions 114, 115. The first electrode 109 and the second electrode 110 are defined on the insulating film 116.

The first electrode 109 includes the first connection electrode 109a, and a first electrode film 119 which is electrically connected to the first connection electrode 109a. The first electrode film 119 further has a first pad 121, and first extraction electrodes 122 which are defined integrally with the first pad 121.

The first pad 121 is defined in a substantially rectangular shape in planar view on the one end portion side of the element forming surface 104. The first connection electrode 109a is connected to the first pad 121. This allows the first extraction electrodes 122 to be electrically connected to the first connection electrode 109a via the first pad 121.

The first extraction electrodes 122 are defined linearly along the row direction from the first pad 121. More specifically, the first extraction electrodes 122 are defined linearly from the first pad 121 toward the odd rows in the element region 103. That is, the first extraction electrodes 122 are defined in a comb-teeth shape. The first extraction electrodes 122 are defined so as to have a width wider than the width of the first diffusion regions 114, and are defined so as to cover the first diffusion regions 114. The first extraction electrodes 122 have a uniform width throughout from the first diffusion regions 114 up to the first pad 121.

The leading end portions of the first extraction electrodes 122 are defined in substantially rectangular shapes whose corner portions are cut off, and are arranged at positions close to the second electrode 110 at an interval therefrom, across the first column in the element region 103. The first extraction electrodes 122 covering the first diffusion regions 114 enter the contact holes 117, to define ohmic contacts with the first diffusion regions 114.

The second electrode 110 includes the second connection electrode 110a, and a second electrode film 120 which is electrically connected to the second connection electrode 110a. The second electrode film 120 further has a second pad 123, and second extraction electrodes 124 which are defined integrally with the second pad 123.

The second pad 123 is defined in a substantially rectangular shape in planar view on the other end portion side (the end portion opposite to the first pad 121) of the element forming surface 104. The second connection electrode 110a is connected to the second pad 123. This allows the second extraction electrodes 124 to be electrically connected to the second connection electrode 110a via the second pad 123.

The second extraction electrodes 124 are defined linearly along the row direction from the second pad 123. More specifically, the second extraction electrodes 124 are defined linearly from the second pad 123 toward the odd rows in the element region 103. That is, the second extraction electrodes 124 are defined in a comb-teeth shape along the longitudinal direction of the first extraction electrodes 122. Accordingly, the first and second electrode films 119, 120 are defined in comb-teeth shapes such that the first and second extraction electrodes 122, 124 engage with each other. Further, the second extraction electrodes 124 are defined so as to have a width wider than the width of the second diffusion regions 115, and are defined so as to cover the second diffusion regions 115. The second extraction electrodes 124 have a uniform width throughout from the second diffusion regions 115 up to the second pad 123.

The leading end portions of the second extraction electrodes 124 are defined in substantially rectangular shapes whose corner portions are cut off, and are arranged at positions close to the first electrode 109 at an interval therefrom, across the fifth column in the element region 103. The second extraction electrodes 124 covering the second diffusion regions 115 enter the contact holes 117, to define ohmic contacts with the second diffusion regions 115.

The first and second electrode films 119, 210 are composed of the same conductive material, and for example, Al, AlCu, AlSiCu, or the like may be exemplified. The first and second electrodes 109, 110 are electrically isolated by slits 125 rimming the respective peripheral edge portions of the first and second electrode films 119, 120 on the insulating film 116.

As shown in FIG. 17 and FIG. 18, the passivation film 111a and the resin film 112 are defined in this order so as to cover the first and second electrode films 119, 120 on the insulating film 116. Further, the passivation film 111b is defined on the side surfaces of the semiconductor substrate 102. The passivation films 111a and 111b are composed of, for example, silicon nitride, and the resin film 112 is composed of, for example, polyimide.

The passivation films 111a and 111b and the resin film 112 constitute a protective film, that reduces or prevents moisture intrusion into the first and second extraction electrodes 122, 124 and the element forming surface 104, and absorbs impact and the like from the outside, which contributes to improvement in durability of the bidirectional Zener diode.

Pad openings 126, 127 for selectively exposing the first and second pads 121, 123 are defined in the passivation film 111a and the resin film 112. The first and second connection electrodes 109a, 110a are defined so as to backfill the pad openings 126, 127. The first and second connection electrodes 109a, 110a are composed of a single-layer conductive material (for example, an Ni layer). The first and second connection electrodes 109a, 110a are defined so as to protrude from the surface of the resin film 112.

Next, the respective arrangements and the respective sizes of the first and second diffusion regions 114, 115 will be described concretely with reference to FIG. 19.

Figure 19:
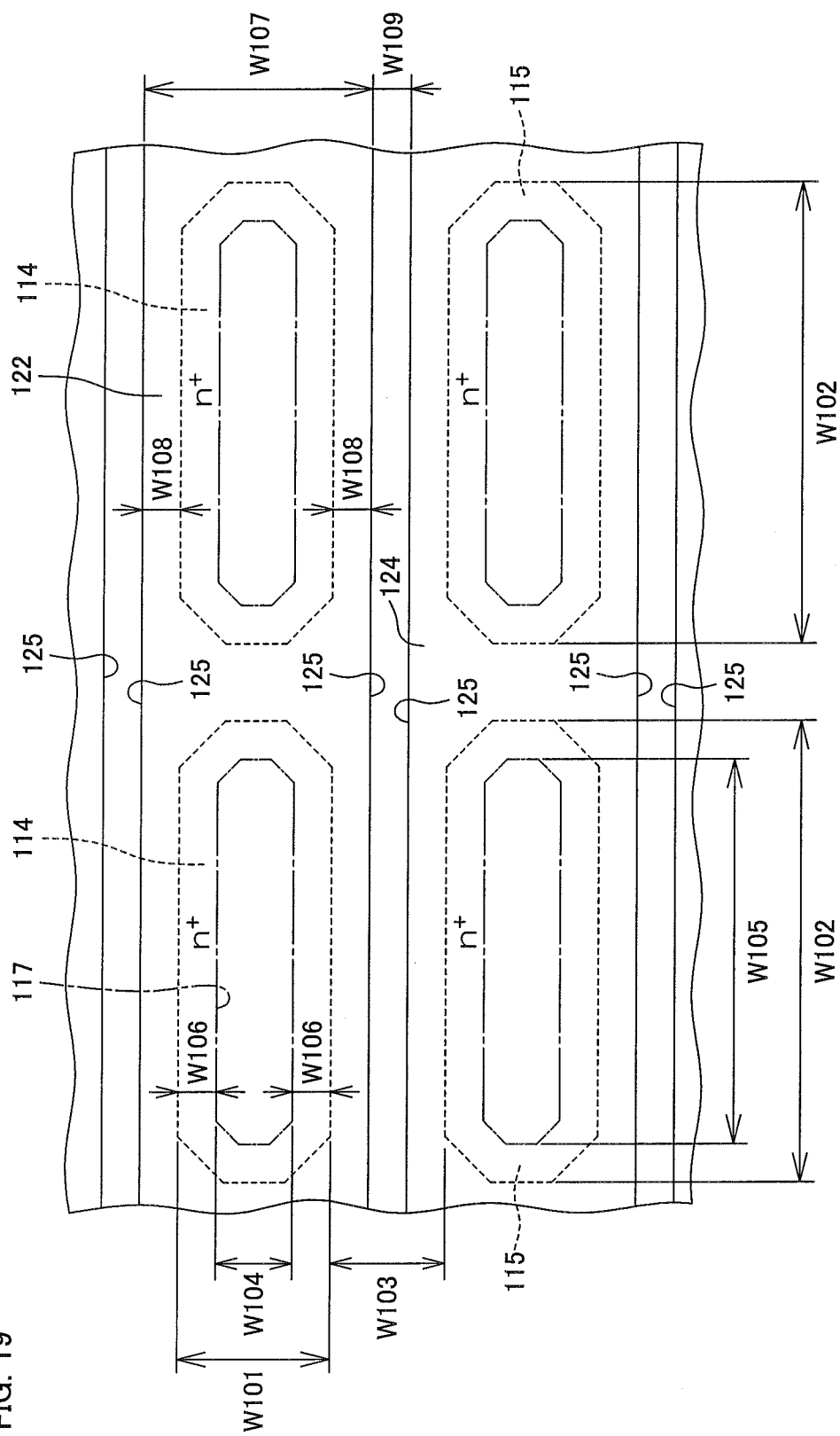
FIG. 19 is an enlarged plan view of a region including the diffusion regions shown in FIG. 15.

FIG. 19 is an enlarged plan view of a region including the first and second diffusion regions 114, 115 shown in FIG. 15.

As shown in FIG. 19, a width W101 in the column direction of the first and second diffusion regions 114, 115 is 5 µm to 15 µm (9 µm in Reference Example 1), and a width W102 in the row direction is 20 µm to 40 µm (28.8 µm in Reference Example 1). Further, a width W103 between the first and second diffusion regions 114, 115 may be 5 µm to 25 µm.

Further, a width W104 in the column direction of the contact hole 117 is 1 µm to 10 µm (4 µm in Reference Example 1), and a width W105 in the row direction is 10 µm to 30 µm (23.8 µm in Reference Example 1). In this planar view, a width W106 from the peripheral edge portion of the first diffusion region 114 to the peripheral edge portion of the contact hole 117 may be approximately 2.5 µm.

Further, each width W107 in the column direction of the first and second extraction electrodes 122, 124 is 10 µm to 20 µm (14 µm in Reference Example 1). In this planar view, a width W108 from the peripheral edge portion of the first and second diffusion regions 114, 115 to the slits 125 of the first and second extraction electrodes 122, 124 may be approximately 2.5 µm. Further, a width W109 between the slits 125 may be 3 µm to 10 µm.

Next, the electrical structure of the bidirectional Zener diode 101 will be described with reference to FIGS. 20A and 20B.

Figure 20A:
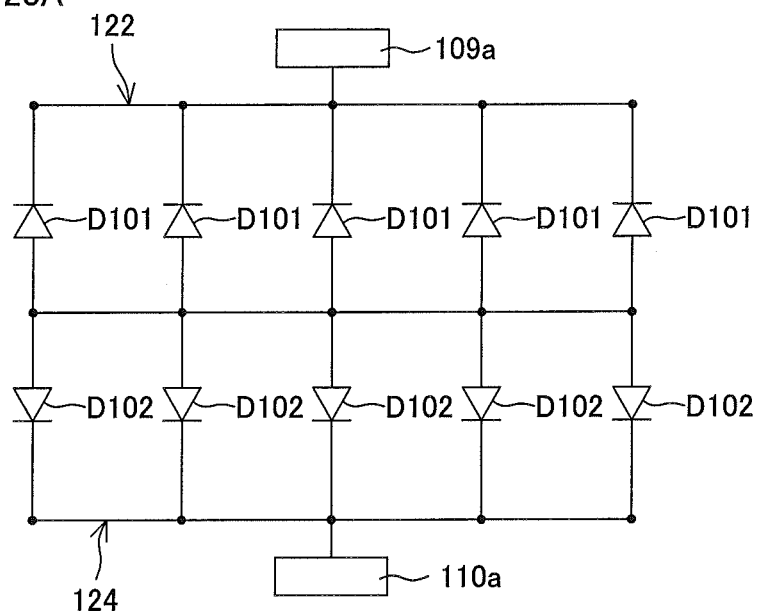
FIG. 20A is an electrical circuit diagram for explanation of the electrical structure of the bidirectional Zener diode shown in FIG. 14.
Figure 20B:
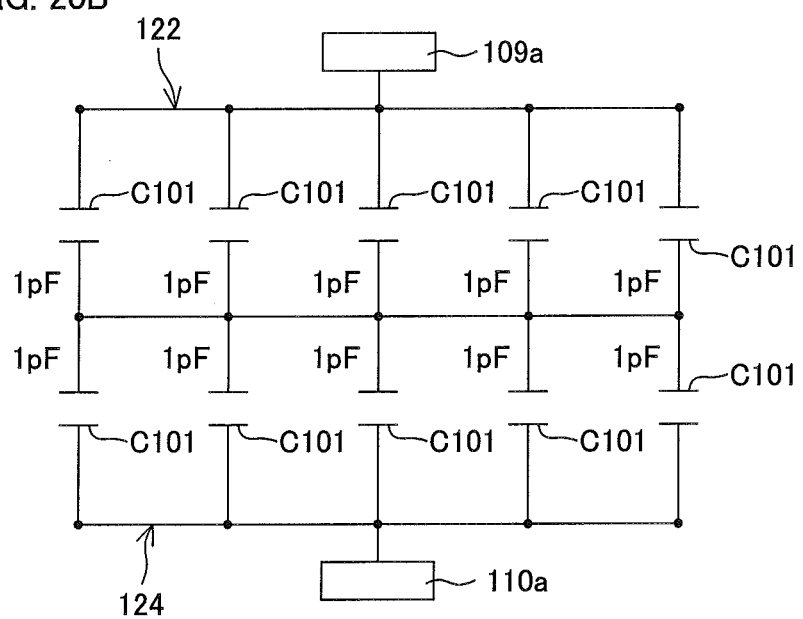
FIG. 20B is an electrical circuit diagram for explanation of the capacitance between terminals of the bidirectional Zener diode shown in FIG. 14.

FIG. 20A is an electrical circuit diagram for explanation of the electrical structure of the bidirectional Zener diode 101 shown in FIG. 14, and FIG. 20B is an electrical circuit diagram for explanation of the capacitance between terminals $C_t$ (the total capacitance between the first electrode 109 and the second electrode 110) of the bidirectional Zener diode 101 shown in FIG. 14. In addition, FIGS. 20A and 20B are diagrams that a pair of the first and second extraction electrodes 122, 124 adjacent to one another is extracted, to be remade into electrical circuit diagrams.

As shown in FIG. 20A, the single bidirectional Zener diode 101 is composed of a plurality of first Zener diodes D101 and a plurality of second Zener diodes D102. The first Zener diodes D101 are defined in the respective first diffusion regions 114 having the p-n junctions with the semiconductor substrate 102 (refer to FIGS. 17 and 18). The cathodes of the respective first Zener diodes D101 are connected in common to the first connection electrode 109a (cathode common). On the other hand, the second Zener diodes D102 are defined in the respective second diffusion regions 115 having the p-n junctions with the semiconductor substrate 102 (refer to FIGS. 17 and 18). The cathodes of the respective second Zener diodes D102 are connected in common to the second connection electrode 110a (cathode common).

On the other hand, the respective anodes of the first and second Zener diodes D101 and D102 are connected in common via the semiconductor substrate 102 (anode common). That is, the first Zener diodes D101 and the second Zener diodes D102 are anti-series connected via the semiconductor substrate 102. The single bidirectional Zener diode 101 is configured in this manner.

As shown in FIG. 20B, respectively, five capacitors C101 serving as parasitic capacitances are connected in parallel to the first and second extraction electrodes 122, 124. The first and second diffusion regions 114, 115 have capacitance components equal to one another (parasitic capacitances. 1 pF in Reference Example 1).

Accordingly, the first and second extraction electrodes 122, 124 respectively have the parasitic capacitances of 5 pF. Further, a pair of the first and second extraction electrodes 122, 124 is connected in series to one another. Accordingly, the pair of first and second extraction electrodes 122, 124 has the parasitic capacitance of 2.5 pF.

As shown in FIG. 15, six pairs of the first and second extraction electrodes 122, 124 are connected in parallel. Accordingly, in the case of the arrangement example shown in FIG. 15, the capacitance between terminals $C_t$, which is 2.5 pF×6 pairs=15.0 pF is obtained as a theoretical value.

In Reference Example 1, in addition to the representative example, a plurality of examples in which the arrangement of the first and second diffusion regions 114, 115 are changed are prepared, and the capacitance between terminals $C_t$, the peak pulse power ($P_{pk}$: Peak Pulse Power), the ESD (Electrostatic Discharge) resistance, and the like were checked. Hereinafter, after explanation of the configuration of a bidirectional Zener diode 150 according to Reference Example in FIG. 21, the arrangement example and the evaluation results of the bidirectional Zener diode 101 according to Reference Example 1 will be described.

Figure 21:
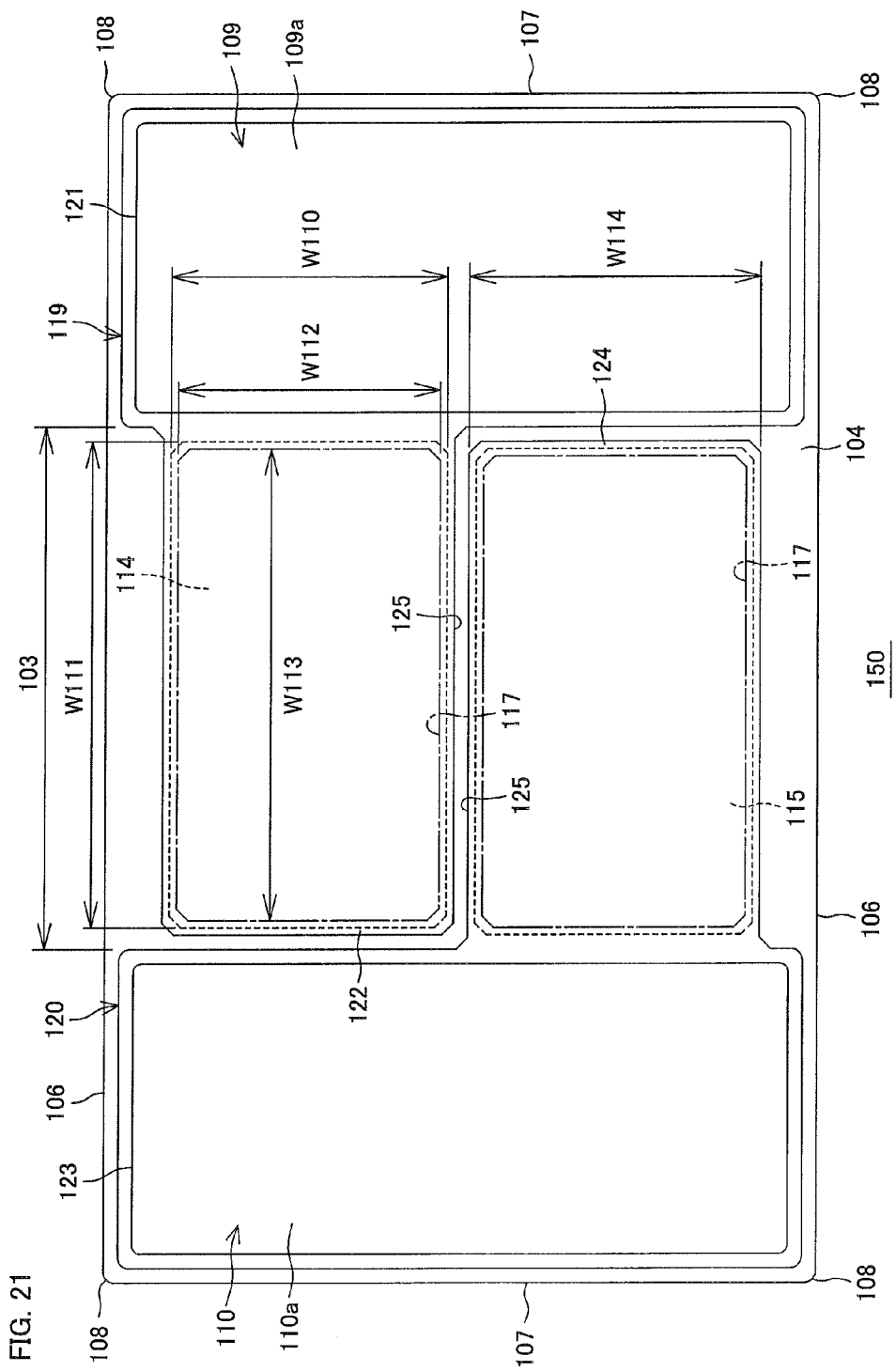
FIG. 21 is a schematic plan view of a bidirectional Zener diode according to Reference Example.

FIG. 21 is a schematic plan view of the bidirectional Zener diode 150 according to Reference Example.

The bidirectional Zener diode 150 is different from the bidirectional Zener diode 101 according to Reference Example 1 in the point that the first diffusion region 114 and the second diffusion region 115 are respectively defined singularly in the element region 103. In FIG. 21, portions corresponding to the respective portions shown FIGS. 14 to 20 are shown with the same reference numerals, and the descriptions thereof will be omitted.

A width W110 in the column direction of the first and second diffusion regions 114, 115 is 114 µm, and a width W111 in the row direction is 174 µm. Further, a width W112 in the column direction of the contact hole 117 is 104 µm, and a width W113 in the row direction is 164 µm. Further, each width W114 in the column direction of the first and second extraction electrodes 122, 124 is 124 µm.

In this manner, in the bidirectional Zener diode 150 according to Reference Example, the first and second diffusion regions 114, 115 having relatively larger areas are defined.

FIG. 22 are schematic plan views for explanation of arrangement examples of the first and second diffusion regions 114, 115 of the bidirectional Zener diode 101 according to Reference Example 1.

FIGS. 22A to 22G are plan views sequentially showing Arrangement Example 101, Arrangement Example 102, . . . and Arrangement Example 107. The first and second diffusion regions 114, 115 are defined so as to be decreased in number in the order of Arrangement Example 101, Arrangement Example 102, . . . and Arrangement Example 107. In addition, Arrangement Example 101 shown in FIG. 22A is the representative example described in FIGS. 14 to 20.

As shown in FIGS. 22A to 22G, with reference to respective Arrangement Examples 101 to 107, the first and second diffusion regions 114, 115 are configured so as to be symmetrical to one another. More specifically, the first and second diffusion regions 114, 115 are configured so as to be point-symmetrical with respect to the central portion (for example, the center of gravity) of the element forming surface 104 in planar view. That is, in the case where the semiconductor substrate 102 is rotated by 180 degrees around a predetermined vertical axis line perpendicular to the element forming surface 104, the positions of the first and second diffusion regions 114, 115 correspond to the positions of the first and second diffusion regions 114, 115 before the rotation. Moreover, with reference to Arrangement Examples 101, 104, and 107, the first and second diffusion regions 114, 115 are defined so as to be line-symmetrical to one another with respect to a straight line passing through the third row in planar view.

In accordance with these symmetrical structures, it is possible to make the electrical characteristics between the first electrode 109 and the second electrode 110 symmetrical. That is, it is possible to substantially equalize the voltage-current characteristics in the case where a voltage is applied with the first connection electrode 109a serving as a positive electrode and the second connection electrode 110a serving as a negative electrode, and the voltage-current characteristics in the case where a voltage is applied with the second connection electrode 110a serving as a positive electrode and the first connection electrode 109a serving as a negative electrode.

Figure 24:
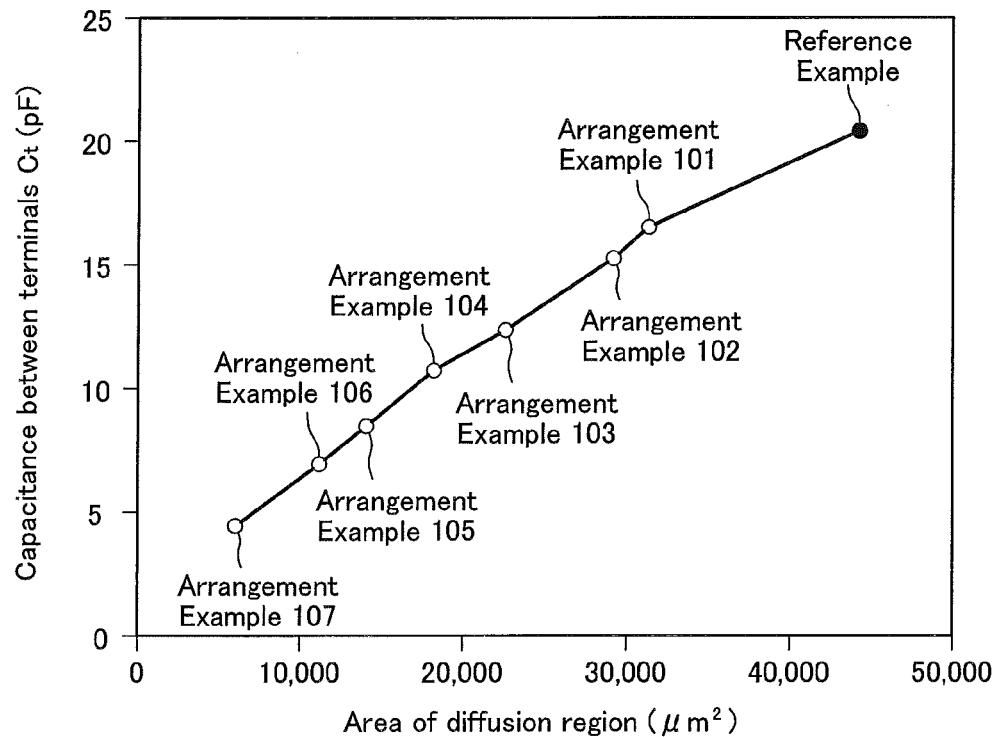
FIG. 24 is a graph showing capacitance between terminal-to-area of diffusion region.

FIG. 23 is a table showing the specifications and the electrical characteristics of the bidirectional Zener diode 150 according to Reference Example shown in FIG. 21 and Arrangement Examples 101 to 107 of the bidirectional Zener diode 101 according to Reference Example 1 shown in FIG. 22. FIG. 24 is a graph showing the capacitances between terminals $C_t$-to-the areas of the first and second diffusion regions 114, 115.

Figure 25:
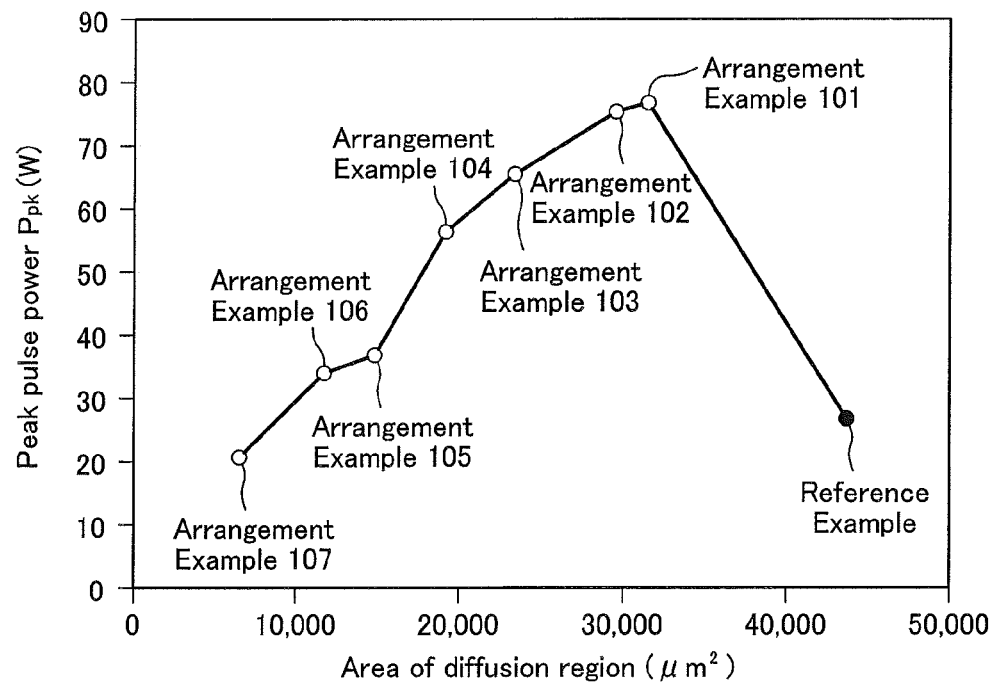
FIG. 25 is a graph showing peak pulse power-to-area of diffusion region.
Figure 26:
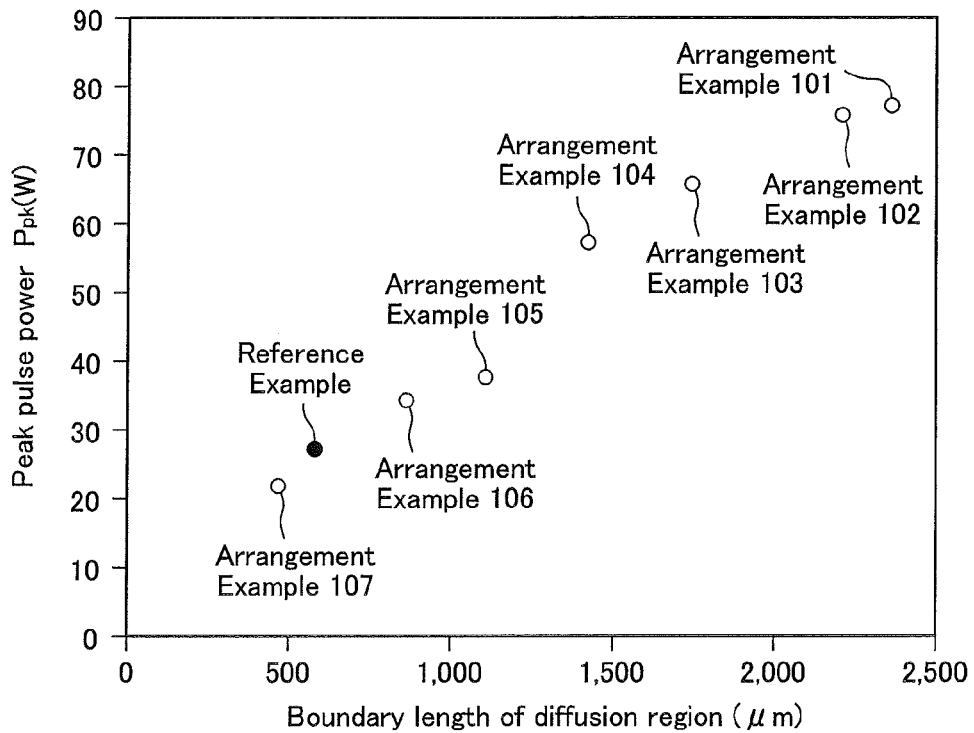
FIG. 26 is a graph showing peak pulse power-to-boundary length of diffusion region.

FIG. 25 is a graph showing the peak pulse powers $P_{pk}$-to-the areas of the first and second diffusion regions 114, 115. FIG. 26 is a graph showing the peak pulse powers $P_{pk}$-to-the boundary lengths of the first and second diffusion regions 114, 115.

As shown in the table of FIG. 23 and the graph of FIG. 24, it is clear that the capacitance between terminals $C_t$ of the bidirectional Zener diode 101 is dependent on the respective areas of the first and second diffusion regions 114, 115. That is, the capacitance between terminals $C_t$ increases with an increase in the respective areas of the first and second diffusion regions 114, 115, and the capacitance between terminals $C_t$ decreases with a decrease in the respective areas of the first and second diffusion regions 114, 115.

In addition, an area of the first diffusion region 114 means a total area of a region surrounded by the boundary between the semiconductor substrate 102 and the first diffusion region 114 in planar view that the element forming surface 104 of the semiconductor substrate 102 is viewed from a normal direction. In the same way, an area of the second diffusion region 115 means a total area of a region surrounded by the boundary between the semiconductor substrate 102 and the second diffusion region 115 in planar view that the element forming surface 104 of the semiconductor substrate 102 is viewed from a normal direction.

In general, it is possible to improve peak pulse power $P_{pk}$ by increasing the respective areas of the first and second diffusion regions 114, 115. However, increasing the areas of the first and second diffusion regions 114, 115 causes a trade-off that the capacitance between terminals $C_t$ as well simultaneously increases (refer to the graph of FIG. 24). Therefore, it may be difficult to satisfy both high peak pulse power $P_{pk}$ and low capacitance between terminals $C_t$.

Here, with reference to the table of FIG. 23 and the graph of FIG. 25, it is clear that the peak pulse power $P_{pk}$ according to Arrangement Examples 101 to 107 is improved with an increase in the respective areas of the first and second diffusion regions 114, 115. That is, in Arrangement Examples 101 to 107, it can be said that the respective areas of the first and second diffusion regions 114, 115 and the peak pulse power $P_{pk}$ are in a proportional relationship.

On the other hand, although the respective areas (=43923 μm²) of the first and second diffusion regions 114,115 according to Reference Example are defined to be relatively larger than the respective areas (=31595 μm²) of the first and second diffusion regions 114, 115 according to Arrangement Example 101, the value of the peak pulse power $P_{pk}$ thereof is lower.

The graph of FIG. 26 is that the graph of FIG. 25 is remade into the peak pulse powers $P_{pk}$-to-the respective boundary lengths of the first and second diffusion regions 114, 115.

As shown in the table of FIG. 23 and the graph of FIG. 26, it is clear that the peak pulse power $P_{pk}$ is dependent on the respective boundary lengths of the first and second diffusion regions 114, 115. That is, the peak pulse power $P_{pk}$ increases with an increase in the respective boundary lengths of the first and second diffusion regions 114, 115, and decreases with a decrease in the respective boundary lengths of the first and second diffusion regions 114, 115. This fact shows that the peak pulse power $P_{pk}$ has no correlation to the respective areas of the first and second diffusion regions 114, 115, but is proportional to the respective boundary lengths of the first and second diffusion regions 114, 115.

That is, it is clear that it is possible to improve the peak pulse power $P_{pk}$ by increasing the respective boundary lengths of the first and second diffusion regions 114, 115 within a range of the limited area (the element region 103). More specifically, as in Arrangement Examples 101 to 107, it is possible to achieve the peak pulse powers $P_{pk}$ of 20 W to 80 pF by setting the respective areas of the first and second diffusion regions 114, 115 to 6000 μm² to 32000 μm², and by setting the respective boundary lengths of the first and second diffusion regions 114, 115 to 470 μm² to 2500 μm².

Moreover, this experimental result shows that it is possible to set the capacitance between terminals $C_t$ and the peak pulse power $P_{pk}$ separately from each other by increasing the respective boundary lengths of the first and second diffusion regions 114, 115 while fixing the respective areas of the first and second diffusion regions 114, 115 to predetermined values.

Figure 27:
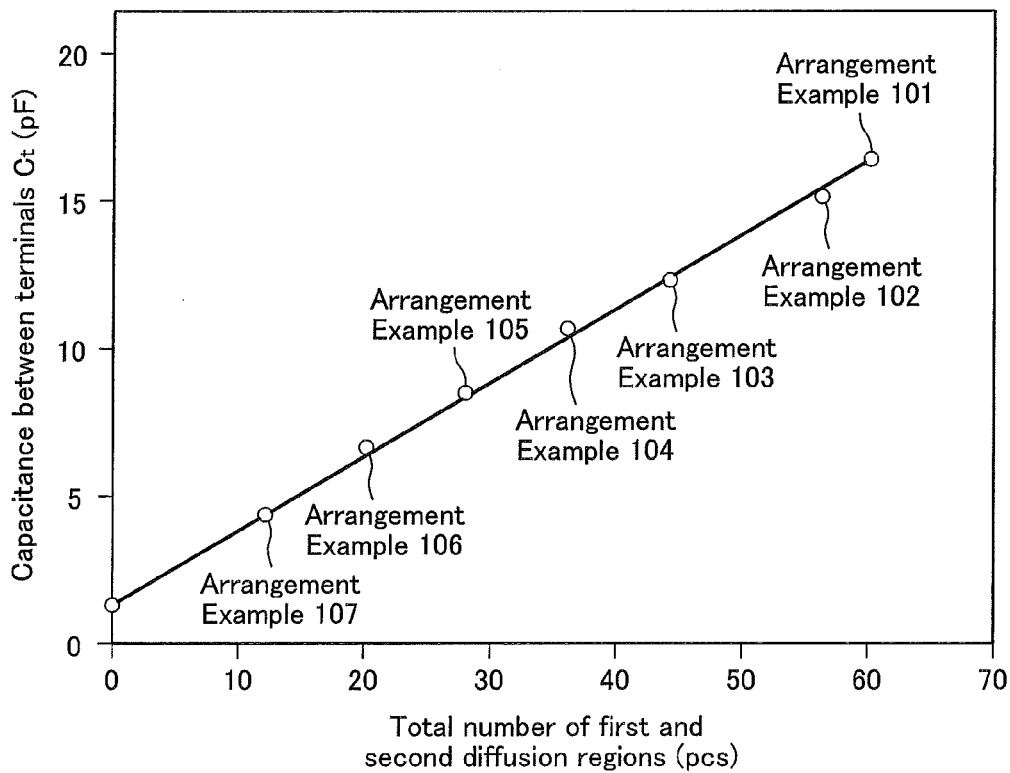
FIG. 27 is a graph showing capacitance between terminals-to-the number of diffusion regions.

FIG. 27 shows the relationship between the number of the first and second diffusion regions 114, 115 and the capacitance between terminals $C_t$ in respective Arrangement Examples 101 to 107. FIG. 27 is a graph showing the capacitances between terminals $C_t$-to-the numbers of the first and second diffusion regions 114, 115.

As shown in the table of FIG. 23 and the graph of FIG. 27, the capacitance between terminals $C_t$ increases proportionally according to the larger number of the first and second diffusion regions 114, 115 being set. With reference to the table of FIG. 23, slight errors are observed between the theoretical values and the measured values of the capacitance between terminals $C_t$. The reason for this is that the capacitance components in the case where the first and second diffusion regions 114, 115 are not defined at all (for example, the parasitic capacitances in the first and second electrode-films 119, 120) are detected so as to be included in the capacitance between terminals $C_t$. With reference to the graph of FIG. 27, the capacitance between terminals $C_t$ in the case where the first and second diffusion regions 114, 115 are not defined at all is approximately 1.5 pF. When this capacitance between terminals $C_t$ (=1.5 pF) is added to the respective theoretical values, the results substantially corresponding to the measured values were obtained (for example, in the case of Arrangement Example 101, 1.5 pF+15.0 pF=16.5 pF z 16.58 pF).

This result shows that it is possible to adjust the capacitance between terminals $C_t$ of the bidirectional Zener diode 101 by adjusting the component ratio of the first and second diffusion regions 114, 115. Further, it is clear that, in accordance with Arrangement Examples 101 to 107, it is possible to adjust the capacitance between terminals $C_t$ of the bidirectional Zener diode 101 in units of [pF].

As described above, in accordance with Reference Example 1, the single bidirectional Zener diode 101 composed of the plurality of first Zener diodes D101 and D102 is defined from the plurality of first and second diffusion regions 114, 115.

The capacitance between terminals $C_t$ in the bidirectional Zener diode 101 is in a proportional relationship with the respective areas of the first and second diffusion regions 114, 115. That is, it is possible to decrease the capacitance between terminals $C_t$ by defining the respective areas of the first and second diffusion regions 114, 115 smaller. On the other hand, the peak pulse power $P_{pk}$ in the bidirectional Zener diode 101 is in a proportional relationship with the respective boundary lengths of the first and second diffusion regions 114, 115. That is, it is possible to improve the peak pulse power $P_{pk}$ by defining the respective boundary lengths of the first and second diffusion regions 114, 115 longer.

Accordingly, a plurality of the first and second diffusion regions 114, 115 are defined within a range of the limited element region 103, thereby it is possible to make the boundary lengths longer than that in the case where the first diffusion region 114 and the second diffusion region 115 which are relatively larger are respectively defined singularly (refer to FIG. 21 as well). Accordingly, because there is no need to unnecessarily increase the respective areas of the first and second diffusion regions 114, 115 as means for improving the peak pulse power $P_{pk}$, it is possible to improve the peak pulse power $P_{pk}$ while suppressing an increase in capacitance between terminals $C_t$ (refer to the graph of FIG. 25 and the graph of FIG. 26).

Further, in accordance with this configuration, the plurality of first and second diffusion regions 114, 115 (the plurality of first and second Zener diodes D101 and D102) having predetermined capacity components (parasitic capacitances) are defined (refer to FIG. 20A and FIG. 20B). Accordingly, it is possible to easily adjust a value of the capacitance between terminals $C_t$ by adjusting the component ratio of the first and second Zener diodes D101 and D102. Therefore, even without application of great design change, it is possible to easily achieve a variety of capacitances between terminals $C_t$ for different purposes. Thereby, it is possible to improve the freedom of design.

In addition, in accordance with this configuration, because the respective capacitance components (parasitic capacitances) in the first and second diffusion regions 114, 115 are set to 1 pF, it is possible to adjust the capacitance between terminals $C_t$ of the bidirectional Zener diode 101 in units of [pF]. Therefore, it is possible to precisely adjust the capacitance between terminals $C_t$ in accordance with the specifications of application and the purposes for which the bidirectional Zener diode 101 is used.

Further, because the semiconductor substrate 102 is a p-type semiconductor substrate, it is possible to achieve stable characteristics even without defining an epitaxial layer on the semiconductor substrate 102. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because the p-type semiconductor substrate 102 has a small in-plane resistivity variation, it is possible to cut a bidirectional Zener diode with stable characteristics out of any place of the p-type semiconductor substrate 102 without defining an epitaxial layer. Therefore, by use of the p-type semiconductor substrate 102, it is possible to simplify the manufacturing process, and reduce the manufacturing cost.

Next, an example of the manufacturing process of the bidirectional Zener diode 101 will be described.

Figure 28:
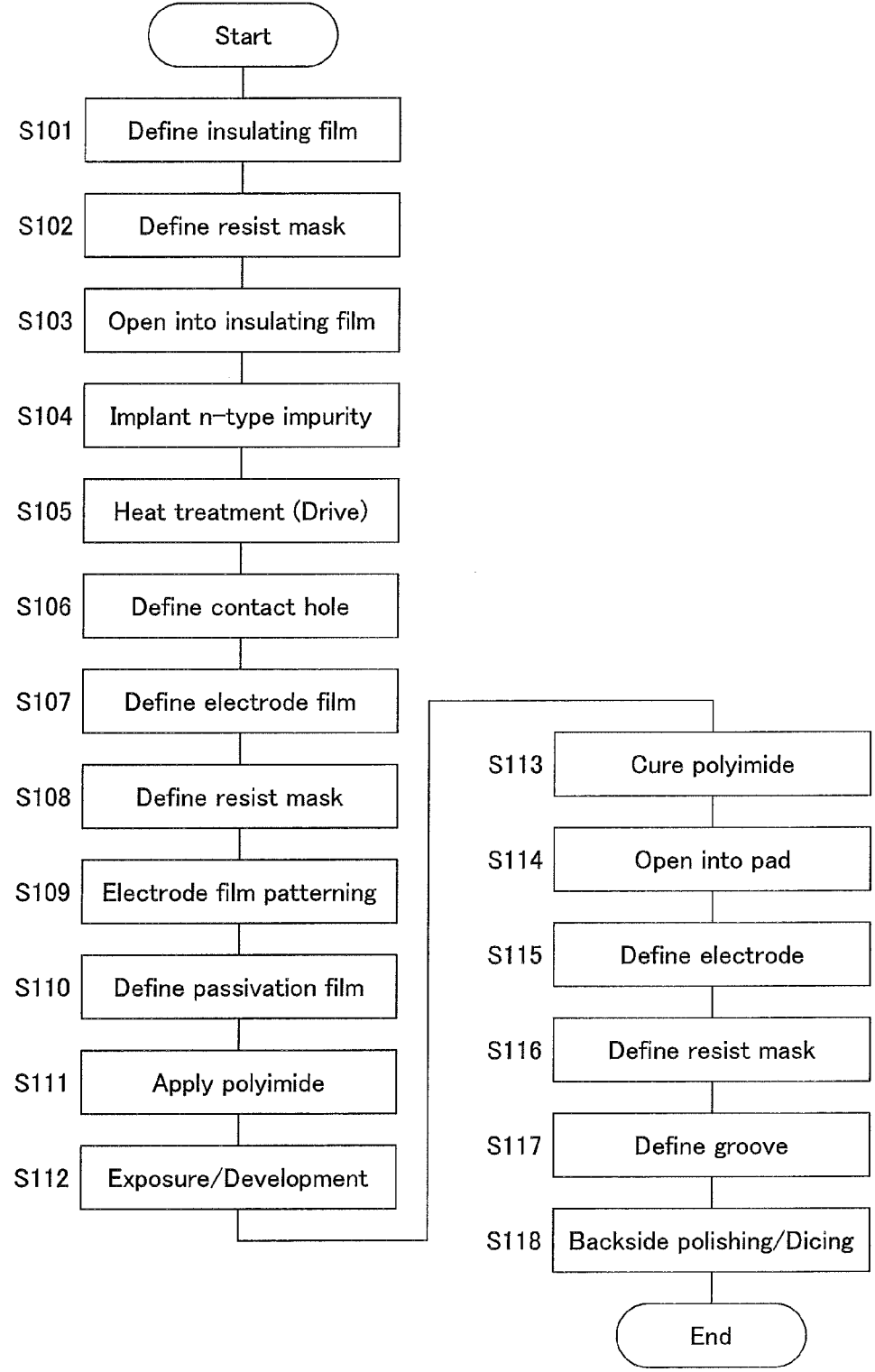
FIG. 28 is a flowchart for explanation of an example of the manufacturing process of the bidirectional Zener diode shown in FIG. 14.
Figure 29:
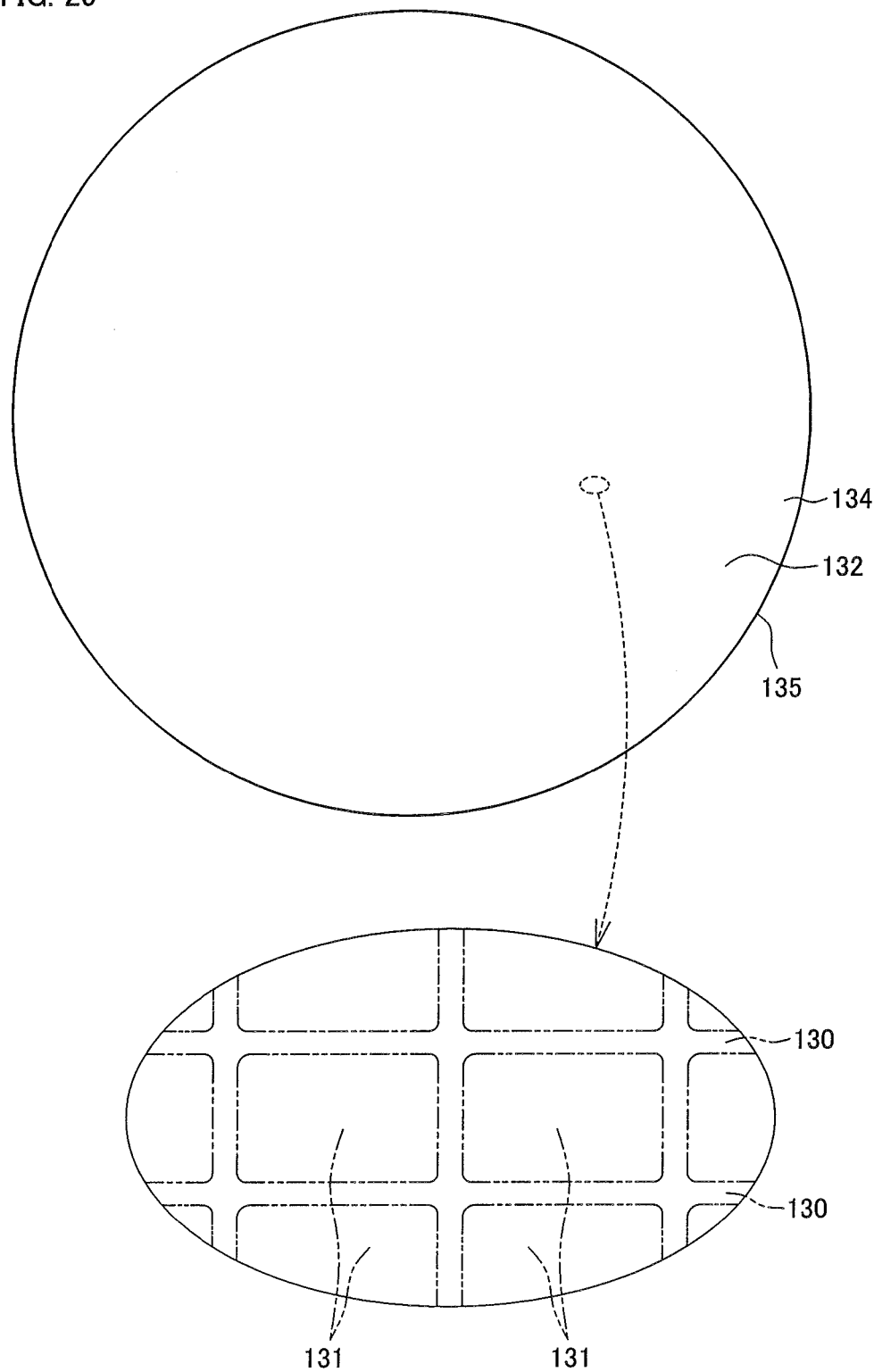
FIG. 29 is a schematic plan view of a semiconductor wafer which is applied to the manufacturing process of FIG. 28.
Figure 30A:
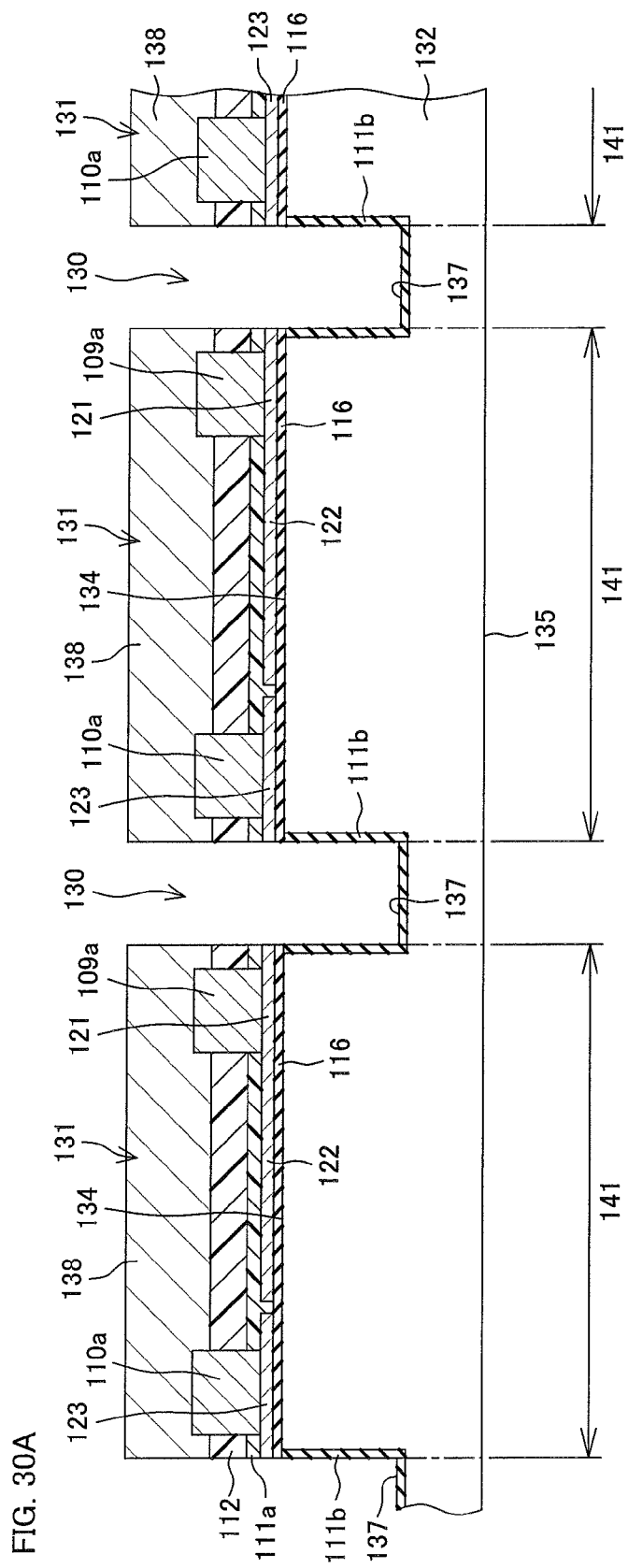

FIG. 28 is a flowchart for explanation of an example of the manufacturing process of the bidirectional Zener diode 101 shown in FIG. 14. FIG. 29 is a schematic plan view of a semiconductor wafer 132 which is applied to the manufacturing process of FIG. 28. FIGS. 30A and 30B are schematic cross-sectional views for explanation of a backside polishing and dicing process shown in FIG. 28. In addition, in FIGS. 30A and 30B, the illustrations of the first and second diffusion regions 114, 115 are omitted.

First, as shown in FIG. 29, the $p^+$-type semiconductor wafer 132 as a base substrate of the semiconductor substrate 102 is prepared. A surface 134 of the semiconductor wafer 132 corresponds to the element forming surface 104 of the semiconductor substrate 102, and a back surface 135 of the semiconductor wafer 132 corresponds to the back surface 105 of the semiconductor substrate 102.

Chip regions 131 in which a plurality of the bidirectional Zener diodes 101 are defined, are set so as to align in a matrix shape on the surface 134 of the semiconductor wafer 132. A boundary region 130 is provided between the chip regions 131 adjacent to one another. The boundary region 130 is a band-shaped region having a substantially constant width, and extends in two directions perpendicular to one another, to be defined in a lattice shape.

Next, as shown in FIG. 28, the insulating film 116 is defined on the surface 134 of the semiconductor wafer 132 (Step S101: Define insulating film). Next, a resist mask is defined on the insulating film 116 (Step S102: Define resist mask). Openings corresponding to the plurality of first and second diffusion regions 114, 115 are defined in the insulating film 116 by etching by use of the resist mask (Step S103: Open insulating film).

Next, after the resist mask is peeled off, an n-type impurity is implanted into the surface 134 of the semiconductor wafer 132 which is exposed from the openings defined in the insulating film 116 (Step S104: Implant n-type impurity). Implantation of the n-type impurity may be performed by the process of depositing phosphorus as the n-type impurity on the surface (so-called phosphorus deposition), or may be performed by implantation of n-type impurity ions (for example, phosphorus ions).

Next, after the insulating film 116 is made into a thick film by a CVD method as needed, a heat treatment (drive) for activation of the impurity ions implanted into the semiconductor wafer 132 is performed (Step S105: Heat treatment (drive)). Thereby, the plurality of first and second diffusion regions 114, 115 on the surface portion of the semiconductor wafer 132 are defined.

Next, a resist mask having openings corresponding to the contact holes 117 is defined on the insulating film 116 (Step S106: Define contact hole). The contact holes 117 are defined in the insulating film 116 by etching via the resist mask. Thereafter, the resist mask is peeled off.

Next, an electrode film constituting the first and second electrode films 119, 120 is defined on the insulating film 116 by, for example, sputtering (Step S107: Define electrode film). In Reference Example 1, an electrode film composed of Al is defined. Then, a resist mask having an opening pattern corresponding to the slits 125 is defined on the electrode film (Step S108: Define resist mask). The slits 125 are defined in the electrode film by etching (for example, reactive ion etching) via the resist mask (Step S109: Electrode film patterning). This separates the electrode film into the first and second electrode films 119, 120.

Next, after the resist mask is peeled off, the passivation film 111a such as a nitride film is defined by, for example, a CVD method (Step S110: Define passivation film). Next, the resin film 112 is defined by application of photosensitive polyimide or the like (Step S111: Apply polyimide). Next, the resin film 112 is exposed through a pattern corresponding to the pad openings 126, 127. Thereafter, the resin film 112 is developed (Step S112: Exposure/development).

Next, as needed, a heat treatment for curing the resin film 112 is performed (Step S113: Cure polyimide). Then, the passivation film 111a is removed by dry etching (for example, reactive ion etching) with the resin film 112 serving as a mask (Step S114: Open pad). Thereby, the pad openings 126, 127 are defined.

Next, for example, a conductive material (for example, an Ni layer) is plated to form a film so as to backfill the pad openings 126, 127 (Step S115: Define electrode). Thereby, the first and second connection electrodes 109a, 110a are defined.

Next, as shown in FIG. 30A, a resist pattern 138 for defining a groove for cutting 137 is defined in the boundary region 130 (refer to FIG. 29 as well) (Step S116: Define resist mask). The resist pattern 138 has a grid-shaped opening corresponding to the boundary region 130. Plasma etching is performed via the resist pattern 138 (Step S117: Define groove). Accordingly, the semiconductor wafer 132 is etched from the surface 134 up to a predetermined depth, to define the groove for cutting 137 along the boundary region 130.

Half-finished products 141 are located one by one in the chip regions 131 surrounded by the groove for cutting 137, and these half-finished products 141 are arranged so as to align in a matrix shape. By defining the groove for cutting 137 in this manner, it is possible to separate the semiconductor wafer 132 into the plurality of chip regions 131. After the groove for cutting 137 is defined, the resist pattern is peeled off.

Next, the passivation film 111b composed of silicon nitride is defined on the surface of the semiconductor wafer 132 by a CVD method. At this time, the passivation film 1111b is defined on the entire area of the inner circumferential surface (the bottom surface and the side surfaces) of the groove for cutting 137.

Next, as shown in FIG. 30B, the semiconductor wafer 132 is polished from the back surface 135 side, so as to reach the bottom surface of the groove for cutting 137 (Step S118: Backside polishing/Dicing). Thereby, the plurality of chip regions 131 into pieces are diced, which makes it possible to obtain the bidirectional Zener diode 101. In this manner, provided that the semiconductor wafer 132 is polished from the back surface 135 side after the groove for cutting 137 is defined, it is possible to simultaneously dice the plurality of chip regions 131 defined on the semiconductor wafer 132 into pieces. Therefore, it is possible to achieve the improvement in productivity of the bidirectional Zener diodes 101 due to shortening of the manufacturing time. In addition, the back surface 105 of the completed semiconductor substrate 102 may be mirrored by polishing or etching, so as to clear the back surface 105.

REFERENCE EXAMPLE 2

Figure 31:
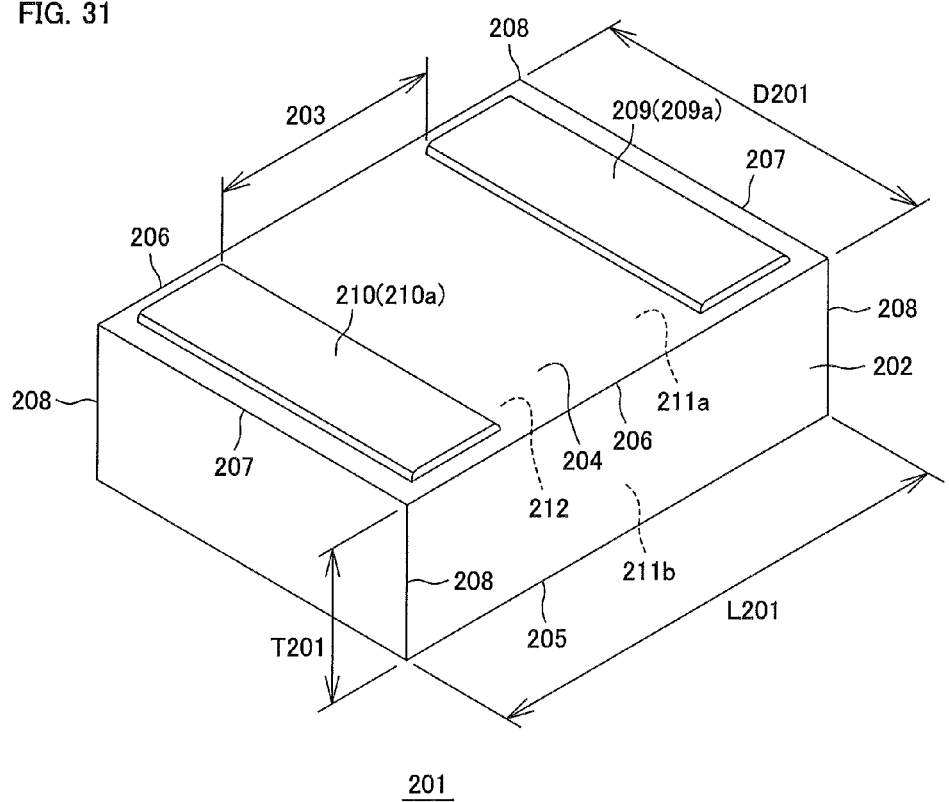
FIG. 31 is a schematic perspective view of a bidirectional Zener diode according to Reference Example 2.

FIG. 31 is a schematic perspective view of a bidirectional Zener diode 201 according to Reference Example 2.

As shown in FIG. 31, the bidirectional Zener diode 201 is a minute chip part, and includes a semiconductor substrate 202 constituting a main body portion.

The semiconductor substrate 202 is defined in a substantially rectangular shape having one end portion and the other end portion, and a rectangular element region 203 in which a plurality of diodes are defined, is set in an interior portion of a surface thereof. Hereinafter, the plane on which the element region 203 is set is called an element forming surface 204, and the plane on the opposite side thereof is called a back surface 205.

With respect to a planar shape of the semiconductor substrate 202, a length L201 of a long side 206 along the longitudinal direction is 0.3 mm to 0.6 mm, and a length D201 of a short side 207 along the short direction is 0.15 mm to 0.3 mm. Further, a thickness T201 of the semiconductor substrate 202 is, for example, 0.1 mm. That is, as the semiconductor substrate 202, so-called a 0603 chip, a 0402 chip, a 03015 chip, or the like is applied.

Respective corner portions 208 of the semiconductor substrate 202 may be round shapes, which are chamfered in planar view. With the round shapes, it is possible to reduce chipping in the manufacturing process or at the time of mounting. A first connection electrode 209a of a first electrode 209 and a second connection electrode 210a of a second electrode 210 are defined on one end portion side and the other end portion side of the element forming surface 204 of the semiconductor substrate 202.

The first connection electrode 209a and the second connection electrode 210a are defined at an interval from one another so as to sandwich the element region 203 from the one end portion side and the other end portion side of the element forming surface 204. The first connection electrode 209a and the second connection electrode 210a are defined in substantially rectangular shapes in planar view along the short side 207 of the semiconductor substrate 202.

In addition, in the semiconductor substrate 202, the respective entire areas of the element forming surface 204 and the side surfaces are covered with passivation films 211a, 211b. Further, a resin film 212 is defined so as to cover the entire area of the passivation film 211a on the element forming surface 204. Therefore, in the strict sense, in FIG. 31, the respective entire areas of the element forming surface 204 and the side surfaces are located on the insides (the rear sides) of the passivation films 211a, 211b and the resin film 212, and are therefore not exposed to the outside. The passivation films 211a, 211b and the resin film 212 will be hereinafter described in detail.

In Reference Example 2, a plurality of diodes are defined in the element region 203 in broadly-divided two methods. These two methods are respectively called Arrangement Example 1 and Arrangement Example 2. Hereinafter, after explanation of Arrangement Example 1, Arrangement Example 2 will be described.

ARRANGEMENT EXAMPLE 1

Figure 32:
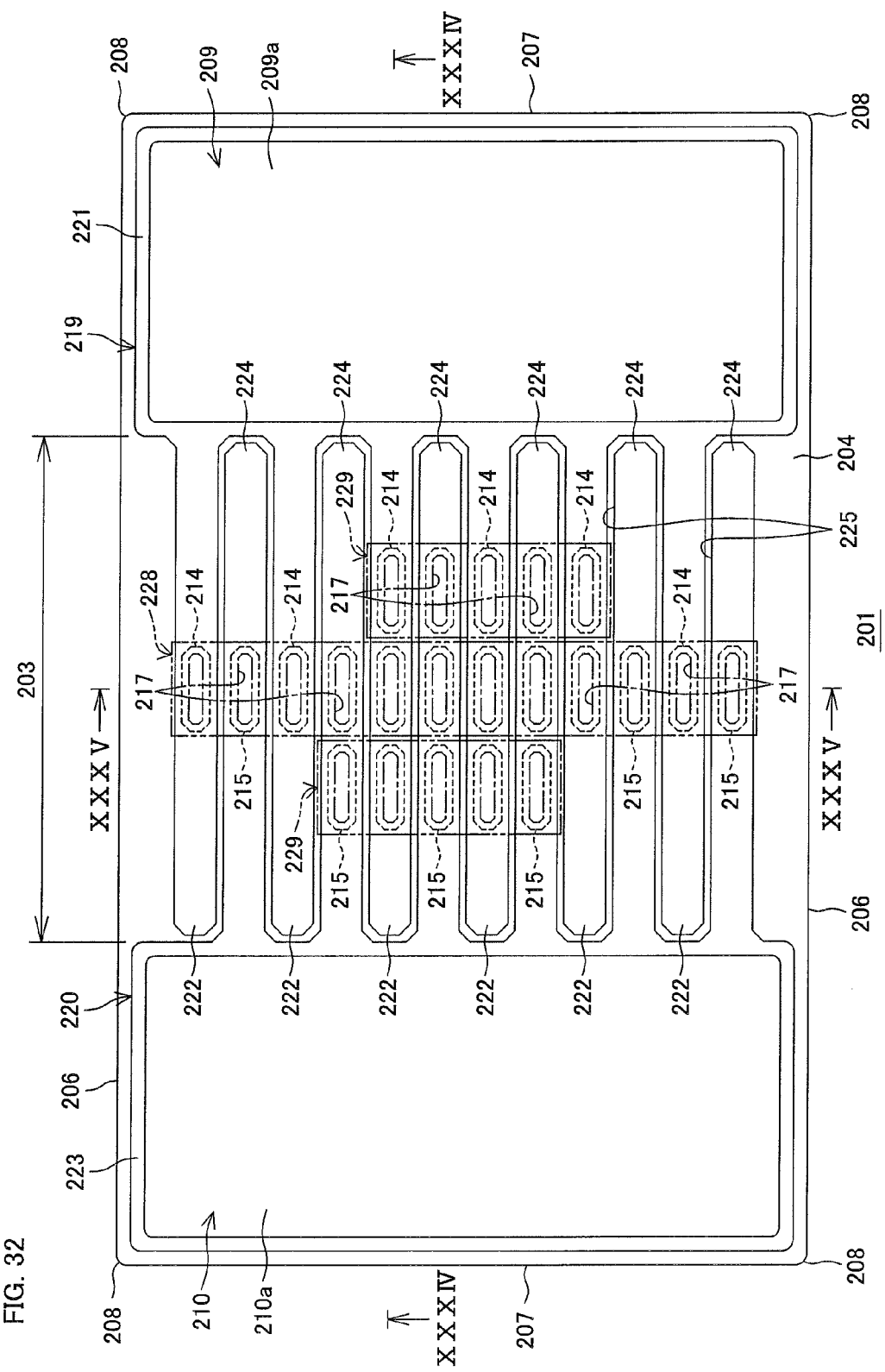
FIG. 32 is a schematic plan view showing Arrangement Example 1 of the bidirectional Zener diode shown in FIG. 31.
Figure 33:
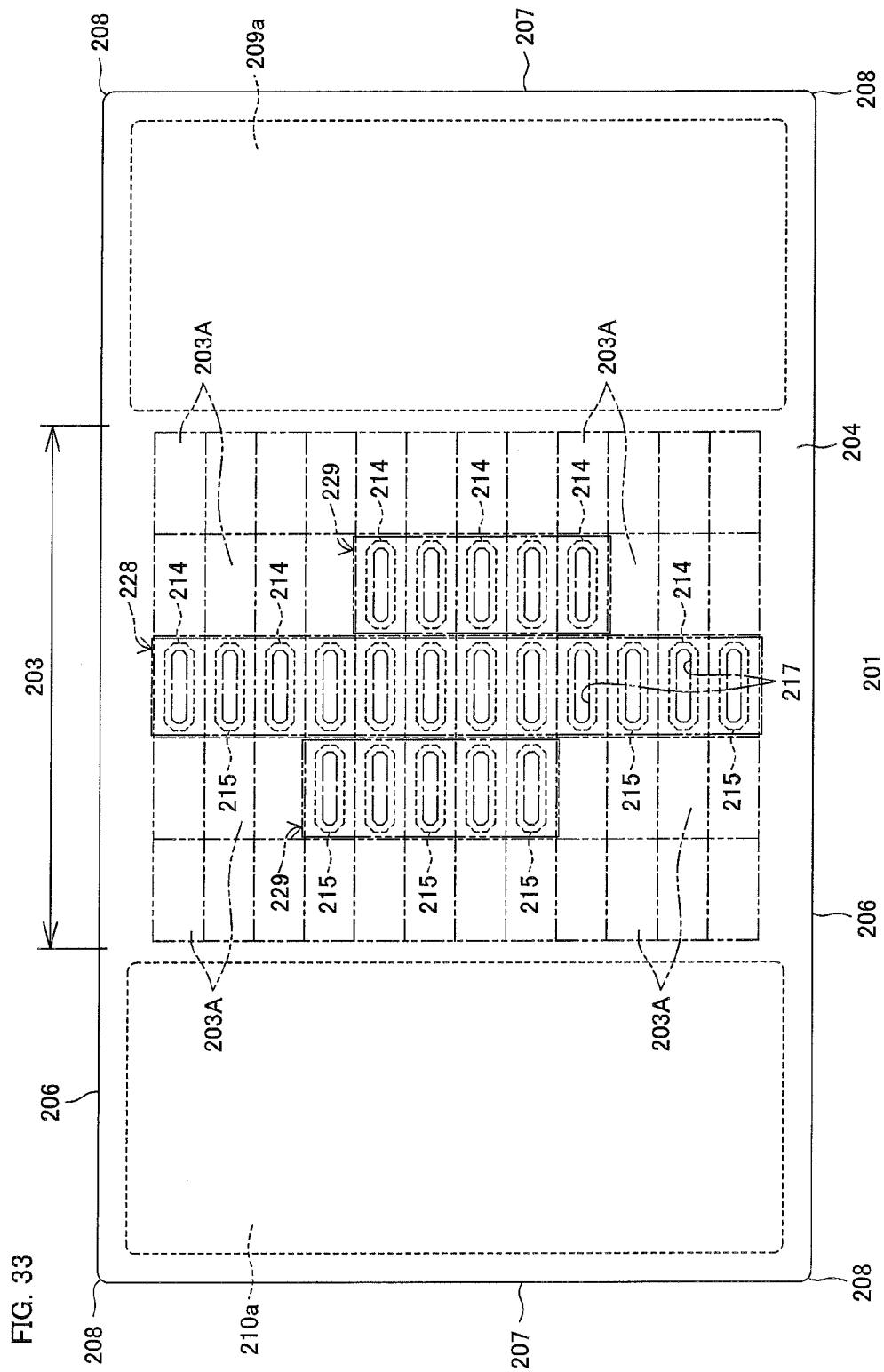
FIG. 33 is a plan view showing an arrangement of the diffusion regions shown in FIG. 32.
Figure 34:
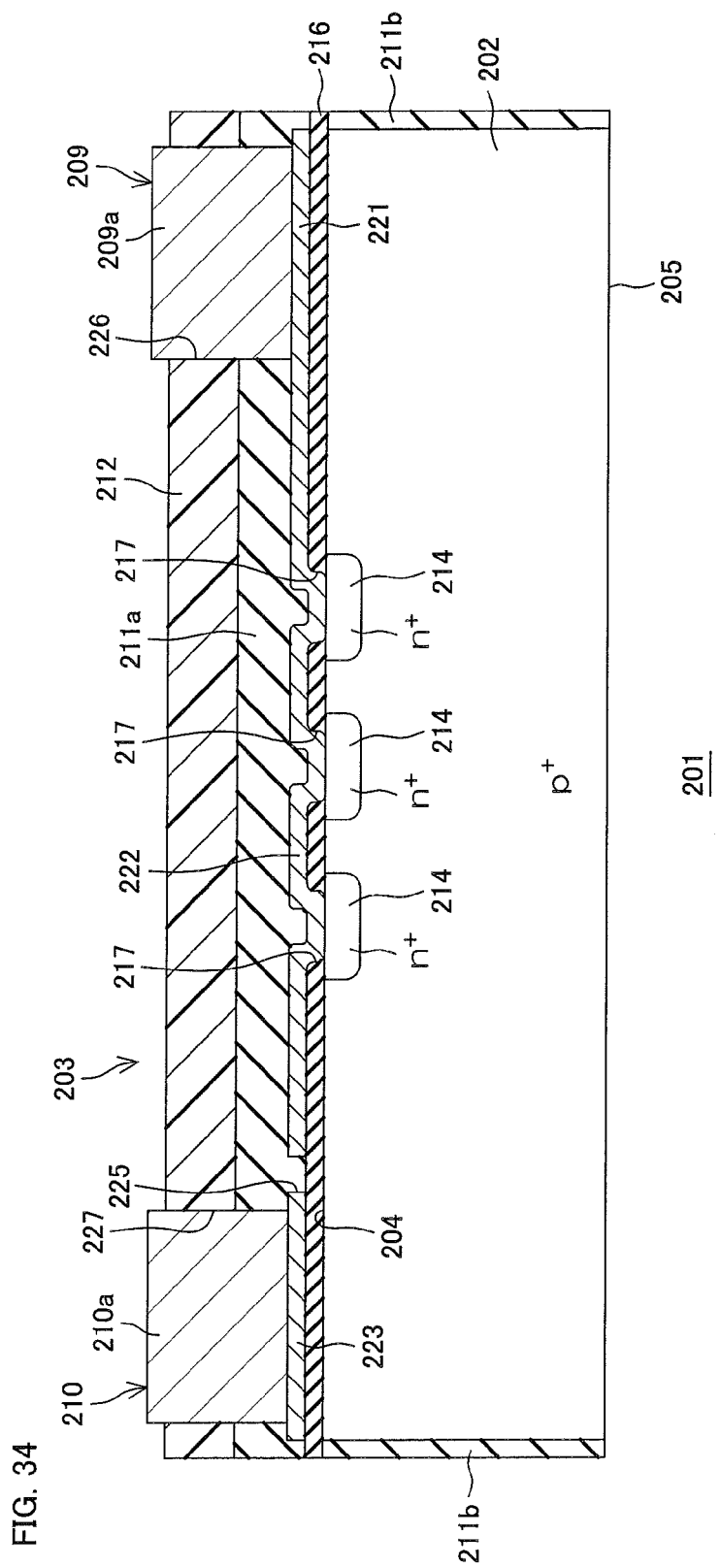
FIG. 34 is a cross-sectional view taken along the cross-section line XXXIV-XXXIV shown in FIG. 32.
Figure 35:
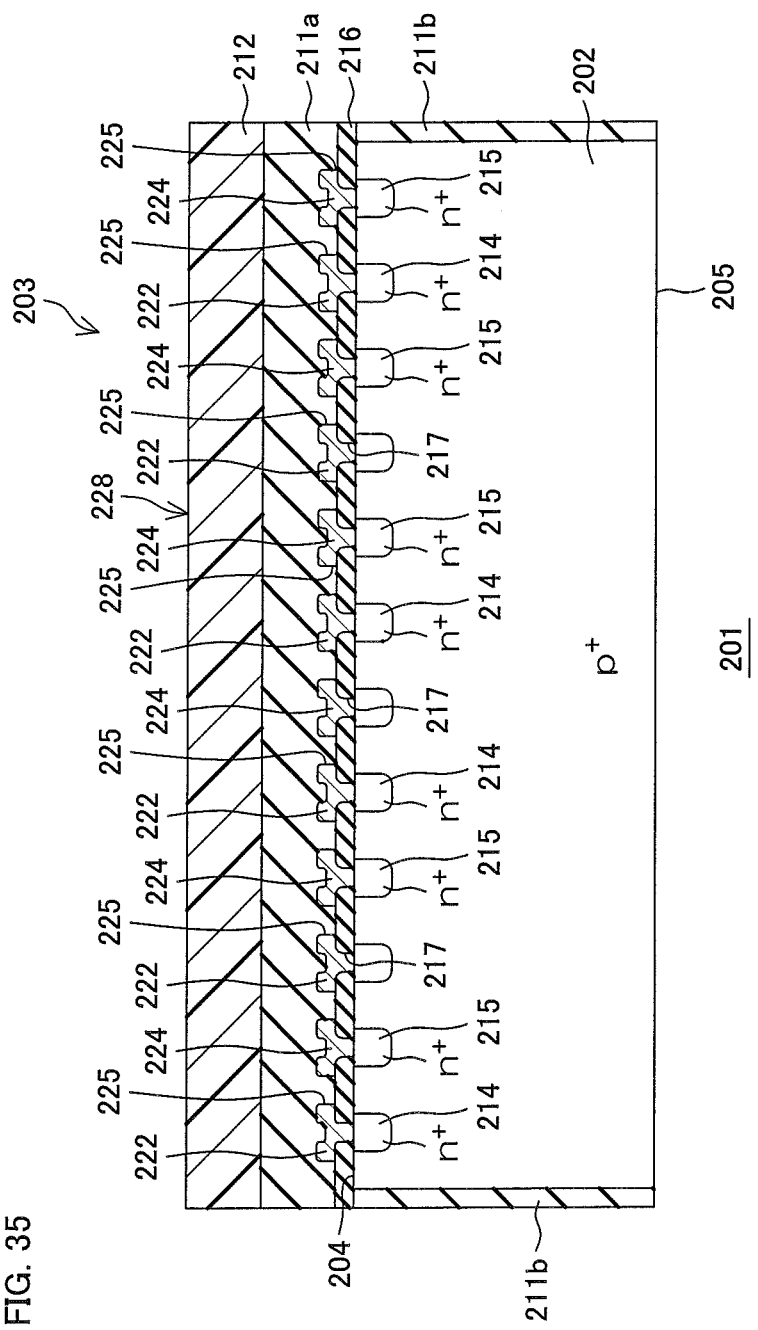
FIG. 35 is a cross-sectional view taken along the cross-section line XXXV-XXXV shown in FIG. 32.

FIG. 32 is a schematic plan view showing Arrangement Example 1 of the bidirectional Zener diode 201 shown in FIG. 31. FIG. 33 is a plan view showing an arrangement of first diffusion regions 214 and second diffusion regions 215 shown in FIG. 32. FIG. 34 is a cross-sectional view taken along the cross-section line XXXIV-XXXIV shown in FIG. 32. FIG. 35 is a cross-sectional view taken along the cross-section line XXXV-XXXV shown in FIG. 32. In addition, FIGS. 32 to 35 illustrate an arrangement example of Arrangement Example 1 as the representative example.

The semiconductor substrate 202 is the $p^+$-type semiconductor substrate 202 (silicon substrate). A plurality of the $n^+$-type first diffusion regions 214 and a plurality of the $n^+$-type second diffusion regions 215 are defined on the surface portion (the element forming surface 204) of the semiconductor substrate 202 in the element region 203. The first and second diffusion regions 214, 215 are defined so as to have the same depth and the same impurity concentration, and define p-n junctions with the semiconductor substrate 202. As shown in FIG. 33, the plurality of first and second diffusion regions 214, 215 are defined so as to regularly align in the element region 203.

More specifically, in the element region 203, as shown in FIG. 33, a plurality of cells 203A which are partitioned in a matrix shape along the row direction and the column direction (the cells 203A composed of 12 rows×5 columns=60 measures in Reference Example 2) are set.

The respective cells 203A are partitioned into substantially rectangular shapes in planar view, and the first diffusion regions 214 or the second diffusion regions 215 are defined one by one in the interior portions thereof. The first and second diffusion regions 214, 215 are defined in substantially rectangular shapes in planar view so as to extend along the row direction in the respective cells 203A. More specifically, each of the first and second diffusion regions 214, 215 is defined in substantially rectangular shapes having the same area, whose four corners are cut off. In addition, the cells 203A are virtual regions which are determined in order to regularly arrange the first and second diffusion regions 214, 215, and as a matter of course, a plurality of the cells 203A composed of 12 rows×5 columns or more may be set in the element region 203.

As shown by the dashed-two dotted line in FIGS. 32 and 33, the plurality of first diffusion regions 214 and the plurality of second diffusion regions 215 are defined so as to aggregate in the central portion of the element region 203. More specifically, the plurality of first diffusion regions 214 and the plurality of second diffusion regions 215 constitute a central diffusion region group 228 along the transverse direction crossing the central portion in the opposite direction of the first connection electrode 209a and the second connection electrode 210a, and auxiliary diffusion region groups 229 which are adjacent to the central diffusion region group 228 in the central portion of the element region 203.

Based on the definition of the first column, the second column, . . . and the fifth column as being from the second connection electrode 210a side toward the first connection electrode 209a side, the plurality of first diffusion regions 214 and the plurality of second diffusion regions 215 are defined so as to be adjacent to one another along the column direction of the third column in the element region 203. Thereby, the band-shaped central diffusion region group 228 including the plurality of first diffusion regions 214 and the plurality of second diffusion regions 215 on the third column are constituted. The central diffusion region group 228 is defined from the first row up to the twelfth row along the column direction of the third column in the element region 203.

Further, the plurality of first diffusion regions 214 and the plurality of second diffusion regions 215 are defined so as to be adjacent to one another along the respective column directions of the second column and the fourth column. Thereby, constituting the auxiliary diffusion region groups 229 including the plurality of first diffusion regions 214 and the plurality of second diffusion regions 215 are constituted. The auxiliary diffusion region groups 229 are selectively defined in the central portions in the column direction of the central diffusion region group 228. More specifically, the auxiliary diffusion region group 229 on the second column is defined from the third row up to the seventh row. Further, the auxiliary diffusion region group 229 on the fourth column is defined from the fourth row up to the ninth row. In this manner, the auxiliary diffusion region groups 229 are defined in band shapes shorter than the central diffusion region group 228 with respect to the column direction, and are defined so as to sandwich the central portion in the column direction of the central diffusion region group 228.

As shown in FIG. 33, the first diffusion regions 214 are arranged on the odd rows, and the second diffusion regions 215 are arranged on the even rows. Accordingly, the first and second diffusion regions 214, 215 are alternately arrayed along the column direction in the central diffusion region group 228 and the auxiliary diffusion region groups 229.

An insulating film 216 (not shown in FIGS. 31 to 33) is defined on the element forming surface 204 of the semiconductor substrate 202. The insulating film 216 is, for example, a silicon oxide film. Contact holes 217 for selectively exposing the first and second diffusion regions 214, 215 are defined in the insulating film 216 (refer to the dashed-dotted lines in FIGS. 32 and 33 as well).

The contact hole 217 is defined so as to have a width narrower than the width of each of the first and second diffusion regions 214, 215. More specifically, the contact hole 217 is defined at a position at a regular interval from the peripheral edge portion of each of the first and second diffusion regions 214, 215 on the interior region side of each of the first and second diffusion regions 214, 215. The first electrode 209 and the second electrode 210 are defined on the insulating film 216.

The first electrode 209 includes the first connection electrode 209a, and a first electrode film 219 which is electrically connected to the first connection electrode 209a. The first electrode film 219 further has a first pad 221, and first extraction electrodes 222 which are defined integrally with the first pad 221.

The first pad 221 is defined in a substantially rectangular shape in planar view on the one end portion side of the element forming surface 204. The first connection electrode 209a is connected to the first pad 221. This allows the first extraction electrodes 222 to be electrically connected to the first connection electrode 209a via the first pad 221.

The first extraction electrodes 222 are defined linearly along the row direction from the first pad 221. More specifically, the first extraction electrodes 222 are defined linearly so as to cross the central diffusion region group 228 and/or the auxiliary diffusion region groups 229 from the first pad 221 toward the odd rows in the element region 203. That is, the first extraction electrodes 222 are defined in a comb-teeth shape. The first extraction electrodes 222 are defined so as to have a width wider than the width of the first diffusion regions 214, and are defined so as to cover the first diffusion regions 214. The first extraction electrodes 222 have a uniform width throughout from the first diffusion regions 214 up to the first pad 221.

The leading end portions of the first extraction electrodes 222 are defined in substantially rectangular shapes whose corner portions are cut off, and are arranged at positions close to the second electrode 210 at an interval therefrom, across the first column in the element region 203. That is, in planar view, the first diffusion regions 214 are defined in regions of the central portions in the longitudinal direction of the first extraction electrodes 222. The first extraction electrodes 222 covering the first diffusion regions 214 enter the contact holes 217, to define ohmic contacts with the first diffusion regions 214.

The second electrode 210 includes the second connection electrode 210a, and a second electrode film 220 which is electrically connected to the second connection electrode 210a. The second electrode film 220 further has a second pad 223, and second extraction electrodes 224 which are defined integrally with the second pad 223.

The second pad 223 is defined in a substantially rectangular shape in planar view on the other end portion side (the end portion opposite to the first pad 221) of the element forming surface 204. The second connection electrode 210a is connected to the second pad 223. This allows the second extraction electrodes 224 to be electrically connected to the second connection electrode 210a via the second pad 223.

The second extraction electrodes 224 are defined linearly along the row direction from the second pad 223. More specifically, the second extraction electrodes 224 are defined linearly so as to cross the central diffusion region group 228 and/or the auxiliary diffusion region groups 229 from the second pad 223 toward the even rows in the element region 203. That is, the second extraction electrodes 224 are defined in a comb-teeth shape along the longitudinal direction of the first extraction electrodes 222. Accordingly, the first and second electrode films 219, 220 are defined in comb-teeth shapes such that the first and second extraction electrodes 222, 224 engage with each other. Further, the second extraction electrodes 224 are defined so as to have a width wider than the width of the second diffusion regions 215, and are defined so as to cover the second diffusion regions 215. The second extraction electrodes 224 have a uniform width throughout from the second diffusion regions 215 up to the second pad 223.

The leading end portions of the second extraction electrodes 224 are defined in substantially rectangular shapes whose corner portions are cut off, and are arranged at positions close to the first electrode 209 at an interval therefrom, across the fifth column in the element region 203. That is, in planar view, the second diffusion regions 215 are defined in regions of the central portions in the longitudinal direction of the second extraction electrodes 224. The second extraction electrodes 224 covering the second diffusion regions 215 enter the contact holes 217, to define ohmic contacts with the second diffusion regions 215.

The first and second electrode films 219, 210 are composed of the same conductive material, and for example, Al, AlCu, AlSiCu, or the like may be exemplified. The first and second electrodes 209, 210 are electrically isolated by slits 225 rimming the respective peripheral edge portions of the first and second electrode films 219, 220 on the insulating film 216.

Figure 36:
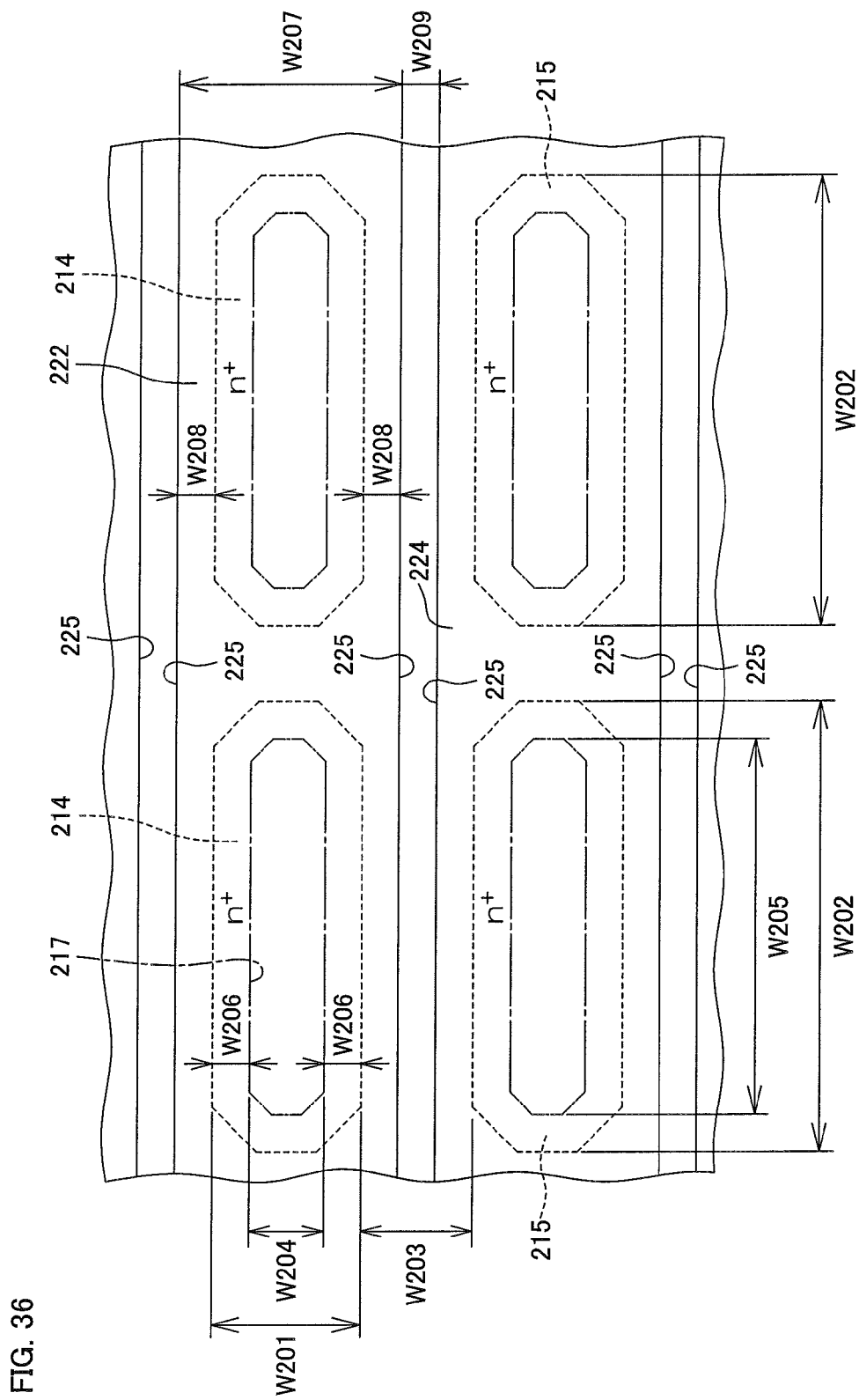
FIG. 36 is an enlarged plan view of a region including the diffusion regions shown in FIG. 32.

As shown in FIGS. 35 and 36, the passivation film 211a and the resin film 212 are defined in this order so as to cover the first and second electrode films 219, 220 on the insulating film 216. Further, the passivation film 211b is defined on the side surfaces of the semiconductor substrate 202. The passivation films 211a, 211b are composed of, for example, silicon nitride, and the resin film 212 is composed of, for example, polyimide.

The passivation films 211a, 211b and the resin film 212 constitute a protective film, that reduces or prevents moisture intrusion into the first and second extraction electrodes 222, 224 and the element forming surface 204, and absorbs impact and the like from the outside, which contributes to improvement in durability of the bidirectional Zener diode.

Pad openings 226, 227 for selectively exposing the first and second pads 221, 223 are defined in the passivation film 211a and the resin film 212. The first and second connection electrodes 209a, 210a are defined so as to backfill the pad openings 226, 227. The first and second connection electrodes 209a, 210a are composed of a single-layer conductive material (for example, an Ni layer). The first and second connection electrodes 209a, 210a are defined so as to protrude from the surface of the resin film 212.

Next, the respective arrangements and the respective sizes of the first and second diffusion regions 214, 215 will be described concretely with reference to FIG. 36.

FIG. 36 is an enlarged plan view of a region including the first and second diffusion regions 214, 215 shown in FIG. 32.

As shown in FIG. 36, a width W201 in the column direction of the first and second diffusion regions 214, 215 is 5 μm to 15 μm (9 μm in Reference Example 2), and a width W202 in the row direction is 20 μm to 40 μm (28.8 μm in Reference Example 2). Further, a width W203 between the first and second diffusion regions 214, 215 may be 5 μm to 25 μm (12.5 μm in Reference Example 2).

Further, a width W204 in the column direction of the contact hole 217 is 1 μm to 10 μm (4 μm in Reference Example 2), and a width W205 in the row direction is 10 μm to 30 μm (23.8 μm in Reference Example 2). In this planar view, a width W206 from the peripheral edge portion of the first diffusion region 214 to the peripheral edge portion of the contact hole 217 may be approximately 2.5 μm.

Further, each width W107 in the column direction of the first and second extraction electrodes 222, 224 is 10 μm to 20 μm (14 μm in Reference Example 2). In this planar view, a width W208 from the peripheral edge portion of the first and second diffusion regions 214, 215 to the slits 225 of the first and second extraction electrodes 222, 224 may be approximately 2.5 μm. Further, a width W209 between the slits 225 may be 3 μm to 10 μm.

Next, the electrical structure of the bidirectional Zener diode 201 will be described with reference to FIG. 37.

Figure 37:
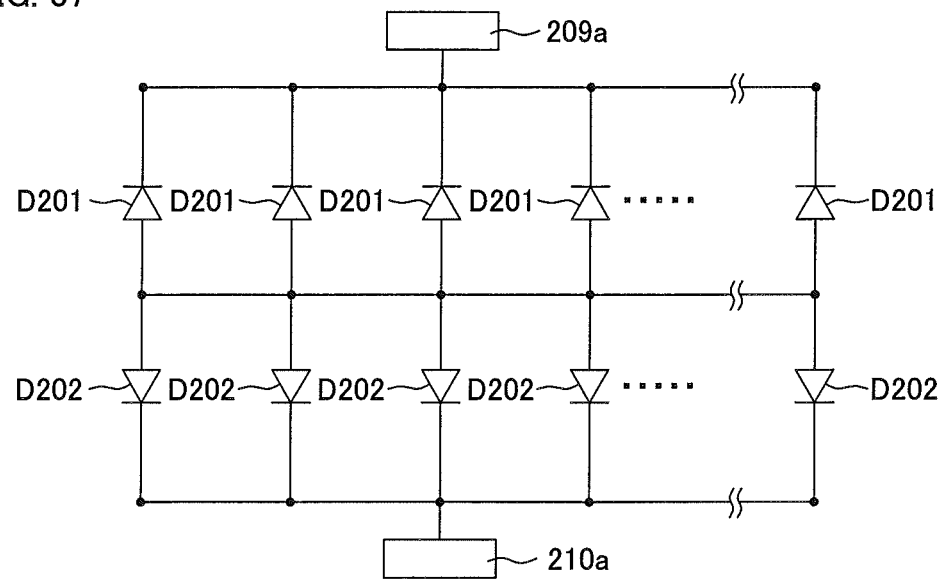
FIG. 37 is an electrical circuit diagram for explanation of the electrical structure of Arrangement Example 1.

FIG. 37 is an electrical circuit diagram for explanation of the electrical structure inside the bidirectional Zener diode 201 shown in FIG. 31.

As shown in FIG. 37, the single bidirectional Zener diode 201 is composed of a plurality of first Zener diodes D201 and a plurality of second Zener diodes D202. The first Zener diodes D201 are defined in the respective first diffusion regions 214 having the p-n junctions with the semiconductor substrate 202 (refer to FIGS. 34 and 35). The cathodes of the respective first Zener diodes D201 are connected in common to the first connection electrode 209a (cathode common). Further, the second Zener diodes D202 are defined in the respective second diffusion regions 215 having the p-n junctions with the semiconductor substrate 202 (refer to FIGS. 34 and 35). The cathodes of the respective second Zener diodes D202 are connected in common to the second connection electrode 210a (cathode common).

On the other hand, the respective anodes of the first and second Zener diodes D201, D202 are connected in common via the semiconductor substrate 202 (anode common). That is, the first Zener diodes D201 and the second Zener diodes D202 are anti-series connected via the semiconductor substrate 202. In this manner, the single bidirectional Zener diode 201 is configured.

<Evaluation of Arrangement Example 1>

In Arrangement Example 1, in addition to the representative example, a plurality of examples in which the arrangement of the first and second diffusion regions 214, 215 are further changed are prepared, and the peak pulse power ($P_{pk}$: Peak Pulse Power), the capacitance between terminals $C_t$ (the total capacitance between the first electrode 209 and the second electrode 210), and the ESD (Electrostatic Discharge) resistance were checked. Hereinafter, the description thereof will be made more specifically with reference to FIG. 38 to FIG. 41.

FIG. 38 are schematic plan views for explanation of arrangement examples of the first and second diffusion regions 214, 215 in Arrangement Example 1.

FIGS. 38A to 38C are plan views sequentially showing Arrangement Example 201, Arrangement Example 202, and Arrangement Example 203. In addition, Arrangement Example 201 shown in FIG. 38A is the representative example of Arrangement Example 1 described in FIGS. 31 to 37.

Arrangement Example 202 shown in FIG. 38B is different from the above-described representative example (Arrangement Example 201) in the point that the auxiliary diffusion region groups 229 are defined on the both end portion sides of the central diffusion region group 228. That is, the auxiliary diffusion region groups 229 are defined so as not to sandwich the central portion in the column direction of the central diffusion region group 228.

Arrangement Example 203 shown in FIG. 38C is different from the above-described representative example (Arrangement Example 201) in the point that the central diffusion region group 228 and the auxiliary diffusion region groups 229 are not defined. More specifically, the first and second diffusion regions 214, 215 are defined on the columns other than the third column in the element region 203. The second diffusion regions 215 are defined along the column direction on the first column and the second column, and the first diffusion regions 214 are defined along the column direction on the fourth column and the fifth column. The total number of the second diffusion regions 215 defined on the second column is one less than the total number of the second diffusion regions 215 defined on the first column (refer to the third row on the second column). In the same way, the total number of the first diffusion regions 214 defined on the fourth column is one less than the total number of the first diffusion regions 214 defined on the fifth column (refer to the eleventh row on the fourth column).

With reference to respective Arrangement Examples 201 to 203, the first and second diffusion regions 214, 215 are configured so as to be symmetrical to one another in planar view. More specifically, the first and second diffusion regions 214, 215 are configured so as to be point-symmetrical with respect to the central portion (for example, the center of gravity) of the element forming surface 204 in planar view. That is, in the case where the semiconductor substrate 202 is rotated by 180 degrees around a predetermined vertical axis line perpendicular to the element forming surface 204, the positions of the first and second diffusion regions 214, 215 correspond to the positions of the first and second diffusion regions 214, 215 before the rotation.

In accordance with these symmetrical structures, it is possible to make the electrical characteristics between the first electrode 209 and the second electrode 210 symmetrical. That is, it is possible to substantially equalize the voltage-current characteristics in the case where a voltage is applied with the first connection electrode 209a serving as a positive electrode and the second connection electrode 210a serving as a negative electrode, and the voltage-current characteristics in the case where a voltage is applied with the second connection electrode 210a serving as a positive electrode and the first connection electrode 209a serving as a negative electrode.

Figure 40:
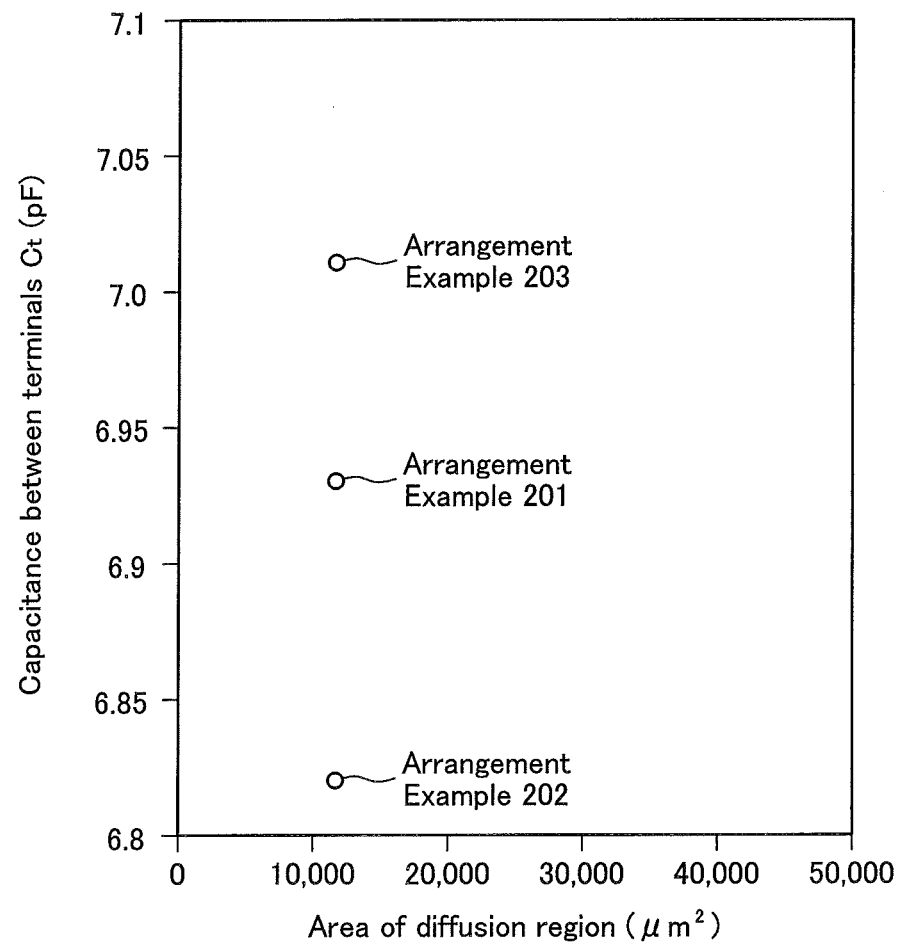
FIG. 40 is a graph on which the capacitances between terminals shown in the table of FIG. 39 are reflected.
Figure 41:
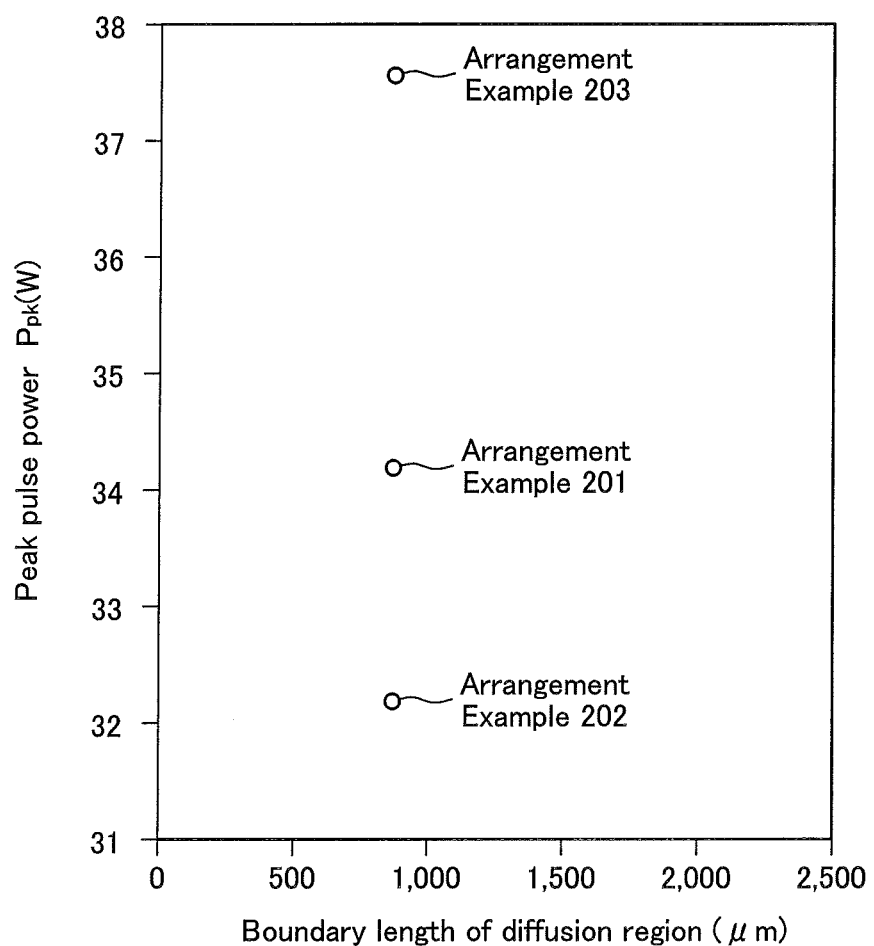
FIG. 41 is a graph on which the peak pulse powers shown in the table of FIG. 39 are reflected.
Figure 42:
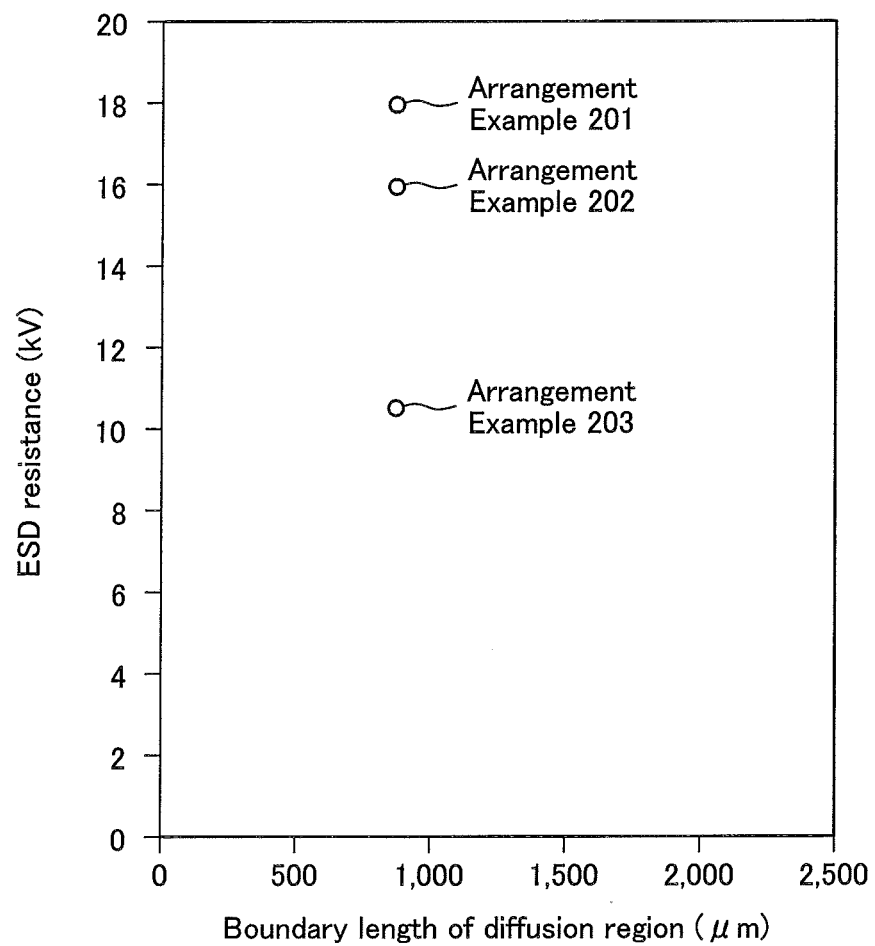
FIG. 42 is a graph on which the ESD resistances shown in the table of FIG. 39 are reflected.

FIG. 39 is a table showing the specifications in respective Arrangement Examples 201 to 203 shown in FIG. 38. FIG. 40 is a graph on which the capacitances between terminals $C_t$ shown in the table of FIG. 39 are reflected. FIG. 41 is a graph on which the peak pulse powers $P_{pk}$ shown in the table of FIG. 39 are reflected. FIG. 42 is a graph on which the ESD resistances shown in the table of FIG. 39 are reflected.

As shown in the table of FIG. 39, in Arrangement Examples 201 to 203, the respective areas and the respective boundary lengths of the first and second diffusion regions 214, 215 are defined so as to be the same in all cases. The respective areas of the first and second diffusion regions 214, 215 are 11585 $\mu m^2$, and the respective boundary lengths of the first and second diffusion regions 214, 215 are 872 $\mu m$.

An area of the first diffusion region 214 means a total area of a region surrounded by the boundary between the semiconductor substrate 202 and the first diffusion region 214 in planar view that the element forming surface 204 of the semiconductor substrate 202 is viewed from a normal direction. In the same way, an area of the second diffusion region 215 means a total area of a region surrounded by the boundary between the semiconductor substrate 202 and the second diffusion region 215 in planar view that the element forming surface 204 of the semiconductor substrate 202 is viewed from a normal direction.

Further, a boundary length of the first diffusion region 214 means a total extension of the boundary between the semiconductor substrate 202 and the first diffusion region 214 in the element forming surface 204 of the semiconductor substrate 202. Further, in the same way, a boundary length of the second diffusion region 215 means a total extension of the boundary between the semiconductor substrate 202 and the second diffusion region 215 in the element forming surface 204 of the semiconductor substrate 202.

The capacitance between terminals $C_t$ of the bidirectional Zener diode 201 is dependent on the respective areas of the first and second diffusion regions 214, 215. That is, the capacitance between terminals $C_t$ increases with an increase in the respective areas of the first and second diffusion regions 214, 215, and the capacitance between terminals $C_t$ decreases with a decrease in the respective areas of the first and second diffusion regions 214, 215.

On the other hand, the peak pulse power $P_{pk}$ of the bidirectional Zener diode 201 is dependent on the respective areas of the first and second diffusion regions 214, 215. That is, the peak pulse power $P_{pk}$ increases with an increase in the respective areas of the first and second diffusion regions 214, 215, and the peak pulse power $P_{pk}$ decreases with a decrease in the respective areas of the first and second diffusion regions 214, 215. That is, the peak pulse power $P_{pk}$ and the capacitance between terminals $C_t$ are in a trade-off relationship.

As in Arrangement Examples 201 to 203, when the respective areas of the first and second diffusion regions 214, 215 are the same (=11585 $\mu m^2$), it is possible to substantially uniform the respective capacitance components (parasitic capacitances) in the first and second diffusion regions 214, 215. That is, by substantially uniforming the respective areas of the first and second diffusion regions 214, 215, it is possible to substantially uniform the values of the capacitance between terminals $C_t$ of the bidirectional Zener diode 201 independently of the arrangement of the first and second diffusion regions 214, 215.

Here, as shown in the table of FIG. 39 and the graph of FIG. 40, in accordance with Arrangement Examples 201 to 203, it has been possible to achieve the capacitances between terminals $C_t$ of 7.1 pF or less (specifically, 6.8 pF<the capacitance between terminals $C_t$<7.1 pF) in all cases. From this fact, it has been confirmed that there are no large fluctuations in the capacitance between terminals $C_t$ due to the respective arrangements of the first and second diffusion regions 214, 215.

As shown in the table of FIG. 39 and the graph of FIG. 40, in accordance with Arrangement Examples 201 to 203, it has been possible to achieve the peak pulse powers $P_{pk}$ of 30 W to 38 W. From this result, it has been confirmed that, by fixing the respective areas of the first and second diffusion regions 214, 215, it is possible to achieve good peak pulse power $P_{pk}$ while reliably suppressing an increase in undesired capacitance between terminals $C_t$.

On the other hand, it has been known that ESD resistance is dependent on the respective boundary lengths of the first and second diffusion regions 214, 215. That is, the ESD resistance increases with elongating the respective boundary lengths of the first and second diffusion regions 214, 215, and the ESD resistance decreases with shortening the respective boundary lengths of the first and second diffusion regions 214, 215. That is, in a case where good ESD resistance is desired, it is recommended that the respective boundary lengths of the first and second diffusion regions 214, 215 be elongated.

As shown in the table of FIG. 39 and the graph of FIG. 40, in Arrangement Examples 201 to 203, the first and second diffusion regions 214, 215 have the same boundary length (=872 m) in all cases. On the contrary, the ESD resistance is improved higher in the order of Arrangement Example 203, Arrangement Example 202, and Arrangement Example 201. This result shows that ESD resistance is dependent on, in addition to the respective boundary lengths of the first and second diffusion regions 214, 215, the arrangement of the first and second diffusion regions 214, 215. In particular, in the case of Arrangement Example 203, the ESD resistance is 10.5 kV. On the other hand, in the case of Arrangement Example 202, it has been possible to achieve the ESD resistance of 16 kV, and in the case of Arrangement Example 201, it has been possible to achieve the ESD resistance of 18 kV. Accordingly, it has been confirmed that it is possible to improve the ESD resistance by aggregating the first and second diffusion regions 214, 215 in the central portion of the element region 203.

As described above, in accordance with Arrangement Example 1 (Arrangement Examples 201 to 203), the plurality of first and second diffusion regions 214, 215 are defined in the element region 203. The single bidirectional Zener diode 201 composed of the plurality of first and second Zener diodes D201, D202 are defined from the plurality of first and second diffusion regions 214, 215. The respective boundary lengths of the first and second diffusion regions 214, 215 are 872 μm, and the respective areas of the first and second diffusion regions 214, 215 are 11585 μm².

In accordance therewith, it is possible to realize the bidirectional Zener diode 201 having the peak pulse power $P_{pk}$ of 30 W to 38 W while achieving the capacitance between terminals $C_t$ of 7.1 pF or less (more specifically, 6.8 pF<the capacitance between terminals $C_t$<7.1 pF) (refer to the table of FIG. 39 and the graph of FIG. 40).

Further, in accordance with Arrangement Examples 201 to 203, it is possible to achieve the ESD resistance of 10 kV to 20 kV (more specifically, 10.5 kV to 18.0 kV). Accordingly, it is possible to conform to IEC61000-4-2 (International Standard) that the lower limit of ESD resistance is stipulated to be 8 kV or higher.

Moreover, ESD resistance is dependent on the arrangement of the first and second diffusion regions 214, 215. As in Arrangement Example 201 and Arrangement Example 202, by aggregating the first and second diffusion regions 214, 215 in the central portion of the element region 203, it is possible to achieve the ESD resistance (=16 kV to 18 kV) higher than the ESD resistance (=10.5 kV) of Arrangement Example 203 in which the first and second diffusion regions 214, 215 are not aggregated in the central portion of the element region 203 (refer to the table of FIG. 39 and the graph of FIG. 42)).

Accordingly, in accordance with Arrangement Example 201 and Arrangement Example 202, it is possible to achieve excellent ESD resistance while achieving good capacitance between terminals $C_t$ and peak pulse power $P_{pk}$. Therefore, it is possible to provide the bidirectional Zener diode 201 which is capable of leading to the improvement in reliability.

Further, because the semiconductor substrate 202 is a p-type semiconductor substrate, it is possible to achieve stable characteristics even without defining an epitaxial layer on the semiconductor substrate. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because the p-type semiconductor substrate 202 has a small in-plane resistivity variation, it is possible to cut a bidirectional Zener diode with stable characteristics out of any place of the p-type semiconductor substrate 202 without defining an epitaxial layer. Therefore, by use of the p-type semiconductor substrate 202, it is possible to simplify the manufacturing process, and reduce the manufacturing cost.

<Manufacturing Method of Arrangement Example 1>

Figure 43:
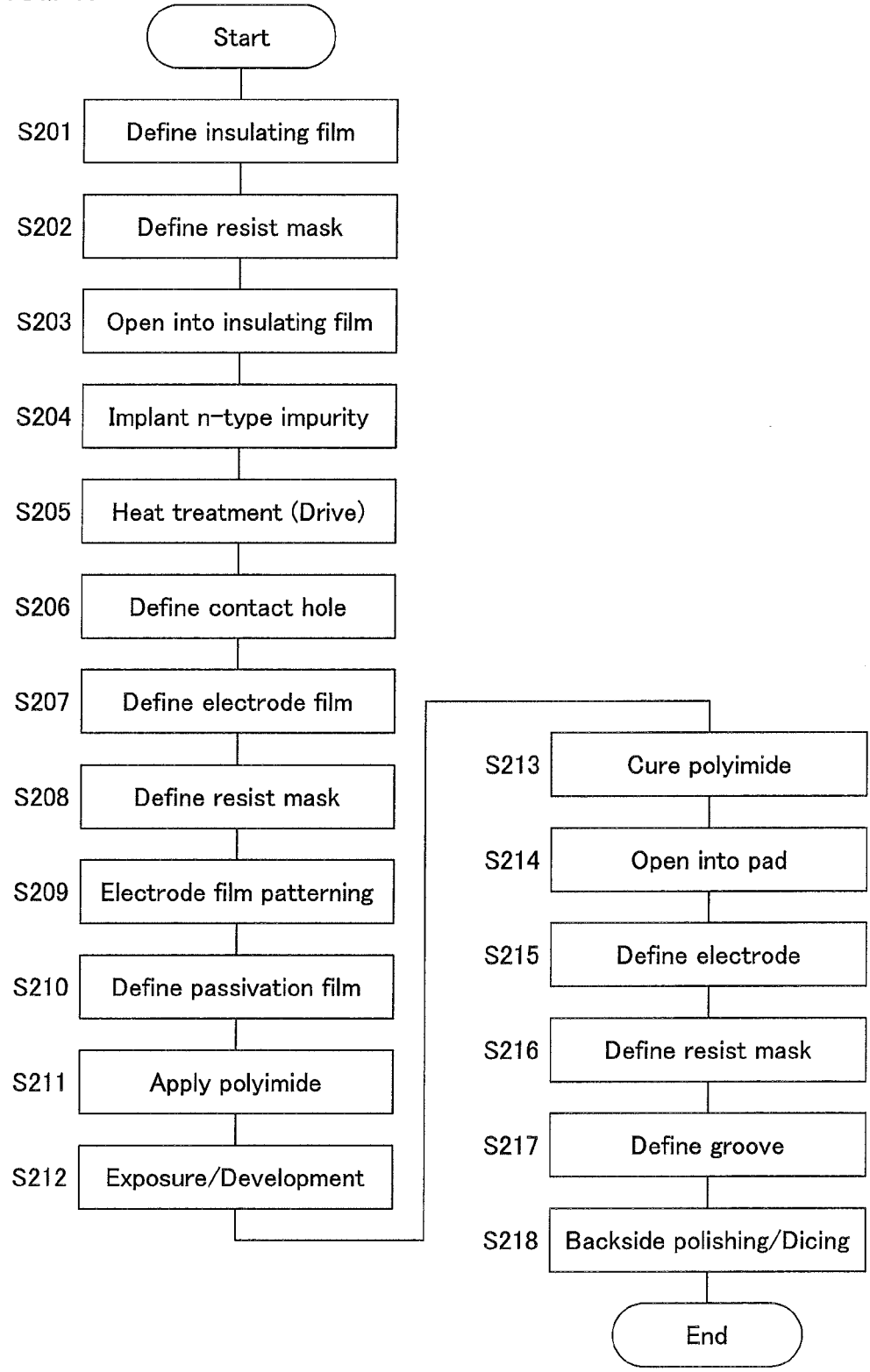
FIG. 43 is a flowchart for explanation of an example of the manufacturing process of the bidirectional Zener diode shown in FIG. 31.
Figure 44:
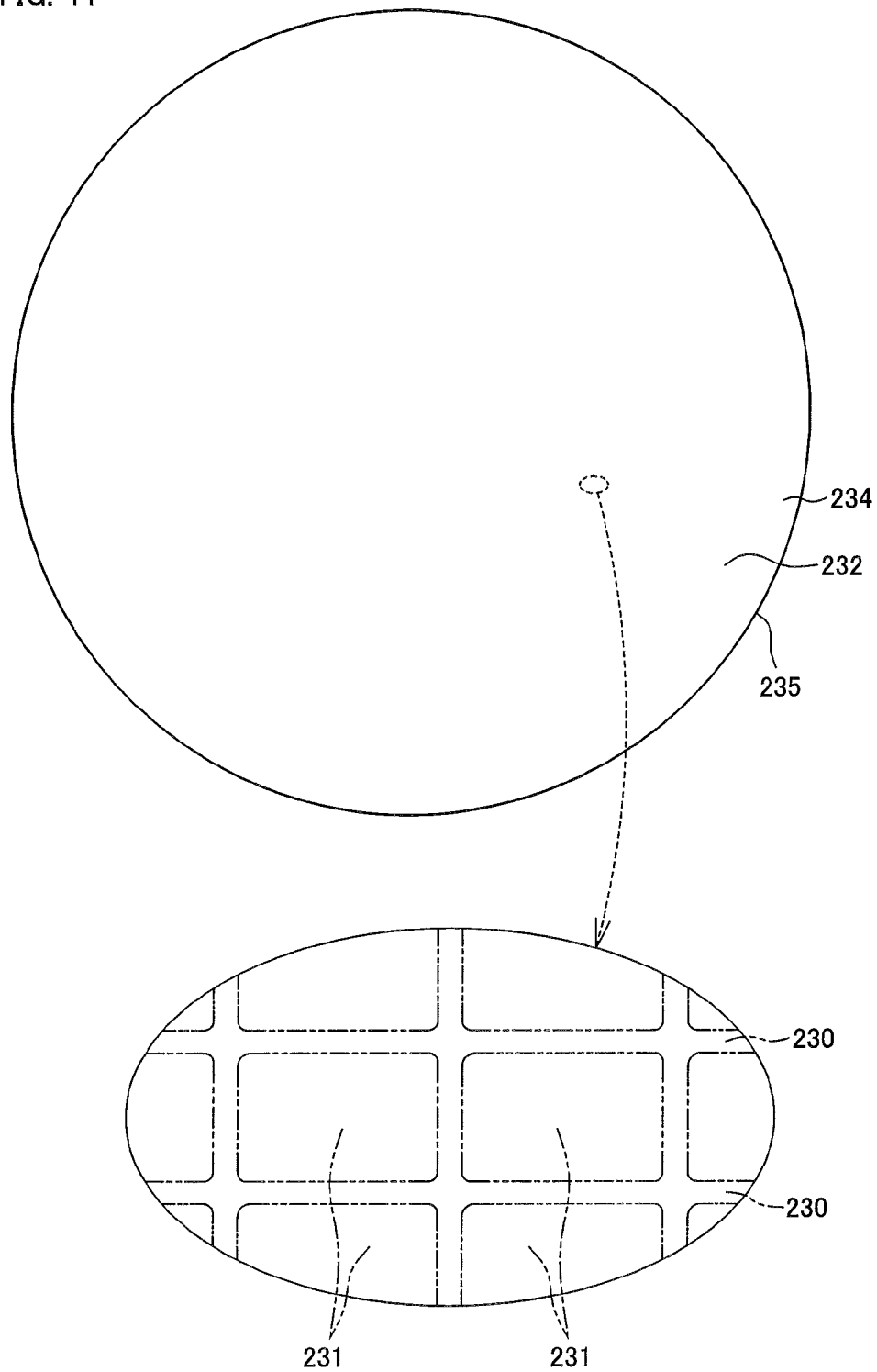
FIG. 44 is a schematic plan view of a semiconductor wafer which is applied to the manufacturing process of FIG. 43.
Figure 45A:
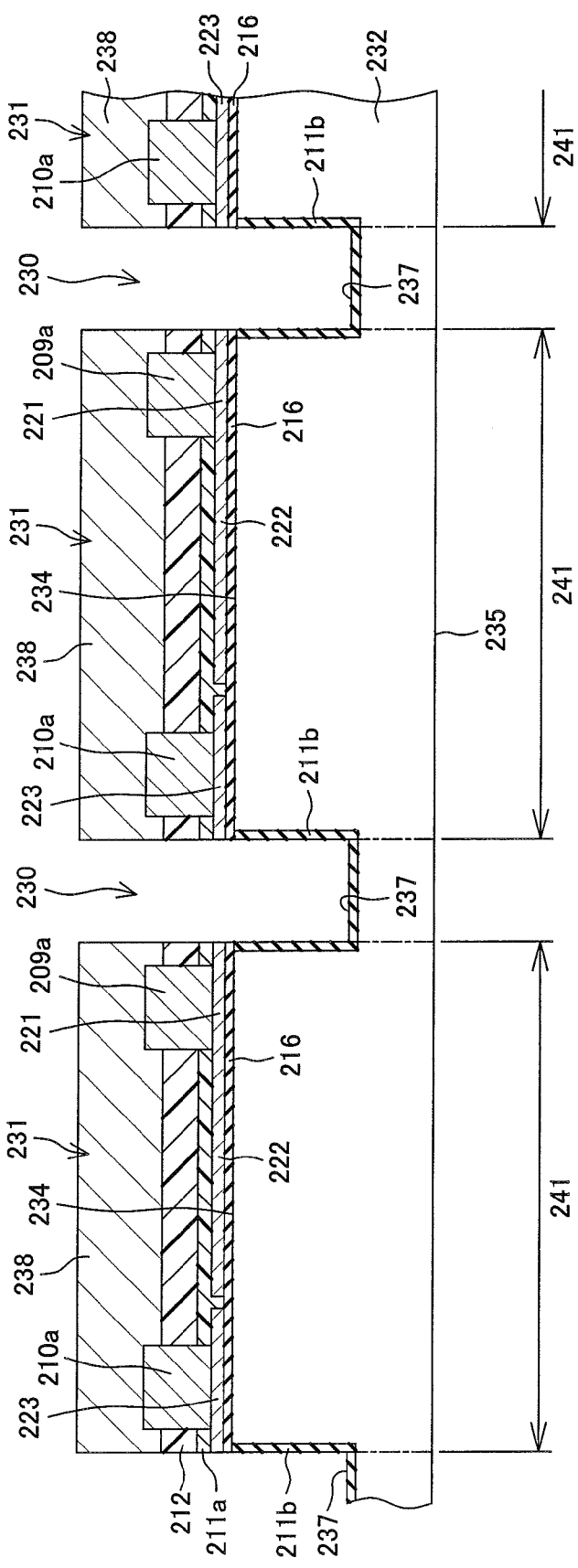
FIGS. 45A and 45B are schematic cross-sectional views for explanation of a backside polishing and dicing process shown in FIG. 43.
Figure 45B:
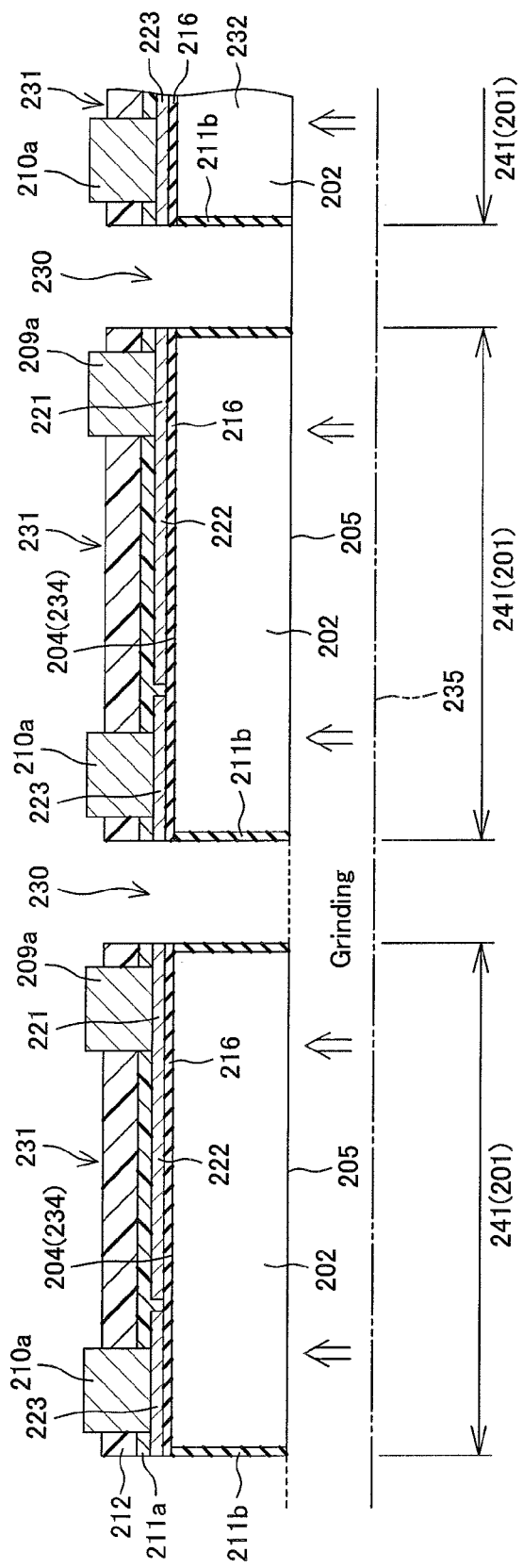

FIG. 43 is a flowchart for explanation of an example of the manufacturing process of the bidirectional Zener diode 201 shown in FIG. 31. FIG. 44 is a schematic plan view of a semiconductor wafer 232 which is applied to the manufacturing process of FIG. 43. FIGS. 45A and 45B are schematic cross-sectional views for explanation of a backside polishing and dicing process shown in FIG. 43. In addition, in FIGS. 45A and 45B, the illustrations of the first and second diffusion regions 214, 215 are omitted.

First, as shown in FIG. 44, the p⁺-type semiconductor wafer 232 as a base substrate of the semiconductor substrate 202 is prepared. A surface 234 of the semiconductor wafer 232 corresponds to the element forming surface 204 of the semiconductor substrate 202, and a back surface 235 of the semiconductor wafer 232 corresponds to the back surface 205 of the semiconductor substrate 202.

Chip regions 231 in which a plurality of the bidirectional Zener diodes 201 are defined, are set so as to align in a matrix shape on the surface 234 of the semiconductor wafer 232. A boundary region 230 is provided between the chip regions 231 adjacent to one another. The boundary region 230 is a band-shaped region having a substantially constant width, and extends in two directions perpendicular to one another, to be defined in a lattice shape.

Next, the insulating film 216 is defined on the surface 234 of the semiconductor wafer 232 (Step S201: Define insulating film). Next, a resist mask is defined on the insulating film 216 (Step S202: Define resist mask). Openings corresponding to the plurality of first and second diffusion regions 214, 215 are defined in the insulating film 216 by etching by use of this resist mask (Step S203: Open insulating film).

Next, after the resist mask is peeled off, an n-type impurity is implanted into the surface 234 of the semiconductor wafer 232 which is exposed from the openings defined in the insulating film 216 (Step S204: Implant n-type impurity). Implantation of the n-type impurity may be performed by the process of depositing phosphorus as the n-type impurity on the surface (so-called phosphorus deposition), or may be performed by implantation of n-type impurity ions (for example, phosphorus ions).

Next, after the insulating film 216 is made into a thick film by a CVD method as needed, a heat treatment (drive) for activation of the impurity ions implanted into the semiconductor wafer 232 is performed (Step S205: Heat treatment (drive)). Thereby, the plurality of first and second diffusion regions 214, 215 are defined on the surface portion of the semiconductor wafer 232.

Next, a resist mask having openings corresponding to the contact holes 217 is defined on the insulating film 216 (Step S206: Define contact hole). The contact holes 217 are defined in the insulating film 216 by etching via the resist mask. Thereafter, the resist mask is peeled off.

Next, an electrode film constituting the first and second electrode films 219, 220 is defined on the insulating film 216 by, for example, sputtering (Step S207: Define electrode film). In Reference Example 2, an electrode film composed of Al is defined. Then, a resist mask having an opening pattern corresponding to the slits 225 is defined on the electrode film (Step S208: Define resist mask). The slits 225 are defined in the electrode film by etching (for example, reactive ion etching) via the resist mask (Step S209: Electrode film patterning). This separates the electrode film into the first and second electrode films 219, 220.

Next, after the resist mask is peeled off, the passivation film 211a such as a nitride film is defined by, for example, a CVD method (Step S210: Define passivation film). Next, the resin film 212 is defined by application of photosensitive polyimide or the like (Step S211: Apply polyimide). Next, the resin film 212 is exposed through a pattern corresponding to the pad openings 226, 227. Thereafter, the resin film 212 is developed (Step S212: Exposure/development process).

Next, as needed, a heat treatment for curing the resin film 212 is performed (Step S213: Cure polyimide). Then, the passivation film 211a is removed by dry etching (for example, reactive ion etching) with the resin film 212 serving as a mask (Step S214: Open pad). Thereby, the pad openings 226, 227 are defined.

Next, for example, a conductive material (for example, an Ni layer) is plated to form a film so as to backfill the pad openings 226, 227 (Step S215: Define electrode). Thereby, the first and second connection electrodes 209a, 210a are defined.

Next, as shown in FIG. 45A, a resist pattern 238 for defining a groove for cutting 237 is defined in the boundary region 230 (refer to FIG. 44 as well) (Step S216: Define resist mask). The resist pattern 238 has a grid-shaped opening corresponding to the boundary region 230. Plasma etching is performed via the resist pattern 238 (Step S217: Define groove). Accordingly, the semiconductor wafer 232 is etched from the surface 234 up to a predetermined depth, to define the groove for cutting 237 along the boundary region 230.

Half-finished products 241 are located one by one in the chip regions 231 surrounded by the groove for cutting 237, and these half-finished products 241 are arranged so as to align in a matrix shape. By defining the groove for cutting 237 in this manner, it is possible to separate the semiconductor wafer 232 into the plurality of chip regions 231. After the groove for cutting 237 is defined, the resist pattern is peeled off.

Next, the passivation film 211b composed of silicon nitride is defined on the surface of the semiconductor wafer 232 by a CVD method. At this time, the passivation film 211b is defined on the entire area of the inner circumferential surface (the bottom surface and the side surfaces) of the groove for cutting 237.

Next, as shown in FIG. 45B, the semiconductor wafer 232 is polished from the back surface 235 side, so as to reach the bottom surface of the groove for cutting 237 (Step S218: Backside polishing/Dicing). Thereby, it is possible to obtain the bidirectional Zener diodes 201 that the plurality of chip regions 231 are diced into pieces. In this manner, provided that the semiconductor wafer 232 is polished from the back surface 235 side after the groove for cutting 237 is defined, it is possible to simultaneously dice the plurality of chip regions 231 defined on the semiconductor wafer 232 into pieces. Therefore, it is possible to achieve the improvement in productivity of the bidirectional Zener diodes 201 due to shortening of the manufacturing time. In addition, the back surface 205 of the completed semiconductor substrate 202 may be mirrored by polishing or etching, so as to clear the back surface 205.

ARRANGEMENT EXAMPLE 2

Figure 46:
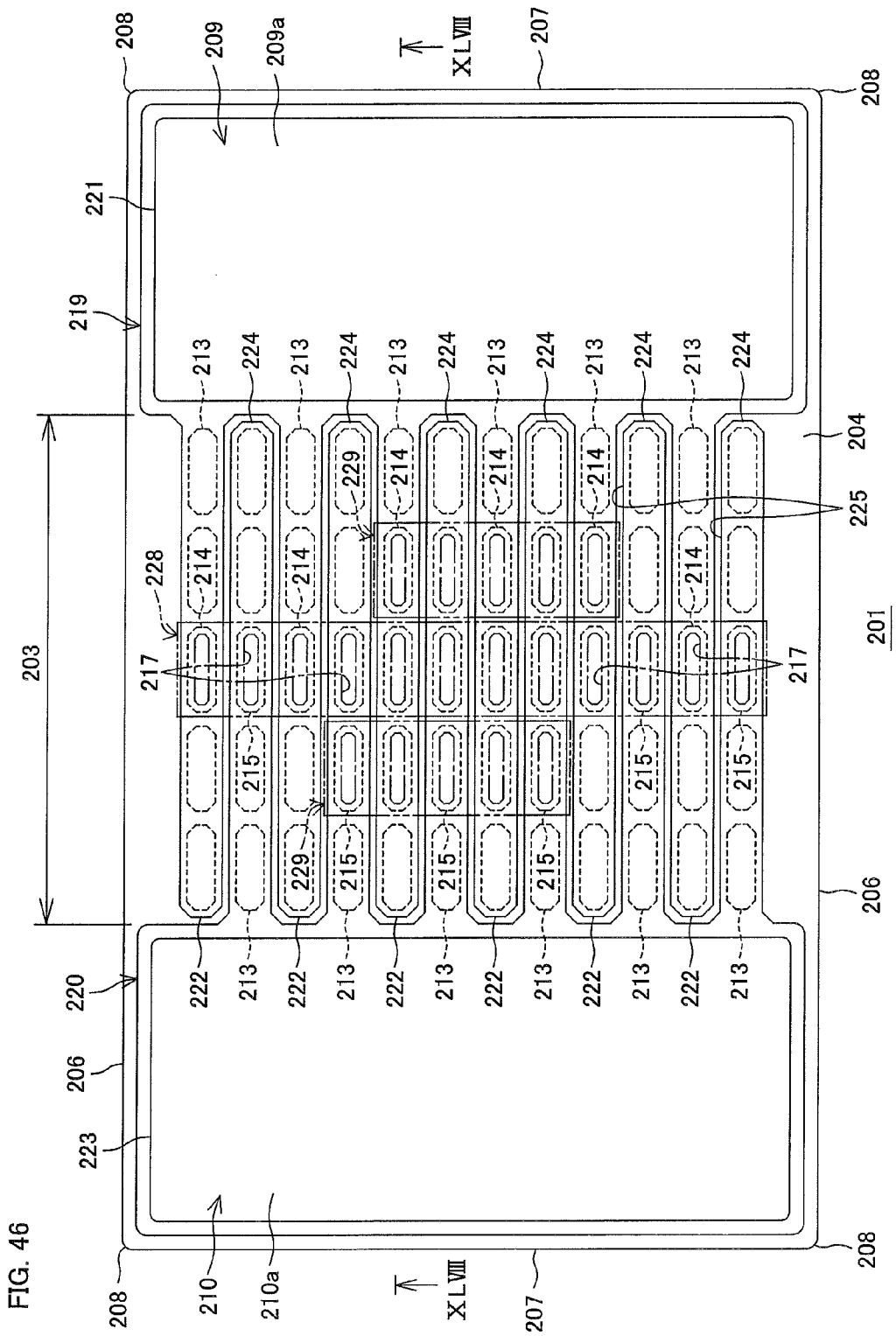
FIG. 46 is a schematic plan view showing Arrangement Example 2 of the bidirectional Zener diode shown in FIG. 31.
Figure 47:
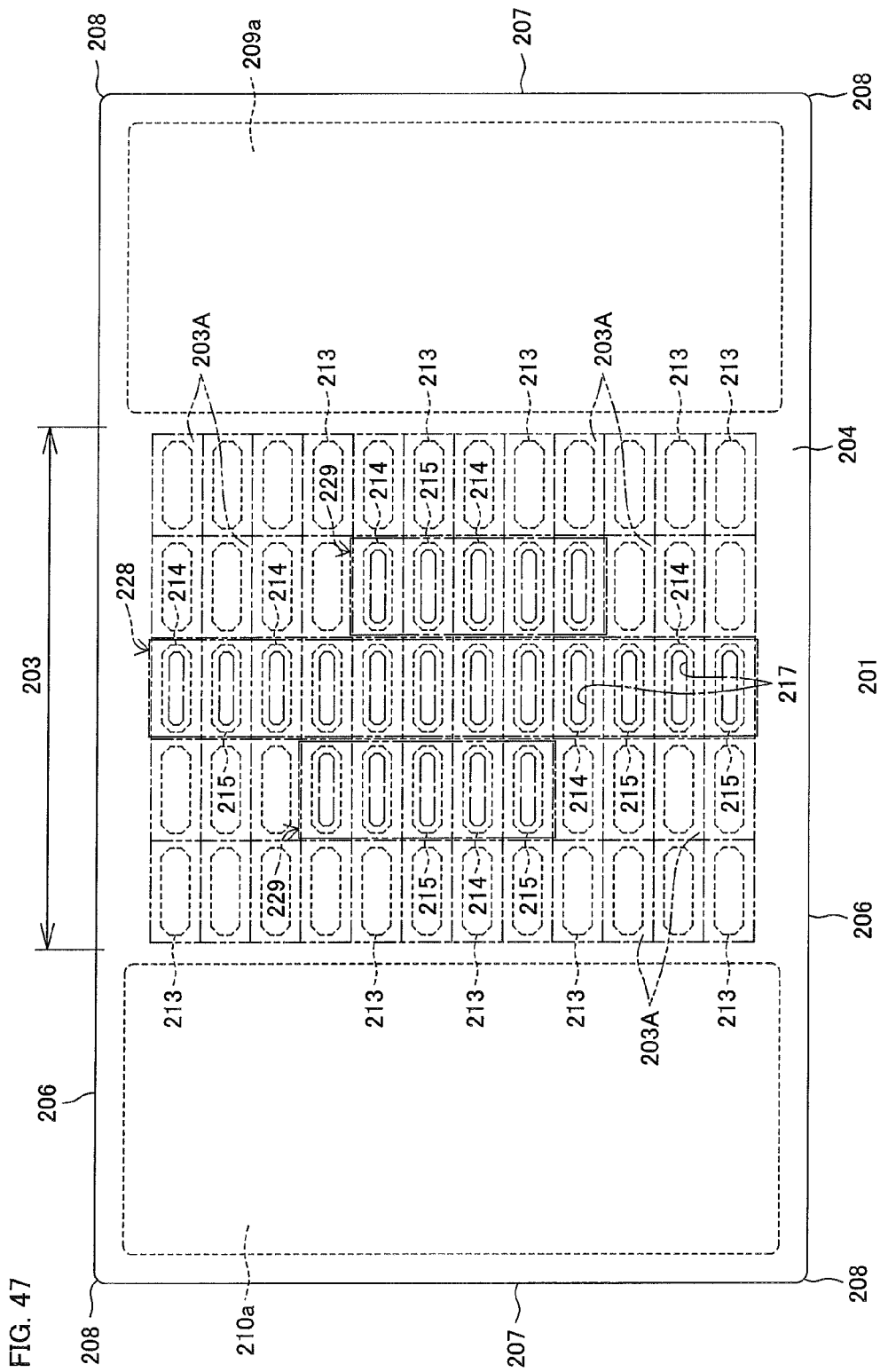
FIG. 47 is a plan view showing an arrangement of the diffusion regions shown in FIG. 46.
Figure 48:
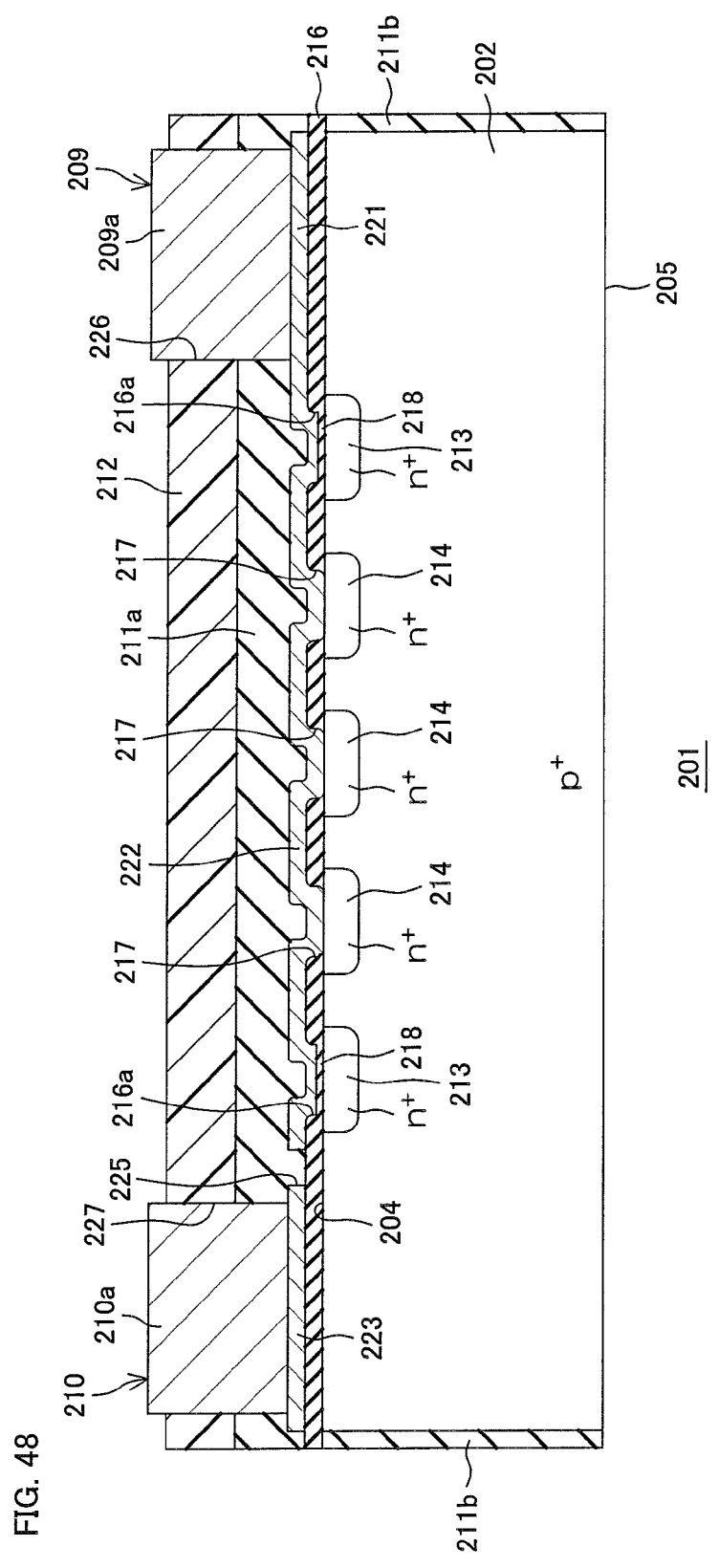

FIG. 46 is a schematic plan view showing Arrangement Example 2 of the bidirectional Zener diode 201 shown in FIG. 31. FIG. 47 is a plan view showing an arrangement of the first diffusion regions 214, the second diffusion regions 215, and pseudo-diode regions 213 shown in FIG. 46. FIG. 48 is a cross-sectional view taken along the cross-section line XLVIII-XLVIII shown in FIG. 46. In addition, FIGS. 46 to 48 illustrate an arrangement example of Arrangement Example 2 as the representative example.

Arrangement Example 2 is different from Arrangement Example 1 described above in the point that the pseudo-diode regions 213 are further included. The other configurations are the same as those of Arrangement Example 1 described above. In FIGS. 46 to 48, portions corresponding to the respective portions shown FIGS. 31 to 45 are shown with the same reference numerals, and the descriptions thereof will be omitted.

In the element region 203 (the element forming surface 204) of the semiconductor substrate 202 in Arrangement Example 2, in addition to the plurality of first diffusion regions 214 and the plurality of second diffusion regions 215, the plurality of pseudo-diode regions 213 are defined so as to regularly align. The pseudo-diode regions 213 are defined so as to have the same depth and the same impurity concentration as the first and second diffusion regions 214, 215, and define p-n junctions with the semiconductor substrate 202.

The pseudo-diode regions 213 are defined in the regions other than the regions where the first and second diffusion regions 214, 215 are defined. That is, the pseudo-diode regions 213 are defined in the regions other than the regions where the first and second diffusion regions 214, 215 are aggregated in the central portion of the element region 203 (that is, the central diffusion region group 228 and the auxiliary diffusion region groups 229).

More specifically, the pseudo-diode regions 213 are defined along the column direction of the first column and the fifth column as shown in FIG. 47. Further, on the second column and the fourth column, the pseudo-diode regions 213 are defined in the cells 203A other than the cells 203A on which the auxiliary diffusion region groups 228 are defined (on the both end sides of the central diffusion region group 228 with respect to the column direction). The pseudo-diode regions 213 are defined so as to have the same shape as that of the first and second diffusion regions 214, 215 in the interior portions of the cells 203A.

As shown in FIG. 48, thin-film portions 218 that the insulating film 216 is selectively thinned are defined on the portions on the pseudo-diode regions 213 in the insulating film 216. The thin-film portions 218 define concave portions 216a in the insulating film 216.

The first extraction electrodes 222 covering the pseudo-diode regions 213 enter the concave portions 216a of the insulating film 216, and face the pseudo-diode regions 213 across the thin-film portions 218. On the other hand, the second extraction electrodes 224 covering the pseudo-diode regions 213 enter the concave portions 216a of the insulating film 216, and face the pseudo-diode regions 213 across the thin-film portions 218. This allows the pseudo-diode regions 213 to be electrically isolated from the first and second connection electrodes 209a, 210a.

From another viewpoint of the configuration in Arrangement Example 2, it may be considered that the plurality of $n^+$-type diffusion regions are arranged in a matrix shape in the element region 203, and the plurality of contact holes 217 are defined so as to aggregate in the central portion of the element region 203 (are defined at positions which are the same as the positions at which the central diffusion region group 228 and the auxiliary diffusion region groups 229 are defined).

Figure 49:
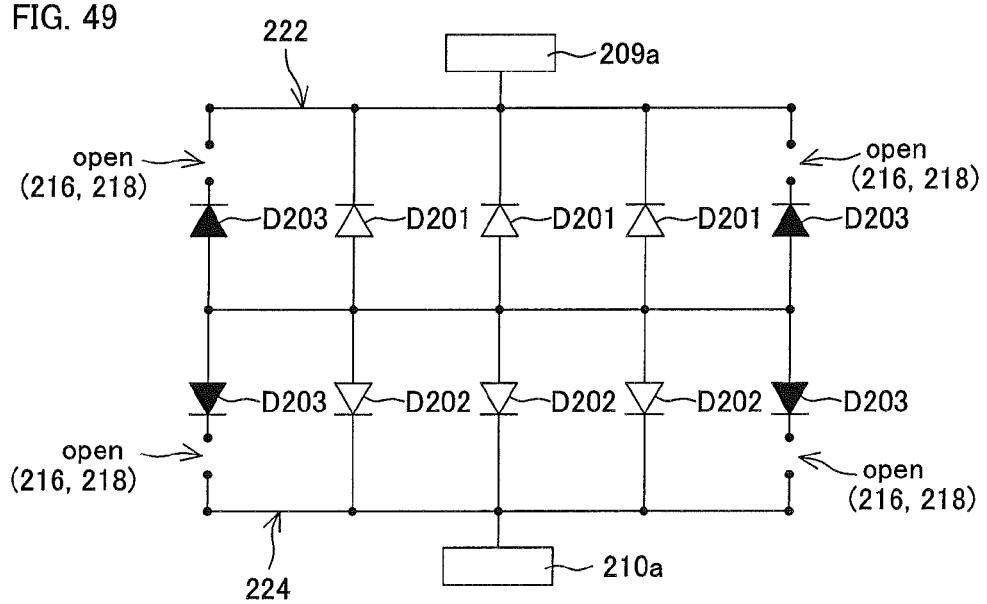
FIG. 49 is an electrical circuit diagram for explanation of the electrical structure of Arrangement Example 2.

Next, the electrical structure of Arrangement Example 2 will be described with reference to FIG. 49. FIG. 49 is an electrical circuit diagram for explanation of the electrical structure of Arrangement Example 2. In addition, FIG. 49 is a diagram that a pair of the first and second extraction electrodes 222, 224 adjacent to one another is extracted, to be remade into an electrical circuit diagram.

As shown in FIG. 49, in Arrangement Example 2, in addition to the first and second Zener diodes D201, D202, pseudo-Zener diodes D203 are defined. The pseudo-Zener diodes D203 are defined in the pseudo-diode regions 213 which are electrically isolated from the first and second connection electrodes 209a, 210a by the insulating film 216 (the thin-film portions 218)(refer to FIG. 48 as well).

The anode sides of the pseudo-Zener diodes D203 are connected in common to the first and second Zener diodes D201, D202 on the semiconductor substrate 202 (anode common). On the other hand, the cathode sides of the pseudo-Zener diodes D203 are electrically open-circuited by the insulating film 216 (the thin-film portions 218). That is, the pseudo-Zener diodes D203 are incapable of electrically operating.

In this manner, in Arrangement Example 2, the single bidirectional Zener diode 201 is composed of the first and second Zener diodes D201, D202 and the pseudo-Zener diodes D203.

FIG. 50 are schematic plan views for explanation of arrangement examples of the first diffusion regions 214, the second diffusion regions 215, and the pseudo-diode regions 213 in Arrangement Example 2.

FIGS. 50A to 50C are plan views sequentially showing Arrangement Example 204, Arrangement Example 205, and Arrangement Example 206. In addition, Arrangement Example 204 shown in FIG. 50A is a representative example of Arrangement Example 2 described in FIGS. 46 to 49.

Arrangement Examples 205 and 206 shown in FIGS. 50A and 50C respectively correspond to Arrangement Examples 202 and 203 of Arrangement Example 1 shown in FIGS. 38B and 38C described above, and are different in the point that the pseudo-diode regions 213 are defined. The other configurations thereof are the same as those in the above-described Arrangement Examples 202 and 203.

<Evaluation of Arrangement Example 2>

Figure 52:
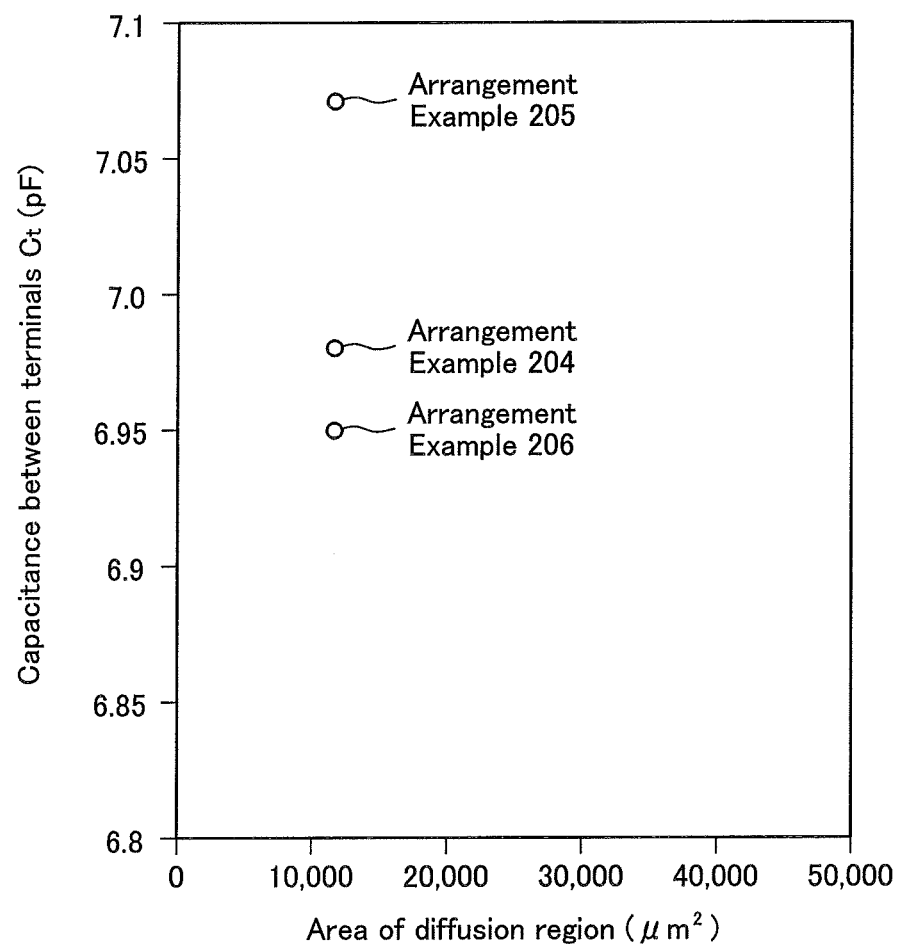
FIG. 52 is a graph on which the capacitances between terminals shown in FIG. 51 are reflected.
Figure 53:
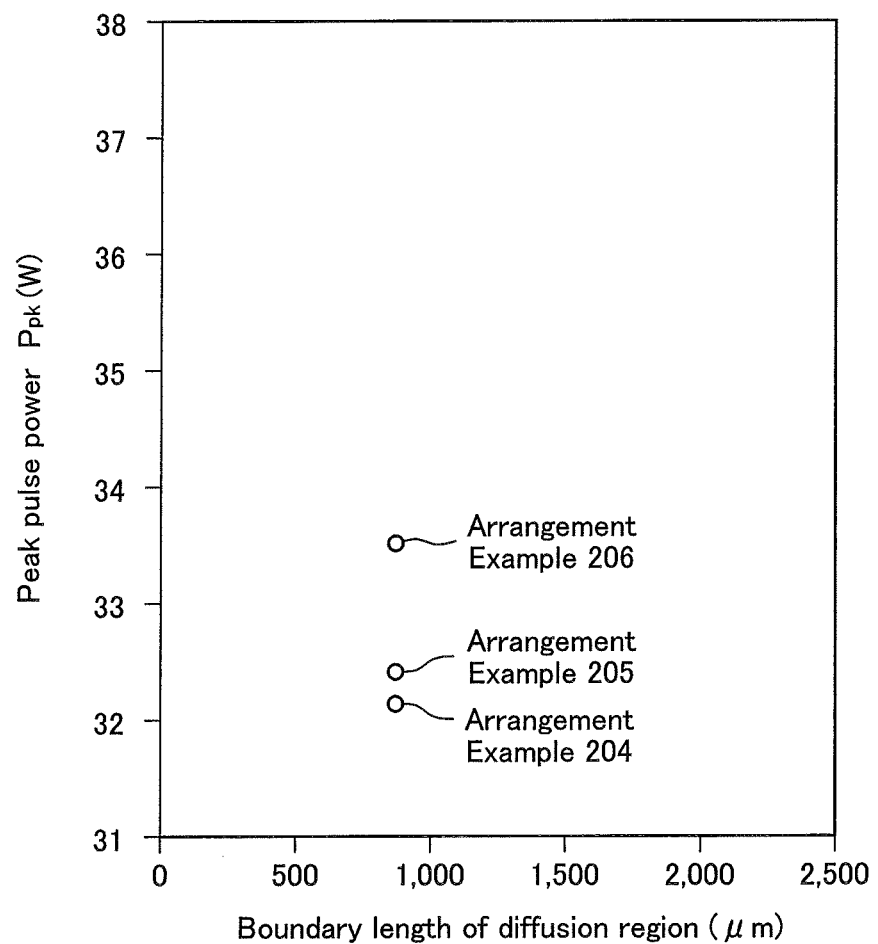
FIG. 53 is a graph on which the peak pulse powers shown in FIG. 51 are reflected.
Figure 54:
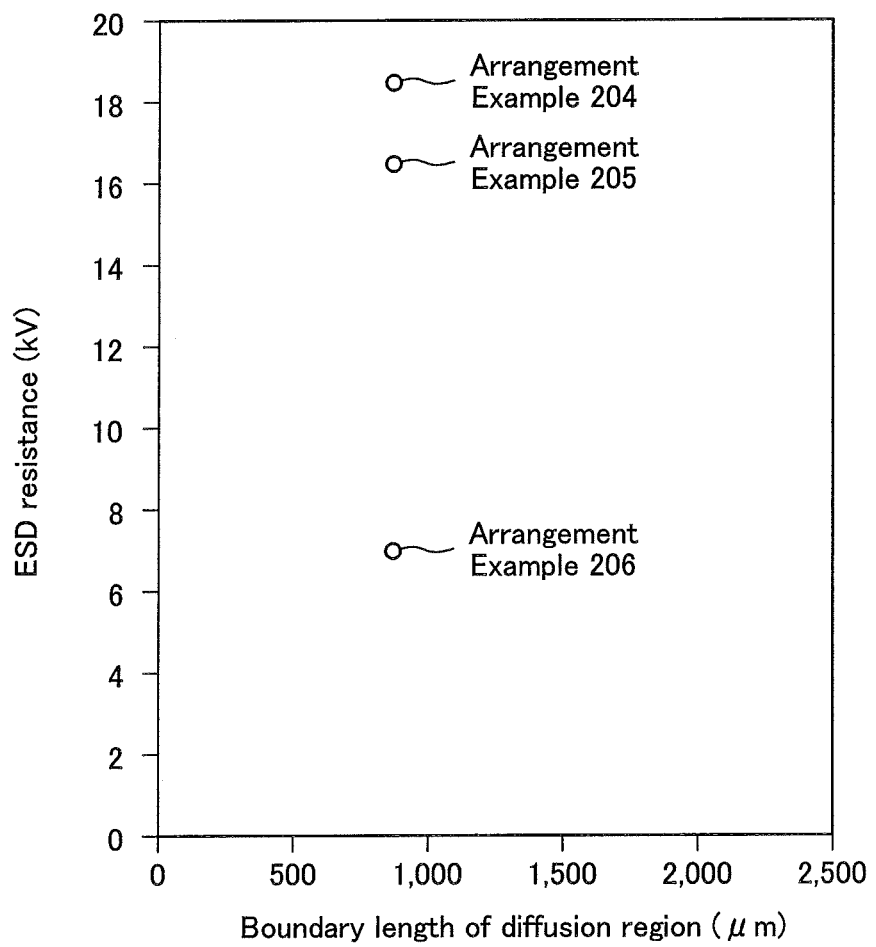
FIG. 54 is a graph on which the ESD resistances shown in FIG. 51 are reflected.

FIG. 51 is a table showing the specifications and the electrical characteristics in respective Arrangement Examples 204 to 206 shown in FIG. 50. FIG. 52 is a graph on which the capacitances between terminals $C_t$ shown in FIG. 51 are reflected. FIG. 53 is a graph on which the peak pulse powers $P_{pk}$ shown in FIG. 51 are reflected. FIG. 54 is a graph on which the ESD resistances shown in FIG. 51 are reflected.

As shown in the table of FIG. 51, the first and second diffusion regions 214, 215 in Arrangement Example 2 are both defined so as to have the same boundary length and area of the first and second diffusion regions 214, 215 in Arrangement Example 1 (refer to FIG. 39).

Further, as shown in the table of FIG. 51 and the graph of FIG. 52, with respect to capacitances between terminals $C_t$ in Arrangement Examples 204 to 206, in the same way as in Arrangement Example 1 described above, it has been possible to achieve the capacitances between terminals $C_t$ of 7.1 pF or less (more specifically, 6.8 pF<the capacitance between terminals $C_t$<7.1 pF). Further, as shown in the table of FIG. 51 and the graph of FIG. 53, in accordance with Arrangement Examples 204 to 206, it has been possible to achieve the peak pulse powers $P_{pk}$ of 30 W to 38 W (more specifically, 32 W to 34 W) while securing the capacitances between terminals $C_t$ of 7.1 pF or less.

Further, as shown in the table of FIG. 51 and the graph of FIG. 54, the values of ESD resistance are 5 kV to 20 kV (more specifically, 7.0V to 18.5V), and the ESD resistance is improved higher in the order of Arrangement Example 206, Arrangement Example 205, and Arrangement Example 204.

In this manner, it has been confirmed that it is possible to achieve the same effects as in Arrangement Example 1 described above even in the case where the pseudo-diode regions 213 are defined in the element region 203.

<Manufacturing Method of Arrangement Example 2>

In order to manufacture the bidirectional Zener diode 201 as in Arrangement Example 2, in a process of implantation of n-type impurity in Step S204 shown in FIG. 43, $n^+$-type diffusion regions are defined in all the cells 203A in the element region 203. Then, after the contact hole defining process in Step S206, it is recommended to add a process of defining the thin-film portions 218 covering the pseudo-diode regions 213 in advance of the electrode films defining process in Step S207.

More specifically, in Step S206, the contact holes 217 for exposing the surfaces of all the $n^+$-type diffusion regions are defined in the insulating film 216. Next, after the resist mask is peeled off, a thermal oxidation treatment is applied to the surface 234 of the semiconductor wafer 232. Thereby, the thin-film portions 218 integrally continuing to the insulating film 216 on the surfaces of the respective $n^+$-type diffusion regions exposed from the contact holes 217 are defined.

Next, a resist mask for selectively exposing $n^+$-type diffusion regions to be the first and second diffusion regions 214, 215 among the plurality of $n^+$-type diffusion regions is defined on the insulating film 216. In other words, a resist mask selectively covering $n^+$-type diffusion regions to be the pseudo-diode regions 213 is defined on the insulating film 216.

Next, the thin-film portions 218 selectively covering the $n^+$-type diffusion regions (the first and second diffusion regions 214, 215) are selectively removed by etching via the resist mask. Thereby, the concave portions 216a and the contact holes 217 in the insulating film 216 are defined. Further, simultaneously, the first and second diffusion regions 214, 215 electrically connected to the first and second electrodes 209, 210, and the pseudo-diode regions 213 electrically isolated from the first and second electrodes 209, 210 are defined in the following process. Thereafter, Step S207 to Step S218 are sequentially carried out, to define the bidirectional Zener diode 201 including the pseudo-diode regions 213.

In this manner, in Arrangement Example 2, the plurality of $n^+$-type diffusion regions are arrayed in a matrix shape in the entire area of the element region 203. Then, the contact holes 217 are aggregated in the central portion of the element region 203, thereby leading to a configuration which is the same as the configuration in which the first and second diffusion regions 214, 215 are aggregated in the central portion of the element region 203 in the same way as in Arrangement Example 1 described above.

In addition, in the manufacturing method of Arrangement Example 2, the method of defining the contact holes 217 for exposing all the $n^+$-type diffusion regions in the contact hole defining process in Step S206 has been described. On the contrary, the contact holes 217 for selectively exposing only the first and second diffusion regions 214, 215 may be defined in the contact hole defining process in Step S206. In this manufacturing process, the above-described thermal oxidation treatment process and the thin-film portion defining process may be omitted.

REFERENCE EXAMPLE 3

Figure 55:
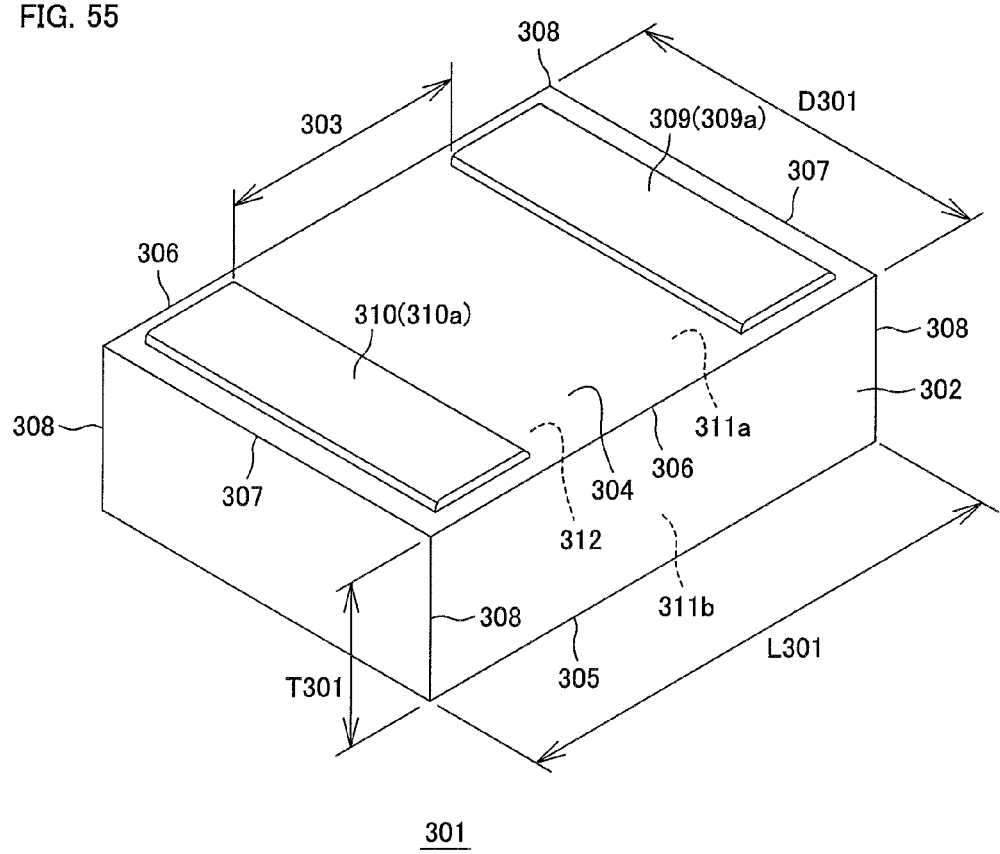
FIG. 55 is a schematic perspective view of a bidirectional Zener diode according to Reference Example 3.

FIG. 55 is a schematic perspective view of a bidirectional Zener diode 301 according to Reference Example 3.

As shown in FIG. 55, the bidirectional Zener diode 301 is a minute chip part, and includes a semiconductor substrate 302 constituting a main body portion.

The semiconductor substrate 302 is defined in a substantially rectangular shape having one end portion and the other end portion, and a rectangular element region 303 in which a plurality of diodes are defined, is set in an interior portion of a surface thereof. Hereinafter, the plane on which the element region 303 is set is called an element forming surface 304, and the plane on the opposite side thereof is called a back surface 305.

With respect to a planar shape of the semiconductor substrate 302, a length L301 of a long side 306 along the longitudinal direction is 0.3 mm to 0.6 mm, and a length D301 of a short side 307 along the short direction is 0.15 mm to 0.3 mm. Further, a thickness T301 of the semiconductor substrate 302 is, for example, 0.1 mm. That is, as the semiconductor substrate 302, so-called a 0603 chip, a 0402 chip, a 03015 chip, or the like is applied. Respective corner portions 308 of the semiconductor substrate 302 may be round shapes, which are chamfered in planar view. With the round shapes, the semiconductor substrate is structured to be able to reduce chipping in the manufacturing process or at the time of mounting.

A first connection electrode 309a of a first electrode 309 and a second connection electrode 310a of a second electrode 310 are defined on one end portion side and the other end portion side of the element forming surface 304 of the semiconductor substrate 302. The first connection electrode 309a and the second connection electrode 310a are defined at an interval from one another so as to sandwich the element region 303 from the one end portion side and the other end portion side of the element forming surface 304. The first connection electrode 309a and the second connection electrode 310a are defined in substantially rectangular shapes in planar view along the short side 307 of the semiconductor substrate 302.

In addition, in the semiconductor substrate 302, the respective entire areas of the element forming surface 304 and the side surfaces are covered with passivation films 311a and 311b. Further, a resin film 312 is defined so as to cover the entire area of the passivation film 311a on the element forming surface 304. Therefore, in the strict sense, in FIG. 55, the respective entire areas of the element forming surface 304 and the side surfaces are located on the insides (the rear sides) of the passivation films 311a and 311b and the resin film 312, and are therefore not exposed to the outside. The passivation films 311a and 311b and the resin film 312 will be hereinafter described in detail.

Figure 56:
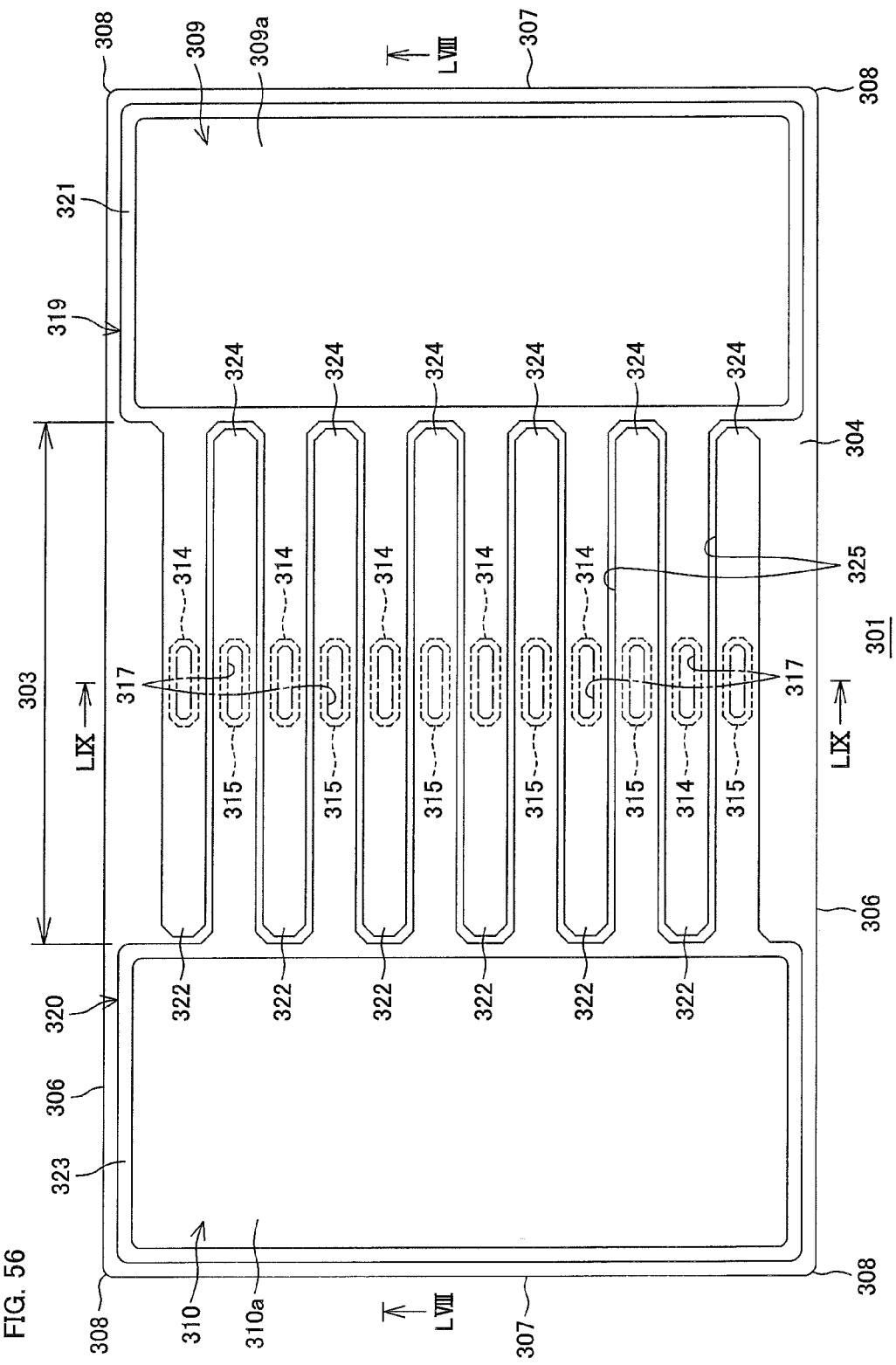
FIG. 56 is a schematic plan view of the bidirectional Zener diode shown in FIG. 55.
Figure 57:
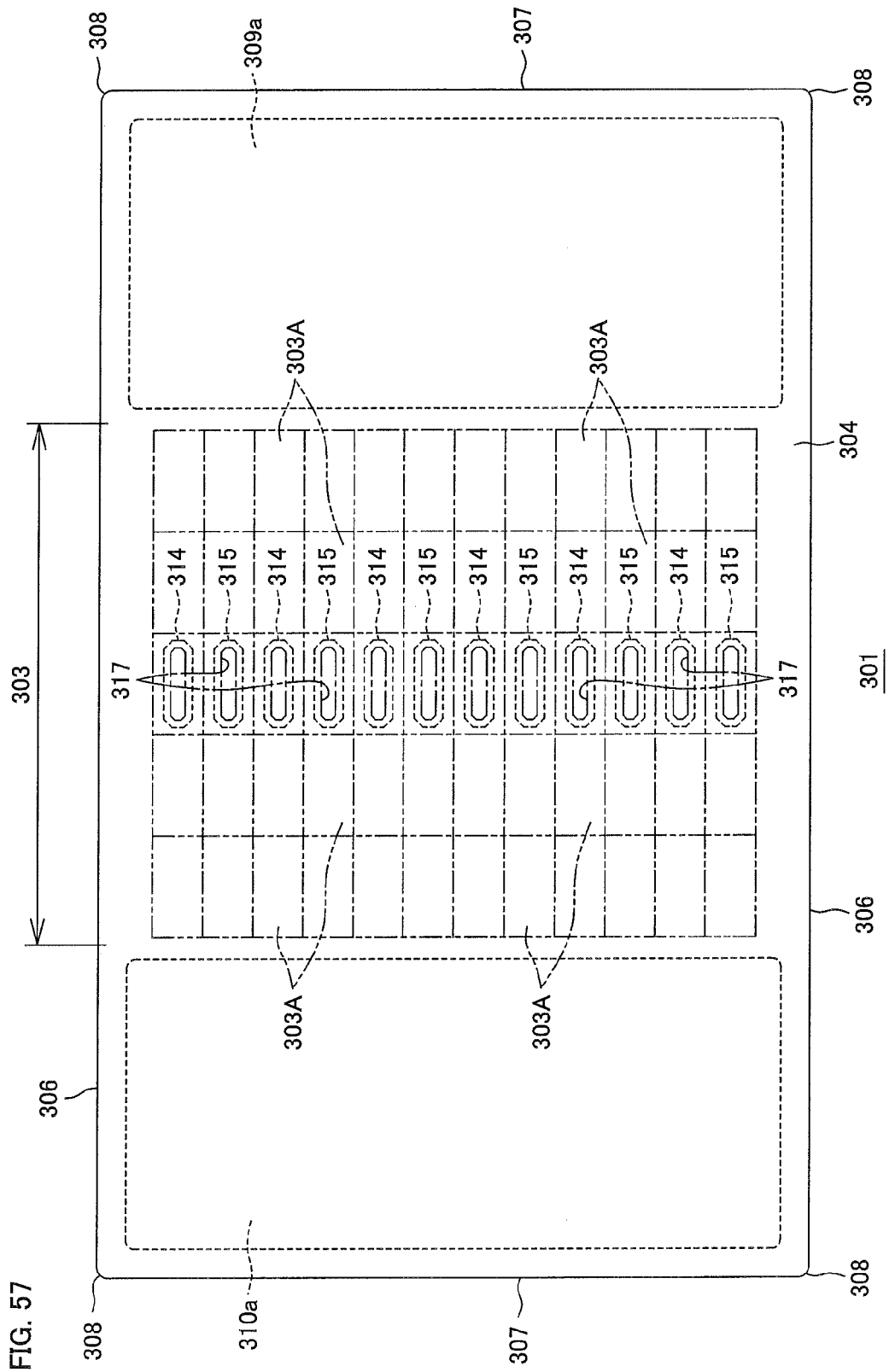
FIG. 57 is a plan view showing an arrangement of the diffusion regions shown in FIG. 56.
Figure 58:
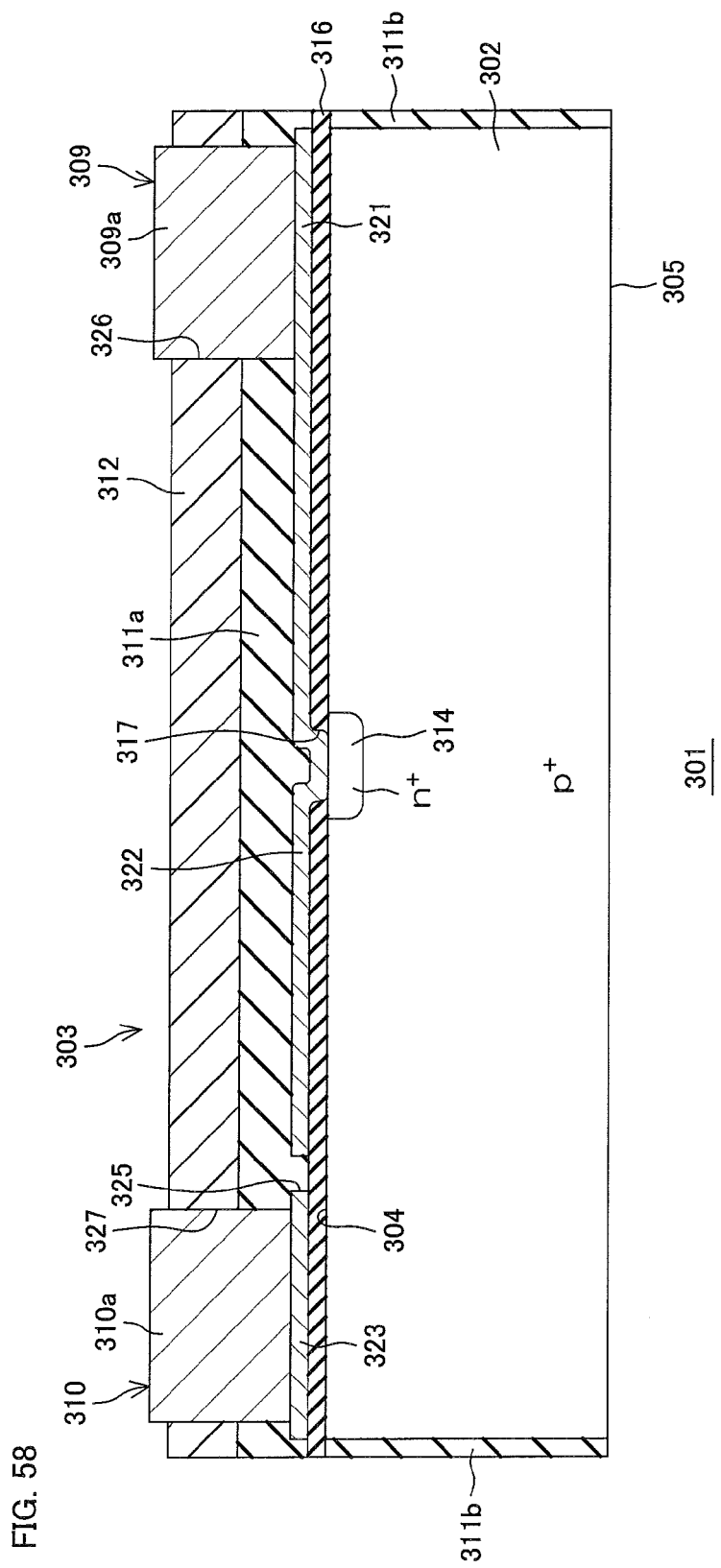
FIG. 58 is a cross-sectional view taken along the cross-section line LVIII-LVIII shown in FIG. 56.
Figure 59:
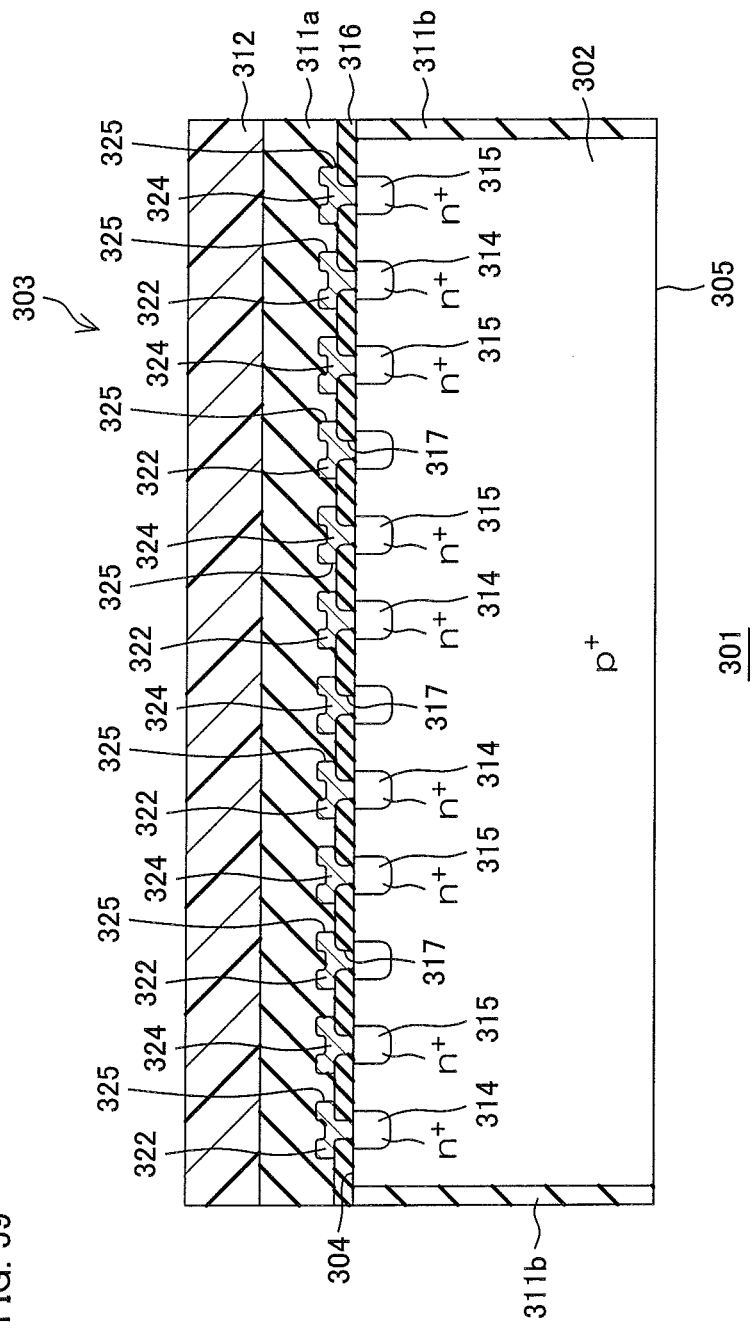
FIG. 59 is a cross-sectional view taken along the cross-section line LIX-LIX shown in FIG. 56.

FIG. 56 is a schematic plan view of the bidirectional Zener diode 301 shown in FIG. 55. FIG. 57 is a plan view showing an arrangement of first diffusion regions 314 and second diffusion regions 315 shown in FIG. 56. FIG. 58 is a cross-sectional view taken along the cross-section line LVIII-LVIII shown in FIG. 56. FIG. 59 is a cross-sectional view taken along the cross-section line LIX-LIX shown in FIG. 56.

The semiconductor substrate 302 is the $p^+$-type semiconductor substrate 302 (silicon substrate). A plurality of the $n^+$-type first diffusion regions 314 and a plurality of the $n^+$-type second diffusion regions 315 are defined on the surface portion (the element forming surface 304) of the semiconductor substrate 302 in the element region 303. The first and second diffusion regions 314, 315 are defined so as to have the same depth and the same impurity concentration, and define p-n junctions with the semiconductor substrate 302. As shown in FIG. 57, the plurality of first and second diffusion regions 314, 315 are defined so as to regularly align in the element region 303.

More specifically, as shown in FIG. 57, a plurality of cells 303A which are partitioned in a matrix shape along the row direction and the column direction (the cells 303A composed of 12 rows×5 columns=60 measures in Reference Example 3) are set in the element region 303.

The respective cells 303A are partitioned into substantially rectangular shapes in planar view, and the first diffusion regions 314 or the second diffusion regions 315 are defined one by one in the interior portions thereof. The first and second diffusion regions 314, 315 are defined in substantially rectangular shapes in planar view so as to extend along the row direction in the respective cells 303A. More specifically, each of the first and second diffusion regions 314, 315 is defined in substantially rectangular shapes having the same area, whose four corners are cut off. In addition, the cells 303A are virtual regions which are determined in order to regularly arrange the first and second diffusion regions 314, 315, and as a matter of course, a plurality of the cells 303A composed of 12 rows×5 columns or more may be set in the element region 303.

As shown in FIG. 57, the first and second diffusion regions 314, 315 are defined along the transverse direction crossing the central portion in the opposite direction of the first connection electrode 309a and the second connection electrode 310a, in the central portion of the element region 303.

More specifically, based on the definition of the first column, the second column, . . . and the fifth column as being from the second connection electrode 310a side toward the first connection electrode 309a side, the plurality of first diffusion regions 314 and the plurality of second diffusion regions 315 are defined along the column direction of the third column in the element region 303. The first diffusion regions 314 are arranged on the odd rows, and the second diffusion regions 315 are disposed on the even rows. That is, the first and second diffusion regions 314, 315 are alternately arrayed along the column direction.

With reference to FIGS. 56 and 57, the first and second diffusion regions 314, 315 are configured so as to be symmetrical to one another in planar view. More specifically, the first and second diffusion regions 314, 315 are configured so as to be point-symmetrical with respect to the central portion (for example, the center of gravity) of the element forming surface 304 in planar view. That is, in the case where the semiconductor substrate 302 is rotated by 180 degrees around a predetermined vertical axis line perpendicular to the element forming surface 304, the positions of the first and second diffusion regions 314, 315 correspond to the positions of the first and second diffusion regions 314, 315 before the rotation. Further, the first and second diffusion regions 314, 315 are defined so as to be line-symmetrical to one another with respect to a straight line passing through the third row.

In accordance with these symmetrical structures, it is possible to make the electrical characteristics between the first electrode 309 and the second electrode 310 symmetrical. That is, it is possible to substantially equalize the voltage-current characteristics in the case where a voltage is applied with the first connection electrode 309a serving as a positive electrode and the second connection electrode 310a serving as a negative electrode, and the voltage-current characteristics in the case where a voltage is applied with the second connection electrode 310a serving as a positive electrode and the first connection electrode 309a serving as a negative electrode.

As shown in FIGS. 58 and 59, an insulating film 316 (not shown in FIGS. 55 to 57) is defined on the element forming surface 304 of the semiconductor substrate 302. The insulating film 316 is, for example, a silicon oxide film. Contact holes 317 for selectively exposing the first and second diffusion regions 314, 315 are defined in the insulating film 316 (refer to FIGS. 56 and 57 as well).

The contact hole 317 is defined so as to have a width narrower than the width of each of the first and second diffusion regions 314, 315. More specifically, the contact hole 317 is defined at a position at a regular interval from the peripheral edge portion of each of the first and second diffusion regions 314, 315 on the interior region side of each of the first and second diffusion regions 314, 315. The first electrode 309 and the second electrode 310 are defined on the insulating film 316.

The first electrode 309 includes the first connection electrode 309a, and a first electrode film 319 which is electrically connected to the first connection electrode 309a. The first electrode film 319 further has a first pad 321, and first extraction electrodes 322 which are defined integrally with the first pad 321.

The first pad 321 is defined in a substantially rectangular shape in planar view on the one end portion side of the element forming surface 304. The first connection electrode 309a is connected to the first pad 321. This allows the first extraction electrodes 322 to be electrically connected to the first connection electrode 309a via the first pad 321.

The first extraction electrodes 322 are defined linearly along the row direction from the first pad 321. More specifically, the first extraction electrodes 322 are defined linearly from the first pad 321 toward the odd rows in the element region 303. That is, the first extraction electrodes 322 are defined in a comb-teeth shape. The first extraction electrodes 322 are defined so as to have a width wider than the width of the first diffusion regions 314, and are defined so as to cover the first diffusion regions 314. The first extraction electrodes 322 have a uniform width throughout from the first diffusion regions 314 up to the first pad 321.

The leading end portions of the first extraction electrodes 322 are defined in substantially rectangular shapes whose corner portions are cut off, and are arranged at positions close to the second electrode 310 across the first column in the element region 303. That is, in planar view, the first diffusion regions 314 are defined in regions of the central portions in the longitudinal direction of the first extraction electrodes 322. The first extraction electrodes 322 covering the first diffusion regions 314 enter the contact holes 317, to define ohmic contacts with the first diffusion regions 314.

The second electrode 310 includes the second connection electrode 310a, and a second electrode film 320 which is electrically connected to the second connection electrode 310a. The second electrode film 320 further has a second pad 323, and second extraction electrodes 324 which are defined integrally with the second pad 323.

The second pad 323 is defined in a substantially rectangular shape in planar view on the other end portion side (the end portion opposite to the first pad 321) of the element forming surface 304. The second connection electrode 310a is connected to the second pad 323. This allows the second extraction electrodes 324 to be electrically connected to the second connection electrode 310a via the second pad 323.

The second extraction electrodes 324 are defined linearly along the row direction from the second pad 323. More specifically, the second extraction electrodes 324 are defined linearly from the second pad 323 toward the odd rows in the element region 303. That is, the second extraction electrodes 324 are defined in a comb-teeth shape along the longitudinal direction of the first extraction electrodes 322. Accordingly, the first and second electrode films 319, 320 are defined in comb-teeth shapes such that the first and second extraction electrodes 322, 324 engage with each other.

Further, the second extraction electrodes 324 are defined so as to have a width wider than the width of the second diffusion regions 315, and are defined so as to cover the second diffusion regions 315. The second extraction electrodes 324 have a uniform width throughout from the second diffusion regions 315 up to the second pad 323.

The leading end portions of the second extraction electrodes 324 are defined in substantially rectangular shapes whose corner portions are cut off, and are arranged at positions close to the first electrode 309 across the fifth column in the element region 303. That is, in planar view, the second diffusion regions 315 are defined in regions of the central portions in the longitudinal direction of the second extraction electrodes 324. The second extraction electrodes 324 covering the second diffusion regions 315 enter the contact holes 317, to define ohmic contacts with the second diffusion regions 315.

The first and second electrode films 319, 310 are composed of the same conductive material, and for example, Al, AlCu, AlSiCu, or the like may be exemplified. The first and second electrodes 309, 310 are electrically isolated by slits 325 rimming the respective peripheral edge portions of the first and second electrode films 319, 320 on the insulating film 316.

The passivation film 311a and the resin film 312 are defined in this order so as to cover the first and second electrode films 319, 320 on the insulating film 316. Further, the passivation film 311b is defined on the side surfaces of the semiconductor substrate 302. The passivation films 311a and 311b are composed of, for example, silicon nitride, and the resin film 312 is composed of, for example, polyimide. The passivation films 311a and 311b and the resin film 312 constitute a protective film, that reduces or prevents moisture intrusion into the first and second extraction electrodes 322, 324 and the element forming surface 304, and absorbs impact and the like from the outside, which contributes to improvement in durability of the bidirectional Zener diode.

Pad openings 326, 327 for selectively exposing the first and second pads 321, 323 are defined in the passivation film 311a and the resin film 312. The first and second connection electrodes 309a, 310a are defined so as to backfill the pad openings 326, 327. The first and second connection electrodes 309a, 310a are composed of a single-layer conductive material (for example, an Ni layer). The first and second connection electrodes 309a, 310a are defined so as to protrude from the surface of the resin film 312.

Figure 60:
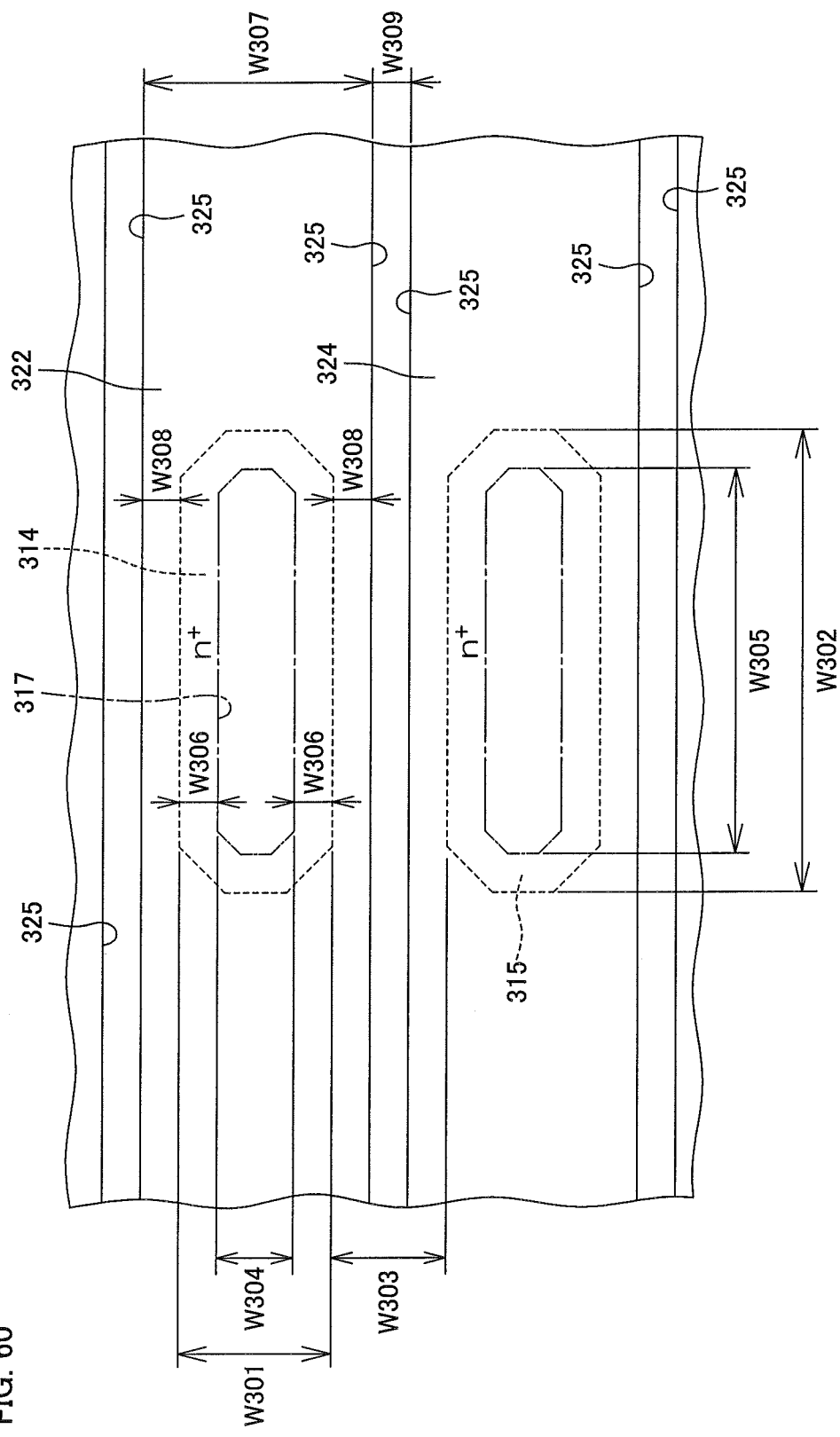
FIG. 60 is an enlarged plan view of a region including the diffusion regions shown in FIG. 56.

Next, the respective arrangements and the respective sizes of the first and second diffusion regions 314, 315 will be described concretely with reference to FIG. 60. FIG. 60 is an enlarged plan view of a region including the first and second diffusion regions 314, 315 shown in FIG. 56.

As shown in FIG. 60, a width W301 in the column direction of the first and second diffusion regions 314, 315 is 5 µm to 15 µm (9 µm in Reference Example 3), and a width W302 in the row direction is 20 µm to 40 µm (28.8 µm in Reference Example 3). Further, a width W303 between the first and second diffusion regions 314, 315 may be 5 µm to 25 µm.

Further, a width W304 in the column direction of the contact hole 317 is 1 µm to 10 µm (4 µm in Reference Example 3), and a width W305 in the row direction is 10 µm to 30 µm (23.8 µm in Reference Example 3). In this planar view, a width W306 from the peripheral edge portion of the first diffusion region 314 to the peripheral edge portion of the contact hole 317 may be approximately 2.5 µm.

Further, each width W307 in the column direction of the first and second extraction electrodes 322, 324 is 10 µm to 20 µm (14 µm in Reference Example 3). In this planar view, a width W308 from the peripheral edge portion of the first and second diffusion regions 314, 315 to the slits 325 of the first and second extraction electrodes 322, 324 may be approximately 2.5 µm. Further, a width W309 between the slits 325 may be 3 µm to 10 µm.

Next, the electrical structure of the bidirectional Zener diode 301 will be described with reference to FIG. 61.

Figure 61:
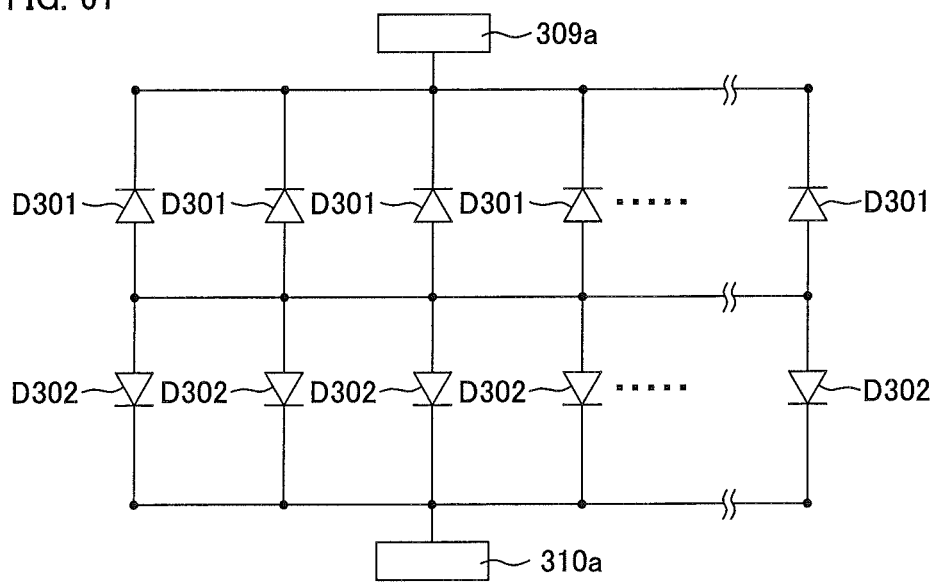
FIG. 61 is an electrical circuit diagram for explanation of the electrical structure of the bidirectional Zener diode shown in FIG. 55.

FIG. 61 is an electrical circuit diagram for explanation of the electrical structure of the bidirectional Zener diode 301 shown in FIG. 55.

As shown in FIG. 61, the single bidirectional Zener diode 301 is composed of a plurality of first Zener diodes D301 and a plurality of second Zener diodes D302. The first Zener diodes D301 are defined in the respective first diffusion regions 314 having the p-n junctions with the semiconductor substrate 302 (refer to FIGS. 58 and 59). The cathodes of the respective first Zener diodes D301 are connected in common to the first connection electrode 309a (cathode common). Further, the second Zener diodes D302 are defined in the respective second diffusion regions 315 having the p-n junctions with the semiconductor substrate 302 (refer to FIGS. 58 and 59). The cathodes of the respective second Zener diodes D302 are connected in common to the second connection electrode 310a (cathode common).

On the other hand, the respective anodes of the first and second Zener diodes D301, D302 are connected in common via the semiconductor substrate 302 (anode common). That is, the first Zener diodes D301 and the second Zener diodes D302 are anti-series connected via the semiconductor substrate 302. The single bidirectional Zener diode 301 is configured in this manner.

In Reference Example 3, the peak pulse power $P_{pk}$ is adjusted by increasing and decreasing the width W303 between the first and second diffusion regions 314, 315 (refer to FIG. 60). Hereinafter, the description thereof will be made more specifically with reference to FIG. 62 to FIG. 65.

Figure 64:
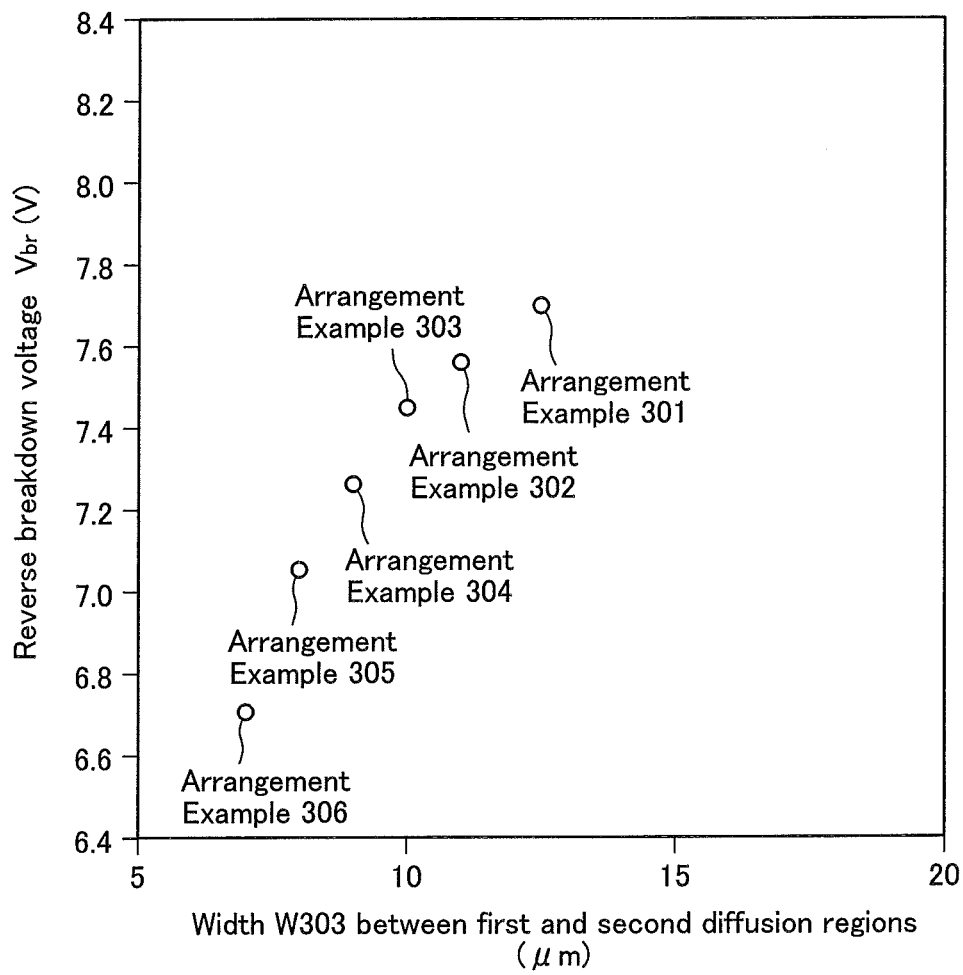
FIG. 64 is a graph on which the reverse breakdown voltages shown in FIG. 62 are reflected.
Figure 65:
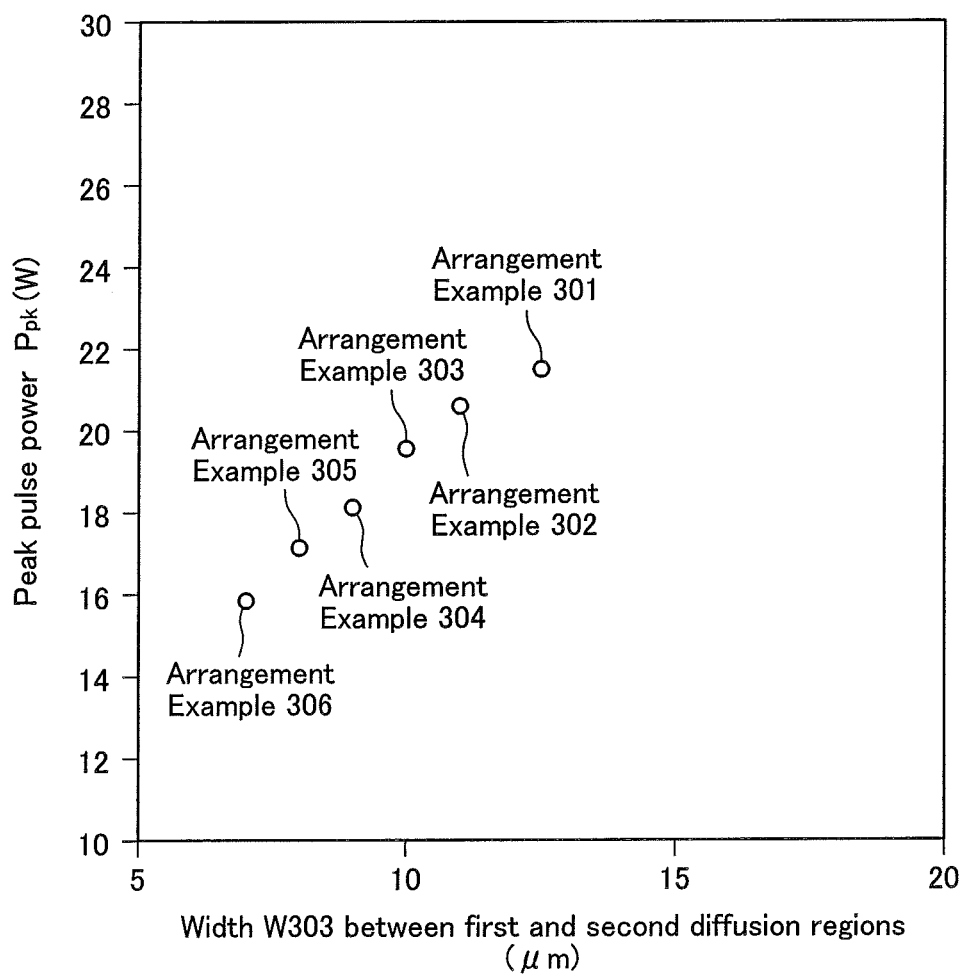
FIG. 65 is a graph on which the peak pulse powers shown in FIG. 62 are reflected.

FIG. 62 is a table showing the specifications of the bidirectional Zener diode 301 shown in FIG. 55. FIG. 63 is a graph on which the ESD resistances shown in the table of FIG. 62 are reflected. FIG. 64 is a graph on which the reverse breakdown voltages $V_{br}$ shown in the table of FIG. 62 are reflected. FIG. 65 is a graph on which the peak pulse powers $P_{pk}$ shown in the table of FIG. 62 are reflected.

As shown in the table of FIG. 62, six Arrangement Examples 301 to 306 with different widths W303 between the first and second diffusion regions 314, 315 are prepared in Reference Example 3. The width W303 between the first and second diffusion regions 314, 315 becomes narrower in the order of Arrangement Examples 301 to 306.

As shown in the table of FIG. 62, the respective areas and the respective boundary lengths of the first and second diffusion regions 314, 315 are defined so as to be the same in all cases. The respective boundary lengths of the first and second diffusion regions 314, 315 are 476 µm, and the respective areas of the first and second diffusion regions 314, 315 are 6319 µm².

A boundary length of the first diffusion region 314 means a total extension of the boundary between the semiconductor substrate 302 and the first diffusion region 314 in the element forming surface 304 of the semiconductor substrate 302. In the same way, a boundary length of the second diffusion region 315 means a total extension of the boundary between the semiconductor substrate 302 and the second diffusion region 315 in the element forming surface 304 of the semiconductor substrate 302.

Further, an area of the first diffusion region 314 means a total area of a region surrounded by the boundary between the semiconductor substrate 302 and the first diffusion region 314 in planar view that the element forming surface 304 of the semiconductor substrate 302 is viewed from a normal direction. In the same way, an area of the second diffusion region 315 means a total area of a region surrounded by the boundary between the semiconductor substrate 302 and the second diffusion region 315 in planar view that the element forming surface 304 of the semiconductor substrate 302 is viewed from a normal direction.

It has been known that the ESD resistance in the bidirectional Zener diode 301 is dependent on the respective boundary lengths between the first and second diffusion regions 314, 315. The respective boundary lengths between the first and second diffusion regions 314, 315 are set to the same value, thereby it is possible to substantially uniform the ESD resistances of the first and second diffusion regions 314, 315.

As shown in the table of FIG. 62 and the graph of FIG. 63, in Arrangement Examples 301 to 306, it has been possible to achieve the ESD resistances of 11.0 kV to 12.0 kV in all cases, and no great changes due to fluctuations in the width W303 between the first and second diffusion regions 314, 315 are seen. Therefore, it is clear that the ESD resistance is independent of the width W303 between the first and second diffusion regions 314, 315.

On the other hand, the capacitance between terminals $C_t$ (the total capacitance between the first electrode 309 and the second electrode 310) of the bidirectional Zener diode 301 is dependent on the respective areas of the first and second diffusion regions 314, 315. That is, the capacitance between terminals $C_t$ increases with an increase in the respective areas of the first and second diffusion regions 314, 315, and the capacitance between terminals $C_t$ decreases with a decrease in the respective areas of the first and second diffusion regions 314, 315.

As shown in the table of FIG. 62 and the graph of FIG. 64, the respective areas of the first and second diffusion regions 314, 315 are set to the same value, thereby it is possible to substantially uniform the respective capacitance components (parasitic capacitances) in the first and second diffusion regions 314, 315. In this case, in Arrangement Examples 301 to 306, it has been possible to achieve the capacitances between terminals $C_t$ of 5 pF or less in all cases (concretely, 4 pF<the capacitance between terminals $C_t$<5 pF).

As shown in the table of FIG. 62, the graph of FIG. 64, and the graph of FIG. 65, it is clear that the reverse breakdown voltage $V_{br}$ and peak pulse power $P_{pk}$ are dependent on the width W303 between the first and second diffusion regions 314, 315. More specifically, the peak pulse power $P_{pk}$ increases with an increase in the width W303 between the first and second diffusion regions 314, 315, and the peak pulse power $P_{pk}$ decreases with a decrease in the width W303 between the first and second diffusion regions 314, 315.

In this case, when the width W303 between the first and second diffusion regions 314, 315 is 5 μm to 15 μm, it is possible to achieve the peak pulse powers $P_{pk}$ of 10 W to 25 W. More specifically, when the width W303 between the first and second diffusion regions 314, 315 is 7 μm to 12.5 μm, it is possible to achieve the peak pulse powers $P_{pk}$ of 16 W to 21.5 W. In accordance with this size, it is possible to obtain good peak pulse power $P_{pk}$ while achieving miniaturization of the bidirectional Zener diode.

It has been known that, in general, the peak pulse power $P_{pk}$ of the bidirectional Zener diode 301 is in a trade-off relationship with the capacitance between terminals $C_t$. That is, it is possible to improve the peak pulse power $P_{pk}$ by increasing the respective areas of the first and second diffusion regions 314, 315. However, there is a problem that the capacitance between terminals $C_t$ as well simultaneously increases.

In accordance with Arrangement Examples 301 to 306, the respective areas of the first and second diffusion regions 314, 315 are both fixed to the same value. Therefore, it is possible to effectively suppress the generation of a trade-off relationship between the peak pulse power $P_{pk}$ and the capacitance between terminals $C_t$. This fact shows that it is possible to achieve good peak pulse power $P_{pk}$ by merely adjusting the width W303 between the first and second diffusion regions 314, 315.

In addition, there can be confirmed a saturation trend rise in the peak pulse power $P_{pk}$ according to the extension of the width W303 between the first and second diffusion regions 314, 315. This may be because of the limitation of the area of the element region 303. That is, in the limited region (the area of the element region 303), it is impossible to endlessly expand the width W303 between the first and second diffusion regions 314, 315 while maintaining the constant area and boundary length. As a result, the peak pulse power $P_{pk}$ may be saturated.

As described above, in accordance with Reference Example 3, the single bidirectional Zener diode 301 is composed of the plurality of first and second Zener diodes D301, D302. The peak pulse power $P_{pk}$ in the bidirectional Zener diode 301 is dependent on the width W303 between the first and second diffusion regions 314, 315 (refer to the table of FIG. 62 and the graph of FIG. 65).

As in this configuration, the width W303 between the first and second diffusion regions 314, 315 is set to 5 μm to 15 μm, thereby it is possible to achieve the peak pulse powers $P_{pk}$ of 10 W to 25 W. More specifically, when the width W303 between the first and second diffusion regions 314, 315 is 7 μm to 12.5 μm, it is possible to achieve the peak pulse powers $P_{pk}$ of 16 W to 21.5 W.

Further, the first and second diffusion regions 314, 315 are defined so as to have the same boundary length. Thereby, it is possible to substantially uniform the ESD resistances of the first and second diffusion regions 314, 315. Further, the respective boundary lengths of the first and second diffusion regions 314, 315 are set to 476 μm, thereby it is possible to achieve the ESD resistance of 11.5 kV to 12.0 kV. Accordingly, it is possible to provide the bidirectional Zener diode 301 which is capable of conforming to IEC61000-4-2 (International Standard) that the lower limit of ESD resistance is stipulated to be 8 kV or higher.

Moreover, the first and second diffusion regions 314, 315 are defined so as to have the same area. Thereby, it is possible to substantially uniform the respective capacitance components (parasitic capacitances) in the first and second diffusion regions 314, 315. Further, the respective boundary lengths of the first and second diffusion regions 314, 315 are set to 6319 μm², thereby it is possible to achieve the capacitance between terminals $C_t$ of 5 pF or less (more concretely, 4 pF<the capacitance between terminals $C_t$<5 pF). Thereby, it is possible to effectively suppress an increase in undesired capacitance between terminals $C_t$, and it is possible to achieve good ESD resistance and peak pulse power $P_{pk}$ in a state of maintaining low capacitance between terminals $C_t$.

As described above, by optimization of the shapes, the arrangement positions (the width W303 between the first and second diffusion regions 314, 315, the respective boundary lengths of the first and second diffusion regions 314, 315, and the respective areas of the first and second diffusion regions 314, 315), and the like of the first and second diffusion regions 314, 315, it is possible to achieve miniaturization thereof, and it is possible to provide the bidirectional Zener diode 301 having excellent ESD resistance, capacitance between terminals $C_t$, and peak pulse power $P_{pk}$, that contributes to the improvement in reliability.

Further, because the semiconductor substrate 302 is a p-type semiconductor substrate, it is possible to achieve stable characteristics even without defining an epitaxial layer on the semiconductor substrate. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because the p-type semiconductor substrate 302 has a small in-plane resistivity variation, it is possible to cut a bidirectional Zener diode with stable characteristics out of any place of the p-type semiconductor substrate 302 without defining an epitaxial layer. Therefore, by use of the p-type semiconductor substrate 302, it is possible to simplify the manufacturing process, and reduce the manufacturing cost.

<Manufacturing Process of Bidirectional Zener Diode 301>

Figure 66:
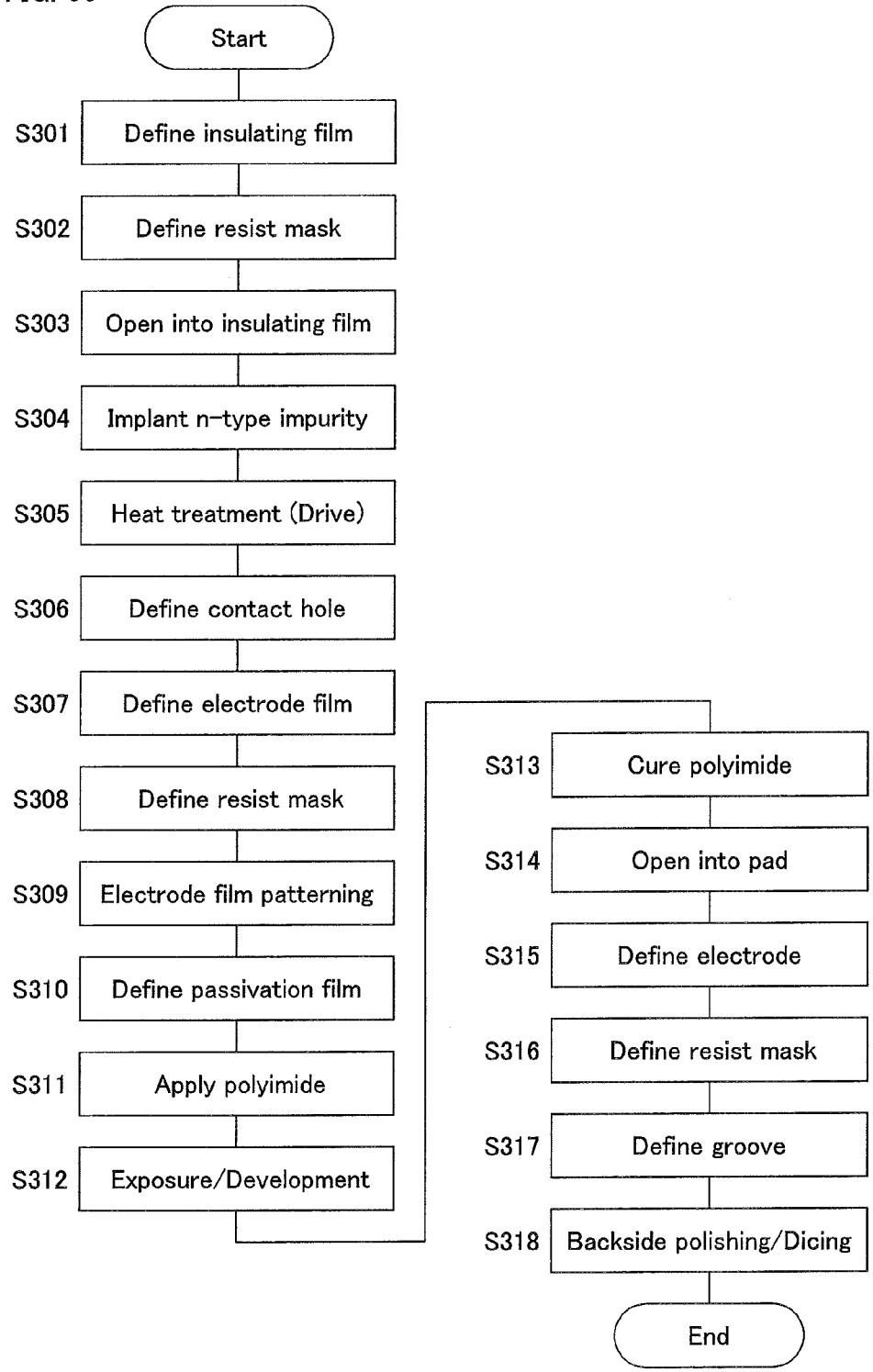
FIG. 66 is a flowchart for explanation of an example of the manufacturing process of the bidirectional Zener diode shown in FIG. 55.
Figure 67:
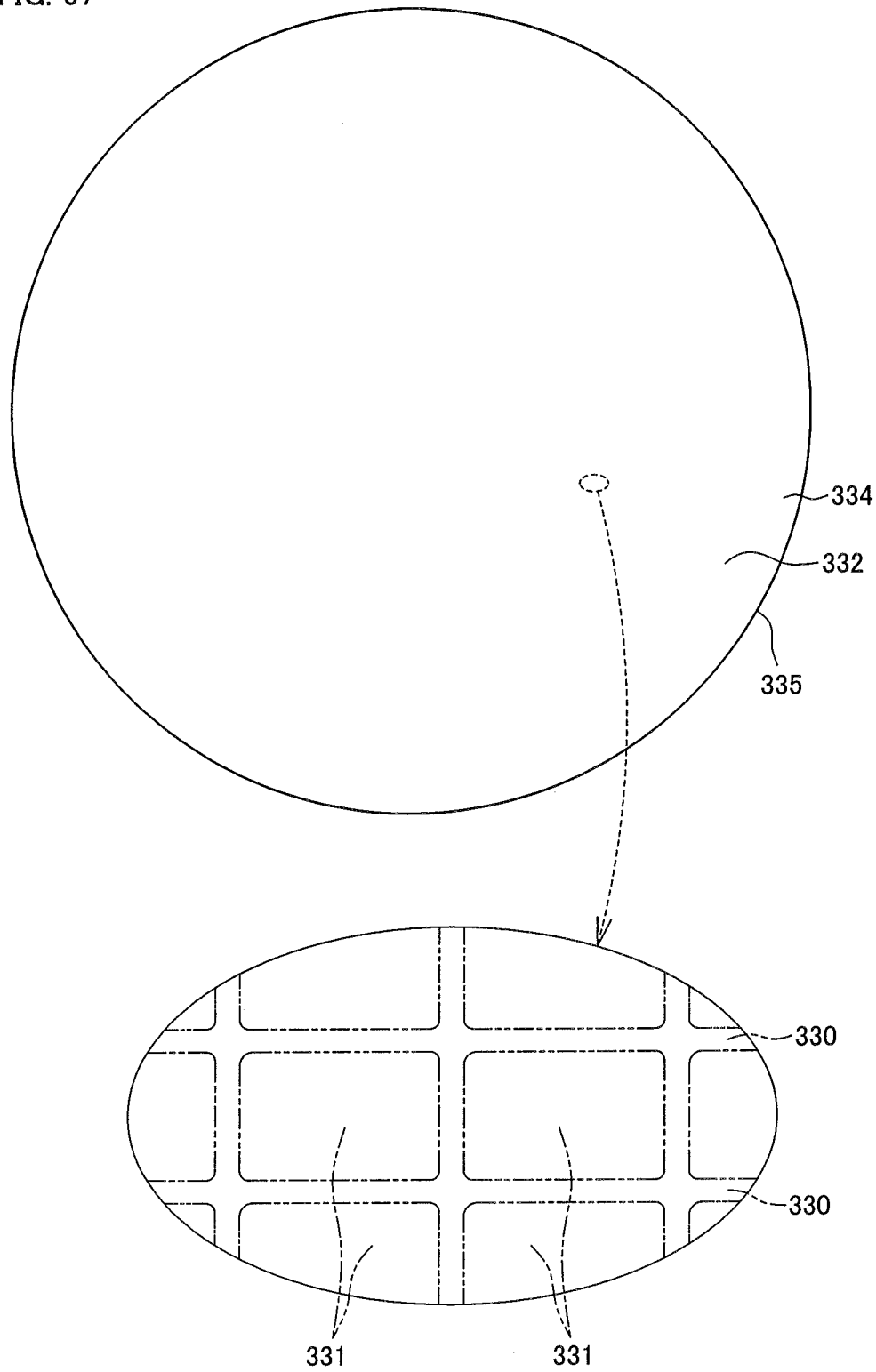
FIG. 67 is a schematic plan view of a semiconductor wafer which is applied to the manufacturing process of FIG. 66.

FIG. 66 is a flowchart for explanation of an example of the manufacturing process of the bidirectional Zener diode 301 shown in FIG. 55. FIG. 67 is a schematic plan view of a semiconductor wafer 332 which is applied to the manufacturing process of FIG. 66. FIGS. 68A and 68B are schematic cross-sectional views for explanation of a backside polishing and dicing process shown in FIG. 66. In addition, in FIGS. 68A and 68B, the illustrations of the first and second diffusion regions 314, 315 are omitted.

First, as shown in FIG. 67, the p⁺-type semiconductor wafer 332 as a base substrate of the semiconductor substrate 302 is prepared. A surface 334 of the semiconductor wafer 332 corresponds to the element forming surface 304 of the semiconductor substrate 302, and a back surface 335 of the semiconductor wafer 332 corresponds to the back surface 305 of the semiconductor substrate 302.

Chip regions 331 in which a plurality of the bidirectional Zener diodes 301 are defined, are set so as to align in a matrix shape on the surface 334 of the semiconductor wafer 332. A boundary region 330 is provided between the chip regions 331 adjacent to one another. The boundary region 330 is a band-shaped region having a substantially constant width, and extends in two directions perpendicular to one another, to be defined in a lattice shape.

Next, the insulating film 316 is defined on the surface 334 of the semiconductor wafer 332 (Step S301: Define insulating film). Next, a resist mask is defined on the insulating film 316 (Step S302: Define resist mask). Openings corresponding to the plurality of first and second diffusion regions 314, 315 are defined in the insulating film 316 by etching by use of the resist mask (Step S303: Open insulating film).

Next, after the resist mask is peeled off, an n-type impurity is implanted into the surface 334 of the semiconductor wafer 332 which is exposed from the openings defined in the insulating film 316 (Step S304: Implant n-type impurity). Implantation of the n-type impurity may be performed by the process of depositing phosphorus as the n-type impurity on the surface (so-called phosphorus deposition), or may be performed by implantation of n-type impurity ions (for example, phosphorus ions).

Next, after the insulating film 316 is made into a thick film by a CVD method as needed, a heat treatment (drive) for activation of the impurity ions implanted into the semiconductor wafer 332 is performed (Step S305: Heat treatment (drive)). Thereby, the plurality of first and second diffusion regions 314, 315 are defined on the surface portion of the semiconductor wafer 332.

Next, a resist mask having openings corresponding to the contact holes 317 is defined on the insulating film 316 (Step S306: Define contact hole). The contact holes 317 are defined in the insulating film 316 by etching via the resist mask. Thereafter, the resist mask is peeled off.

Next, an electrode film constituting the first and second electrode films 319, 320 is defined on the insulating film 316 by, for example, sputtering (Step S307: Define electrode film). In Reference Example 3, an electrode film composed of Al is defined. Then, a resist mask having an opening pattern corresponding to the slits 325 is defined on the electrode film (Step S308: Define resist mask). The slits 325 are defined in the electrode film by etching (for example, reactive ion etching) via the resist mask (Step S309: Electrode film patterning). This separates the electrode film into the first and second electrode films 319, 320.

Next, after the resist mask is peeled off, the passivation film 311a such as a nitride film is defined by, for example, a CVD method (Step S310: Define passivation film). Next, the resin film 312 is defined by application of photosensitive polyimide or the like (Step S311: Apply polyimide). Next, the resin film 312 is exposed through a pattern corresponding to the pad openings 326, 327. Thereafter, the resin film 312 is developed (Step S312: Exposure/development process).

Next, as needed, a heat treatment for curing the resin film 312 is performed (Step S313: Cure polyimide). Then, the passivation film 311a is removed by dry etching (for example, reactive ion etching) with the resin film 312 serving as a mask (Step S314: Define pad). Thereby, the pad openings 326, 327 are defined.

Next, for example, a conductive material (for example, an Ni layer) is plated to form a film so as to backfill the pad openings 326, 327 (Step S315: Define electrode). Thereby, the first and second connection electrodes 309a, 310a are defined.

Next, as shown in FIG. 68A, a resist pattern 338 for defining a groove for cutting 337 is defined in the boundary region 330 (refer to FIG. 67 as well) (Step S316: Define resist mask). The resist pattern 338 has a grid-shaped opening corresponding to the boundary region 330. Plasma etching is performed via the resist pattern 338 (Step S317: Define groove). Accordingly, the semiconductor wafer 332 is etched from the surface 334 up to a predetermined depth, to define the groove for cutting 337 along the boundary region 330.

Half-finished products 341 are located one by one in the chip regions 331 surrounded by the groove for cutting 337, and these half-finished products 341 are arranged so as to align in a matrix shape. By defining the groove for cutting 337 in this manner, it is possible to separate the semiconductor wafer 332 into the plurality of chip regions 331. After the groove for cutting 337 is defined, the resist pattern is peeled off.

Next, the passivation film 311b composed of silicon nitride is defined over the entire area of the surface 334 of the semiconductor wafer 332 by a CVD method. At this time, the passivation film 311b is defined on the entire area of the inner circumferential surface (the bottom surface and the side surfaces) of the groove for cutting 337.

Next, as shown in FIG. 68B, the semiconductor wafer 332 is polished from the back surface 335 side, so as to reach the bottom surface of the groove for cutting 337 (Step S318: Backside polishing/Dicing). Thereby, it is possible to obtain the bidirectional Zener diodes 301 that the plurality of chip regions 331 are diced into pieces. In this manner, provided that the semiconductor wafer 332 is polished from the back surface 335 side after the groove for cutting 337 is defined, it is possible to simultaneously dice the plurality of chip regions 331 defined on the semiconductor wafer 332 into pieces. Therefore, it is possible to achieve the improvement in productivity of the bidirectional Zener diodes 301 due to shortening of the manufacturing time. In addition, the back surface 305 of the completed semiconductor substrate 302 may be mirrored by polishing or etching, so as to clear the back surface 305.

REFERENCE EXAMPLE 4

Figure 69:
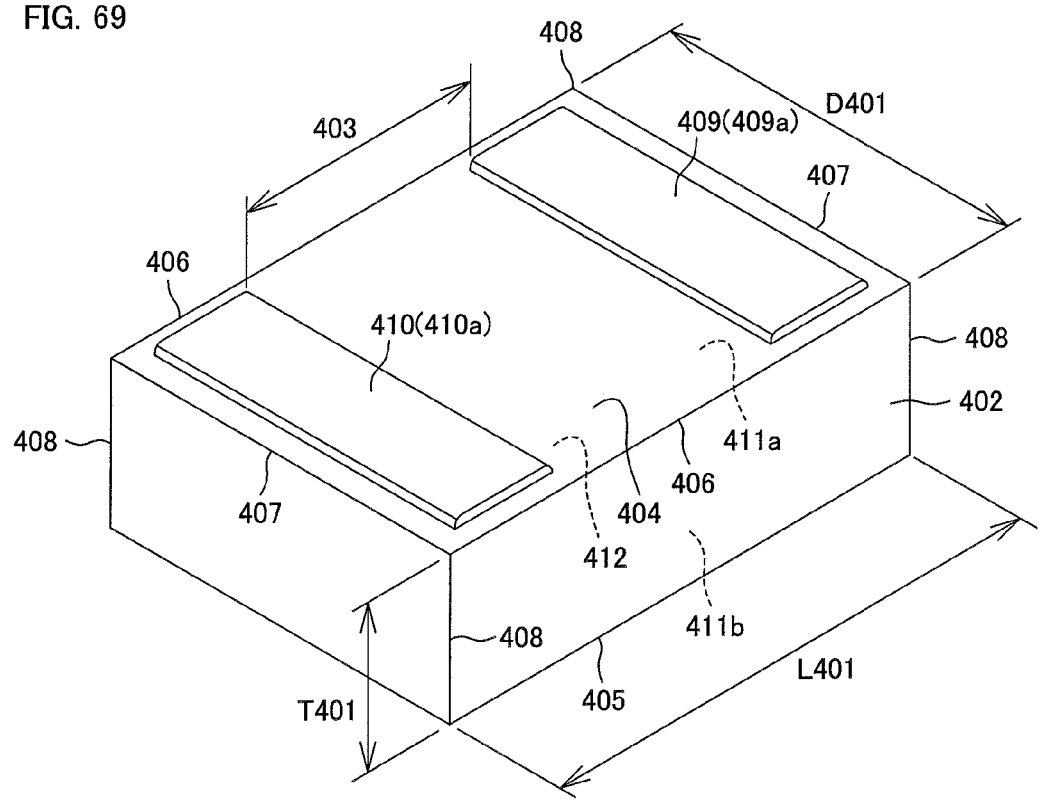
FIG. 69 is a schematic perspective view of a bidirectional Zener diode according to Reference Example 4.

FIG. 69 is a schematic perspective view of a bidirectional Zener diode 401 according to Reference Example 4.

As shown in FIG. 69, the bidirectional Zener diode 401 is a minute chip part, and includes a semiconductor substrate 402 constituting a main body portion.

The semiconductor substrate 402 is defined in a substantially rectangular shape having one end portion and the other end portion, and a rectangular element region 403 in which a plurality of diodes are defined, is set in an interior portion of a surface thereof. Hereinafter, the plane on which the element region 403 is set is called an element forming surface 404, and the plane on the opposite side thereof is called a back surface 405.

With respect to a planar shape of the semiconductor substrate 402, a length L401 of a long side 406 along the longitudinal direction is 0.3 mm to 0.6 mm, and a length D401 of a short side 407 along the short direction is 0.15 mm to 0.3 mm. Further, a thickness T401 of the semiconductor substrate 402 is, for example, 0.1 mm. That is, as the semiconductor substrate 402, so-called a 0603 chip, a 0402 chip, a 03015 chip, or the like is applied. In Reference Example 4, a 0603 chip is adopted.

Respective corner portions 408 of the semiconductor substrate 402 may be round shapes, which are chamfered in planar view. With the round shapes, the semiconductor substrate is structured to be able to reduce chipping in the manufacturing process or at the time of mounting. A first connection electrode 409a of a first electrode 409 and a second connection electrode 410a of a second electrode 410 are defined on one end portion side and the other end portion side of the element forming surface 404 of the semiconductor substrate 402.

The first connection electrode 409a and the second connection electrode 410a are defined at an interval from one another so as to sandwich the element region 403 from the one end portion side and the other end portion side of the element forming surface 404. The first connection electrode 409a and the second connection electrode 410a are defined in substantially rectangular shapes in planar view along the short side 407 of the semiconductor substrate 402.

In addition, in the semiconductor substrate 402, the respective entire areas of the element forming surface 404 and the side surfaces are covered with passivation films 411a, 411b. Further, a resin film 412 is defined so as to cover the entire area of the passivation film 411a on the element forming surface 404. Therefore, in the strict sense, in FIG. 69, the respective entire areas of the element forming surface 404 and the side surfaces are located on the insides (the rear sides) of the passivation films 411a, 411b and the resin film 412, and are therefore not exposed to the outside. The passivation films 411a, 411b and the resin film 412 will be hereinafter described in detail.

Figure 70:
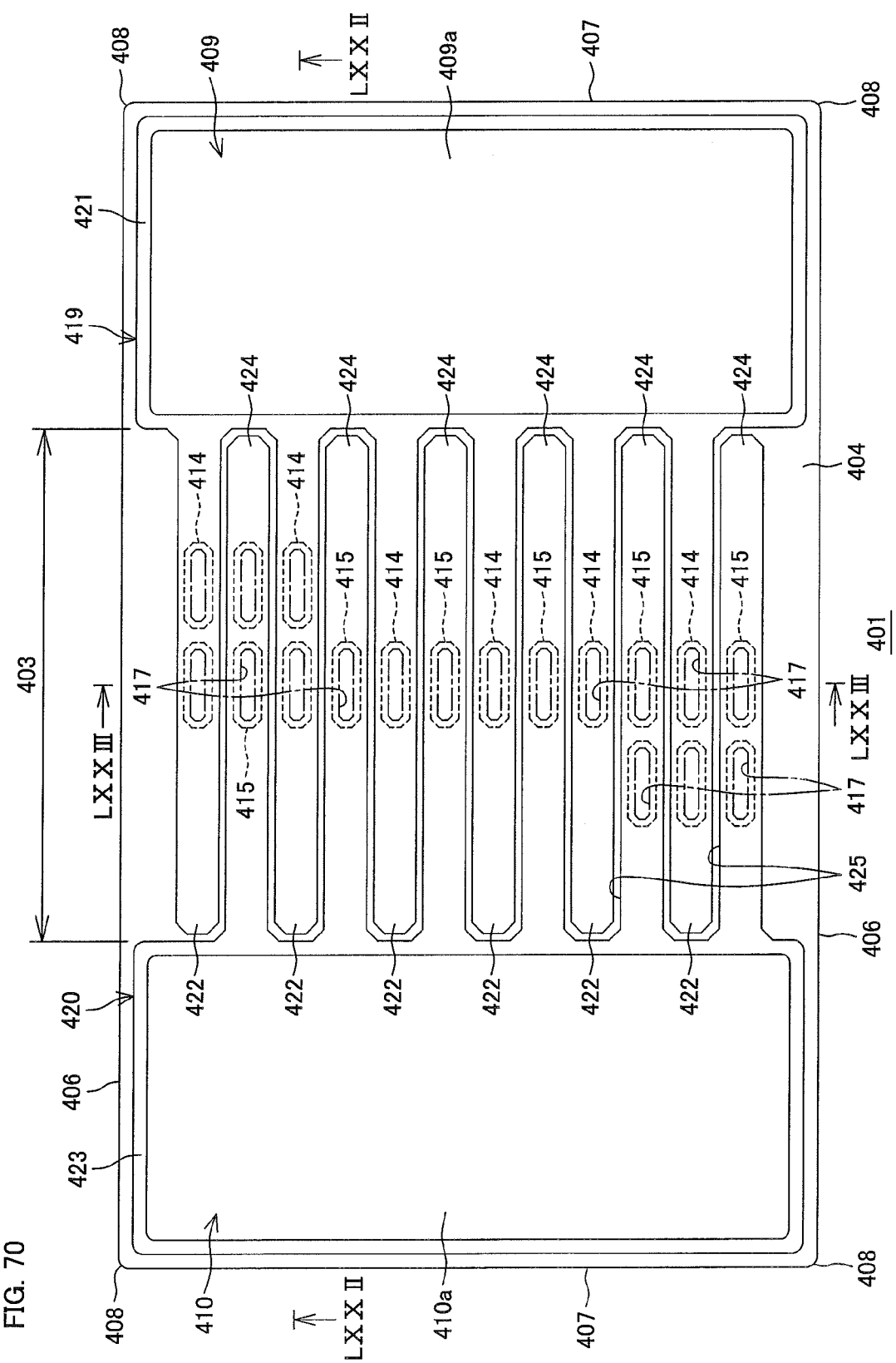
FIG. 70 is a schematic plan view of the bidirectional Zener diode shown in FIG. 69.
Figure 71:
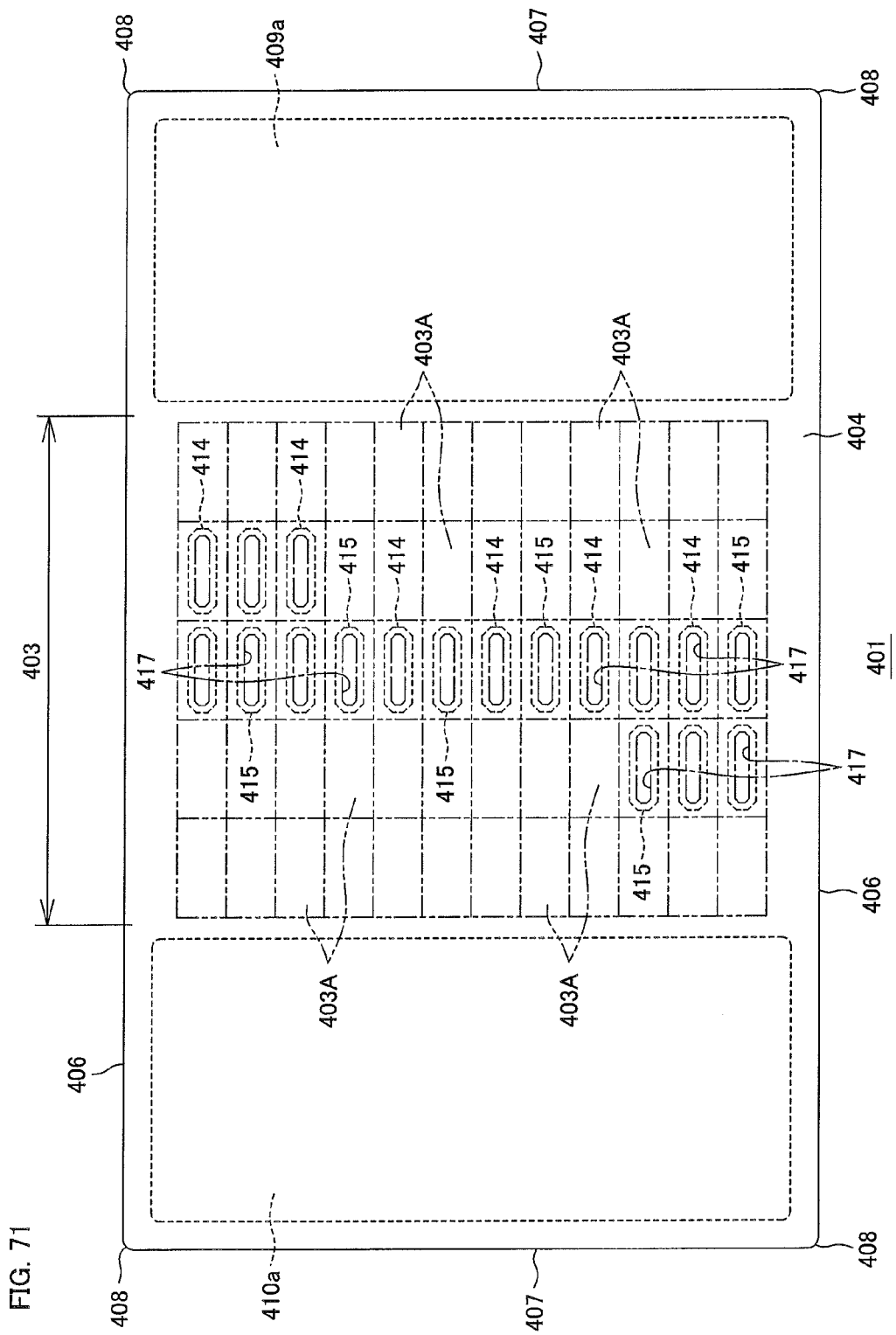
FIG. 71 is a plan view showing an arrangement of the diffusion regions shown in FIG. 70.
Figure 72:
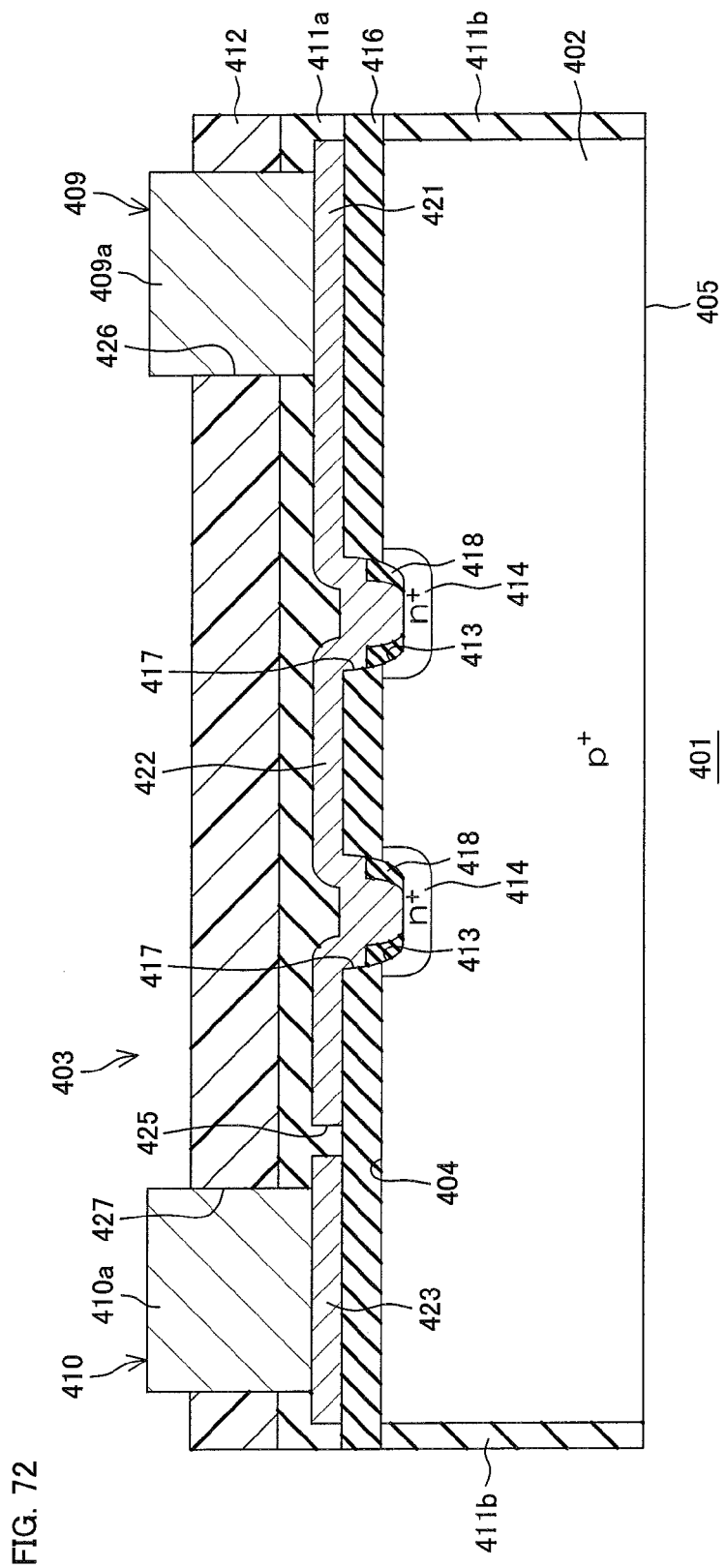
FIG. 72 is a cross-sectional view taken along the cross-section line LXXII-LXXII shown in FIG. 70.
Figure 73:
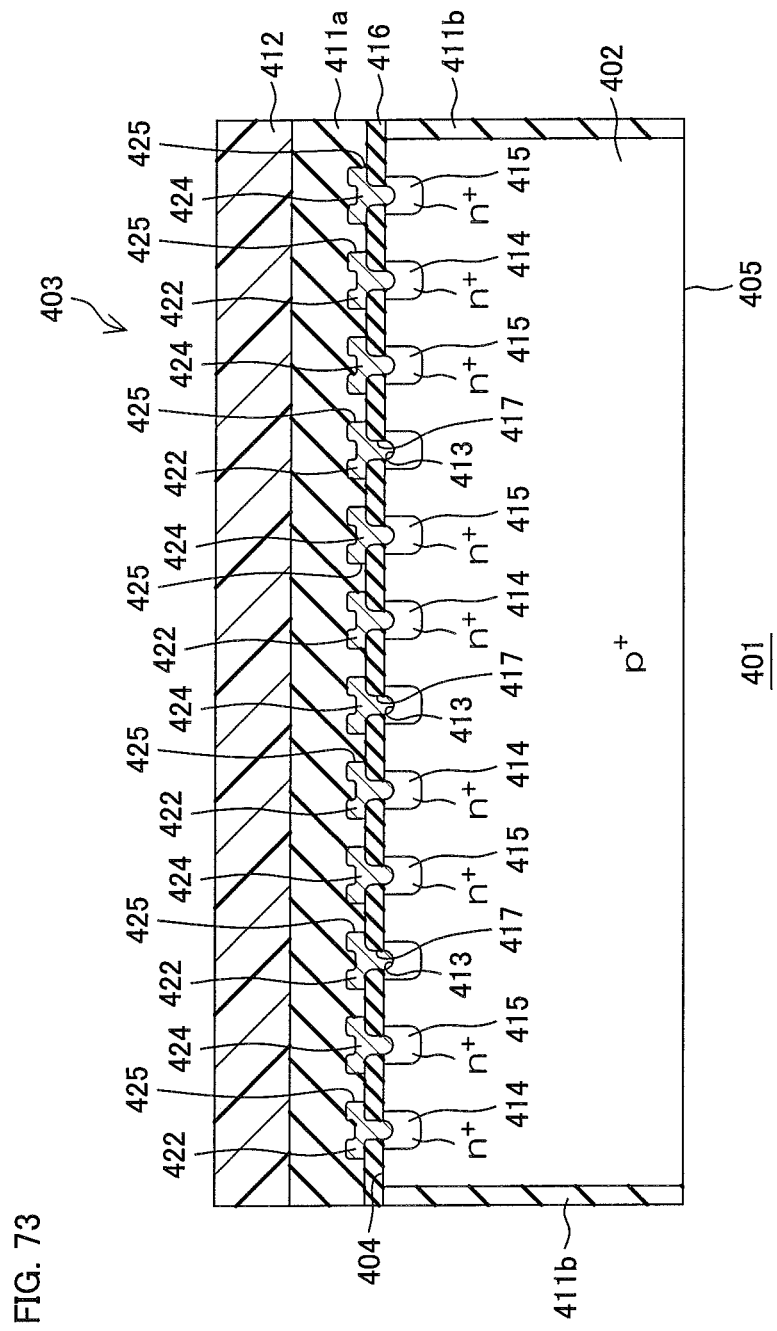
FIG. 73 is a cross-sectional view taken along the cross-section line LXXIII-LXXIII shown in FIG. 70.

FIG. 70 is a schematic plan view of a bidirectional Zener diode 401 shown in FIG. 69. FIG. 71 is a plan view showing an arrangement of the first diffusion regions 414 and the second diffusion regions 415 shown in FIG. 70. FIG. 72 is a cross-sectional view taken along the cross-section line LXXII-LXXII shown in FIG. 70. FIG. 73 is a cross-sectional view taken along the cross-section line LXXIII-LXXIII shown in FIG. 70.

The semiconductor substrate 402 is the $p^+$-type semiconductor substrate 402 (silicon substrate). A plurality of the $n^+$-type first diffusion regions 414 and a plurality of the $n^+$-type second diffusion regions 415 are defined on the surface portion (the element forming surface 404) of the semiconductor substrate 402 in the element region 403. The first and second diffusion regions 414, 415 are defined so as to have the same depth and the same impurity concentration, and define p-n junctions with the semiconductor substrate 402. With respect to the first and second diffusion regions 414, 415, a depth of the deepest portion thereof is 2 μm to 3 μm from the element forming surface 404. As shown in FIG. 71, the plurality of first and second diffusion regions 414, 415 are defined so as to regularly align in the element region 403.

More specifically, as shown in FIG. 71, a plurality of cells 403A which are partitioned in a matrix shape along the row direction and the column direction (the cells 403A composed of 12 rows×5 columns=60 measures in Reference Example 4) are set in the element region 403.

The respective cells 403A are partitioned into substantially rectangular shapes in planar view, and the first diffusion regions 414 or the second diffusion regions 415 are defined one by one in the interior portions thereof. The first and second diffusion regions 414, 415 are defined in substantially rectangular shapes in planar view so as to extend along the row direction in the respective cells 403A. More specifically, each of the first and second diffusion regions 414, 415 is defined in substantially rectangular shapes having the same area, whose four corners are cut off. In addition, the cells 403A are virtual regions which are determined in order to regularly arrange the first and second diffusion regions 414, 415, and as a matter of course, a plurality of the cells 403A composed of 12 rows×5 columns or more may be set in the element region 403.

Based on the definition of the first column, the second column, . . . and the fifth column as being from the second connection electrode 410a side toward the first connection electrode 409a side, the plurality of first diffusion regions 414 and the plurality of second diffusion regions 415 are defined along the column direction of the third column in the element region 403. More specifically, the respective first diffusion regions 414 are defined on the odd rows, and the respective second diffusion regions 415 are defined on the even rows. That is, the plurality of first and second diffusion regions 414, 415 are defined so as to be adjacent to one another in the column direction.

Further, on the tenth row to the twelfth row on the second column, the two second diffusion regions 415 are defined so as to sandwich the one first diffusion region 414. On the other hand, on the first row to the third row on the fourth column, the two first diffusion regions 414 are defined so as to sandwich the one second diffusion region 415.

With reference to FIG. 70 and FIG. 71, the first and second diffusion regions 414, 415 are configured so as to be symmetrical to one another in planar view. More specifically, the first and second diffusion regions 414, 415 are configured so as to be point-symmetrical with respect to the central portion (for example, the center of gravity) of the element forming surface 404 in planar view. That is, in the case where the semiconductor substrate 402 is rotated by 180 degrees around a predetermined vertical axis line perpendicular to the element forming surface 404, the positions of the first and second diffusion regions 414, 415 correspond to the positions of the first and second diffusion regions 414, 415 before the rotation.

In accordance with these symmetrical structures, it is possible to make the electrical characteristics between the first electrode 409 and the second electrode 410 symmetrical. That is, it is possible to substantially equalize the voltage-current characteristics in the case where a voltage is applied with the first connection electrode 409a serving as a positive electrode and the second connection electrode 410a serving as a negative electrode, and the voltage-current characteristics in the case where a voltage is applied with the second connection electrode 410a serving as a positive electrode and the first connection electrode 409a serving as a negative electrode.

As shown in FIGS. 72 and 73, an insulating film 416 (not shown in FIGS. 69 to 71) is defined on the element forming surface 404 of the semiconductor substrate 402. The insulating film 416 is, for example, a silicon oxide film. Contact holes 417 for selectively exposing the surfaces of the first and second diffusion regions 414, 415 are defined in the insulating film 416 (refer to FIGS. 70 and 71 as well).

The contact hole 417 is defined so as to have a width narrower than the width of each of the first and second diffusion regions 414, 415. More specifically, the contact hole 417 is defined at a position at a regular interval from the peripheral edge portion of each of the first and second diffusion regions 414, 415 on the interior region side of each of the first and second diffusion regions 414, 415. Concave portions 413 are defined so as to continue the contact holes 417 on the respective surfaces of the first and second diffusion regions 414, 415.

The concave portions 413 are defined in their entirety in the interior regions of the first and second diffusion regions 414, 415, and side surfaces thereof smoothly continue to the side surfaces of the contact holes 417 with no stage. Accordingly, the concave portion 413 and the contact hole 417 are combined to define one hole having a smooth side surface with no stage. Then, a concave portion insulating film 418 is defined on the peripheral edge portion of this hole (the peripheral edge portion of the concave portion 413). The concave portion insulating film 418 is composed of an oxide film, and is, in Reference Example 4, defined in a ring shape along the side of the concave portion 413 so as to expose the center of the bottom surface of the concave portion 413. Further, the concave portion insulating film 418 is defined so as to cross the boundary between the concave portion 413 and the contact hole 417, and a part thereof (the upper portion) protrudes upward from the element forming surface 404. In addition, in FIG. 73, for convenience of explanation, the illustration of the concave portion insulating film 418 is omitted. The first electrode 409 and the second electrode 410 are defined on the insulating film 416.

The first electrode 409 includes the first connection electrode 409a, and a first electrode film 419 which is electrically connected to the first connection electrode 409a. The first electrode film 419 further has a first pad 421, and first extraction electrodes 422 which are defined integrally with the first pad 421.

The first pad 421 is defined in a substantially rectangular shape in planar view on the one end portion side of the element forming surface 404. The first connection electrode 409a is connected to the first pad 421. This allows the first extraction electrodes 422 to be electrically connected to the first connection electrode 409a via the first pad 421.

The first extraction electrodes 422 are defined linearly along the row direction from the first pad 421. More specifically, the first extraction electrodes 422 are defined linearly from the first pad 421 toward the odd rows in the element region 403. That is, the first extraction electrodes 422 are defined in a comb-teeth shape. The first extraction electrodes 422 are defined so as to have a width wider than the width of the first diffusion regions 414, and are defined so as to cover the first diffusion regions 414. The first extraction electrodes 422 have a uniform width throughout from the first diffusion regions 414 up to the first pad 421.

The leading end portions of the first extraction electrodes 422 are defined in substantially rectangular shapes whose corner portions are cut off, and are arranged at positions close to the second electrode 410 at an interval therefrom, across the first column in the element region 403. That is, in planar view, the first diffusion regions 414 are defined in regions of the central portions in the longitudinal direction of the first extraction electrodes 422. The first extraction electrodes 422 covering the first diffusion regions 414 enter the contact holes 417, to define ohmic contacts with the first diffusion regions 414.

The second electrode 410 includes the second connection electrode 410a, and a second electrode film 420 which is electrically connected to the second connection electrode 410a. The second electrode film 420 further has a second pad 423, and second extraction electrodes 424 which are defined integrally with the second pad 423.

The second pad 423 is defined in a substantially rectangular shape in planar view on the other end portion side (the end portion opposite to the first pad 421) of the element forming surface 404. The second connection electrode 410a is connected to the second pad 423. This allows the second extraction electrodes 424 to be electrically connected to the second connection electrode 410a via the second pad 423.

The second extraction electrodes 424 are defined linearly along the row direction from the second pad 423. More specifically, the second extraction electrodes 424 are defined linearly from the second pad 423 toward the odd rows in the element region 403. That is, the second extraction electrodes 424 are defined in a comb-teeth shape along the longitudinal direction of the first extraction electrodes 422. Accordingly, the first and second electrode films 419, 420 are defined in comb-teeth shapes such that the first and second extraction electrodes 422, 424 engage with each other.

The second extraction electrodes 424 are defined so as to have a width wider than the width of the second diffusion regions 415, and are defined so as to cover the second diffusion regions 415. The second extraction electrodes 424 have a uniform width throughout from the second diffusion regions 415 up to the second pad 423.

The leading end portions of the second extraction electrodes 424 are defined in substantially rectangular shapes whose corner portions are cut off, and are arranged at positions close to the first electrode 409 at an interval therefrom, across the fifth column in the element region 403. That is, in planar view, the second diffusion regions 415 are defined in regions of the central portions in the longitudinal direction of the second extraction electrodes 424. The second extraction electrodes 424 covering the second diffusion regions 415 enter the contact holes 417, to define ohmic contacts with the second diffusion regions 415.

The first and second electrodes 409, 410 are electrically isolated by slits 425 rimming the respective peripheral edge portions of the first and second electrode films 419, 420 on the insulating film 416. The first and second electrode films 419, 420 are composed of the same conductive material, and for example, Al, AlCu, AlSiCu, or the like may be exemplified. In Reference Example 4, AlSiCu is used.

As shown in FIGS. 72 and 73, the passivation film 411a and the resin film 412 are defined in this order so as to cover the first and second electrode films 419, 420 on the insulating film 416. Further, the passivation film 411b is defined on the side surfaces of the semiconductor substrate 402. The passivation films 411a, 411b are composed of, for example, silicon nitride, and the resin film 412 is composed of, for example, polyimide.

The passivation films 411a, 411b and the resin film 412 constitute a protective film, that reduces or prevents moisture intrusion into the first and second extraction electrodes 422, 424 and the element forming surface 404, and absorbs impact and the like from the outside, which contributes to improvement in durability of the bidirectional Zener diode.

Pad openings 426, 427 for selectively exposing the first and second pads 421, 423 are defined in the passivation film 411a and the resin film 412. The first and second connection electrodes 409a, 410a are defined so as to backfill the pad openings 426, 427. The first and second connection electrodes 409a, 410a are composed of a single-layer conductive material (for example, an Ni layer). The first and second connection electrodes 409a, 410a are defined so as to protrude from the surface of the resin film 412.

Next, the respective arrangements and the respective sizes of the first and second diffusion regions 414, 415 will be described concretely with reference to FIG. 74.

Figure 74:
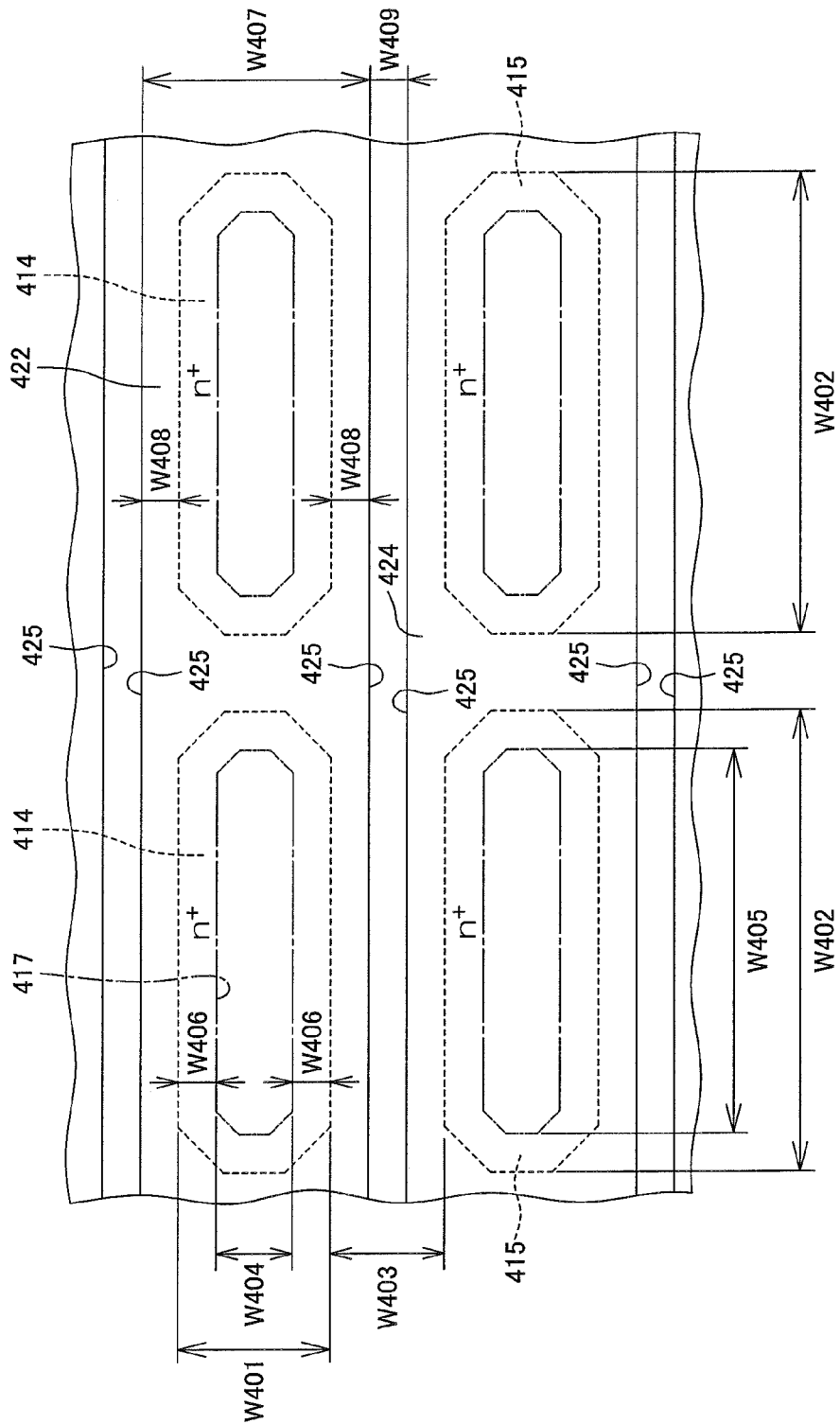
FIG. 74 is an enlarged plan view of a region including the diffusion regions shown in FIG. 70.

FIG. 74 is an enlarged plan view of the first and second diffusion regions 414, 415 shown in FIG. 70.

As shown in FIG. 74, a width W401 in the column direction of the first and second diffusion regions 414, 415 is 5 µm to 15 µm (9 µm in Reference Example 4), and a width W402 in the row direction is 20 µm to 40 µm (28.8 µm in Reference Example 4). Further, a width W403 between the first and second diffusion regions 414, 415 may be 5 µm to 25 µm (12.5 µm in Reference Example 4).

Further, a width W404 in the column direction of the contact hole 417 is 1 µm to 10 µm (4 µm in Reference Example 4), and a width W405 in the row direction is 10 µm to 30 µm (23.8 µm in Reference Example 4). In this planar view, a width W406 from the peripheral edge portion of the first diffusion region 414 to the peripheral edge portion of the contact hole 417 may be approximately 2.5 µm.

Further, each width W407 in the column direction of the first and second extraction electrodes 422, 424 is 10 µm to 20 µm (14 µm in Reference Example 4). In this planar view, a width W408 from the peripheral edge portion of the first and second diffusion regions 414, 415 to the slits 425 of the first and second extraction electrodes 422, 424 may be approximately 2.5 µm. Further, a width W409 between the slits 425 may be 3 µm to 10 µm.

Next, the electrical structure of the bidirectional Zener diode 401 will be described with reference to FIG. 75.

Figure 75:
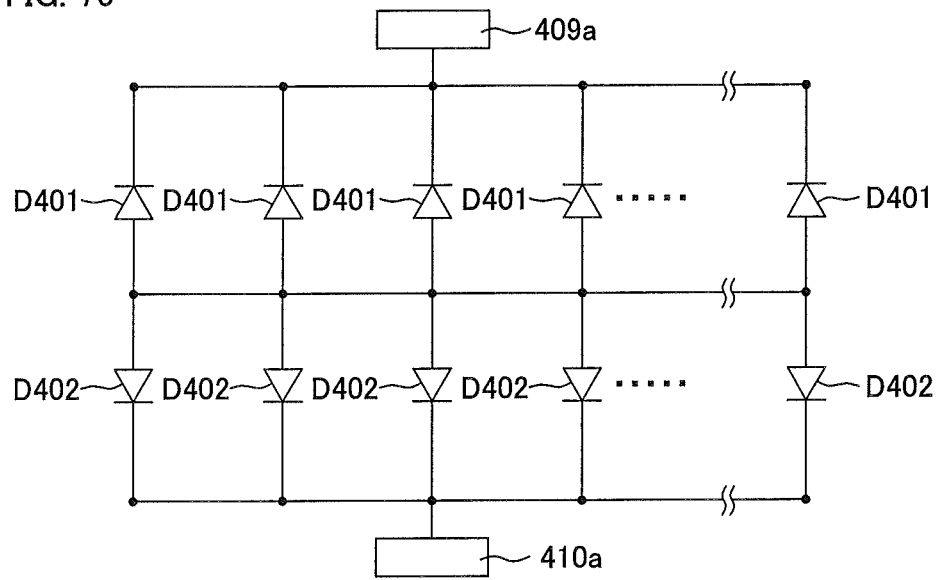
FIG. 75 is an electrical circuit diagram for explanation of the electrical structure of the bidirectional Zener diode shown in FIG. 69.

FIG. 75 is an electrical circuit diagram for explanation of the electrical structure of the bidirectional Zener diode 401 shown in FIG. 69.

As shown in FIG. 75, the single bidirectional Zener diode 401 is composed of a plurality of first Zener diodes D401 and a plurality of second Zener diodes D402. The first Zener diodes D401 are defined in the respective first diffusion regions 414 having the p-n junctions with the semiconductor substrate 402 (refer to FIGS. 72 and 73). The cathodes of the respective first Zener diodes D401 are connected in common to the first connection electrode 409a (cathode common). Further, the second Zener diodes D402 are defined in the respective second diffusion regions 415 having the p-n junctions with the semiconductor substrate 402 (refer to FIGS. 72 and 73). The cathodes of the respective second Zener diodes D402 are connected in common to the second connection electrode 410a (cathode common).

On the other hand, the respective anodes of the first and second Zener diodes D401, D402 are connected in common via the semiconductor substrate 402 (anode common). That is, the first Zener diodes D401 and the second Zener diodes D402 are anti-series connected via the semiconductor substrate 402. The single bidirectional Zener diode 401 is configured in this manner.

Next, an example of the manufacturing process of the bidirectional Zener diode 401 will be described.

Figure 76:
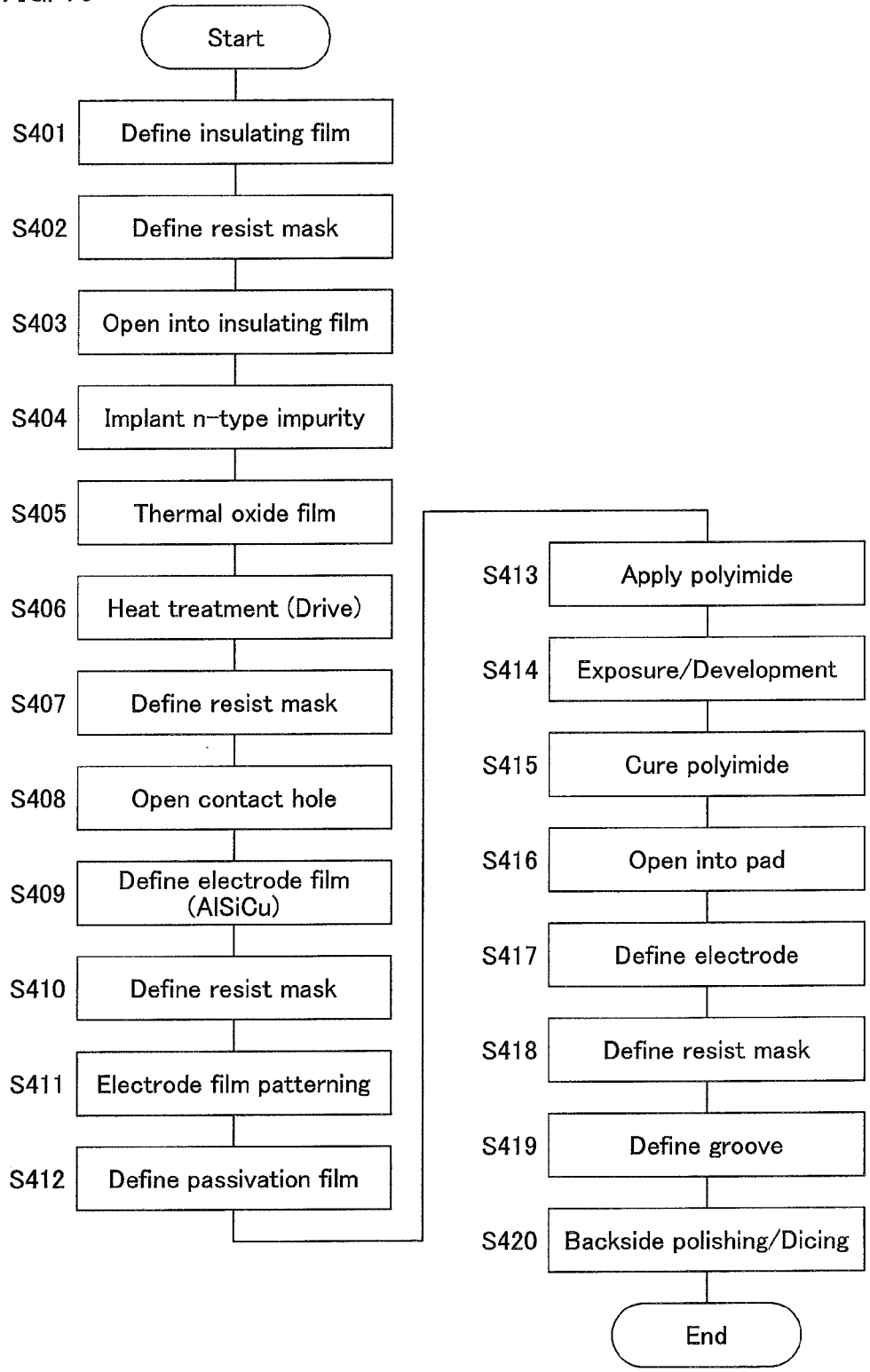
FIG. 76 is a flowchart for explanation of an example of the manufacturing process of the bidirectional Zener diode shown in FIG. 69.
Figure 77:
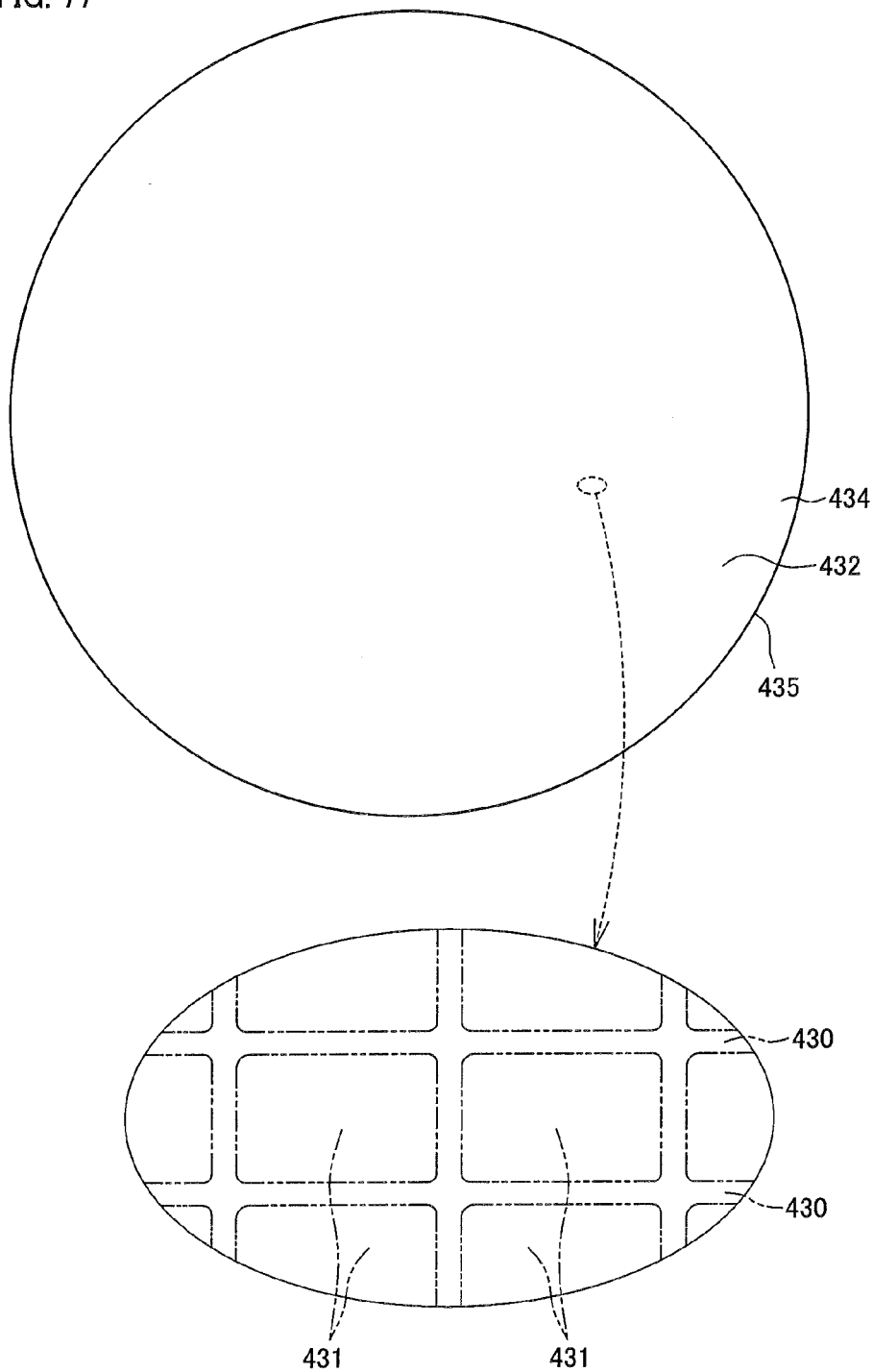
FIG. 77 is a schematic plan view of a semiconductor wafer which is applied to the manufacturing process of FIG. 76.
Figure 79A:
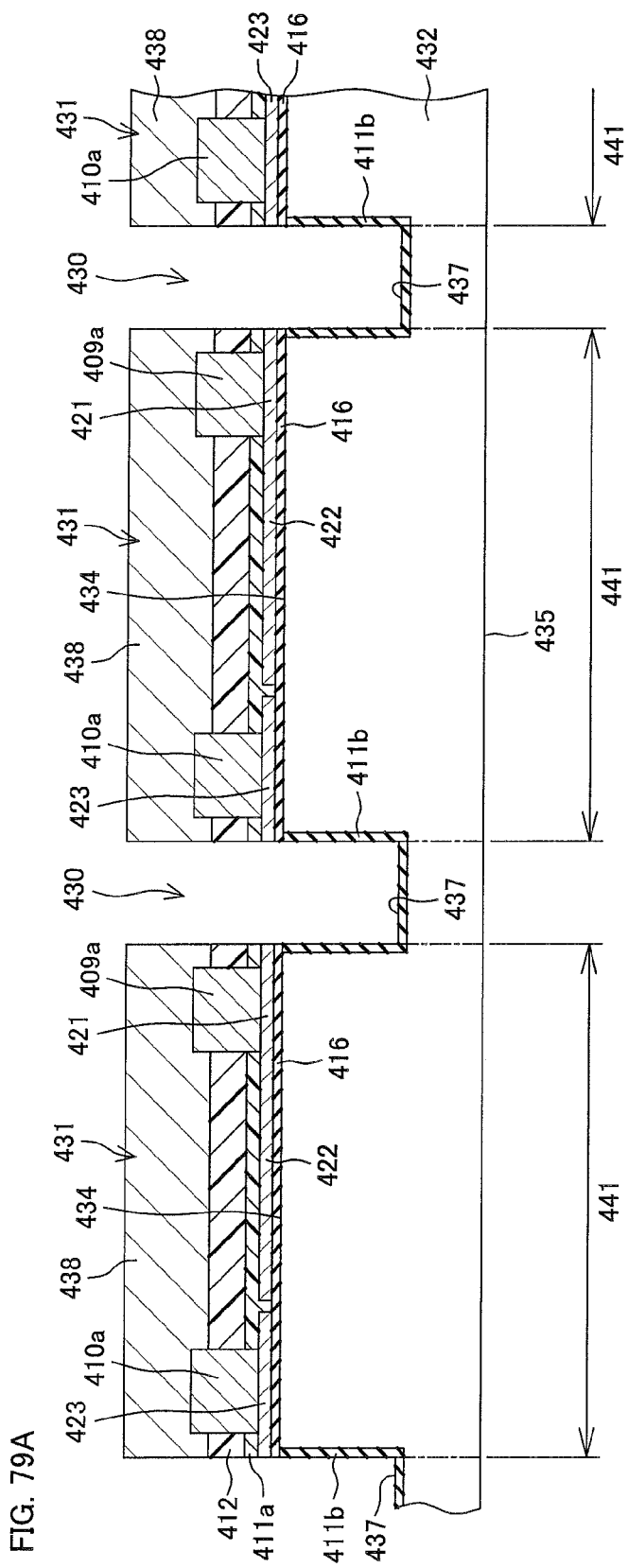
FIGS. 79A and 79B are schematic cross-sectional views for explanation of a backside polishing and dicing process shown in FIG. 76.
Figure 79B:
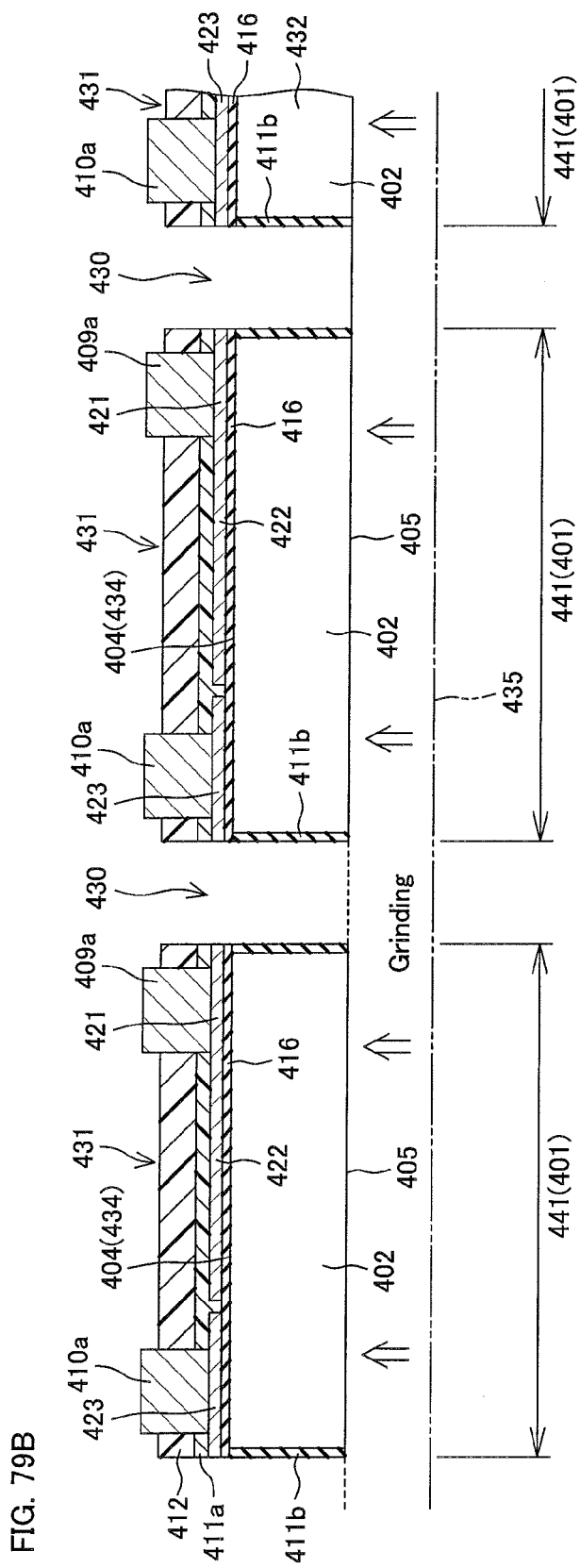
Figure 80:
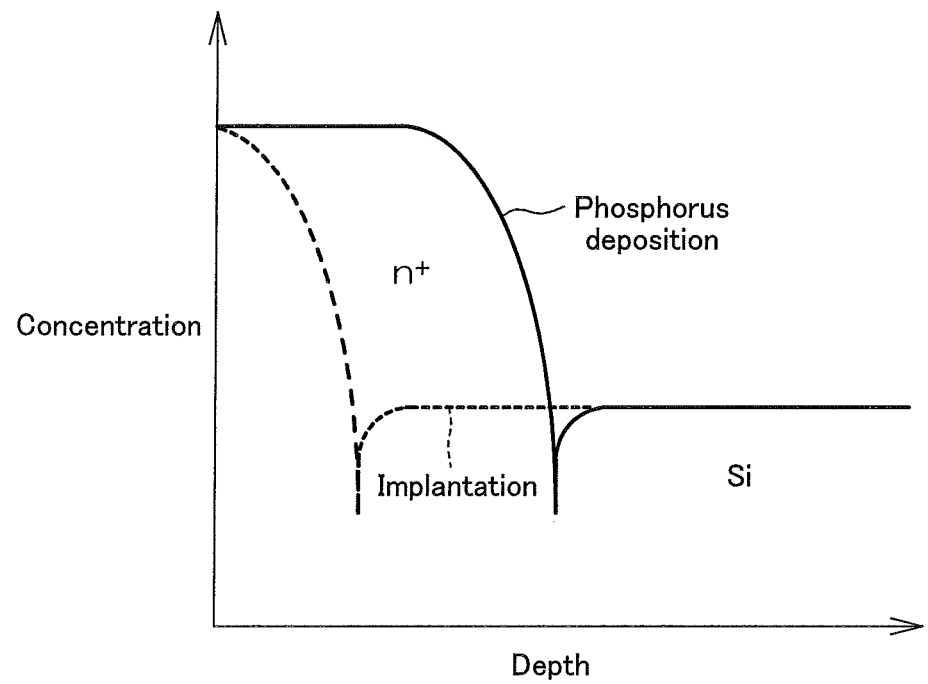
FIG. 80 is a diagram showing a concentration profile of a diffusion region.

FIG. 76 is a flowchart for explanation of an example of the manufacturing process of the bidirectional Zener diode 401 shown in FIG. 69. FIG. 77 is a schematic plan view of a semiconductor wafer 432 which is applied to the manufacturing process of FIG. 76. FIGS. 78A to 78D are cross-sectional views showing the configuration along the way of one process shown in FIG. 76. FIGS. 79A and 79B are schematic cross-sectional views for explanation of a backside polishing and dicing process shown in FIG. 76. FIG. 80 is a diagram showing a concentration profile of the first and second diffusion regions 414, 415. In addition, in FIGS. 79A and 79B, the illustrations of the first and second diffusion regions 114, 115 are omitted.

First, as shown in FIG. 77, the $p^+$-type semiconductor wafer 432 as a base substrate of the semiconductor substrate 402 is prepared. A surface 434 of the semiconductor wafer 432 corresponds to the element forming surface 404 of the semiconductor substrate 402, and a back surface 435 of the semiconductor wafer 432 corresponds to a back surface 405 of the semiconductor substrate 402.

Chip regions 431 in which a plurality of the bidirectional Zener diodes 401 are defined, are set so as to align in a matrix shape on the surface 434 of the semiconductor wafer 432. A boundary region 430 is provided between the chip regions 431 adjacent to one another. The boundary region 430 is a band-shaped region having a substantially constant width, and extends in two directions perpendicular to one another, to be defined in a lattice shape.

Figure 78A:
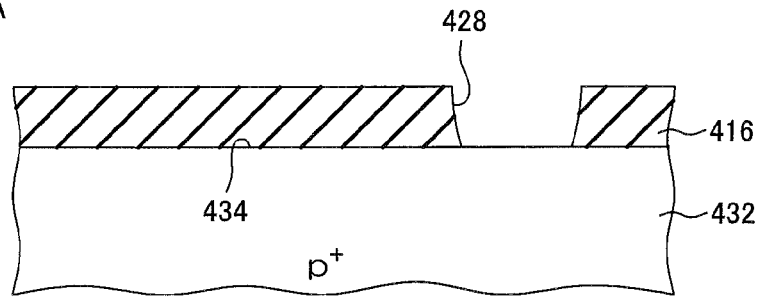
FIGS. 78A to 78D are cross-sectional views showing the configuration along the way of one process shown in FIG. 76.

Next, as shown in FIG. 78A, the insulating film 416 is defined on the surface 434 of the semiconductor wafer 432 (Step S401: Define insulating film). Next, a resist mask (not shown) is defined on the insulating film 416 (Step S402: Define resist mask). Openings 428 corresponding to the first and second diffusion regions 414, 415 are defined in the insulating film 416 by etching by use of this resist mask (Step S403: Open insulating film).

Next, after the resist mask is peeled off, an n-type impurity is introduced into the surface 434 of the semiconductor wafer 432 which is exposed from the openings 428 defined in the insulating film 416 (Step S404: Introduce n-type impurity). Introduction of the n-type impurity is performed by the process of depositing phosphorus as the n-type impurity on the surface (so-called phosphorus deposition). Phosphorus deposition is processing that the semiconductor wafer 432 is carried into a diffusion furnace, and phosphorus is deposited on the surface 434 of the semiconductor wafer 432 exposed in the openings 428 in the insulating film 416 by a heat treatment performed by flowing a $POCl_3$ gas in the diffusion furnace.

Figure 78B:
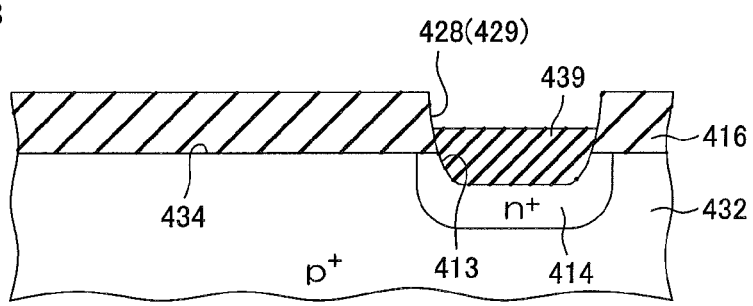

Next, as shown in FIG. 78B, yet another resist mask (not shown) having openings corresponding to openings 429 wider than the openings 428 is defined as needed on the insulating film 416. The openings 428 are expanded to become the openings 429 by etching via the resist mask. Then, the surface 434 of the semiconductor wafer 432 in the openings 429 are thermally oxidized selectively, to define a thermal oxide film 439 (Step S405: Thermal oxidation).

The thermal oxide film 439 grows, not only above the surface 434 of the semiconductor wafer 432, but also on the back surface side so as to transmute the silicon close to the surface 434 of the semiconductor wafer 432, into oxide silicon. Thereby, the concave portions 413 continuing to openings 429 are defined in the surface 434. Thereafter, a heat treatment (drive-in processing) for activation of the impurity ions introduced into the semiconductor wafer 432 is performed (Step S406: Heat treatment (drive)). The conditions (temperature and duration) for the drive-in processing may be selected according to an intended depth of the first and second diffusion regions 414, 415. Thereby, the first and second diffusion regions 414, 415 are defined on the surface layer portion of the semiconductor wafer 432.

In accordance with this method, because introduction of the n-type impurity is performed by phosphorus deposition, as shown in FIG. 80, it is possible to provide the first and second diffusion regions 414, 415 with a constant concentration profile from the surface 434 of the semiconductor wafer 432 (the element forming surface 404 of the semiconductor substrate 402) to a predetermined depth. In contrast, in the case where the n-type impurity is introduced by ion implantation, its concentration profile decreases continuously from the surface 434 of the semiconductor wafer 432 to a predetermined depth.

Figure 78C:
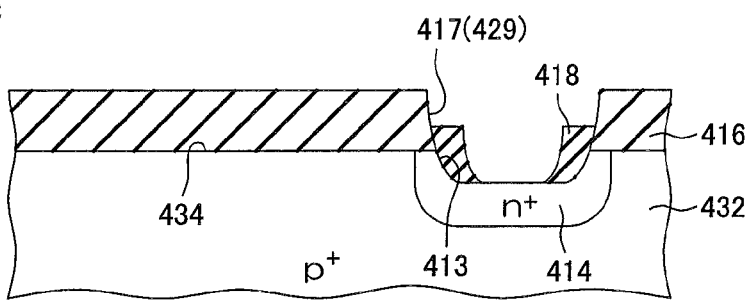

Next, as shown in FIG. 78C, yet another resist mask (not shown) having openings corresponding to the contact holes 417 is defined on the insulating film 416 (Step S407: Define resist mask). The contact holes 417 are defined in the insulating film 416 by etching via the resist mask (Step S408: Open contact hole). At the same time, the thermal oxide film 439 is partially and selectively removed, and the remaining portions are defined as the concave portion insulating films 418. Thereafter, the resist mask is peeled off.

Figure 78D:
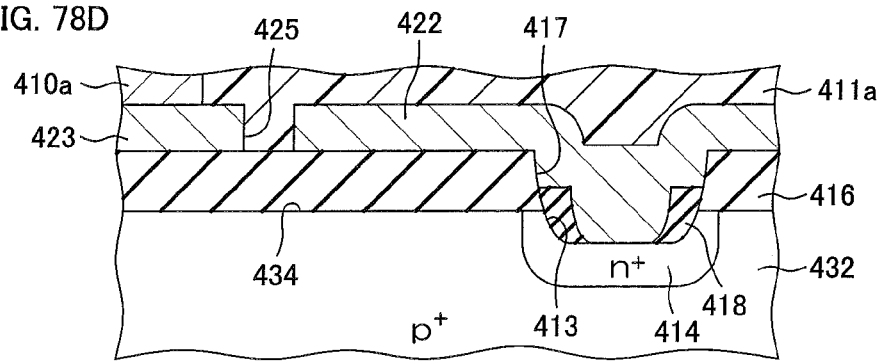

Next, as shown in FIG. 78D, an electrode film constituting the first and second electrode films 419, 420 is defined on the insulating film 416 by sputtering (Step S409: Define electrode film). In Reference Example 4, an electrode film composed of AlSiCu (having a thickness of 10000 Å, for example) is defined. Then, a resist mask (not shown) having an opening pattern corresponding to the slits 425 is defined on the electrode film (Step S410: Define resist mask). The slits 425 are defined in the electrode film by etching (for example, reactive ion etching) via the resist mask (Step S411: Electrode film patterning). This separates the electrode film into the first and second electrode films 419, 420.

Figure 81:
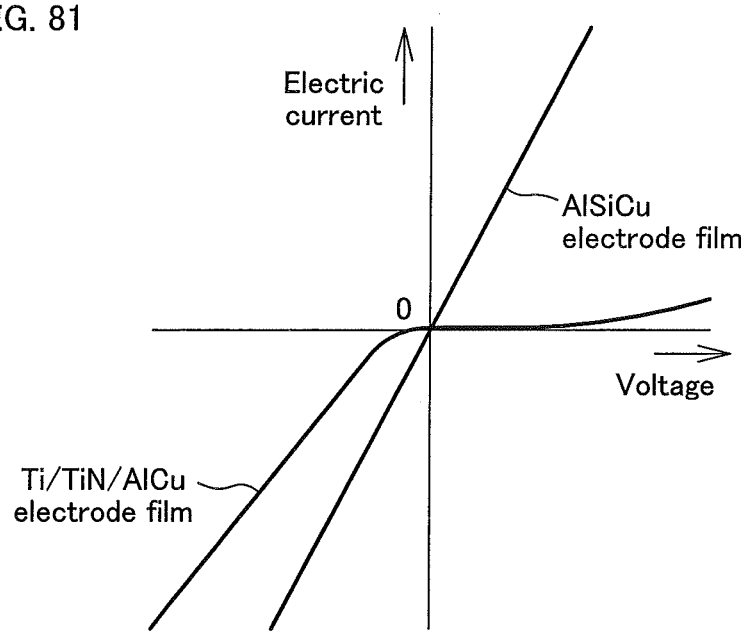
FIG. 81 is a diagram for explanation of an ohmic contact defined between an AlSiCu electrode film and a $p^+$-type semiconductor substrate.

The voltage-current characteristics between the p$^+$-type semiconductor wafer 432 (the semiconductor substrate 402) and the AlSiCu electrode film when an AlSiCu electrode film is defined on the p$^+$-type semiconductor wafer 432 (the semiconductor substrate 402) is shown in FIG. 81.

FIG. 81 is a diagram for explanation of an ohmic contact defined between the AlSiCu electrode film and the p$^+$-type semiconductor substrate. In FIG. 81, for comparison, similar characteristics in the case where an electrode film defined on the p$^+$-type semiconductor substrate is composed of a laminated film that a Ti film, a TiN film, and an AlCu film are laminated in the order from the substrate surface are shown by the curve.

As shown in the graph of FIG. 81, in the case of the AlSiCu electrode film, it is clear that the current is proportional to the applied voltage, and a good ohmic contact is defined. On the other hand, in the case of the Ti/TiN/AlCu electrode film, it is clear that the voltage-current characteristics are not linear characteristics, and no ohmic contact is obtained. From this fact, by use of the AlSiCu electrode film as an electrode film, it is possible to define the first and second electrode films 419, 420 which define ohmic contacts with the p$^+$-type semiconductor substrate without defining a high-concentration region in the p$^+$-type semiconductor substrate, thereby it is possible to simplify the manufacturing process.

Next, after the resist mask is peeled off, the passivation film 411a such as a nitride film is defined by, for example, a CVD method (Step S412: Define passivation film). Next, the resin film 412 is defined by application of photosensitive polyimide or the like (Step S413: Apply polyimide). Next, the resin film 412 is exposed through a pattern corresponding to the pad openings 426, 427. Thereafter, the resin film 412 is developed (Step S414: Exposure/development process).

Next, as needed, a heat treatment for curing the resin film 412 is performed (Step S415: Cure polyimide). Then, the passivation film 411a is removed by dry etching (for example, reactive ion etching) with the resin film 412 serving as a mask (Step S416: Open pad). Thereby, the pad openings 426, 427 are defined.

Next, for example, a conductive material (for example, an Ni layer) is plated to form a film so as to backfill the pad openings 426, 427 (Step S417: Define electrode). Thereby, the first and second connection electrodes 409a, 410a are defined.

Next, as shown in FIG. 79A, a resist pattern 438 for defining a groove for cutting 437 is defined in the boundary region 430 (refer to FIG. 76 as well) (Step S418: Define resist mask). The resist pattern 438 has a grid-shaped opening corresponding to the boundary region 430. Plasma etching is performed via the resist pattern 438 (Step S419: Define groove). Accordingly, the semiconductor wafer 432 is etched from the surface 434 up to a predetermined depth, to define the groove for cutting 437 along the boundary region 430.

Half-finished products 441 are located one by one in the chip regions 431 surrounded by the groove for cutting 437, and these half-finished products 441 are arranged so as to align in a matrix shape. By defining the groove for cutting 437 in this manner, it is possible to separate the semiconductor wafer 432 into the plurality of chip regions 431. After the groove for cutting 437 is defined, the resist pattern is peeled off.

Next, the passivation film 411b composed of silicon nitride is defined on the entire area of the surface 434 of the semiconductor wafer 432 by a CVD method. At this time, the passivation film 411b is defined on the entire area of the inner circumferential surface (the bottom surface and the side surfaces) of the groove for cutting 437.

Next, as shown in FIG. 79B, the semiconductor wafer 432 is polished from the back surface 435 side, so as to reach the bottom surface of the groove for cutting 437 (Step S420: Backside polishing/Dicing). Thereby, it is possible to obtain the bidirectional Zener diodes 401 that the plurality of chip regions 431 are diced into pieces. In this manner, provided that the semiconductor wafer 432 is polished from the back surface 435 side after the groove for cutting 437 is defined, it is possible to simultaneously dice the plurality of chip regions 431 defined on the semiconductor wafer 432 into pieces. Therefore, it is possible to achieve the improvement in productivity of the bidirectional Zener diodes 401 due to shortening of the manufacturing time. In addition, the back surface 405 of the completed semiconductor substrate 402 may be mirrored by polishing or etching, so as to clear the back surface 405.

Figure 82:
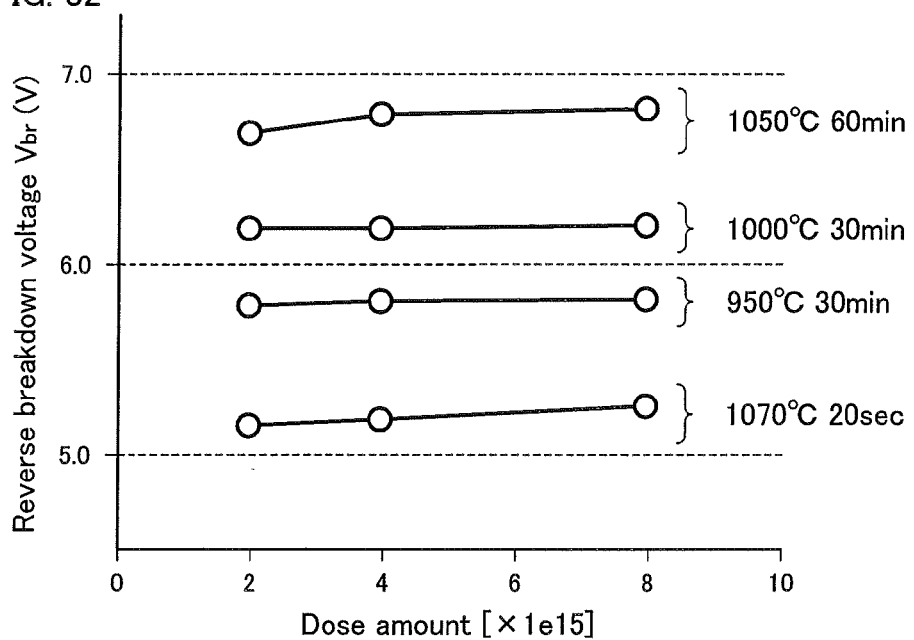
FIG. 82 is a diagram for explanation of the feature for adjustment of a reverse breakdown voltage.

FIG. 82 is a diagram for explanation of the feature for adjustment of the reverse breakdown voltage $V_{br}$.

In the bidirectional Zener diode 401, in the manufacturing process, a heat treatment (drive-in processing) in Step S406 is performed (refer to FIG. 76). The reverse breakdown voltage $V_{br}$ changes according to the temperature and duration of this heat treatment. Specifically, the reverse breakdown voltage $V_{br}$ tends to be higher with an increase in the amount of heat applied to the semiconductor wafer 432 (the semiconductor substrate 402) during the heat treatment. By use of this tendency, it is possible to adjust the reverse breakdown voltage $V_{br}$. As is clear from FIG. 82, the reverse breakdown voltage $V_{br}$ is strongly dependent on the amount of heat during the heat treatment more than the dose amount of the impurity.

Figure 83:
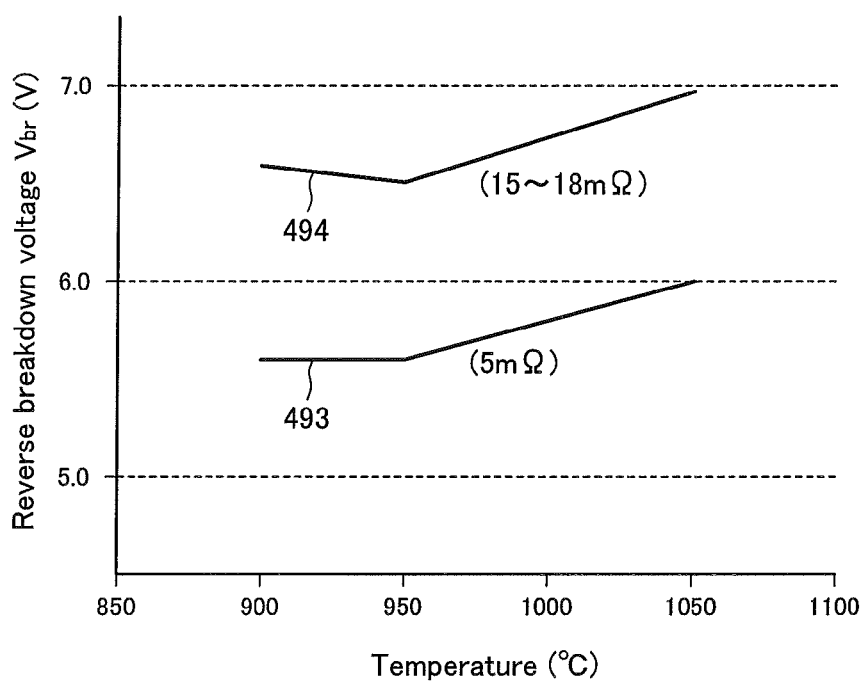
FIG. 83 is a diagram for explanation of another feature for adjustment of a reverse breakdown voltage.

FIG. 83 is a diagram for explanation of another feature for adjustment of the reverse breakdown voltage $V_{br}$.

Specifically, the changes of the reverse breakdown voltage $V_{br}$ with respect to the temperature during the heat treatment for activation of the n-type impurity introduced into the semiconductor wafer 432 are shown, the curve 493 indicates the reverse breakdown voltage $V_{br}$ in the case where a semiconductor wafer having a relatively low resistivity (for example, 5 mΩ) is used, and the curve 493 indicates the reverse breakdown voltage $V_{br}$ in the case where a semiconductor wafer having a relatively high resistivity (for example, 15 to 18 mΩ) is used. The comparison between the curves 493, 494 shows that the reverse breakdown voltage $V_{br}$ is dependent on the resistivity of the semiconductor wafer. Accordingly, by applying a semiconductor wafer having appropriate resistivity in accordance with a target reverse breakdown voltage $V_{br}$, it is possible to control the reverse breakdown voltage $V_{br}$ to be a designed value.

Figure 84:
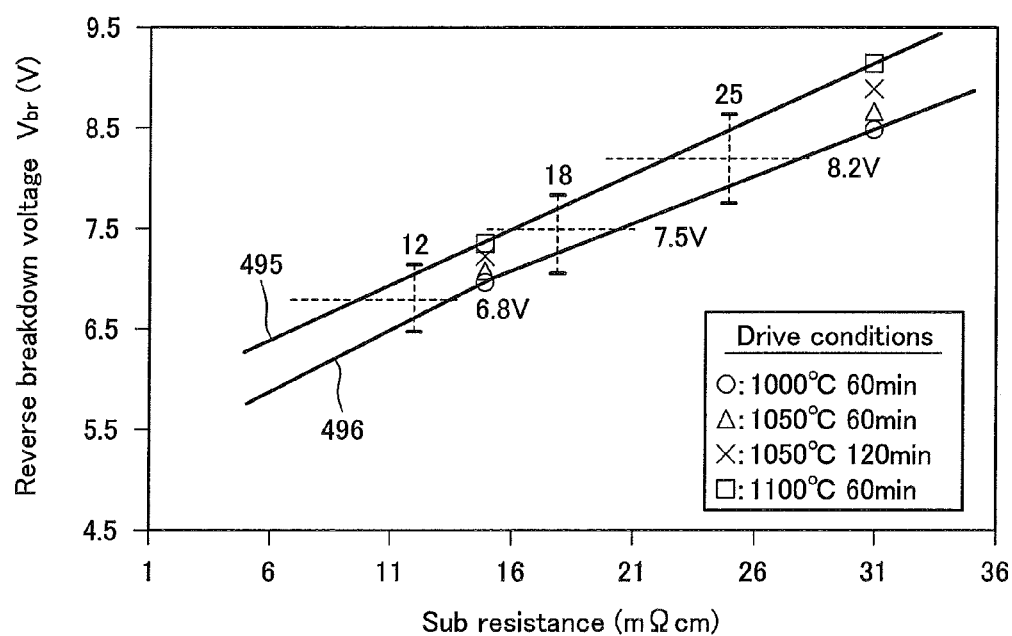
FIG. 84 is a diagram for explanation of yet another feature for adjustment of a reverse breakdown voltage.

FIG. 84 is a diagram for explanation of yet another feature for adjustment of a reverse breakdown voltage.

Specifically, the changes of the reverse breakdown voltage $V_{br}$ with respect to the resistivity of the semiconductor wafer (Sub resistance) are shown. The upper curve 495 indicates the reverse breakdown voltage $V_{br}$ in the case where a relatively large amount of heat is applied during the heat treatment (drive conditions: 1100° C. and 60 min.), and the lower curve 496 indicates the reverse breakdown voltage $V_{br}$ in the case where a relatively small amount of heat is applied (drive conditions: 1000° C. and 60 min.). From the curves 495, 496 and the results under the other drive conditions, when a semiconductor wafer having resistivity of 10 mΩ·cm or higher is used, it is possible to express the reverse breakdown voltage $V_{br}$ of 6.5V or higher. It is particularly shown that, when a semiconductor wafer having resistivity of 25 mΩ·cm is used, it is possible to express the high reverse breakdown voltage $V_{br}$ of 8.2V. Accordingly, provided that a semiconductor wafer having resistivity of 10 mΩ·cm to 30 mΩ·cm is used, and drive-in processing is performed under the conditions under which the n-type impurity is diffused to a depth of 2 μm to 3 μm, it is possible to accurately control the reverse breakdown voltage $V_{br}$ of the bidirectional Zener diode 401 to be from 6.5V to 9.0V.

The above manufacturing method and the method of adjusting the reverse breakdown voltage $V_{br}$ are applicable to the usual Zener diodes. Hereinafter, a Zener diode 450 will be described as Reference Example.

<Zener Diode>

Figure 85:
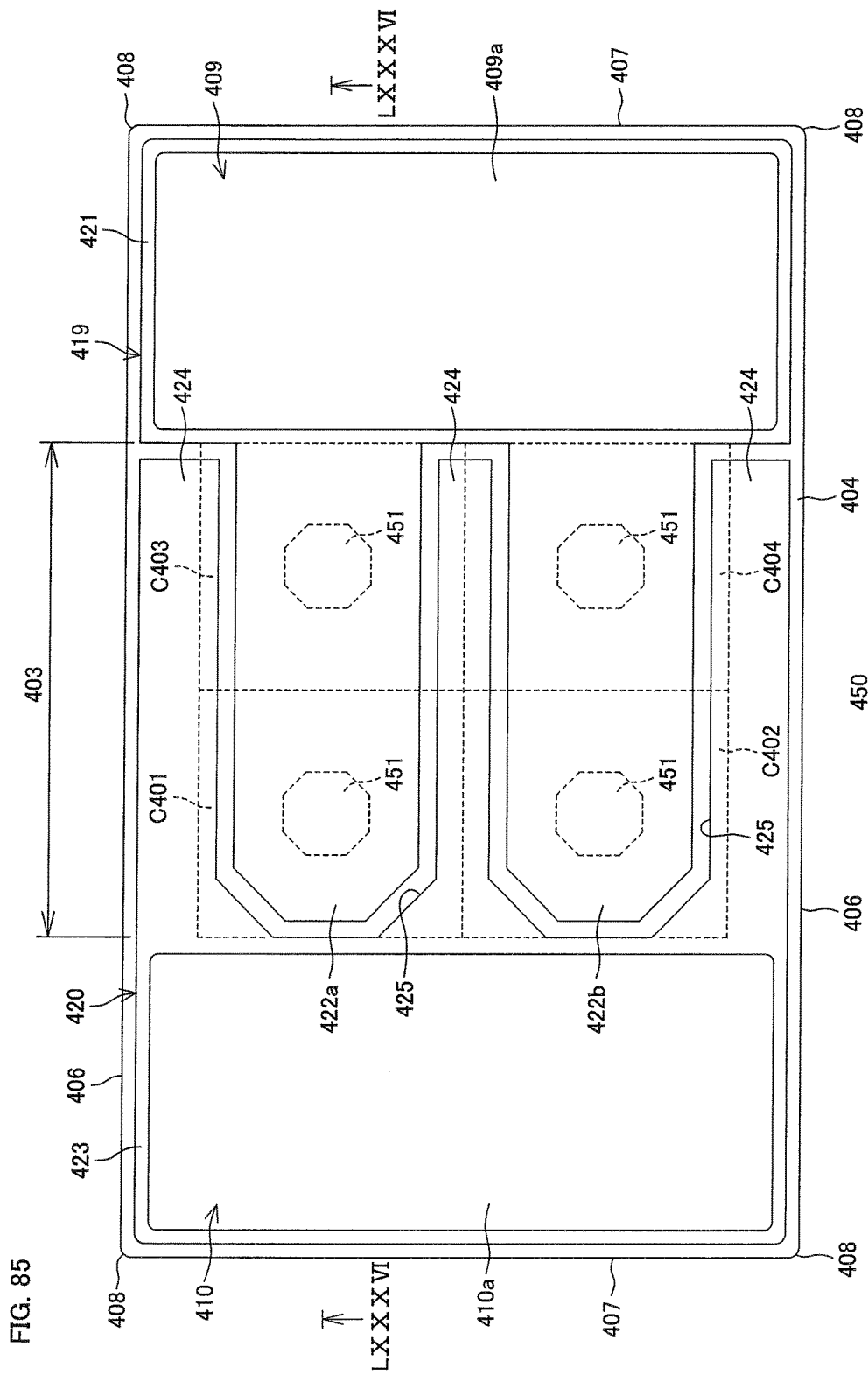
FIG. 85 is a schematic plan view of a Zener diode according to Reference Example.
Figure 86:
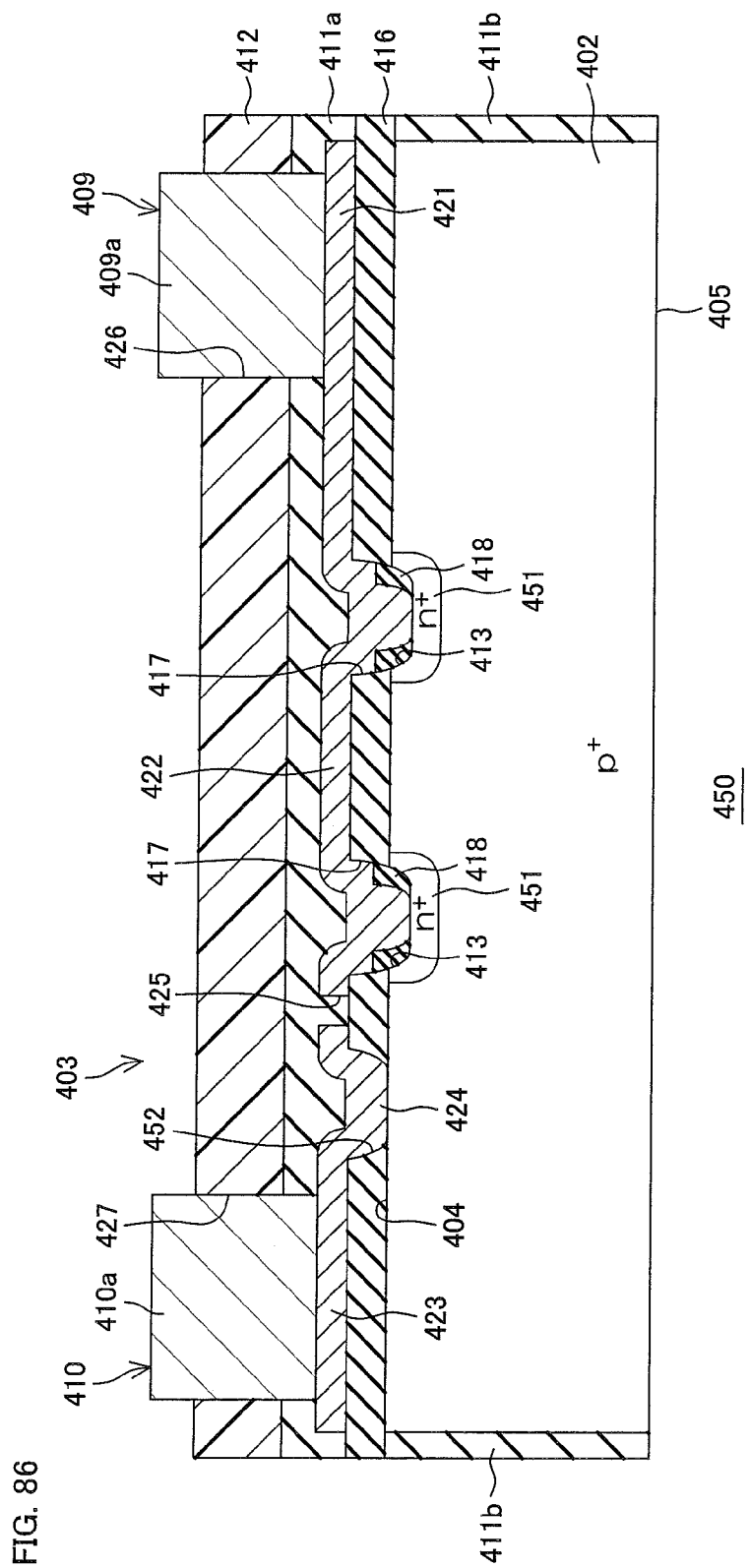
FIG. 86 is a cross-sectional view taken along the cross-section line LXXXVI-LXXXVI shown in FIG. 85.

FIG. 85 is a schematic plan view of the Zener diode 450 according to Reference Example. FIG. 86 is a cross-sectional view taken along the cross-section line LXXXVI-LXXXVI shown in FIG. 85. In FIGS. 85 to 86, portions corresponding to the respective portions shown FIGS. 69 to 84 are shown with the same reference numerals, and the descriptions thereof will be omitted.

In the element region 403 in the Zener diode 450, a plurality of (four in Reference Example 4) diode cells C401 to C404 are arranged. The diode cells C401 to C404 are arrayed two-dimensionally at regular intervals in a square matrix shape along the longitudinal direction and short direction of the semiconductor substrate 402.

$n^+$-type regions 451 are defined on the surface portions of the semiconductor substrate 402 in the respective regions of the diode cells C401 to C404. The $n^+$-type regions 451 are separated for each diode cell. The $n^+$-type regions 451 are defined so as to have the same depth, and define p-n junctions with the semiconductor substrate 402. With respect to each of the respective $n^+$-type regions 451, a depth of the deepest portion thereof is 2 μm to 3 μm from the element forming surface 404. In this manner, the diode cells C401 to C404 respectively have p-n junctions separated for each diode cell.

The plurality of diode cells C401 to C404 are defined so as to have the same size and the same shape in this example. Specifically, the plurality of diode cells C401 to C404 are defined in the rectangular shapes in planar view, and the polygonal (octagonal in this Reference Example) $n^+$-type regions 451 are defined in the rectangular regions of the respective diode cells. The $n^+$-type regions 451 have the four sides respectively along the four sides defining the rectangular regions of the diode cells C401 to C404, and other four sides respectively facing the four corner portions of the rectangular regions of the diode cells C401 to C404.

As shown in FIG. 85 and FIG. 86, in the Zener diode 450, the first electrode 409 is defined as a cathode electrode, and the second electrode 410 is defined as an anode electrode. The first extraction electrodes 422 in the first electrode 409 include first extraction electrodes 422a, 422b which are defined at an interval from one another.

The first extraction electrode 422a is defined so as to be extracted from the first pad 421 toward the row direction, and cover the diode cells C401, C403. The first extraction electrode 422a is defined linearly along the straight line from the diode cell C401 up to the first pad 421 via the diode cell C403. The first extraction electrode 422a is brought into the contact holes 417 and the concave portions 413 of the diode cells C401, C403 from the surface of the insulating film 416, to define ohmic contacts with the respective $n^+$-type regions 451 of the diode cells C401, C403 in the respective concave portions 413.

In the same way, the first extraction electrode 422b is defined so as to be extracted from the first pad 421 toward the row direction, and cover the diode cells C402, C404. The first extraction electrode 422b is defined linearly along the straight line from the diode cell C402 up to the first pad 421 via the diode cell C404. The first extraction electrode 422b is brought into the contact holes 417 and the concave portions 413 of the diode cells C402, C404 from the surface of the insulating film 416, to define ohmic contacts with the respective $n^+$-type regions 451 of the diode cells C402, C404 in the respective concave portions 413.

On the other hand, the second extraction electrodes 424 are defined as anode extraction electrodes in regions other than the second pad 423 in the second electrode 410. The second extraction electrodes 424 are extracted from anode contact holes 452 toward the row direction.

The second extraction electrodes 424 extend from the surface of the insulating film 416 toward the inner sides of the anode contact holes 452, and define ohmic contacts with the semiconductor substrate 402 in the anode contact holes 452. The second extraction electrodes 424 are defined so as to surround the first extraction electrodes 422a, 422b at an interval corresponding to the slits 425 on the surface of the insulating film 416. With this, the first and second electrode films 419, 420 are defined in comb-teeth shapes such that the first extraction electrodes 422a, 422b and the second extraction electrodes 424 engage with each other.

Next, the electrical structure of the Zener diode 450 will be described with reference to FIG. 87.

Figure 87:
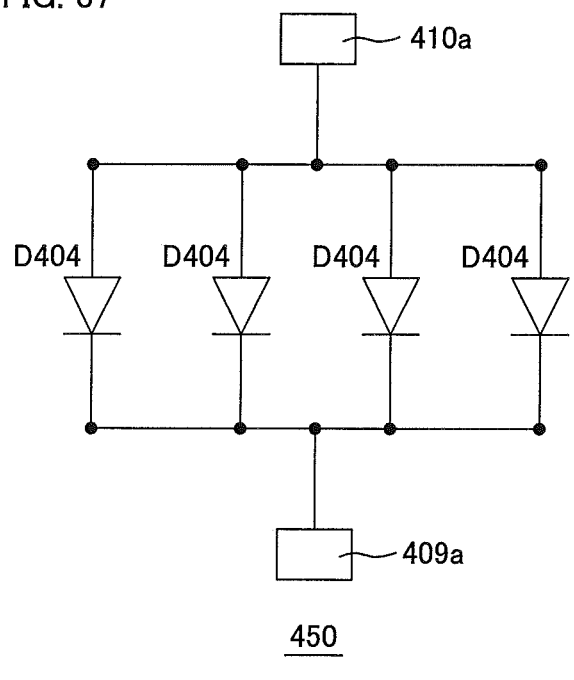
FIG. 87 is an electrical circuit diagram for explanation of the electrical structure of the Zener diode shown in FIG. 85.

FIG. 87 is an electrical circuit diagram showing the electrical structure of the Zener diode 450. Four Zener diodes D404 are defined by the diode cells C401 to C404. The cathode sides of the Zener diodes D404 are connected in common (cathode common) by the first connection electrode 409a, and the anode sides of the Zener diodes D404 are connected in common (anode common) by the second connection electrode 410a. That is, the four Zener diodes D404 are parallel-connected. In this manner, the Zener diode 450 functioning as one diode as a whole is defined.

Figures 88, 89:
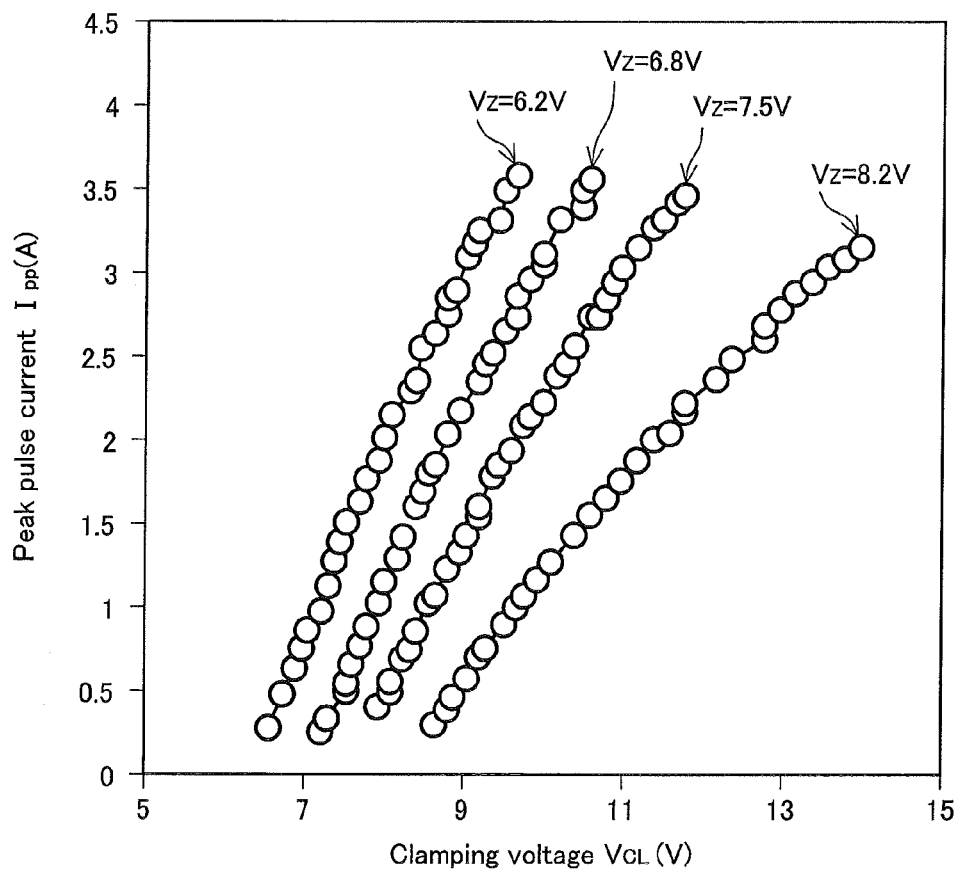
FIG. 88 is a table showing the electrical characteristics of the Zener diode shown in FIG. 85.
FIG. 89 is a graph showing the electrical characteristics of the Zener diode shown in FIG. 85.

FIG. 88 is a table showing the electrical characteristics of the Zener diode 450 shown in FIG. 85. FIG. 89 is a graph showing the electrical characteristics of the Zener diode 450 shown in FIG. 85. In addition, the horizontal axis indicates the clamping voltage $V_{CL}$, and the vertical axis indicates the peak pulse current $I_{pp}$.

FIG. 88 shows the electrical characteristics of the Zener diode 450 which is manufactured by applying the method of adjusting a reverse breakdown voltage $V_{br}$ shown in FIGS. 76 to 84. In addition, a Zener voltage $V_Z$ in a Zener diode corresponds to a reverse breakdown voltage $V_{br}$ of a bidirectional Zener diode.

As shown in the graph of FIG. 88, it is clear that the clamping voltage $V_{CL}$ and the peak pulse current $I_{pp}$ increase with an increase in the Zener voltage $V_Z$. That is, it is clear that it is possible to improve the peak pulse power $P_{pk}$ (=the clamping voltage $V_{CL}$×the peak pulse current $I_{pp}$) by application of the manufacturing method and the method of adjusting the reverse breakdown voltage $V_{br}$ (the Zener voltage $V_Z$) shown in FIGS. 76 to 84 (refer to the table of FIG. 88).

In addition, when the Zener voltage $V_Z$ is 8.2V, the ESD resistance has decreased while the good peak pulse power $P_{pk}$ has been secured. This may be because the $n^+$-type regions 451 expand in the cross direction (that is, the direction perpendicular to the depth direction of the semiconductor wafer 432) with an increase in the amount of heat during the heat treatment in Step S406 (refer to FIG. 76).

From the above results, it is clear that the improvement effect of the peak pulse power $P_{pk}$ is obtained in the above-described bidirectional Zener diode 401 as well. Hereinafter, the description thereof will be made more specifically with reference to FIGS. 90 and 91.

Figures 90, 91:
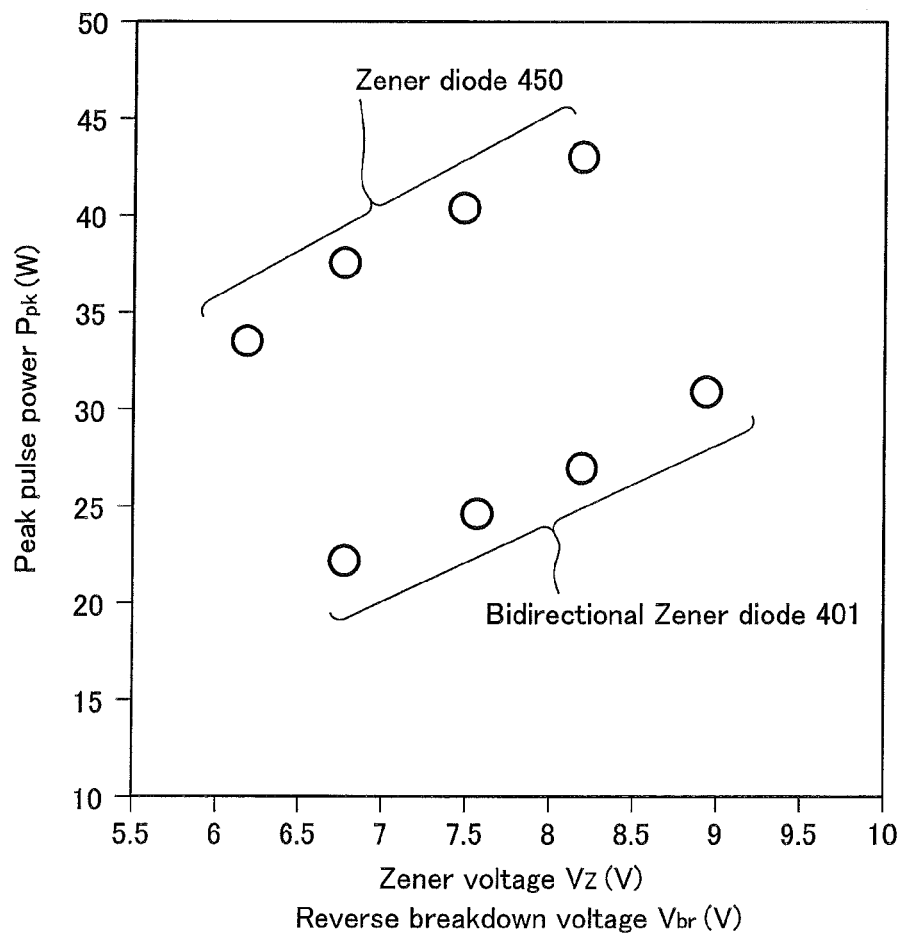
FIG. 90 is a table showing the electrical characteristics of the bidirectional Zener diode shown in FIG. 69.
FIG. 91 is a graph for comparison of the characteristics of the respective peak pulse powers of the bidirectional Zener diode and the Zener diode.

FIG. 90 is a table showing the electrical characteristics of the bidirectional Zener diode 401 shown in FIG. 69. FIG. 91 is a graph for comparison of the characteristics of the respective peak pulse powers $P_{pk}$ of the bidirectional Zener diode 401 and the Zener diode 450.

As shown in FIG. 90, it is clear that the peak pulse power $P_{pk}$ is improved with an increase in the reverse breakdown voltage $V_{br}$ in the bidirectional Zener diode 401. More specifically, when the reverse breakdown voltage $V_{br}$ is 6.8V or higher, it is possible to achieve the peak pulse power $P_{pk}$ of 22.1 W or higher. Further, when the reverse breakdown voltage $V_{br}$ is 7.5V to 8.9V, it is possible to achieve the peak pulse powers $P_{pk}$ of 24.7 W to 28.4 W.

Further, in the bidirectional Zener diode 401, the peak pulse power $P_{pk}$ at the time of the reverse breakdown voltage $V_{br}$ of 8.2V is improved approximately 21% higher than the peak pulse powers $P_{pk}$ at the time of the reverse breakdown voltage $V_{br}$ of 6.8V. In the same way, in the Zener diode 450, the peak pulse power $P_{pk}$ at the time of the Zener voltage $V_Z$ of 8.2V is improved approximately 21% higher than the peak pulse power $P_{pk}$ at the time of the Zener voltage $V_Z$ of 6.8V.

Further, when the reverse breakdown voltage $V_{br}$ is 8.2V, it has been possible to achieve the ESD resistance of 24 kV and the capacitance between terminals $C_t$ (the total capacitance between the first electrode 409 and the second electrode 410) of 5.1 pF. Here, in simulation, the peak pulse power $P_{pk}$ is converted with the capacitance between terminals $C_t$ (=5.1 pF) at the time of the reverse breakdown voltage $V_{br}$ of 8.2V being set to 5.5 based on the capacitance between terminals $C_t$ (=5.5 pF) at the time of the reverse breakdown voltage $V_{br}$ of 6.8V. Thereby, it has been confirmed that it is possible to achieve the peak pulse power $P_{pk}$ of 28.8 W. In the same way, it has been confirmed that it is possible to achieve the peak pulse power $P_{pk}$ of 34 W in the case where the capacitance between terminals $C_t$ is set to 6.5 pF.

In addition, at the time of the reverse breakdown voltage $V_{br}$ of 8.9V, the ESD resistance has decreased while the good peak pulse power $P_{pk}$ has been secured. This may be because the first and second diffusion regions 414, 415 expand in the cross direction (that is, the direction perpendicular to the depth direction of the semiconductor wafer 432) with an increase in the amount of heat during the heat treatment in Step S406 (refer to FIG. 76).

From the above results, the improvement effect of the peak pulse power $P_{pk}$ according to the improvement of the reverse breakdown voltage $V_{br}$ (the Zener voltage $V_Z$) has been confirmed between the both of the bidirectional Zener diode 401 and the Zener diode 450.

As described above, by defining a thermal oxide film in Step S405 before the drive-in processing in Step S406, it is possible to reduce the concentration of the impurity (the n-type impurity or the p-type impurity) in the surface portion of the semiconductor substrate 402 (the semiconductor wafer 432). Additionally, the resistivity of the semiconductor substrate 402 (the semiconductor wafer 432) to be used is 10 mΩ·cm to 30 mΩ·cm. Therefore, the drive-in processing is performed such that the impurity diffuses up to a depth of 2 μm to 3 μm, and the amount of heat during the drive-in processing is applied to the semiconductor substrate 402 (the semiconductor wafer 432), thereby it is possible to manufacture the bidirectional Zener diode 401 with the reverse breakdown voltage $V_{br}$ of 6.5V to 9.0V.

Further, in accordance with the manufacturing method and the method of adjusting the reverse breakdown voltage $V_{br}$, it is possible to achieve the peak pulse powers $P_{pk}$ of 22 W to 29 W. Further, when the reverse breakdown voltage $V_{br}$ is 7.5V to 8.9V, it is possible to achieve the peak pulse powers $P_{pk}$ of 24.7 W to 28.4 W. In particular, it is possible to realize the ESD resistance of 24 kV at the time of the reverse breakdown voltage $V_{br}$ of 8.2V.

Moreover, in accordance with the bidirectional Zener diode 401, it is possible to achieve the capacitance between terminals $C_t$ of 6 pF or less, which is relatively low. Thereby, it is possible to achieve excellent peak pulse power $P_{pk}$, ESD resistance, and capacitance between terminals $C_t$, and it is possible to provide the bidirectional Zener diode 401 which is capable of leading to the improvement in reliability.

Further, in accordance with the bidirectional Zener diode 401, because the semiconductor substrate 402 (the semiconductor wafer 432) is a p-type semiconductor substrate, it is possible to achieve stable characteristics even without defining an epitaxial layer on the semiconductor substrate. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because a p-type semiconductor substrate has a small in-plane resistivity variation, it is possible to cut a bidirectional Zener diode with stable characteristics out of any place of the p-type semiconductor substrate without defining an epitaxial layer. Therefore, by use of the p-type semiconductor substrate, it is possible to simplify the manufacturing process, and reduce the manufacturing cost.

The modes according to the preferred embodiment and Reference Examples of the present invention have been described. The modes according to the preferred embodiment and Reference Examples of the present invention may be implemented further in other modes.

For example, in the above-described preferred embodiment, the example of the first and second connection electrodes 9a, 10a protruding from the surface of the resin film 12 has been described. On the contrary, the first and second connection electrodes 9a, 10a may have overlapping portions striding over the surface of the resin film 12 from the open ends of the pad openings 26, 27. Further, the first and second connection electrodes 9a, 10a may have their surfaces at positions lower than the surface of the resin film 12 (positions close to the semiconductor substrate 2).

Further, in the above-described preferred embodiment, the example in which the first and second connection electrodes 9a, 10a composed of the single layer conductive material (the Ni layer) are defined has been shown. On the contrary, this may have a laminated (three-layered) structure of an Ni layer/a Pd layer/an Au layer. In this case, it is recommended that the Ni layer/the Pd layer/the Au layer be plated to form films in sequence.

Further, in the above-described preferred embodiment, in place of the $n^+$-type diffusion regions 13 of a rectangular shape in planar view, a plurality of the $n^+$-type diffusion regions 13 of a circular shape in planar view may be defined. Further, a plurality of the $n^+$-type diffusion regions 13 may be defined in shapes different from one another. In this case, the plurality of $n^+$-type diffusion regions 13 may be defined so as to have their parasitic capacitances equal to one another, or may be defined so as to have their parasitic capacitances different from one another (for example, a plurality of the $n^+$-type diffusion regions 13 of 0.5 pF and a plurality of the $n^+$-type diffusion regions 13 of 2 pF). Even in the case where a plurality of the $n^+$-type diffusion regions 13 are defined so as to have their parasitic capacitances different from one another, provided that the values of the respective parasitic capacitances are determined in advance, it is possible to easily adjust the capacitance between terminal $C_t$.

Further, a plurality of the $n^+$-type diffusion regions 13 may be defined in random dot shapes separated from the element region 3 which is partitioned in a matrix shape (the plurality of cells 3A) as in the above-described preferred embodiment. Further, the positions of the respective $n^+$-type diffusion regions 13 may be shifted in the row direction on every other row, so as to be arrayed in a zigzag shape.

Further, in the above-described preferred embodiment, the conductivity types of the respective semiconductor portions may be reversed. That is, the p-type portions may be changed to the n-type, and the n-type portions may be changed to the p-type.

Further, in Reference Example 1 described above, the example of the first and second connection electrodes 109a, 110a protruding from the surface of the resin film 112 has been described. On the contrary, the first and second connection electrodes 109a, 110a may have overlapping portions striding over the surface of the resin film 112 from the open ends of the pad openings 126, 127. Further, the first and second connection electrodes 109a, 110a may have their surfaces at positions lower than the surface of the resin film 112 (positions close to the semiconductor substrate 102).

Further, in Reference Example 1 described above, the example in which the first and second connection electrodes 109a, 110a composed of the single layer conductive material (the Ni layer) are defined has been shown. On the contrary, this may have a laminated (three-layered) structure of an Ni layer/a Pd layer/an Au layer. In this case, it is recommended that the Ni layer/the Pd layer/the Au layer be plated to form films in sequence.

Further, in Reference Example 1 described above, in place of the first and second diffusion regions 114, 115 of a rectangular shape in planar view, a plurality of the first and second diffusion regions 114, 115 of a circular shape in planar view may be defined. Further, a plurality of the first and second diffusion regions 114, 115 may be defined in shapes different from one another. In this case, the plurality of first and second diffusion regions 114, 115 may be defined so as to have their parasitic capacitances equal to one another, or may be defined so as to have their parasitic capacitances different from one another. Even in the case where the plurality of first and second diffusion regions 114, 115 are defined so as to have their parasitic capacitances different from one another, provided that the values of the respective parasitic capacitances are determined in advance, it is possible to easily adjust the capacitance between terminal $C_t$.

Further, a plurality of the first and second diffusion regions 114, 115 may be defined in random dot shapes separated from the element region 103 which is partitioned in a matrix shape (the plurality of cells 103A) as in Reference Example 1 described above. Further, the positions of the respective first and second diffusion regions 114, 115 may be shifted in the row direction on every other row, so as to array the plurality of first and second diffusion regions 114, 115 in a zigzag shape.

Further, in Reference Example 1 described above, the conductivity types of the respective semiconductor portions may be reversed. That is, the p-type portions may be changed to the n-type, and the n-type portions may be changed to the p-type.

For example, in Reference Example 2 described above, the example of the first and second connection electrodes 209a, 210a protruding from the surface of the resin film 212 has been described. On the contrary, the first and second connection electrodes 209a, 210a may have overlapping portions striding over the surface of the resin film 212 from the open ends of the pad openings 226, 227. Further, the first and second connection electrodes 209a, 210a may have their surfaces at positions lower than the surface of the resin film 212 (positions close to the semiconductor substrate 202).

Further, in Reference Example 2 described above, the example in which the first and second connection electrodes 209a, 210a composed of the single layer conductive material (the Ni layer) are defined has been shown. On the contrary, this may have a laminated (three-layered) structure of an Ni layer/a Pd layer/an Au layer. In this case, it is recommended that the Ni layer/the Pd layer/the Au layer be plated to form films in sequence.

Further, in Reference Example 2 described above, in place of the first and second diffusion regions 214, 215 of a rectangular shape in planar view, a plurality of the first and second diffusion regions 214, 215 of a circular shape in planar view may be defined. Further, a plurality of the first and second diffusion regions 214, 215 may be defined in shapes different from one another. In this case, the plurality of first and second diffusion regions 214, 215 are preferably defined so as to have areas and boundary lengths which are equal to one another.

Further, if the plurality of first and second diffusion regions 214, 215 are defined so as to aggregate in the central portion of the element region 203, a plurality of the first and second diffusion regions 214, 215 may be defined in random dot shapes separated from the element region 203 which is partitioned in a matrix shape (the plurality of cells 203A) as in Reference Example 2 described above. Further, the positions of the respective first and second diffusion regions 214, 215 may be shifted in the row direction on every other row, so as to array the first and second diffusion regions 214, 215 in a zigzag shape.

Further, in Reference Example 2 described above, the conductivity types of the respective semiconductor portions may be reversed. That is, the p-type portions may be changed to the n-type, and the n-type portions may be changed to the p-type.

Further, in Reference Example 3 described above, the example of the first and second connection electrodes 309a, 310a protruding from the surface of the resin film 312 has been described. On the contrary, the first and second connection electrodes 309a, 310a may have overlapping portions striding over the surface of the resin film 312 from the open ends of the pad openings 326, 327. Further, the first and second connection electrodes 309a, 310a may have their surfaces at positions lower than the surface of the resin film 312 (positions close to the semiconductor substrate 302).

Further, in Reference Example 3 described above, the example in which the first and second connection electrodes 309a, 310a composed of the single layer conductive material (the Ni layer) are defined has been shown. On the contrary, this may have a laminated (three-layered) structure of an Ni layer/a Pd layer/an Au layer. In this case, it is recommended that the Ni layer/the Pd layer/the Au layer be plated to form films in sequence.

Further, in Reference Example 3 described above, the example in which the first and second diffusion regions 314, 315 are defined only on the third column has been described. On the contrary, a plurality of the first and second diffusion regions 314, 315 may be defined along the row direction.

Further, in Reference Example 3 described above, in place of the first and second diffusion regions 314, 315 of a rectangular shape in planar view, a plurality of the first and second diffusion regions 314, 315 of a circular shape in planar view may be defined. Further, a plurality of the first and second diffusion regions 314, 315 may be defined in shapes different from one another. In this case, the plurality of first and second diffusion regions 314, 315 are preferably defined so as to have their parasitic capacitances which are equal to one another.

Further, a plurality of the first and second diffusion regions 314, 315 may be defined in a random dot array separately from the element region 303 which is partitioned in a matrix shape (the plurality of cells 303A) as in Reference Example 3 described above. Further, the positions of the respective first and second diffusion regions 314, 315 may be shifted in the row direction on every other row, so as to array the first and second diffusion regions 314, 315 in a zigzag shape.

Further, in Reference Example 3 described above, the conductivity types of the respective semiconductor portions may be reversed. That is, the p-type portions may be changed to the n-type, and the n-type portions may be changed to the p-type.

Further, in Reference Example 4 described above, the example of the first and second connection electrodes 409a, 410a protruding from the surface of the resin film 412 has been described. On the contrary, the first and second connection electrodes 409a, 410a may have overlapping portions striding over the surface of the resin film 412 from the open ends of the pad openings 426, 427. Further, the first and second connection electrodes 409a, 410a may have their surfaces at positions lower than the surface of the resin film 412 (positions close to the semiconductor substrate 402).

Further, in Reference Example 4 described above, the example in which the first and second connection electrodes 409a, 410a composed of the single layer conductive material (the Ni layer) are defined has been shown. On the contrary, this may have a laminated (three-layered) structure of an Ni layer/a Pd layer/an Au layer. In this case, it is recommended that the Ni layer/the Pd layer/the Au layer be plated to form films in sequence.

Further, in Reference Example 4 described above, in place of the first and second diffusion regions 414, 415 of a rectangular shape in planar view, a plurality of the first and second diffusion regions 414, 415 of a circular shape in planar view may be defined. Further, a plurality of the first and second diffusion regions 414, 415 may be defined in shapes different from one another. In this case, the plurality of first and second diffusion regions 414, 415 are preferably defined so as to have their parasitic capacitances which are equal to one another. By having the parasitic capacitances equal to one another, it is possible to suppress an increase in undesired capacitance between terminals $C_t$.

Further, a plurality of the first and second diffusion regions 414, 415 may be defined in random dot shapes separated from the element region 403 which is partitioned in a matrix shape (the plurality of cells 403A) as in Reference Example 4 described above. Further, the positions of the respective first and second diffusion regions 414, 415 may be shifted in the row direction on every other row, so as to array the plurality of first and second diffusion regions 414, 415 in a zigzag shape.

Further, in Reference Example 4 described above, the conductivity types of the respective semiconductor portions may be reversed. That is, the p-type portions may be changed to the n-type, and the n-type portions may be changed to the p-type.

The bidirectional Zener diode 1, 101, 201, 301, or 401 may be, as a protection element for a memory (for example, a storage device such as a flash memory), built in an electronic device, for example, a mobile terminal such as a portable electronic device. In this case, the electronic device includes a chassis in which a circuit assembly on which the bidirectional Zener diode 1, 101, 201, 301, or 401 is mounted is housed. That is, a mounted substrate and the bidirectional Zener diode 1, 101, 201, 301, or 401 mounted on the mounted substrate are included in the circuit assembly adopted for the electronic device. At this time, the bidirectional Zener diode 1, 101, 201, 301, or 401 may be connected (surface-mounted) to the mounted substrate by wireless bonding.

Additionally, various design changes can be applied within the scope of the matters described in the scope of claims. The features extracted from this specification and the drawings are hereinafter shown.

For example, with reference to FIGS. 14 to 30B, in the case where it is an object of the present invention to provide a bidirectional Zener diode which is capable of improving a peak pulse power while suppressing an increase in capacitance between terminals, a bidirectional Zener diode having features as shown in the following A1 to A17 may be extracted.

A1: A bidirectional Zener diode includes a semiconductor substrate of a first conductivity type, a first electrode and a second electrode which are defined on the semiconductor substrate, a plurality of first diffusion regions of a second conductivity type, which are defined on a surface portion of the semiconductor substrate, to be connected to the first electrode, and a plurality of second diffusion regions of a second conductivity type, which are defined at intervals from the first diffusion regions on the surface portion of the semiconductor substrate, to be connected to the second electrode.

In accordance with this configuration, a plurality of first Zener diodes whose cathodes are connected to the first electrode are defined in the plurality of first diffusion regions electrically connected to the first electrode. Further, a plurality of second Zener diodes whose cathodes are connected to the second electrode are defined in the plurality of second diffusion regions electrically connected to the second electrode. The respective anodes of the first and second Zener diodes are connected in common to the semiconductor substrate. In this manner, because the first Zener diodes and the second Zener diodes are anti-series connected via the semiconductor substrate, the bidirectional Zener diode is configured between the first electrode and the second electrode.

Here, as the characteristics of the bidirectional Zener diode, there are a reverse breakdown voltage ($V_{br}$: Reverse Breakdown Voltage), peak pulse power ($P_{pk}$: Peak Pulse Power), capacitance between terminals ($C_t$), ESD (Electrostatic Discharge) resistance, and the like. Particularly, in electronic devices including mobile telephones, relatively low capacitance between terminals (the total capacitance between the first electrode and the second electrode) is required from the viewpoint of good transmission of electric signals, and a relatively high peak pulse power is required from the viewpoint of ensuring reliability.

In general, it is possible to improve a peak pulse power by increasing the areas of the diffusion regions constituting the bidirectional Zener diode. However, increasing the areas of the diffusion regions causes a trade-off that the capacitance between terminals as well simultaneously increases. Therefore, there is a problem that it is difficult to satisfy both a high peak pulse power and low capacitance between terminals.

In response to this problem, it has been ascertained that the capacitance between terminals in the bidirectional Zerner diode is in a proportional relationship to the respective areas of the first and second diffusion regions, and the peak pulse power is in a proportional relationship to the respective boundary lengths of the first and second diffusion regions. That is, it is possible to decrease the capacitance between terminals by defining the respective areas of the first and second diffusion regions smaller. On the contrary, it is possible to improve the peak pulse power by making the respective boundary lengths of the first and second diffusion regions longer.

Accordingly, a plurality of first diffusion regions and a plurality of second diffusion regions are defined within a range of the limited area, thereby it is possible to make the boundary lengths longer than that in the case where the first diffusion region and the second diffusion region are respectively defined singularly. Accordingly, because there is no need to unnecessarily increase the respective areas of the first diffusion regions and the second diffusion regions as means for improving the peak pulse power, it is possible to improve the peak pulse power $P_{pk}$ while suppressing an increase in capacitance between terminals.

In addition, an area of the first diffusion region means a total area of a region surrounded by the boundary between the semiconductor substrate and the first diffusion region in planar view that the surface of the semiconductor substrate is viewed from a normal direction. In the same way, an area of the second diffusion region means a total area of a region surrounded by the boundary between the semiconductor substrate and the second diffusion region in planar view that the surface of the semiconductor substrate is viewed from a normal direction.

Further, a boundary length of the first diffusion region means a total extension of the boundary between the semiconductor substrate and the first diffusion region on the surface of the semiconductor substrate. Further, in the same way, a boundary length of the second diffusion region means a total extension of the boundary between the semiconductor substrate and the second diffusion region on the surface of the semiconductor substrate.

A2: The bidirectional Zener diode according to A1, in which the first electrode includes a first extraction electrode which is defined so as to cover the plurality of first diffusion regions, and the second electrode includes second extraction electrodes which are defined so as to cover the plurality of second diffusion regions along an extracting direction of the first extraction electrode.

A3: The bidirectional Zener diode according to A2, in which a plurality of the first extraction electrodes and a plurality of the second extraction electrodes are defined in comb-teeth shapes engaging with each other.

In accordance with this configuration, because the plurality of first extraction electrodes and the plurality of second extraction electrodes are defined in comb-teeth shapes engaging with each other, it is possible to efficiently define the respective boundary lengths of the first diffusion regions and the second diffusion regions as longer within a range of the limited area.

A4: The bidirectional Zener diode according to A2 or A3, in which the plurality of first diffusion regions and the plurality of second diffusion regions are arrayed along the extracting direction of the first extraction electrodes and the second extraction electrodes.

In accordance with this configuration, it is possible to arrange the first diffusion regions and the second diffusion regions without waste in the extracting direction of the first extraction electrodes and the second extraction electrodes while maintaining the good connection between the first diffusion regions and the second diffusion regions, and the first extraction electrodes and the second extraction electrodes. Therefore, it is possible to efficiently define the respective boundary lengths of the first diffusion regions and the second diffusion regions as longer.

A5: The bidirectional Zener diode according to any one of A2 to A4, in which the plurality of first diffusion regions and the plurality of second diffusion regions are defined so as to be adjacent to one another along a direction perpendicular to the extracting direction of the first extraction electrodes and the second extraction electrodes.

In accordance with this configuration, it is possible to arrange the first diffusion regions and the second diffusion regions without waste in a direction perpendicular to the extracting direction of the first extraction electrodes and the second extraction electrodes. Therefore, it is possible to efficiently define the respective boundary lengths of the first diffusion regions and the second diffusion regions as longer.

A6: The bidirectional Zener diode according to any one of A2 to A5, in which the first extraction electrodes and the second extraction electrodes are defined so as to have a width wider than each width of the plurality of first diffusion regions and the plurality of second diffusion regions.

In accordance with this configuration, it is possible to favorably connect the first extraction electrodes and the second extraction electrodes to the first diffusion regions and the second diffusion regions.

A7: The bidirectional Zener diode according to any one of A1 to A6 further includes an insulating film which covers the surface of the semiconductor substrate, in which contact holes for selectively exposing the plurality of first diffusion regions and the plurality of second diffusion regions are defined in the insulating film.

A8: The bidirectional Zener diode according to A7, in which each of the contact holes is defined so as to have a width narrower than each width of the plurality of first diffusion regions and the plurality of second diffusion regions.

In accordance with this configuration, it is possible to favorably electrically connect the first electrode and the second electrode to the first diffusion regions and the second diffusion regions.

A9: The bidirectional Zener diode according to any one of A1 to A8, in which the plurality of first diffusion regions and the plurality of second diffusion regions are respectively defined so as to have the same area and the same depth.

In accordance with this configuration, it is possible to substantially equalize the capacitance components (parasitic capacitances) in the plurality of first diffusion regions, and the capacitance components (parasitic capacitances) in the plurality of second diffusion regions. Therefore, the boundary lengths of the first diffusion regions and the second diffusion regions are made longer under this configuration, thereby it is possible to improve the peak pulse power while effectively suppressing an increase in undesired capacitance between terminals.

Further, because the capacitance components (parasitic capacitances) in the plurality of first diffusion regions and the capacitance components (parasitic capacitances) in the plurality of second diffusion regions are equal to one another, it is possible to adjust the capacitance between terminals of the bidirectional Zener diode by adjusting a component ratio of the first diffusion regions and the second diffusion regions. Thereby, it is possible to improve the freedom of design.

A10: The bidirectional Zener diode according to any one of A1 to A9, in which the plurality of first diffusion regions and the plurality of second diffusion regions respectively have parasitic capacitances equal to one another.

A11: The bidirectional Zener diode according to A10, in which the parasitic capacitances are 1.0 pF.

In accordance with this configuration, it is possible to adjust the capacitance between terminals of the bidirectional Zener diode in units of [pF]. Therefore, it is possible to precisely adjust the capacitance between terminals in accordance with the specifications of application and the purposes for which the bidirectional Zener diode is used.

A12: The bidirectional Zener diode according to any one of A1 to A11, in which the plurality of first diffusion regions and the plurality of second diffusion regions have the same boundary length.

A13: The bidirectional Zener diode according to any one of A1 to A12, in which the plurality of first diffusion regions and the plurality of second diffusion regions are arrayed so as to be symmetrical.

In accordance with this configuration, it is possible to substantially equalize the electrical characteristics of the first Zener diodes, and the electrical characteristics of the second Zener diodes. Thereby, it is possible to substantially equalize the characteristics of an electric current flowing from the first electrode toward the second electrode, and the characteristics of an electric current flowing from the second electrode toward the first electrode. Symmetry includes point symmetry and line symmetry. Further, symmetry also includes a mode, which is even not an exact symmetrical figure, but considered as being substantially symmetrical as long as the electrical characteristics are symmetrical.

A14: A bidirectional Zener diode includes a semiconductor substrate of a first conductivity type, a first electrode and a second electrode which are defined on the semiconductor substrate, a plurality of first diffusion regions of a second conductivity type, which are defined on a surface portion of the semiconductor substrate, to be connected to the first electrode, and a plurality of second diffusion regions of a second conductivity type, which are defined at intervals from the first diffusion regions on the surface portion of the semiconductor substrate, to be connected to the second electrode, the bidirectional Zener diode in which the respective boundary lengths of the first diffusion regions and the second diffusion regions are respectively 470 µm or more in planar view that the semiconductor substrate is viewed from a normal direction.

In accordance with this configuration, first Zener diodes whose cathodes are connected to the first electrode are defined in the first diffusion regions electrically connected to the first electrode. Further, second Zener diodes whose cathodes are connected to the second electrode are defined in the second diffusion regions electrically connected to the second electrode. The respective anodes of the first and second Zener diodes are connected in common to the semiconductor substrate. In this manner, because the first Zener diodes and the second Zener diodes are anti-series connected via the semiconductor substrate, the bidirectional Zener diode is configured between the first electrode and the second electrode. Further, as in this configuration, the respective boundary lengths of the first diffusion regions and the second diffusion regions are respectively made to be 470 µm or more, thereby it is possible to achieve the peak pulse power of 20 W or higher.

A15: The bidirectional Zener diode according A14, in which the respective boundary lengths of the first diffusion regions and the second diffusion regions are respectively 2500 µm or less. In accordance with this configuration, it is possible to achieve the peak pulse power of 20 W to 80 W.

A16: The bidirectional Zener diode according A14 or A15, in which the respective areas of the first diffusion regions and the second diffusion regions are respectively 6000 µm² to 32000 µm². In accordance with this configuration, it is possible to achieve the capacitance between terminals of 4 pF to 20 pF.

A17: The bidirectional Zener diode according to any one of A14 to A16, in which the first electrode includes a plurality of first extraction electrodes which cover the plurality of first diffusion regions, the second electrode includes a plurality of second extraction electrodes which cover the plurality of second diffusion regions, and the first extraction electrodes and the second extraction electrodes are defined in comb-teeth shapes engaging with each other.

In accordance with this configuration, because the plurality of first extraction electrodes and the plurality of second extraction electrodes are defined in comb-teeth shapes engaging with each other, it is possible to efficiently define the respective boundary lengths of the first diffusion regions and the second diffusion regions as longer within a range of the limited area.

Further, with reference to FIGS. 31 to 54, in the case where it is an object of the present invention to provide a bidirectional Zener diode which is capable of achieving excellent ESD resistance, and leading to the improvement in reliability, a bidirectional Zener diode having features as shown in the following B1 to B17 may be extracted.

B1: A bidirectional Zener diode includes a semiconductor substrate of a first conductivity type, which has an element region, a first electrode and a second electrode which are defined on the semiconductor substrate, a plurality of first diffusion regions of a second conductivity type, which are defined on a surface portion of the semiconductor substrate, to be connected to the first electrode, and a plurality of second diffusion regions of a second conductivity type, which are defined at intervals from the first diffusion regions on the surface portion of the semiconductor substrate, to be connected to the second electrode, the bidirectional Zener diode in which the plurality of first diffusion regions and the plurality of second diffusion regions are aggregated in a central portion of the element region.

In accordance with this configuration, first Zener diodes whose cathodes are connected to the first electrode are defined in the first diffusion regions electrically connected to the first electrode. Further, second Zener diodes whose cathodes are connected to the second electrode are defined in the second diffusion regions electrically connected to the second electrode. The respective anodes of the first and second Zener diodes are connected in common to the semiconductor substrate. In this manner, because the first Zener diodes and the second Zener diodes are anti-series connected via the semiconductor substrate, the bidirectional Zener diode is configured between the first electrode and the second electrode.

As the characteristics of the bidirectional Zener diode, there are a reverse breakdown voltage ($V_{br}$: Reverse Breakdown Voltage), peak pulse power ($P_{pk}$: Peak Pulse Power), capacitance between terminals ($C_t$), ESD (Electrostatic Discharge) resistance, and the like. In the bidirectional Zener diode, high ESD resistance is required from the viewpoint of ensuring reliability.

The ESD (Electrostatic Discharge) resistance in the bidirectional Zener diode fluctuates according to the positions at which the plurality of first diffusion regions and the plurality of second diffusion regions (the first Zener diodes and the second Zener diodes) are defined. As in this configuration, the plurality of first diffusion regions and the plurality of second diffusion regions are aggregated in the central portion of the element region, thereby it is possible to improve the ESD resistance better than that in the case where the plurality of first diffusion regions and the plurality of second diffusion regions are not aggregated in the central portion of the element region. Thereby, it is possible to provide the bidirectional Zener diode which is capable of leading to the improvement in reliability.

B2: The bidirectional Zener diode according to B1, in which the first electrode and the second electrode are defined so as to sandwich the element region, and the plurality of first diffusion regions and the plurality of second diffusion regions constitute a central diffusion region group along a transverse direction crossing the central portion in the opposite direction of the first electrode and the second electrode in the central portion of the element region.

In accordance with this configuration, because the plurality of first diffusion regions and the plurality of second diffusion regions constitute the central diffusion region group, it is possible to reliably achieve the improvement effect of the ESD resistance.

B3: The bidirectional Zener diode according to B2, in which the plurality of first diffusion regions and the plurality of second diffusion regions further constitute auxiliary diffusion region groups adjacent to the central diffusion region group in the central portion of the element region.

B4: The bidirectional Zener diode according to B3, in which the auxiliary diffusion region groups are defined as shorter than the central diffusion region group with respect to a length in the transverse direction.

B5: The bidirectional Zener diode according to B4, in which the auxiliary diffusion region groups are selectively arranged in central portions in the transverse direction of the central diffusion region group.

B6: The bidirectional Zener diode according to any one of B2 to B5, in which the plurality of first diffusion regions and the plurality of second diffusion regions are defined in rectangular shapes along the opposite direction.

B7: The bidirectional Zener diode according to any one of B2 to B6, in which the plurality of first diffusion regions and the plurality of second diffusion regions are defined so as to be adjacent to one another along the transverse direction.

B8: The bidirectional Zener diode according to any one of B1 to B7, in which the first electrode includes a plurality of first extraction electrodes which cover the plurality of first diffusion regions, the second electrode includes a plurality of second extraction electrodes which cover the plurality of second diffusion regions, and the second extraction electrodes are defined along a longitudinal direction of the first extraction electrodes.

B9: The bidirectional Zener diode according to B8, in which the first extraction electrodes and the second extraction electrodes are defined in comb-teeth shapes engaging with each other.

In accordance with this configuration, because the plurality of first extraction electrodes and the plurality of second extraction electrodes are defined in comb-teeth shapes engaging with each other, it is possible to efficiently arrange the plurality of first diffusion regions and the plurality of second diffusion regions which are connected to the first electrode and the second electrode.

B10: The bidirectional Zener diode according to B8 or B9, in which the first extraction electrodes and the second extraction electrodes are defined so as to have a width wider than a width of the plurality of first diffusion regions and the plurality of second diffusion regions.

In accordance with this configuration, it is possible to favorably connect the first extraction electrodes and the second extraction electrodes to the plurality of first diffusion regions and the plurality of second diffusion regions.

B11: The bidirectional Zener diode according to any one of B1 to B10 further includes an insulating film which covers the semiconductor substrate, in which contact holes for selectively exposing the plurality of first diffusion regions and the plurality of second diffusion regions are defined in the insulating film.

B12: The bidirectional Zener diode according to B11, in which the contact hole is defined so as to have a width narrower than the width of the plurality of first diffusion regions and the plurality of second diffusion regions.

In accordance with this configuration, it is possible to favorably electrically connect the first electrode and the second electrode to the plurality of first diffusion regions and the plurality of second diffusion regions.

B13: The bidirectional Zener diode according to any one of B1 to B12, in which the plurality of first diffusion regions and the plurality of second diffusion regions have the same area.

In accordance with this configuration, it is possible to substantially uniform the respective capacitance components (parasitic capacitances) in the plurality of first diffusion regions and the plurality of second diffusion regions. Accordingly, it is possible to effectively suppress an increase in undesired capacitance between terminals, and it is possible to achieve good ESD resistance in a state of maintaining low capacitance between terminals.

In addition, an area of the first diffusion region means a total area of a region surrounded by the boundary between the semiconductor substrate and the first diffusion region in planar view that the surface of the semiconductor substrate is viewed from a normal direction. In the same way, an area of the second diffusion region means a total area of a region surrounded by the boundary between the semiconductor substrate and the second diffusion region in planar view that the surface of the semiconductor substrate is viewed from a normal direction.

B14: The bidirectional Zener diode according to any one of B1 to B13, in which the plurality of first diffusion regions and the plurality of second diffusion regions have the same boundary length.

B15: The bidirectional Zener diode according to any one of B1 to B14, in which the plurality of first diffusion regions and the plurality of second diffusion regions are defined so as to be symmetrical to one another.

In accordance with this configuration, it is possible to substantially equalize the electrical characteristics of the first Zener diodes, and the electrical characteristics of the second Zener diodes. Thereby, it is possible to substantially equalize the characteristics for the respective electric current directions. Symmetry includes point symmetry and line symmetry. Further, symmetry also includes a mode, which is even not an exact symmetrical figure, but considered as being substantially symmetrical as long as the electrical characteristics are symmetrical.

B16: The bidirectional Zener diode according to any one of B1 to B15 further includes pseudo-diode regions which are electrically isolated from the first electrode and the second electrode, in which the pseudo-diode regions are defined in regions other than the regions in which the plurality of first diffusion regions and the plurality of second diffusion regions are defined.

B17: The bidirectional Zener diode according to any one of B1 to B16, in which the semiconductor substrate is a p-type semiconductor substrate, and the first diffusion regions and the second diffusion regions are n-type diffusion regions.

In accordance with this configuration, because the semiconductor substrate is a p-type semiconductor substrate, it is possible to achieve stable characteristics even without defining an epitaxial layer on the semiconductor substrate. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because a p-type semiconductor substrate has a small in-plane resistivity variation, it is possible to cut a bidirectional Zener diode with stable characteristics out of any place of the p-type semiconductor substrate without defining an epitaxial layer. Therefore, by use of the p-type semiconductor substrate, it is possible to simplify the manufacturing process, and reduce the manufacturing cost.

Further, with reference to FIGS. 55 to 68B, in the case where it is an object of the present invention to provide a bidirectional Zener diode which is capable of achieving excellent peak pulse power, that leads to the improvement in reliability, a bidirectional Zener diode having features as shown in the following C1 to C17 may be extracted.

C1: A bidirectional Zener diode includes a semiconductor substrate of a first conductivity type, a first electrode and a second electrode which are defined on the semiconductor substrate, first diffusion regions of a second conductivity type which are defined on a surface portion of the semiconductor substrate, to be connected to the first electrode, and second diffusion regions of a second conductivity type which are defined at intervals from the first diffusion regions on the surface portion of the semiconductor substrate, to be connected to the second electrode, the bidirectional Zener diode in which an interval between the first diffusion region and the second diffusion region is 5 μm or more.

In accordance with this configuration, first Zener diodes whose cathodes are connected to the first electrode are defined in the first diffusion regions electrically connected to the first electrode. Further, second Zener diodes whose cathodes are connected to the second electrode are defined in the second diffusion regions electrically connected to the second electrode. The respective anodes of the first and second Zener diodes are connected in common to the semiconductor substrate. In this manner, because the first Zener diodes and the second Zener diodes are anti-series connected via the semiconductor substrate, the bidirectional Zener diode is configured between the first electrode and the second electrode.

As the characteristics of the bidirectional Zener diode, there are a reverse breakdown voltage ($V_{br}$: Reverse Breakdown Voltage), peak pulse power ($P_{pk}$: Peak Pulse Power), capacitance between terminals ($C_t$), ESD (Electrostatic Discharge) resistance, and the like. From the viewpoint of ensuring reliability, high peak pulse power ($P_{pk}$) is required in the bidirectional Zener diode.

The peak pulse power ($P_{pk}$: Peak Pulse Power) in the bidirectional Zener diode is dependent on an interval between the first diffusion region and the second diffusion region. As in this configuration, an interval between the first diffusion region and the second diffusion region is set to 5 μm or more, thereby it is possible to achieve the peak pulse power of 10 W or higher. Thereby, it is possible to provide the bidirectional Zener diode which is capable of achieving excellent peak pulse power, that leads to the improvement in reliability.

C2: The bidirectional Zener diode according to C1, in which an interval between the first diffusion region and the second diffusion region is 15 μm or less.

As in this configuration, an interval between the first diffusion region and the second diffusion region is set to 15 μm or less, thereby it is possible to achieve the peak pulse power of 10 W to 25 W while achieving miniaturization of the bidirectional Zener diode.

C3: The bidirectional Zener diode according to C1 or C2, in which peak pulse power is 10 W to 25 W.

C4: The bidirectional Zener diode according to any one of C1 to C3, in which the first electrode includes first extraction electrodes which cover the first diffusion regions, the second electrode includes second extraction electrodes which cover the second diffusion regions, and the second extraction electrode is defined along a longitudinal direction of the first extraction electrodes.

In accordance with this configuration, because the first extraction electrode and the second extraction electrode are defined parallel, it is possible to arrange the first diffusion regions and the second diffusion regions so as to be adjacent to one another. Therefore, it is possible to more favorably adjust an interval between the first diffusion regions and the second diffusion regions.

C5: The bidirectional Zener diode according to C4, in which the first diffusion regions and the second diffusion regions are respectively defined in regions of the central portions in the longitudinal direction of the first extraction electrodes and the second extraction electrodes in planar view.

C6: The bidirectional Zener diode according to C4 or C5, in which the first diffusion regions and the second diffusion regions are defined so as to be adjacent to one another along a direction perpendicular to the longitudinal direction.

C7: The bidirectional Zener diode according to any one of C4 to C6, in which the first diffusion regions and the second diffusion regions are defined so as to extend along the longitudinal direction of the first extraction electrodes and the second extraction electrodes.

It is possible to increase the peak pulse power in the bidirectional Zener diode by defining the respective areas of the first diffusion regions and the second diffusion regions as larger. As in this configuration, the first diffusion regions and the second diffusion regions are defined so as to extend along the longitudinal direction of the first extraction electrodes and the second extraction electrodes, thereby it is possible to efficiently increase the respective areas of the first diffusion regions and the second diffusion regions. Therefore, it is possible to easily obtain good peak pulse power.

In addition, an area of the first diffusion region means a total area of a region surrounded by the boundary between the semiconductor substrate and the first diffusion region in planar view that the surface of the semiconductor substrate is viewed from a normal direction. In the same way, an area of the second diffusion region means a total area of a region surrounded by the boundary between the semiconductor substrate and the second diffusion region in planar view that the surface of the semiconductor substrate is viewed from a normal direction.

C8: The bidirectional Zener diode according to any one of C4 to C7, in which the first extraction electrodes and the second extraction electrodes are defined in comb-teeth shapes engaging with each other.

In accordance with this configuration, because the first extraction electrodes and the second extraction electrodes are defined in comb-teeth shapes engaging with each other, it is possible to efficiently arrange the first diffusion regions and the second diffusion regions. Thereby, it is possible to efficiently define the respective areas of the first diffusion regions and the second diffusion regions as larger.

C9: The bidirectional Zener diode according to any one of C4 to C8, in which the first extraction electrodes and the second extraction electrodes are defined so as to have a width wider than a width of the first diffusion regions and the second diffusion regions.

In accordance with this configuration, it is possible to favorably connect the first extraction electrodes and the second extraction electrodes to the first diffusion regions and the second diffusion regions.

C10: The bidirectional Zener diode according to any one of C1 to C9, in which the first diffusion regions and the second diffusion regions have the same area.

It is possible to improve the peak pulse power of the bidirectional Zener diode by increasing the respective areas of the first diffusion regions and the second diffusion regions. However, in this case, there is a trade-off that the capacitance between terminals (the total capacitance between the first electrode and the second electrode) as well increases.

As in this configuration, by fixing the first diffusion regions and the second diffusion regions to the same area, it is possible to substantially uniform the respective capacitance components (parasitic capacitances) in the first diffusion regions and the second diffusion regions. Accordingly, it is possible to effectively suppress an increase in undesired capacitance between terminals, and it is possible to achieve good peak pulse power in a state of maintaining low capacitance between terminals.

C11: The bidirectional Zener diode according to C10, in which the respective areas of the first diffusion regions and the second diffusion regions are 6500 $\mu m^2$ or less. In accordance with this configuration, it is possible to control the capacitance between terminal to be 5 pF or less.

C12: The bidirectional Zener diode according to any one of C1 to C11, in which the first diffusion regions and the second diffusion regions have the same boundary length.

The ESD (Electrostatic Discharge) resistance of the Zener diode is dependent on the respective boundary lengths of the first diffusion regions and the second diffusion regions. That is, a value of the ESD resistance goes up with an increase in the respective boundary lengths, and a value of the ESD resistance is lowered as with a decrease in the respective boundary lengths. Accordingly, as in this configuration, the respective boundary lengths of the first diffusion regions and the second diffusion regions are uniformed, thereby it is possible to substantially uniform the ESD resistances of the first diffusion regions and the second diffusion regions. Further, the respective boundary lengths of the first diffusion regions and the second diffusion regions are uniformed, thereby it is possible to obtain good peak pulse power while maintaining a state of keeping good ESD resistance.

Further, a boundary length of the first diffusion region means a total extension of the boundary between the semiconductor substrate and the first diffusion region on the surface of the semiconductor substrate. Further, a boundary length of the second diffusion region means a total extension of the boundary between the semiconductor substrate and the second diffusion region on the surface of the semiconductor substrate.

C13: The bidirectional Zener diode according to C12, in which the respective boundary lengths of the first diffusion regions and the second diffusion regions are 480 $\mu m$ or less.

In accordance with this configuration, it is possible to achieve the ESD resistance of 10 kV or higher. Accordingly, it is possible to provide a bidirectional Zener diode which is capable of conforming to IEC61000-4-2 (International Standard) that the lower limit of ESD resistance is stipulated to be 8 kV or higher.

C14: The bidirectional Zener diode according to any one of C1 to C13, in which the first diffusion regions and the second diffusion regions are defined so as to be symmetrical to one another.

In accordance with this configuration, it is possible to substantially equalize the electrical characteristics of the first Zener diodes, and the electrical characteristics of the second Zener diodes. Thereby, it is possible to substantially equalize the characteristics for the respective electric current directions. Symmetry includes point symmetry and line symmetry. Further, symmetry also includes a mode, which is not an exact symmetrical figure, but considered as being substantially symmetrical as long as the electrical characteristics are symmetrical.

C15: The bidirectional Zener diode according to any one of C1 to C14 further includes an insulating film which covers the surface of the semiconductor substrate, in which contact holes for selectively exposing the first diffusion regions and the second diffusion regions are defined in the insulating film.

C16: The bidirectional Zener diode according to C15, in which the contact holes are defined so as to have a width narrower than each width of the first diffusion regions and the second diffusion regions.

In accordance with this configuration, it is possible to favorably electrically connect the first electrode and the second electrode to the first diffusion regions and the second diffusion regions.

C17: The bidirectional Zener diode according to any one of C1 to C16, in which the semiconductor substrate is a p-type semiconductor substrate, and the first diffusion regions and the second diffusion regions are n-type diffusion regions.

In accordance with this configuration, because the semiconductor substrate is a p-type semiconductor substrate, it is possible to achieve stable characteristics even without defining an epitaxial layer on the semiconductor substrate. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because a p-type semiconductor substrate has a small in-plane resistivity variation, it is possible to cut a bidirectional Zener diode with stable characteristics out of any place of the p-type semiconductor substrate without defining an epitaxial layer. Therefore, by use of the p-type semiconductor substrate, it is possible to simplify the manufacturing process, and reduce the manufacturing cost.

Further, with reference to FIGS. 69 to 91, in the case where it is an object of the present invention to provide a bidirectional Zener diode which is capable of achieving excellent peak pulse power, that leads to the improvement in reliability, and a manufacturing method of the same, a bidirectional Zener diode having features as shown in the following D1 to D18 may be extracted.

D1: A bidirectional Zener diode with a reverse breakdown voltage of 6.5V to 9.0V, includes a semiconductor substrate of a first conductivity type which having resistivity of 10 mΩ·cm to 30 mΩ·cm, a first electrode and a second electrode which are defined on the semiconductor substrate, first diffusion regions of a second conductivity type, which are defined on a surface portion of the semiconductor substrate, to be connected to the first electrode, and second diffusion regions of a second conductivity type, which are defined at intervals from the first diffusion regions on the surface portion of the semiconductor substrate, to be connected to the second electrode, the bidirectional Zener diode in which the first diffusion regions and the second diffusion regions have a depth of 2 μm to 3 μm from the surface of the semiconductor substrate.

In accordance with this configuration, first Zener diodes whose cathodes are connected to the first electrode are defined in the first diffusion regions electrically connected to the first electrode. Further, second Zener diodes whose cathodes are connected to the second electrode are defined in the second diffusion regions electrically connected to the second electrode. The respective anodes of the first and second Zener diodes are connected in common to the semiconductor substrate. In this manner, because the first Zener diodes and the second Zener diodes are anti-series connected via the semiconductor substrate, the bidirectional Zener diode is configured between the first electrode and the second electrode.

As the characteristics of the bidirectional Zener diode, there are a reverse breakdown voltage ($V_{br}$: Reverse Breakdown Voltage), peak pulse power ($P_{pk}$: Peak Pulse Power), capacitance between terminals ($C_t$), ESD (Electrostatic Discharge) resistance, and the like. From the viewpoint of ensuring reliability, high peak pulse power is required in the bidirectional Zener diode.

In accordance with this configuration, the resistivity of the semiconductor substrate is 10 mΩ·cm to 30 mΩ·cm, and the first diffusion regions and the second diffusion regions have a depth of 2 μm to 3 μm from the surface of the semiconductor substrate. Thereby, it is possible to achieve the peak pulse power $P_{pk}$ of 22 W to 29 W. As a result, it is possible to provide a bidirectional Zener diode which is capable of achieving excellent peak pulse power, that leads to the improvement in reliability.

D2: The bidirectional Zener diode according to D1, in which the first electrode includes first extraction electrodes which are defined so as to cover the first diffusion regions, and the second electrode includes second extraction electrodes which are defined so as to cover the second diffusion regions along an extracting direction of the first extraction electrode.

D3: The bidirectional Zener diode according to D2, in which a plurality of the first extraction electrodes and a plurality of the second extraction electrodes are defined in comb-teeth shapes engaging with each other.

D4: The bidirectional Zener diode according to D2 or D3, in which the first diffusion regions and the second diffusion regions are arrayed along the extracting direction of the first extraction electrodes and the second extraction electrodes.

D5: The bidirectional Zener diode according to any one of D2 to D4, in which the first diffusion regions and the second diffusion regions are defined so as to be adjacent to one another along a direction perpendicular to the extracting direction of the first extraction electrodes and the second extraction electrodes.

D6: The bidirectional Zener diode according to any one of D2 to D5, in which the first extraction electrodes and the second extraction electrodes are defined so as to have a width wider than each width of the first diffusion regions and the second diffusion regions.

In accordance with this configuration, it is possible to favorably connect the first extraction electrodes and the second extraction electrodes to the first diffusion regions and the second diffusion regions.

D7: The bidirectional Zener diode according to any one of D1 to D6, in which the first diffusion regions and the second diffusion regions are arrayed so as to be symmetrical.

In accordance with this configuration, it is possible to substantially equalize the electrical characteristics of the first Zener diodes, and the electrical characteristics of the second Zener diodes. Thereby, it is possible to substantially equalize the characteristics for the respective electric current directions. Symmetry includes point symmetry and line symmetry. Further, symmetry also includes a mode, which is even not an exact symmetrical figure, but considered as being substantially symmetrical as long as the electrical characteristics are symmetrical.

D8: The bidirectional Zener diode according to any one of D1 to D7, in which the semiconductor substrate is a p-type semiconductor substrate, and the first diffusion regions and the second diffusion regions are n-type diffusion regions.

In accordance with this configuration, because the semiconductor substrate is a p-type semiconductor substrate, it is possible to achieve stable characteristics even without defining an epitaxial layer on the semiconductor substrate. That is, because an n-type semiconductor substrate has a large in-plane resistivity variation, it is necessary to define an epitaxial layer with a small in-plane resistivity variation on the surface, and define an impurity diffusion layer on the epitaxial layer, to define a p-n junction. On the contrary, because a p-type semiconductor substrate has a small in-plane resistivity variation, it is possible to cut a bidirectional Zener diode with stable characteristics out of any place of the p-type semiconductor substrate without defining an epitaxial layer. Therefore, by use of the p-type semiconductor substrate, it is possible to simplify the manufacturing process, and reduce the manufacturing cost.

D9: The bidirectional Zener diode according to D8, in which the first electrode and the second electrode contain a conductive material composed of AlSiCu.

AlSiCu has a work function approximate to that of a p-type semiconductor (particularly a p-type silicon semiconductor). Therefore, an AlSiCu electrode film is capable of defining a good ohmic contact with a p-type semiconductor. Therefore, there is no need to define a diffusion layer with a high-impurity concentration for defining an ohmic contact with a p-type semiconductor substrate. Thereby, further simplifying the manufacturing method, in response, it is possible to reduce the productivity and the production cost. As an electrode film which is capable of defining an ohmic contact with a p-type semiconductor, an AlSi electrode film material is additionally applicable. On the contrary, an AlSiCu electrode film is capable of leading to the improvement in reliability more than this AlSi electrode film.

D10: The bidirectional Zener diode according to any one of D1 to D9 further includes an insulating film which covers the surface of the semiconductor substrate, and in which contact holes for selectively exposing the first diffusion regions and the second diffusion regions are defined, the bidirectional Zener diode in which concave portions continuing the contact holes are defined in the first diffusion regions and the second diffusion regions.

D11: The bidirectional Zener diode according to D10 further includes a concave portion insulating film which is selectively defined on the peripheral edge portion of the concave portion.

D12: The bidirectional Zener diode according to D11, in which the concave portion insulating film is defined so as to cross a boundary between the concave portion and the contact hole.

D13: The bidirectional Zener diode according to any one of D10 to D12, in which the contact hole is defined so as to have a width narrower than a width of the first diffusion regions and the second diffusion regions.

D14: The bidirectional Zener diode according to any one of D1 to D13, in which the first diffusion regions and the second diffusion regions have a constant concentration profile from the surface of the semiconductor substrate to a predetermined depth.

D15: A method for manufacturing a bidirectional Zener diode includes a process of defining an insulating film in which openings are selectively defined, on a surface of a semiconductor substrate of a first conductivity type having resistivity of 10 mΩ·cm to 30 mΩ·cm, a process of selectively introducing an impurity into the surface of the semiconductor substrate via the openings, a process of defining a thermal oxide film on the surface of the semiconductor substrate so as to cover at least regions into which the impurity is introduced, a process of defining first diffusion regions and second diffusion regions which have a depth of 2 μm to 3 μm from the surface of the semiconductor substrate, on the surface of the semiconductor substrate by performing drive-in processing in a state in which the surface of the semiconductor substrate is covered with the thermal oxide film, to diffuse the impurity, a process of defining an electrode film on the insulating film so as to backfill the openings after the thermal oxide film is removed, and a process of defining a first electrode which is connected to the first diffusion regions and a second electrode which is connected to the second diffusion regions by removing unnecessary portions of the electrode film.

In accordance with this method, first Zener diodes whose cathodes are connected to the first electrode are defined in the first diffusion regions electrically connected to the first electrode. Further, second Zener diodes whose cathodes are connected to the second electrode are defined in the second diffusion regions electrically connected to the second electrode. The respective anodes of the first and second Zener diodes are connected in common to the semiconductor substrate. In this manner, because the first Zener diodes and the second Zener diodes are anti-series connected via the semiconductor substrate, the bidirectional Zener diode is configured between the first electrode and the second electrode.

Further, in accordance with this method, by defining a thermal oxide film before the drive-in processing, it is possible to reduce the concentration of the impurity (the n-type impurity or the p-type impurity) in the surface portion of the semiconductor substrate. Additionally, the resistivity of the semiconductor substrate to be used is 10 mΩ·cm to 30 mΩ·cm. Therefore, drive-in processing is performed such that the impurity diffuses into a depth of 2 μm to 3 μm, and the amount of heat during the drive-in processing is applied to the semiconductor substrate, thereby it is possible to achieve the peak pulse power $P_{pk}$ of 22 W to 29 W. Thereby, it is possible to provide a bidirectional Zener diode which is capable of achieving excellent peak pulse power, that leads to the improvement in reliability.

D16: The method for manufacturing the bidirectional Zener diode according to D15, in which the process of defining the first electrode and the second electrode includes a process of defining first extraction electrodes which cover the first diffusion regions, and second extraction electrodes which cover the second diffusion regions along an extracting direction of the first extraction electrodes.

D17: The method for manufacturing the bidirectional Zener diode according to D15 or D16, in which the process of defining the first electrode and the second electrode includes a process of defining the first extraction electrodes and the second extraction electrodes in comb-teeth shapes engaging with each other.

In accordance with this method, because the first extraction electrodes and the second extraction electrodes are defined in comb-teeth shapes engaging with each other, it is possible to efficiently arrange the first diffusion regions and the second diffusion regions at intervals from one another, and it is possible to achieve good electrical connections.

D18: The method for manufacturing the bidirectional Zener diode according to any one of D15 to D17, in which the process of defining the thermal oxide film includes a process of defining concave portions continuing the openings in the semiconductor substrate by selectively performing thermal oxidation of surfaces of the openings in the semiconductor substrate, to grow the thermal oxide film up to the back surface side of the semiconductor substrate.

The invention claimed is:

1. A bidirectional Zener diode, comprising:
a semiconductor substrate of a first conductivity type, which has an element region;
a first electrode and a second electrode which are defined on the semiconductor substrate;
a plurality of first diffusion regions of a second conductivity type, which are defined on a surface portion of the semiconductor substrate, to be connected to the first electrode; and
a plurality of second diffusion regions of a second conductivity type, which are defined at intervals from the first diffusion regions on the surface portion of the semiconductor substrate, to be connected to the second electrode, wherein
the plurality of first diffusion regions and the plurality of second diffusion regions are aggregated in a central portion of the element region in the bidirectional Zener diode,
the first electrode and the second electrode are defined so as to sandwich the element region,
the plurality of first diffusion regions and the plurality of second diffusion regions constitute a central diffusion region group along a transverse direction crossing the central portion in the opposite direction of the first electrode and the second electrode in the central portion of the element region, and
the plurality of first diffusion regions and the plurality of second diffusion regions further constitute auxiliary diffusion region groups adjacent to the central diffusion region group in the central portion of the element region.

2. The bidirectional Zener diode according to claim 1, wherein the auxiliary diffusion region groups are defined as shorter than the central diffusion region group with respect to a length in the transverse direction.

3. The bidirectional Zener diode according to claim 2, wherein the auxiliary diffusion region groups are selectively arranged in central portions in the transverse direction of the central diffusion region group.

4. The bidirectional Zener diode according to claim 1, wherein the plurality of first diffusion regions and the plurality of second diffusion regions are defined in rectangular shapes along the opposite direction.

5. The bidirectional Zener diode according to claim 1, wherein the plurality of first diffusion regions and the plurality of second diffusion regions are defined so as to be adjacent to one another along the transverse direction.

6. The bidirectional Zener diode according to claim 1, wherein
the first electrode includes a plurality of first extraction electrodes which cover the plurality of first diffusion regions,
the second electrode includes a plurality of second extraction electrodes which cover the plurality of second diffusion regions, and
the second extraction electrodes are defined along a longitudinal direction of the first extraction electrodes.

7. The bidirectional Zener diode according to claim 6, wherein the first extraction electrodes and the second extraction electrodes are defined in comb-teeth shapes engaging with each other.

8. The bidirectional Zener diode according to claim 6, wherein the first extraction electrodes and the second extraction electrodes are defined so as to have a width wider than a width of the plurality of first diffusion regions and the plurality of second diffusion regions.

9. The bidirectional Zener diode according to claim 1, further comprising an insulating film which covers the semiconductor substrate, wherein
contact holes for selectively exposing the plurality of first diffusion regions and the plurality of second diffusion regions are defined in the insulating film.

10. The bidirectional Zener diode according to claim 9, wherein the contact hole is defined so as to have a width narrower than the width of the plurality of first diffusion regions and the plurality of second diffusion regions.

11. The bidirectional Zener diode according to claim 1, wherein the plurality of first diffusion regions and the plurality of second diffusion regions have the same area.

12. The bidirectional Zener diode according to claim 1, wherein the plurality of first diffusion regions and the plurality of second diffusion regions have the same boundary length.

13. The bidirectional Zener diode according to claim 1, wherein the plurality of first diffusion regions and the plurality of second diffusion regions are defined so as to be symmetrical to one another.

14. The bidirectional Zener diode according to claim 1, further comprising pseudo-diode regions which are electrically isolated from the first electrode and the second electrode, wherein
the pseudo-diode regions are defined in regions other than the regions in which the plurality of first diffusion regions and the plurality of second diffusion regions are defined.

15. The bidirectional Zener diode according to claim 1, wherein
the semiconductor substrate is a p-type semiconductor substrate, and
the first diffusion regions and the second diffusion regions are n-type diffusion regions.

* * * * *